(12) United States Patent
Waldern et al.

(10) Patent No.: US 12,158,612 B2
(45) Date of Patent: Dec. 3, 2024

(54) EVACUATED PERIODIC STRUCTURES AND METHODS OF MANUFACTURING

(71) Applicant: DigiLens Inc., Sunnyvale, CA (US)

(72) Inventors: Jonathan David Waldern, Los Altos Hills, CA (US); Alastair John Grant, San Jose, CA (US); Milan Momcilo Popovich, Leicester (GB); Shibu Abraham, Sunnyvale, CA (US); Baeddan George Hill, Sunnyvale, CA (US); Tsung-Jui Ho, Sunnyvale, CA (US); Michiel Koen Callens, Sunnyvale, CA (US); Hyesog Lee, Sunnyvale, CA (US)

(73) Assignee: DigiLens Inc., Sunnyvale, CA (US)

( * ) Notice: Subject to any disclaimer, the term of this patent is extended or adjusted under 35 U.S.C. 154(b) by 60 days.

(21) Appl. No.: 17/653,818

(22) Filed: Mar. 7, 2022

(65) Prior Publication Data
US 2022/0283376 A1    Sep. 8, 2022

Related U.S. Application Data

(60) Provisional application No. 63/223,311, filed on Jul. 19, 2021, provisional application No. 63/174,401,
(Continued)

(51) Int. Cl.
*G02B 6/34*    (2006.01)
*G02B 5/18*    (2006.01)
(Continued)

(52) U.S. Cl.
CPC ............. *G02B 6/34* (2013.01); *G02B 5/1857* (2013.01); *G02B 5/32* (2013.01); *G03H 1/0248* (2013.01);
(Continued)

(58) Field of Classification Search
None
See application file for complete search history.

(56) References Cited

U.S. PATENT DOCUMENTS

| | | |
|---|---|---|
| 1,043,938 A | 11/1912 | Huttenlocher |
| 2,141,884 A | 12/1938 | Sonnefeld |
| | (Continued) | |

FOREIGN PATENT DOCUMENTS

| | | |
|---|---|---|
| BR | PI0720469 A2 | 1/2014 |
| CA | 2889727 A1 | 6/2014 |
| | (Continued) | |

OTHER PUBLICATIONS

Extended European Search Report for EP Application No. 13192383.1, dated Apr. 2, 2014, 7 pgs.
(Continued)

*Primary Examiner* — Stephone B Allen
*Assistant Examiner* — Jyotsna V Dabbi
(74) *Attorney, Agent, or Firm* — KPPB LLP

(57) ABSTRACT

Gratings may be used in waveguides. Deep surface relief gratings (SRGs) may offer many advantages over conventional SRGs, an important one being a higher S-diffraction efficiency. Deep SRGs can be implemented as polymer surface relief gratings or evacuated periodic structures (EPSs). EPSs can be formed by first recording a holographic polymer dispersed liquid crystal (HPDLC) periodic structure. Removing the liquid crystal from the cured periodic structure provides a polymer surface relief grating. Polymer surface relief gratings have many applications including for use in waveguide-based displays.

18 Claims, 55 Drawing Sheets

Related U.S. Application Data filed on Apr. 13, 2021, provisional application No. 63/157,467, filed on Mar. 5, 2021.

(51) Int. Cl.
  *G02B 5/32* (2006.01)
  *G03H 1/02* (2006.01)
  *G03H 1/04* (2006.01)
  *H10K 50/80* (2023.01)

(52) U.S. Cl.
  CPC ......... *G03H 1/0408* (2013.01); *H10K 50/868* (2023.02); *G03H 2001/0264* (2013.01); *G03H 2223/16* (2013.01); *G03H 2260/12* (2013.01); *G03H 2260/33* (2013.01); *G03H 2270/11* (2013.01); *G03H 2270/14* (2013.01)

(56) References Cited

U.S. PATENT DOCUMENTS

| | | |
|---|---|---|
| 3,482,498 A | 12/1969 | Becker |
| 3,620,601 A | 11/1971 | Leonard et al. |
| 3,741,716 A | 6/1973 | Johne et al. |
| 3,804,496 A | 4/1974 | Crane et al. |
| 3,843,231 A | 10/1974 | Borel et al. |
| 3,851,303 A | 11/1974 | Muller |
| 3,885,095 A | 5/1975 | Wolfson et al. |
| 3,940,204 A | 2/1976 | Withrington |
| 3,965,029 A | 6/1976 | Arora |
| 3,975,711 A | 8/1976 | McMahon |
| 4,028,725 A | 6/1977 | Lewis |
| 4,035,068 A | 7/1977 | Rawson |
| 4,066,334 A | 1/1978 | Fray et al. |
| 4,082,432 A | 4/1978 | Kirschner |
| 4,099,841 A | 7/1978 | Ellis |
| 4,133,152 A | 1/1979 | Penrose |
| 4,178,074 A | 12/1979 | Heller |
| 4,218,111 A | 8/1980 | Withrington et al. |
| 4,232,943 A | 11/1980 | Rogers |
| 4,248,093 A | 2/1981 | Andersson et al. |
| 4,251,137 A | 2/1981 | Knop et al. |
| 4,309,070 A | 1/1982 | St. Leger Searle |
| 4,322,163 A | 3/1982 | Schiller |
| 4,386,361 A | 5/1983 | Simmonds |
| 4,389,612 A | 6/1983 | Simmonds et al. |
| 4,403,189 A | 9/1983 | Simmonds |
| 4,403,827 A | 9/1983 | Bryan et al. |
| 4,418,993 A | 12/1983 | Lipton |
| 4,468,420 A * | 8/1984 | Kawahara ............... C03C 17/25 427/430.1 |
| 4,472,037 A | 9/1984 | Lipton |
| 4,523,226 A | 6/1985 | Lipton et al. |
| 4,544,267 A | 10/1985 | Schiller |
| 4,562,463 A | 12/1985 | Lipton |
| 4,566,758 A | 1/1986 | Bos et al. |
| 4,583,117 A | 4/1986 | Lipton et al. |
| 4,643,515 A | 2/1987 | Upatnieks |
| 4,647,967 A | 3/1987 | Kirschner et al. |
| 4,688,900 A | 8/1987 | Doane et al. |
| 4,711,512 A | 12/1987 | Upatnieks |
| 4,714,320 A | 12/1987 | Banbury |
| 4,728,547 A | 3/1988 | Vaz et al. |
| 4,729,640 A | 3/1988 | Sakata et al. |
| 4,743,083 A | 5/1988 | Schimpe |
| 4,749,256 A | 6/1988 | Bell et al. |
| 4,765,703 A | 8/1988 | Suzuki et al. |
| 4,775,218 A | 10/1988 | Wood et al. |
| 4,791,788 A | 12/1988 | Simmonds et al. |
| 4,792,850 A | 12/1988 | Liptoh et al. |
| 4,799,765 A | 1/1989 | Ferrer |
| 4,811,414 A | 3/1989 | Fishbine et al. |
| 4,848,093 A | 7/1989 | Simmonds et al. |
| 4,852,988 A | 8/1989 | Velez et al. |
| 4,854,688 A | 8/1989 | Hayford et al. |
| 4,860,294 A | 8/1989 | Winzer et al. |
| 4,884,876 A | 12/1989 | Lipton et al. |
| 4,890,902 A | 1/1990 | Doane et al. |
| 4,928,301 A | 5/1990 | Smoot |
| 4,933,976 A | 6/1990 | Fishbine et al. |
| 4,938,568 A | 7/1990 | Margerum et al. |
| 4,946,245 A | 8/1990 | Chamberlin et al. |
| 4,960,311 A | 10/1990 | Moss et al. |
| 4,964,701 A | 10/1990 | Dorschner et al. |
| 4,967,268 A | 10/1990 | Lipton et al. |
| 4,970,129 A | 11/1990 | Ingwall et al. |
| 4,971,719 A | 11/1990 | Vaz et al. |
| 4,994,204 A | 2/1991 | Doane et al. |
| 5,004,323 A | 4/1991 | West |
| 5,007,711 A | 4/1991 | Wood et al. |
| 5,009,483 A | 4/1991 | Rockwell et al. |
| 5,011,624 A | 4/1991 | Yamagishi et al. |
| 5,016,953 A | 5/1991 | Moss et al. |
| 5,033,814 A | 7/1991 | Brown et al. |
| 5,035,734 A | 7/1991 | Honkanen et al. |
| 5,053,834 A | 10/1991 | Simmonds |
| 5,063,441 A | 11/1991 | Lipton et al. |
| 5,076,664 A | 12/1991 | Migozzi |
| 5,079,416 A | 1/1992 | Filipovich |
| 5,096,282 A | 3/1992 | Margerum et al. |
| 5,099,343 A | 3/1992 | Margerum et al. |
| 5,109,465 A | 4/1992 | Klopotek |
| 5,110,034 A | 5/1992 | Simmonds et al. |
| 5,117,285 A | 5/1992 | Nelson et al. |
| 5,117,302 A | 5/1992 | Lipton |
| 5,119,454 A | 6/1992 | McMahon et al. |
| 5,124,821 A | 6/1992 | Antier et al. |
| 5,138,687 A | 8/1992 | Horie et al. |
| 5,139,192 A | 8/1992 | Simmonds et al. |
| 5,142,357 A | 8/1992 | Lipton et al. |
| 5,142,644 A | 8/1992 | Vansteenkiste et al. |
| 5,148,302 A | 9/1992 | Nagano et al. |
| 5,150,234 A | 9/1992 | Takahashi et al. |
| 5,151,958 A | 9/1992 | Honkanen |
| 5,153,751 A | 10/1992 | Ishikawa et al. |
| 5,159,445 A | 10/1992 | Gitlin et al. |
| 5,160,523 A | 11/1992 | Honkanen et al. |
| 5,181,133 A | 1/1993 | Lipton |
| 5,183,545 A | 2/1993 | Branca et al. |
| 5,187,597 A | 2/1993 | Kato et al. |
| 5,193,000 A | 3/1993 | Lipton et al. |
| 5,198,912 A | 3/1993 | Ingwall et al. |
| 5,200,861 A | 4/1993 | Moskovich et al. |
| 5,210,624 A | 5/1993 | Matsumoto et al. |
| 5,210,801 A | 5/1993 | Fournier et al. |
| 5,218,360 A | 6/1993 | Goetz et al. |
| 5,218,480 A | 6/1993 | Moskovich et al. |
| 5,224,198 A | 6/1993 | Jachimowicz et al. |
| 5,239,372 A | 8/1993 | Lipton |
| 5,240,636 A | 8/1993 | Doane et al. |
| 5,241,337 A | 8/1993 | Betensky et al. |
| 5,242,476 A | 9/1993 | Bartel et al. |
| 5,243,413 A | 9/1993 | Gitlin et al. |
| 5,251,048 A | 10/1993 | Doane et al. |
| 5,264,950 A | 11/1993 | West et al. |
| 5,268,792 A | 12/1993 | Kreitzer et al. |
| 5,284,499 A | 2/1994 | Harvey et al. |
| 5,289,315 A | 2/1994 | Makita et al. |
| 5,295,208 A | 3/1994 | Caulfield et al. |
| 5,296,967 A | 3/1994 | Moskovich et al. |
| 5,299,289 A | 3/1994 | Omae et al. |
| 5,303,085 A | 4/1994 | Rallison |
| 5,306,923 A | 4/1994 | Kazmierski et al. |
| 5,309,283 A | 5/1994 | Kreitzer et al. |
| 5,313,330 A | 5/1994 | Betensky |
| 5,315,324 A | 5/1994 | Kubelik et al. |
| 5,315,419 A | 5/1994 | Saupe et al. |
| 5,315,440 A | 5/1994 | Betensky et al. |
| 5,317,405 A | 5/1994 | Kuriki et al. |
| 5,327,269 A | 7/1994 | Tilton et al. |
| 5,329,363 A | 7/1994 | Moskovich et al. |
| 5,341,230 A | 8/1994 | Smith |
| 5,343,147 A | 8/1994 | Sager et al. |
| 5,351,151 A | 9/1994 | Levy |
| 5,359,362 A | 10/1994 | Lewis et al. |

(56) References Cited

U.S. PATENT DOCUMENTS

| | | |
|---|---|---|
| 5,363,220 A | 11/1994 | Kuwayama et al. |
| 5,368,770 A | 11/1994 | Saupe et al. |
| 5,369,511 A | 11/1994 | Amos |
| 5,371,626 A | 12/1994 | Betensky |
| 5,400,069 A | 3/1995 | Braun et al. |
| 5,408,346 A | 4/1995 | Trissel et al. |
| 5,410,370 A | 4/1995 | Janssen |
| 5,410,376 A | 4/1995 | Cornsweet et al. |
| 5,416,510 A | 5/1995 | Lipton et al. |
| 5,416,514 A | 5/1995 | Janssen et al. |
| 5,418,584 A | 5/1995 | Larson |
| 5,418,871 A | 5/1995 | Revelli et al. |
| 5,428,480 A | 6/1995 | Betensky et al. |
| 5,437,811 A | 8/1995 | Doane et al. |
| 5,438,357 A | 8/1995 | McNelley |
| 5,452,385 A | 9/1995 | Izumi et al. |
| 5,453,863 A | 9/1995 | West et al. |
| 5,455,693 A | 10/1995 | Wreede et al. |
| 5,455,713 A | 10/1995 | Kreitzer et al. |
| 5,462,700 A | 10/1995 | Beeson et al. |
| 5,463,428 A | 10/1995 | Lipton et al. |
| 5,465,311 A | 11/1995 | Caulfield et al. |
| 5,471,326 A | 11/1995 | Hall et al. |
| 5,473,222 A | 12/1995 | Thoeny et al. |
| 5,476,611 A | 12/1995 | Nolan et al. |
| 5,481,321 A | 1/1996 | Lipton |
| 5,481,385 A | 1/1996 | Zimmerman et al. |
| 5,485,313 A | 1/1996 | Betensky |
| 5,493,430 A | 2/1996 | Lu et al. |
| 5,493,448 A | 2/1996 | Betensky et al. |
| 5,496,621 A | 3/1996 | Makita et al. |
| 5,499,140 A | 3/1996 | Betensky |
| 5,500,671 A | 3/1996 | Andersson et al. |
| 5,500,769 A | 3/1996 | Betensky |
| 5,510,913 A | 4/1996 | Hashimoto et al. |
| 5,515,184 A | 5/1996 | Caulfield et al. |
| 5,516,455 A | 5/1996 | Jacobine et al. |
| 5,524,272 A | 6/1996 | Podowski et al. |
| 5,528,720 A | 6/1996 | Winston et al. |
| 5,530,566 A | 6/1996 | Kumar |
| 5,532,736 A | 7/1996 | Kuriki et al. |
| 5,532,875 A | 7/1996 | Betemsky |
| 5,537,232 A | 7/1996 | Biles |
| RE35,310 E | 8/1996 | Moskovich |
| 5,543,950 A | 8/1996 | Lavrentovich et al. |
| 5,559,637 A | 9/1996 | Moskovich et al. |
| 5,572,248 A | 11/1996 | Allen et al. |
| 5,572,250 A | 11/1996 | Lipton et al. |
| 5,576,888 A | 11/1996 | Betensky |
| 5,579,026 A | 11/1996 | Tabata |
| 5,583,795 A | 12/1996 | Smyth |
| 5,585,035 A | 12/1996 | Nerad et al. |
| 5,593,615 A | 1/1997 | Nerad et al. |
| 5,604,611 A | 2/1997 | Saburi et al. |
| 5,606,433 A | 2/1997 | Yin et al. |
| 5,612,733 A | 3/1997 | Flohr |
| 5,612,734 A | 3/1997 | Nelson et al. |
| 5,619,254 A | 4/1997 | McNelley |
| 5,619,586 A | 4/1997 | Sibbald et al. |
| 5,621,529 A | 4/1997 | Gordon et al. |
| 5,621,552 A | 4/1997 | Coates et al. |
| 5,625,495 A | 4/1997 | Moskovich et al. |
| 5,629,259 A | 5/1997 | Akada et al. |
| 5,631,107 A | 5/1997 | Tarumi et al. |
| 5,633,100 A | 5/1997 | Mickish et al. |
| 5,646,785 A | 7/1997 | Gilboa et al. |
| 5,648,857 A | 7/1997 | Ando et al. |
| 5,661,577 A | 8/1997 | Jenkins et al. |
| 5,661,603 A | 8/1997 | Hanano et al. |
| 5,665,494 A | 9/1997 | Kawabata et al. |
| 5,668,614 A | 9/1997 | Chien et al. |
| 5,668,907 A | 9/1997 | Veligdan |
| 5,677,797 A | 10/1997 | Betensky et al. |
| 5,680,231 A | 10/1997 | Grinberg et al. |
| 5,680,411 A | 10/1997 | Ramdane et al. |
| 5,682,255 A | 10/1997 | Friesem et al. |
| 5,686,931 A | 11/1997 | Fuenfschilling et al. |
| 5,686,975 A | 11/1997 | Lipton |
| 5,691,795 A | 11/1997 | Doane et al. |
| 5,694,230 A | 12/1997 | Welch |
| 5,695,682 A | 12/1997 | Doane et al. |
| 5,701,132 A | 12/1997 | Kollin et al. |
| 5,706,108 A | 1/1998 | Ando et al. |
| 5,706,136 A | 1/1998 | Okuyama et al. |
| 5,707,925 A | 1/1998 | Akada et al. |
| 5,710,645 A | 1/1998 | Phillips et al. |
| 5,724,189 A | 3/1998 | Ferrante |
| 5,724,463 A | 3/1998 | Deacon et al. |
| 5,726,782 A | 3/1998 | Kato et al. |
| 5,727,098 A | 3/1998 | Jacobson |
| 5,729,242 A | 3/1998 | Margerum et al. |
| 5,731,060 A | 3/1998 | Hirukawa et al. |
| 5,731,853 A | 3/1998 | Taketomi et al. |
| 5,742,262 A | 4/1998 | Tabata et al. |
| 5,745,266 A | 4/1998 | Smith et al. |
| 5,745,301 A | 4/1998 | Betensky et al. |
| 5,748,272 A | 5/1998 | Tanaka et al. |
| 5,748,277 A | 5/1998 | Huang et al. |
| 5,751,452 A | 5/1998 | Tanaka et al. |
| 5,757,546 A | 5/1998 | Lipton et al. |
| 5,760,931 A | 6/1998 | Saburi et al. |
| 5,760,960 A | 6/1998 | Lin et al. |
| 5,764,414 A | 6/1998 | King et al. |
| 5,771,320 A | 6/1998 | Stone |
| 5,790,288 A | 8/1998 | Jager et al. |
| 5,790,314 A | 8/1998 | Duck et al. |
| 5,798,641 A | 8/1998 | Spagna et al. |
| 5,804,609 A | 9/1998 | Ohnishi et al. |
| 5,808,804 A | 9/1998 | Moskovich |
| 5,812,608 A | 9/1998 | Valimaki et al. |
| 5,822,089 A | 10/1998 | Phillips et al. |
| 5,822,127 A | 10/1998 | Chen et al. |
| 5,825,448 A | 10/1998 | Bos et al. |
| 5,831,700 A | 11/1998 | Li et al. |
| 5,835,661 A | 11/1998 | Tai et al. |
| 5,841,507 A | 11/1998 | Barnes |
| 5,841,587 A | 11/1998 | Moskovich et al. |
| 5,847,787 A | 12/1998 | Fredley et al. |
| 5,856,842 A | 1/1999 | Tedesco |
| 5,857,043 A | 1/1999 | Cook et al. |
| 5,867,238 A | 2/1999 | Miller et al. |
| 5,867,618 A | 2/1999 | Ito et al. |
| 5,868,951 A | 2/1999 | Schuck, III et al. |
| 5,870,228 A | 2/1999 | Kreitzer et al. |
| 5,875,012 A | 2/1999 | Crawford et al. |
| 5,877,826 A | 3/1999 | Yang et al. |
| 5,886,822 A | 3/1999 | Spitzer |
| 5,892,598 A | 4/1999 | Asakawa et al. |
| 5,892,599 A | 4/1999 | Bahuguna |
| 5,898,511 A | 4/1999 | Mizutani et al. |
| 5,900,987 A | 5/1999 | Kreitzer et al. |
| 5,900,989 A | 5/1999 | Kreitzer |
| 5,903,395 A | 5/1999 | Rallison et al. |
| 5,903,396 A | 5/1999 | Rallison |
| 5,907,416 A | 5/1999 | Hegg et al. |
| 5,907,436 A | 5/1999 | Perry et al. |
| 5,917,459 A | 6/1999 | Son et al. |
| 5,926,147 A | 7/1999 | Sehm et al. |
| 5,929,946 A | 7/1999 | Sharp et al. |
| 5,929,960 A | 7/1999 | West et al. |
| 5,930,433 A | 7/1999 | Williamson et al. |
| 5,936,776 A | 8/1999 | Kreitzer |
| 5,937,115 A | 8/1999 | Domash |
| 5,942,157 A | 8/1999 | Sutherland et al. |
| 5,945,893 A | 8/1999 | Plessky et al. |
| 5,949,302 A | 9/1999 | Sarkka |
| 5,949,508 A | 9/1999 | Kumar et al. |
| 5,956,113 A | 9/1999 | Crawford |
| 5,962,147 A | 10/1999 | Shalhub et al. |
| 5,963,375 A | 10/1999 | Kreitzer |
| 5,966,223 A | 10/1999 | Friesem et al. |
| 5,969,874 A | 10/1999 | Moskovich |
| 5,969,876 A | 10/1999 | Kreitzer et al. |
| 5,973,727 A | 10/1999 | McGrew et al. |

(56) References Cited

U.S. PATENT DOCUMENTS

| | | |
|---|---|---|
| 5,974,162 A | 10/1999 | Metz et al. |
| 5,985,422 A | 11/1999 | Krauter |
| 5,986,746 A | 11/1999 | Metz et al. |
| 5,991,087 A | 11/1999 | Rallison |
| 5,999,089 A | 12/1999 | Carlson et al. |
| 5,999,282 A | 12/1999 | Suzuki et al. |
| 5,999,314 A | 12/1999 | Asakura et al. |
| 6,014,187 A | 1/2000 | Taketomi et al. |
| 6,023,375 A | 2/2000 | Kreitzer |
| 6,042,947 A | 3/2000 | Asakura et al. |
| 6,043,585 A | 3/2000 | Plessky et al. |
| 6,046,585 A | 4/2000 | Simmonds |
| 6,052,540 A | 4/2000 | Koyama |
| 6,061,107 A | 5/2000 | Yang |
| 6,061,463 A | 5/2000 | Metz et al. |
| 6,069,728 A | 5/2000 | Huignard et al. |
| 6,075,626 A | 6/2000 | Mizutani et al. |
| 6,078,427 A | 6/2000 | Fontaine et al. |
| 6,084,998 A | 7/2000 | Straayer |
| 6,094,311 A | 7/2000 | Moskovich |
| 6,097,551 A | 8/2000 | Kreitzer |
| 6,104,448 A | 8/2000 | Doane et al. |
| 6,107,943 A | 8/2000 | Schroeder |
| 6,115,152 A | 9/2000 | Popovich et al. |
| 6,118,908 A | 9/2000 | Bischel et al. |
| 6,121,899 A | 9/2000 | Theriault |
| 6,124,954 A | 9/2000 | Popovich et al. |
| 6,127,066 A | 10/2000 | Ueda et al. |
| 6,128,058 A | 10/2000 | Walton et al. |
| 6,133,971 A | 10/2000 | Silverstein et al. |
| 6,133,975 A | 10/2000 | Li et al. |
| 6,137,630 A | 10/2000 | Tsou et al. |
| 6,141,074 A | 10/2000 | Bos et al. |
| 6,141,154 A | 10/2000 | Kreitzer et al. |
| 6,151,142 A | 11/2000 | Phillips et al. |
| 6,154,190 A | 11/2000 | Yang et al. |
| 6,156,243 A | 12/2000 | Kosuga et al. |
| 6,167,169 A | 12/2000 | Brinkman et al. |
| 6,169,594 B1 | 1/2001 | Aye et al. |
| 6,169,613 B1 | 1/2001 | Amitai et al. |
| 6,169,636 B1 | 1/2001 | Kreitzer et al. |
| 6,172,792 B1 | 1/2001 | Jepsen et al. |
| 6,176,837 B1 | 1/2001 | Foxlin |
| 6,185,015 B1 | 2/2001 | Reinhorn et al. |
| 6,185,016 B1 | 2/2001 | Popovich |
| 6,188,462 B1 | 2/2001 | Lavrentovich et al. |
| 6,191,887 B1 | 2/2001 | Michaloski et al. |
| 6,195,206 B1 | 2/2001 | Yona et al. |
| 6,195,209 B1 | 2/2001 | Kreitzer et al. |
| 6,204,835 B1 | 3/2001 | Yang et al. |
| 6,211,976 B1 | 4/2001 | Popovich et al. |
| 6,222,297 B1 | 4/2001 | Perdue |
| 6,222,675 B1 | 4/2001 | Mall et al. |
| 6,222,971 B1 | 4/2001 | Veligdan et al. |
| 6,249,386 B1 | 6/2001 | Yona et al. |
| 6,259,423 B1 | 7/2001 | Tokito et al. |
| 6,259,559 B1 | 7/2001 | Kobayashi et al. |
| 6,268,839 B1 | 7/2001 | Yang et al. |
| 6,269,203 B1 | 7/2001 | Davies et al. |
| 6,275,031 B1 | 8/2001 | Simmonds et al. |
| 6,278,429 B1 | 8/2001 | Ruth et al. |
| 6,285,813 B1 | 9/2001 | Schultz et al. |
| 6,297,860 B1 | 10/2001 | Moskovich et al. |
| 6,301,056 B1 | 10/2001 | Kreitzer et al. |
| 6,301,057 B1 | 10/2001 | Kreitzer et al. |
| 6,317,083 B1 | 11/2001 | Johnson et al. |
| 6,317,227 B1 | 11/2001 | Mizutani et al. |
| 6,317,228 B2 | 11/2001 | Popovich et al. |
| 6,317,528 B1 | 11/2001 | Gadkaree et al. |
| 6,320,563 B1 | 11/2001 | Yang et al. |
| 6,321,069 B1 | 11/2001 | Piirainen |
| 6,323,970 B1 | 11/2001 | Popovich |
| 6,323,989 B1 | 11/2001 | Jacobson et al. |
| 6,324,014 B1 | 11/2001 | Moskovich et al. |
| 6,327,089 B1 | 12/2001 | Hosaki et al. |
| 6,330,109 B1 | 12/2001 | Ishii et al. |
| 6,333,819 B1 | 12/2001 | Svedenkrans |
| 6,335,224 B1 | 1/2002 | Peterson et al. |
| 6,339,486 B1 | 1/2002 | Popovich |
| 6,340,540 B1 | 1/2002 | Ueda et al. |
| 6,351,273 B1 | 2/2002 | Lemelson et al. |
| 6,351,333 B2 | 2/2002 | Araki et al. |
| 6,356,172 B1 | 3/2002 | Koivisto et al. |
| 6,356,674 B1 | 3/2002 | Davis et al. |
| 6,359,730 B2 | 3/2002 | Tervonen |
| 6,359,737 B1 | 3/2002 | Stringfellow |
| 6,366,281 B1 | 4/2002 | Lipton et al. |
| 6,366,369 B2 | 4/2002 | Ichikawa et al. |
| 6,366,378 B1 | 4/2002 | Tervonen et al. |
| 6,377,238 B1 | 4/2002 | McPheters |
| 6,377,321 B1 | 4/2002 | Khan et al. |
| 6,388,797 B1 | 5/2002 | Lipton et al. |
| 6,392,812 B1 | 5/2002 | Howard |
| 6,407,724 B2 | 6/2002 | Waldern et al. |
| 6,409,687 B1 | 6/2002 | Foxlin |
| 6,411,444 B1 | 6/2002 | Moskovich et al. |
| 6,414,760 B1 | 7/2002 | Lopez et al. |
| 6,417,971 B1 | 7/2002 | Moskovich et al. |
| 6,421,109 B1 | 7/2002 | Popovich |
| 6,437,563 B1 | 8/2002 | Simmonds et al. |
| 6,445,512 B1 | 9/2002 | Moskovich et al. |
| 6,449,095 B1 | 9/2002 | Ohtaki et al. |
| 6,456,584 B1 | 9/2002 | Nagata et al. |
| 6,470,132 B1 | 10/2002 | Nousiainen et al. |
| 6,473,209 B1 | 10/2002 | Popovich |
| 6,476,974 B1 | 11/2002 | Kreitzer et al. |
| 6,483,303 B2 | 11/2002 | Simmonds et al. |
| 6,486,997 B1 | 11/2002 | Bruzzone et al. |
| 6,504,518 B1 | 1/2003 | Kuwayama et al. |
| 6,504,629 B1 | 1/2003 | Popovich et al. |
| 6,509,937 B1 | 1/2003 | Moskovich et al. |
| 6,510,263 B1 | 1/2003 | Maisenhoelder et al. |
| 6,518,747 B2 | 2/2003 | Sager et al. |
| 6,519,088 B1 | 2/2003 | Lipton |
| 6,522,794 B1 | 2/2003 | Bischel et al. |
| 6,522,795 B1 | 2/2003 | Jordan et al. |
| 6,524,771 B2 | 2/2003 | Maeda et al. |
| 6,529,336 B1 | 3/2003 | Kreitzer et al. |
| 6,534,977 B1 | 3/2003 | Duncan et al. |
| 6,545,778 B2 | 4/2003 | Ono et al. |
| 6,550,949 B1 | 4/2003 | Bauer et al. |
| 6,552,789 B1 | 4/2003 | Modro |
| 6,557,413 B2 | 5/2003 | Nieminen et al. |
| 6,559,813 B1 | 5/2003 | DeLuca et al. |
| 6,560,019 B2 | 5/2003 | Nakai |
| 6,563,648 B2 | 5/2003 | Gleckman et al. |
| 6,563,650 B2 | 5/2003 | Moskovich et al. |
| 6,567,014 B1 | 5/2003 | Hansen et al. |
| 6,567,573 B1 | 5/2003 | Domash et al. |
| 6,577,411 B1 | 6/2003 | David et al. |
| 6,577,429 B1 | 6/2003 | Kurtz et al. |
| 6,580,529 B1 | 6/2003 | Amitai et al. |
| 6,583,838 B1 | 6/2003 | Hoke et al. |
| 6,583,873 B1 | 6/2003 | Goncharov et al. |
| 6,587,619 B1 | 7/2003 | Kinoshita |
| 6,594,090 B2 | 7/2003 | Kruschwitz et al. |
| 6,596,193 B2 | 7/2003 | Coates et al. |
| 6,597,176 B2 | 7/2003 | Simmonds et al. |
| 6,597,475 B1 | 7/2003 | Shirakura et al. |
| 6,598,987 B1 | 7/2003 | Parikka |
| 6,600,590 B2 | 7/2003 | Roddy et al. |
| 6,608,720 B1 | 8/2003 | Freeman |
| 6,611,253 B1 | 8/2003 | Cohen |
| 6,618,104 B1 | 9/2003 | Date et al. |
| 6,624,943 B2 | 9/2003 | Nakai et al. |
| 6,625,381 B2 | 9/2003 | Roddy et al. |
| 6,646,772 B1 | 11/2003 | Popovich et al. |
| 6,646,810 B2 | 11/2003 | Harter, Jr. et al. |
| 6,661,495 B1 | 12/2003 | Popovich |
| 6,661,578 B2 | 12/2003 | Hedrick |
| 6,667,134 B1 | 12/2003 | Sutherland et al. |
| 6,674,578 B2 | 1/2004 | Sugiyama et al. |
| 6,677,086 B1 | 1/2004 | Sutehrland et al. |
| 6,686,815 B1 | 2/2004 | Mirshekarl-Syahkal et al. |

(56) References Cited

U.S. PATENT DOCUMENTS

| | | | |
|---|---|---|---|
| 6,690,516 B2 | 2/2004 | Aritake et al. |
| 6,692,666 B2 | 2/2004 | Sutherland et al. |
| 6,699,407 B1 | 3/2004 | Sutehrland et al. |
| 6,706,086 B2 | 3/2004 | Emig et al. |
| 6,706,451 B1 | 3/2004 | Sutherland et al. |
| 6,710,900 B1 * | 3/2004 | Klug | G03H 1/02 430/1 |
| 6,721,096 B2 | 4/2004 | Bruzzone et al. |
| 6,730,442 B1 | 5/2004 | Sutherland et al. |
| 6,731,434 B1 | 5/2004 | Hua et al. |
| 6,738,105 B1 | 5/2004 | Hannah et al. |
| 6,741,189 B1 | 5/2004 | Gibbons, II et al. |
| 6,744,478 B1 | 6/2004 | Asakura et al. |
| 6,747,781 B2 | 6/2004 | Trisnadi et al. |
| 6,748,342 B1 | 6/2004 | Dickhaus |
| 6,750,941 B2 | 6/2004 | Satoh et al. |
| 6,750,995 B2 | 6/2004 | Dickson |
| 6,750,996 B2 | 6/2004 | Jagt et al. |
| 6,757,105 B2 | 6/2004 | Niv et al. |
| 6,771,403 B1 | 8/2004 | Endo et al. |
| 6,776,339 B2 | 8/2004 | Piikivi |
| 6,781,701 B1 | 8/2004 | Sweetser et al. |
| 6,791,629 B2 | 9/2004 | Moskovich et al. |
| 6,791,739 B2 | 9/2004 | Ramanujan et al. |
| 6,804,066 B1 | 10/2004 | Ha et al. |
| 6,805,490 B2 | 10/2004 | Levola |
| 6,821,457 B1 | 11/2004 | Natarajan et al. |
| 6,822,713 B1 | 11/2004 | Yaroshchuk et al. |
| 6,825,987 B2 | 11/2004 | Repetto et al. |
| 6,829,095 B2 | 12/2004 | Amitai |
| 6,830,789 B2 | 12/2004 | Doane et al. |
| 6,833,955 B2 | 12/2004 | Niv |
| 6,836,369 B2 | 12/2004 | Fujikawa et al. |
| 6,842,563 B2 | 1/2005 | Zhang et al. |
| 6,844,212 B2 | 1/2005 | Bond et al. |
| 6,844,980 B2 | 1/2005 | He et al. |
| 6,844,989 B1 | 1/2005 | Jo et al. |
| 6,847,274 B2 | 1/2005 | Salmela et al. |
| 6,847,488 B2 | 1/2005 | Travis |
| 6,850,210 B1 | 2/2005 | Lipton et al. |
| 6,853,491 B1 | 2/2005 | Ruhle et al. |
| 6,853,493 B2 | 2/2005 | Kreitzer et al. |
| 6,861,107 B2 | 3/2005 | Klasen-memmer et al. |
| 6,864,861 B2 | 3/2005 | Schehrer et al. |
| 6,864,927 B1 | 3/2005 | Cathey |
| 6,864,931 B1 | 3/2005 | Kumar et al. |
| 6,867,888 B2 | 3/2005 | Sutherland et al. |
| 6,873,443 B1 | 3/2005 | Joubert et al. |
| 6,876,791 B2 | 4/2005 | Murashima et al. |
| 6,878,494 B2 | 4/2005 | Sutehrland et al. |
| 6,885,483 B2 | 4/2005 | Takada |
| 6,903,872 B2 | 6/2005 | Schrader |
| 6,909,345 B1 | 6/2005 | Salmela et al. |
| 6,917,375 B2 | 7/2005 | Akada et al. |
| 6,919,003 B2 | 7/2005 | Ikeda et al. |
| 6,922,267 B2 | 7/2005 | Endo et al. |
| 6,926,429 B2 | 8/2005 | Barlow et al. |
| 6,927,570 B2 | 8/2005 | Simmonds et al. |
| 6,927,694 B1 | 8/2005 | Smith et al. |
| 6,940,361 B1 | 9/2005 | Jokio et al. |
| 6,943,788 B2 | 9/2005 | Tomono |
| 6,950,173 B1 | 9/2005 | Sutherland et al. |
| 6,950,227 B2 | 9/2005 | Schrader |
| 6,951,393 B2 | 10/2005 | Koide |
| 6,952,312 B2 | 10/2005 | Weber et al. |
| 6,952,435 B2 | 10/2005 | Lai et al. |
| 6,958,662 B1 | 10/2005 | Salmela et al. |
| 6,958,868 B1 | 10/2005 | Pender |
| 6,963,454 B1 | 11/2005 | Martins et al. |
| 6,972,788 B1 | 12/2005 | Robertson et al. |
| 6,975,345 B2 | 12/2005 | Lipton et al. |
| 6,980,365 B2 | 12/2005 | Moskovich |
| 6,985,296 B2 | 1/2006 | Lipton et al. |
| 6,987,908 B2 | 1/2006 | Bond et al. |
| 6,999,239 B1 | 2/2006 | Martins et al. |
| 7,002,618 B2 | 2/2006 | Lipton et al. |
| 7,002,753 B2 | 2/2006 | Moskovich et al. |
| 7,003,075 B2 | 2/2006 | Miyake et al. |
| 7,003,187 B2 | 2/2006 | Frick et al. |
| 7,006,732 B2 | 2/2006 | Gunn, III et al. |
| 7,009,773 B2 | 3/2006 | Chaoulov et al. |
| 7,018,563 B1 | 3/2006 | Sutherland et al. |
| 7,018,686 B2 | 3/2006 | Sutehrland et al. |
| 7,018,744 B2 | 3/2006 | Otaki et al. |
| 7,019,793 B2 | 3/2006 | Moskovich et al. |
| 7,021,777 B2 | 4/2006 | Amitai |
| 7,026,892 B2 | 4/2006 | Kajiya |
| 7,027,671 B2 | 4/2006 | Huck et al. |
| 7,034,748 B2 | 4/2006 | Kajiya |
| 7,046,439 B2 | 5/2006 | Kaminsky et al. |
| 7,050,674 B2 | 5/2006 | Lee et al. |
| 7,053,735 B2 | 5/2006 | Salmela et al. |
| 7,053,991 B2 | 5/2006 | Sandusky |
| 7,054,045 B2 | 5/2006 | McPheters et al. |
| 7,058,434 B2 | 6/2006 | Wang et al. |
| 7,068,405 B2 | 6/2006 | Sutherland et al. |
| 7,068,898 B2 | 6/2006 | Buretea et al. |
| 7,072,020 B1 | 7/2006 | Sutherland et al. |
| 7,075,273 B2 | 7/2006 | O'Gorman et al. |
| 7,077,984 B1 * | 7/2006 | Natarajan | G03H 1/0005 359/254 |
| 7,081,215 B2 | 7/2006 | Natarajan et al. |
| 7,088,457 B1 | 8/2006 | Zou et al. |
| 7,088,515 B2 | 8/2006 | Lipton |
| 7,095,562 B1 | 8/2006 | Peng et al. |
| 7,099,080 B2 | 8/2006 | Lipton et al. |
| 7,101,048 B2 | 9/2006 | Travis |
| 7,108,383 B1 | 9/2006 | Mitchell et al. |
| 7,110,184 B1 | 9/2006 | Yona et al. |
| 7,119,965 B1 | 10/2006 | Rolland et al. |
| 7,123,418 B2 | 10/2006 | Weber et al. |
| 7,123,421 B1 | 10/2006 | Moskovich et al. |
| 7,126,418 B2 | 10/2006 | Hunton et al. |
| 7,126,583 B1 | 10/2006 | Breed |
| 7,132,200 B1 | 11/2006 | Ueda et al. |
| 7,133,084 B2 | 11/2006 | Moskovich et al. |
| 7,139,109 B2 | 11/2006 | Mukawa |
| RE39,424 E | 12/2006 | Moskovich |
| 7,145,729 B2 | 12/2006 | Kreitzer et al. |
| 7,149,385 B2 | 12/2006 | Parikka et al. |
| 7,151,246 B2 | 12/2006 | Fein et al. |
| 7,158,095 B2 | 1/2007 | Jenson et al. |
| 7,167,286 B2 | 1/2007 | Anderson et al. |
| 7,167,616 B2 | 1/2007 | Ling et al. |
| 7,175,780 B1 | 2/2007 | Sutherland et al. |
| 7,181,105 B2 | 2/2007 | Teramura et al. |
| 7,181,108 B2 | 2/2007 | Levola |
| 7,184,002 B2 | 2/2007 | Lipton et al. |
| 7,184,615 B2 | 2/2007 | Levola |
| 7,186,567 B1 | 3/2007 | Sutherland et al. |
| 7,190,849 B2 | 3/2007 | Katase |
| 7,198,737 B2 | 4/2007 | Natarajan et al. |
| 7,199,934 B2 | 4/2007 | Yamasaki |
| 7,205,960 B2 | 4/2007 | David |
| 7,205,964 B1 | 4/2007 | Yokoyama et al. |
| 7,206,107 B2 | 4/2007 | Levola |
| 7,212,175 B1 | 5/2007 | Magee et al. |
| 7,218,817 B2 | 5/2007 | Magnusson et al. |
| 7,230,767 B2 | 6/2007 | Walck et al. |
| 7,230,770 B2 | 6/2007 | Kreitzer et al. |
| 7,242,527 B2 | 7/2007 | Spitzer et al. |
| 7,248,128 B2 | 7/2007 | Mattila et al. |
| 7,248,765 B2 | 7/2007 | Lee et al. |
| 7,256,915 B2 | 8/2007 | Sutherland et al. |
| 7,259,906 B1 | 8/2007 | Islam |
| 7,265,882 B2 | 9/2007 | Sutherland et al. |
| 7,265,903 B2 | 9/2007 | Sutherland et al. |
| 7,268,946 B2 | 9/2007 | Wang |
| 7,285,903 B2 | 10/2007 | Cull et al. |
| 7,286,272 B2 | 10/2007 | Mukawa |
| 7,289,069 B2 | 10/2007 | Ranta |
| RE39,911 E | 11/2007 | Moskovich |
| 7,299,983 B2 | 11/2007 | Piikivi |
| 7,301,601 B2 | 11/2007 | Lin et al. |

(56) References Cited

U.S. PATENT DOCUMENTS

| | | |
|---|---|---|
| 7,312,906 B2 | 12/2007 | Sutherland et al. |
| 7,313,291 B2 | 12/2007 | Okhotnikov et al. |
| D559,250 S | 1/2008 | Pombo |
| 7,319,573 B2 | 1/2008 | Nishiyama |
| 7,320,534 B2 | 1/2008 | Sugikawa et al. |
| 7,323,275 B2 | 1/2008 | Otaki et al. |
| 7,333,685 B2 | 2/2008 | Stone et al. |
| 7,336,271 B2 | 2/2008 | Ozeki et al. |
| 7,339,737 B2 | 3/2008 | Urey et al. |
| 7,339,742 B2 | 3/2008 | Amitai et al. |
| 7,349,612 B2 | 3/2008 | Nishii et al. |
| 7,356,218 B2 | 4/2008 | Kato et al. |
| 7,356,224 B2 | 4/2008 | Levner et al. |
| 7,369,911 B1 | 5/2008 | Volant et al. |
| 7,375,870 B2 | 5/2008 | Schorpp |
| 7,375,886 B2 | 5/2008 | Lipton et al. |
| 7,376,068 B1 | 5/2008 | Khoury |
| 7,376,307 B2 | 5/2008 | Singh et al. |
| 7,389,023 B2 | 6/2008 | Yeo et al. |
| 7,391,573 B2 | 6/2008 | Amitai |
| 7,394,865 B2 | 7/2008 | Borran et al. |
| 7,394,961 B2 | 7/2008 | Kornilovich et al. |
| 7,395,181 B2 | 7/2008 | Foxlin |
| 7,397,606 B1 | 7/2008 | Peng et al. |
| 7,401,920 B1 | 7/2008 | Kranz et al. |
| 7,404,644 B2 | 7/2008 | Evans et al. |
| 7,410,286 B2 | 8/2008 | Travis |
| 7,411,637 B2 | 8/2008 | Weiss |
| 7,413,678 B1 | 8/2008 | Natarajan et al. |
| 7,413,679 B1 | 8/2008 | Sutherland et al. |
| 7,415,173 B2 | 8/2008 | Kassamakov et al. |
| 7,416,818 B2 | 8/2008 | Sutherland et al. |
| 7,418,170 B2 | 8/2008 | Mukawa et al. |
| 7,420,733 B1 | 9/2008 | Natarajan et al. |
| 7,433,116 B1 | 10/2008 | Islam |
| 7,436,568 B1 | 10/2008 | Kuykendall, Jr. |
| D581,447 S | 11/2008 | Yee |
| 7,447,967 B2 | 11/2008 | Onggosanusi et al. |
| 7,453,612 B2 | 11/2008 | Mukawa |
| 7,454,103 B2 | 11/2008 | Parriaux |
| 7,457,040 B2 | 11/2008 | Amitai |
| 7,466,994 B2 | 12/2008 | Pihlaja et al. |
| 7,477,206 B2 | 1/2009 | Cowan et al. |
| 7,479,354 B2 | 1/2009 | Ueda et al. |
| 7,480,215 B2 | 1/2009 | Makela et al. |
| 7,482,996 B2 | 1/2009 | Larson et al. |
| 7,483,604 B2 | 1/2009 | Levola |
| 7,492,512 B2 | 2/2009 | Niv et al. |
| 7,496,293 B2 | 2/2009 | Shamir et al. |
| 7,499,217 B2 | 3/2009 | Cakmakci et al. |
| 7,500,104 B2 | 3/2009 | Goland |
| 7,511,891 B2 | 3/2009 | Messerschmidt |
| 7,513,668 B1 | 4/2009 | Peng et al. |
| 7,522,344 B1 | 4/2009 | Curatu et al. |
| 7,525,448 B1 | 4/2009 | Wilson et al. |
| 7,528,385 B2 | 5/2009 | Volodin et al. |
| 7,542,210 B2 | 6/2009 | Chirieleison |
| 7,545,429 B2 | 6/2009 | Travis |
| 7,550,234 B2 | 6/2009 | Otaki et al. |
| 7,558,446 B2 | 7/2009 | Wimberger-friedl et al. |
| 7,567,372 B2 | 7/2009 | Schorpp |
| 7,570,322 B1 | 8/2009 | Sutherland et al. |
| 7,570,405 B1 | 8/2009 | Sutherland et al. |
| 7,570,429 B2 | 8/2009 | Maliah et al. |
| 7,572,555 B2 | 8/2009 | Takizawa et al. |
| 7,573,640 B2 | 8/2009 | Nivon et al. |
| 7,576,916 B2 | 8/2009 | Amitai |
| 7,577,326 B2 | 8/2009 | Amitai |
| 7,579,119 B2 | 8/2009 | Ueda et al. |
| 7,583,423 B2 | 9/2009 | Sutherland et al. |
| 7,587,110 B2 | 9/2009 | Singh et al. |
| 7,588,863 B2 | 9/2009 | Takizawa et al. |
| 7,589,900 B1 | 9/2009 | Powell |
| 7,589,901 B2 | 9/2009 | DeJong et al. |
| 7,592,988 B2 | 9/2009 | Katase |
| 7,593,575 B2 | 9/2009 | Houle et al. |
| 7,597,447 B2 | 10/2009 | Larson et al. |
| 7,599,012 B2 | 10/2009 | Nakamura et al. |
| 7,600,893 B2 | 10/2009 | Laino et al. |
| 7,602,552 B1 | 10/2009 | Blumenfeld |
| 7,605,719 B1 | 10/2009 | Wenger et al. |
| 7,605,774 B1 | 10/2009 | Brandt et al. |
| 7,605,882 B1 | 10/2009 | Sutherland et al. |
| 7,616,270 B2 | 11/2009 | Hirabayashi et al. |
| 7,617,022 B1 | 11/2009 | Wood et al. |
| 7,618,750 B2 | 11/2009 | Ueda et al. |
| 7,619,739 B1 | 11/2009 | Sutherland et al. |
| 7,619,825 B1 | 11/2009 | Peng et al. |
| 7,629,086 B2 | 12/2009 | Otaki et al. |
| 7,639,208 B1 | 12/2009 | Ha et al. |
| 7,639,911 B2 | 12/2009 | Lee et al. |
| 7,643,214 B2 | 1/2010 | Amitai |
| 7,643,225 B1 | 1/2010 | Tsai |
| 7,656,585 B1 | 2/2010 | Powell et al. |
| 7,660,047 B1 | 2/2010 | Travis et al. |
| 7,672,055 B2 | 3/2010 | Amitai |
| 7,672,549 B2 | 3/2010 | Ghosh et al. |
| 7,675,684 B1 | 3/2010 | Weissman et al. |
| 7,691,248 B2 | 4/2010 | Ikeda et al. |
| 7,710,622 B2 | 5/2010 | Takabayashi et al. |
| 7,710,654 B2 | 5/2010 | Ashkenazi et al. |
| 7,711,228 B2 | 5/2010 | Noda et al. |
| 7,724,441 B2 | 5/2010 | Amitai |
| 7,724,442 B2 | 5/2010 | Amitai |
| 7,724,443 B2 | 5/2010 | Amitai |
| 7,733,571 B1 | 6/2010 | Li |
| 7,733,572 B1 | 6/2010 | Brown et al. |
| 7,740,387 B2 | 6/2010 | Schultz et al. |
| 7,747,113 B2 | 6/2010 | Mukawa et al. |
| 7,751,122 B2 | 7/2010 | Amitai |
| 7,751,662 B2 | 7/2010 | Kleemann et al. |
| 7,764,413 B2 | 7/2010 | Levola |
| 7,777,819 B2 | 8/2010 | Simmonds |
| 7,778,305 B2 | 8/2010 | Parriaux et al. |
| 7,778,508 B2 | 8/2010 | Hirayama |
| 7,843,642 B2 | 11/2010 | Shaoulov et al. |
| 7,847,235 B2 | 12/2010 | Krupkin et al. |
| 7,864,427 B2 | 1/2011 | Korenaga et al. |
| 7,865,080 B2 | 1/2011 | Hecker et al. |
| 7,866,869 B2 | 1/2011 | Karakawa |
| 7,872,707 B1 | 1/2011 | Sutherland et al. |
| 7,872,804 B2 | 1/2011 | Moon et al. |
| 7,884,593 B2 | 2/2011 | Simmonds et al. |
| 7,884,985 B2 | 2/2011 | Amitai et al. |
| 7,887,186 B2 | 2/2011 | Watanabe |
| 7,903,921 B2 | 3/2011 | Ostergard |
| 7,907,342 B2 | 3/2011 | Simmonds et al. |
| 7,920,787 B2 | 4/2011 | Gentner et al. |
| 7,928,862 B1 | 4/2011 | Matthews |
| 7,936,513 B2 | 5/2011 | Wu et al. |
| 7,936,519 B2 | 5/2011 | Mukawa et al. |
| 7,944,428 B2 | 5/2011 | Travis |
| 7,944,616 B2 | 5/2011 | Mukawa |
| 7,949,214 B2 | 5/2011 | DeJong et al. |
| D640,310 S | 6/2011 | Suzuki et al. |
| 7,961,117 B1 | 6/2011 | Zimmerman et al. |
| 7,969,644 B2 | 6/2011 | Tilleman et al. |
| 7,969,657 B2 | 6/2011 | Cakmakci et al. |
| 7,970,246 B2 | 6/2011 | Travis et al. |
| 7,976,208 B2 | 7/2011 | Travis |
| 7,984,884 B1 | 7/2011 | Iliev et al. |
| 7,999,982 B2 | 8/2011 | Endo et al. |
| 8,000,020 B2 | 8/2011 | Amitai et al. |
| 8,000,491 B2 | 8/2011 | Brodkin et al. |
| 8,004,765 B2 | 8/2011 | Amitai |
| 8,014,050 B2 | 9/2011 | McGrew |
| 8,016,475 B2 | 9/2011 | Travis |
| 8,018,579 B1 | 9/2011 | Krah |
| 8,022,942 B2 | 9/2011 | Bathiche et al. |
| 8,023,783 B2 | 9/2011 | Mukawa et al. |
| RE42,992 E | 12/2011 | David |
| 8,073,296 B2 | 12/2011 | Mukawa et al. |
| 8,077,274 B2 | 12/2011 | Sutherland et al. |
| 8,079,713 B2 | 12/2011 | Ashkenazi |

(56) References Cited

U.S. PATENT DOCUMENTS

| | | |
|---|---|---|
| 8,082,222 B2 | 12/2011 | Rangarajan et al. |
| 8,086,030 B2 | 12/2011 | Gordon et al. |
| 8,089,568 B1 | 1/2012 | Brown et al. |
| 8,093,451 B2 | 1/2012 | Spangenberg et al. |
| 8,098,439 B2 | 1/2012 | Amitai et al. |
| 8,105,662 B2 | 1/2012 | Cherkaoui et al. |
| 8,107,023 B2 | 1/2012 | Simmonds et al. |
| 8,107,780 B2 | 1/2012 | Simmonds |
| 8,120,548 B1 | 2/2012 | Barber |
| 8,120,848 B2 | 2/2012 | Isano |
| 8,132,948 B2 | 3/2012 | Owen et al. |
| 8,132,976 B2 | 3/2012 | Odell et al. |
| 8,134,434 B2 | 3/2012 | Diederichs et al. |
| 8,136,690 B2 | 3/2012 | Fang et al. |
| 8,137,981 B2 | 3/2012 | Andrew et al. |
| 8,142,016 B2 | 3/2012 | Legerton et al. |
| 8,149,086 B2 | 4/2012 | Klein et al. |
| 8,152,315 B2 | 4/2012 | Travis et al. |
| 8,152,353 B2 | 4/2012 | Yang et al. |
| 8,155,489 B2 | 4/2012 | Saarikko et al. |
| 8,159,752 B2 | 4/2012 | Wertheim et al. |
| 8,160,409 B2 | 4/2012 | Large |
| 8,160,411 B2 | 4/2012 | Levola et al. |
| D659,137 S | 5/2012 | Matsumoto |
| 8,167,173 B1 | 5/2012 | Simmonds et al. |
| 8,186,874 B2 | 5/2012 | Sinbar et al. |
| 8,188,925 B2 | 5/2012 | DeJean |
| 8,189,263 B1 | 5/2012 | Wang et al. |
| 8,189,973 B2 | 5/2012 | Travis et al. |
| D661,334 S | 6/2012 | Cho et al. |
| D661,335 S | 6/2012 | Jeon |
| 8,194,325 B2 | 6/2012 | Levola et al. |
| 8,199,803 B2 | 6/2012 | Hauske et al. |
| 8,202,405 B2 | 6/2012 | Meneghini et al. |
| 8,213,065 B2 | 7/2012 | Mukawa |
| 8,213,755 B2 | 7/2012 | Mukawa et al. |
| 8,220,966 B2 | 7/2012 | Mukawa |
| 8,224,133 B2 | 7/2012 | Popovich et al. |
| 8,233,204 B1 | 7/2012 | Robbins et al. |
| 8,253,914 B2 | 8/2012 | Kajiya et al. |
| 8,254,031 B2 | 8/2012 | Levola |
| 8,264,498 B1 | 9/2012 | Vanderkamp et al. |
| 8,294,749 B2 | 10/2012 | Cable |
| 8,295,710 B2 | 10/2012 | Marcus |
| 8,301,031 B2 | 10/2012 | Gentner et al. |
| 8,305,577 B2 | 11/2012 | Kivioja et al. |
| 8,306,423 B2 | 11/2012 | Gottwald et al. |
| 8,310,327 B2 | 11/2012 | Willers et al. |
| 8,314,819 B2 | 11/2012 | Kimmel et al. |
| 8,314,993 B2 | 11/2012 | Levola et al. |
| 8,320,032 B2 | 11/2012 | Levola |
| 8,321,810 B2 | 11/2012 | Heintze |
| 8,325,166 B2 | 12/2012 | Akutsu et al. |
| 8,329,773 B2 | 12/2012 | Fäcke et al. |
| 8,335,040 B2 | 12/2012 | Mukawa et al. |
| 8,335,414 B2 | 12/2012 | Zinoviev et al. |
| D673,996 S | 1/2013 | Kim et al. |
| 8,351,744 B2 | 1/2013 | Travis et al. |
| 8,354,640 B2 | 1/2013 | Hamre et al. |
| 8,354,806 B2 | 1/2013 | Travis et al. |
| 8,355,610 B2 | 1/2013 | Simmonds |
| 8,369,019 B2 | 2/2013 | Baker et al. |
| 8,376,548 B2 | 2/2013 | Schultz |
| 8,382,293 B2 | 2/2013 | Phillips, III et al. |
| 8,384,504 B2 | 2/2013 | Diederichs et al. |
| 8,384,694 B2 | 2/2013 | Powell et al. |
| 8,384,730 B1 | 2/2013 | Vanderkamp et al. |
| 8,396,339 B2 | 3/2013 | Mukawa et al. |
| 8,396,341 B2 | 3/2013 | Lee et al. |
| 8,398,242 B2 | 3/2013 | Yamamoto et al. |
| 8,403,490 B2 | 3/2013 | Sugiyama et al. |
| 8,422,840 B2 | 4/2013 | Large |
| 8,427,439 B2 | 4/2013 | Larsen et al. |
| 8,432,363 B2 | 4/2013 | Saarikko et al. |
| 8,432,372 B2 | 4/2013 | Butler et al. |
| 8,432,614 B2 | 4/2013 | Amitai |
| 8,441,731 B2 | 5/2013 | Sprague |
| 8,447,365 B1 | 5/2013 | Imanuel |
| 8,466,953 B2 | 6/2013 | Levola |
| 8,472,119 B1 | 6/2013 | Kelly |
| 8,472,120 B2 | 6/2013 | Border et al. |
| 8,477,261 B2 | 7/2013 | Travis et al. |
| 8,481,130 B2 | 7/2013 | Harding et al. |
| 8,482,858 B2 | 7/2013 | Sprague |
| 8,488,246 B2 | 7/2013 | Border et al. |
| 8,491,121 B2 | 7/2013 | Tilleman et al. |
| 8,491,136 B2 | 7/2013 | Travis et al. |
| 8,493,366 B2 | 7/2013 | Bathiche et al. |
| 8,493,662 B2 | 7/2013 | Noui |
| 8,494,229 B2 | 7/2013 | Jarvenpaa et al. |
| 8,508,848 B2 | 8/2013 | Saarikko |
| 8,520,309 B2 | 8/2013 | Sprague |
| D691,192 S | 10/2013 | Stanley et al. |
| 8,547,638 B2 | 10/2013 | Levola |
| 8,548,290 B2 | 10/2013 | Travers et al. |
| 8,565,560 B2 | 10/2013 | Popovich et al. |
| D694,310 S | 11/2013 | Cho et al. |
| D694,311 S | 11/2013 | Cho et al. |
| 8,578,038 B2 | 11/2013 | Kaikuranta et al. |
| 8,581,831 B2 | 11/2013 | Travis |
| 8,582,206 B2 | 11/2013 | Travis |
| 8,593,734 B2 | 11/2013 | Laakkonen |
| 8,611,014 B2 | 12/2013 | Valera et al. |
| 8,619,062 B2 | 12/2013 | Powell et al. |
| D697,130 S | 1/2014 | Lövgren |
| 8,633,786 B2 | 1/2014 | Ermolov et al. |
| 8,634,120 B2 | 1/2014 | Popovich et al. |
| 8,634,139 B1 | 1/2014 | Brown et al. |
| 8,639,072 B2 | 1/2014 | Popovich et al. |
| 8,643,691 B2 | 2/2014 | Rosenfeld et al. |
| 8,643,948 B2 | 2/2014 | Amitai et al. |
| 8,649,099 B2 | 2/2014 | Schultz et al. |
| 8,654,420 B2 | 2/2014 | Simmonds |
| 8,659,826 B1 | 2/2014 | Brown et al. |
| D701,206 S | 3/2014 | Luckey et al. |
| 8,670,029 B2 | 3/2014 | McEldowney |
| 8,693,087 B2 | 4/2014 | Nowatzyk et al. |
| 8,698,705 B2 | 4/2014 | Burke |
| 8,731,350 B1 | 5/2014 | Lin et al. |
| 8,736,802 B2 | 5/2014 | Kajiya et al. |
| 8,736,963 B2 | 5/2014 | Robbins et al. |
| 8,742,952 B1 | 6/2014 | Bold |
| 8,746,008 B1 | 6/2014 | Mauritsen et al. |
| 8,749,886 B2 | 6/2014 | Gupta |
| 8,749,890 B1 | 6/2014 | Wood et al. |
| 8,767,294 B2 | 7/2014 | Chen et al. |
| 8,786,923 B2 | 7/2014 | Chuang et al. |
| 8,810,600 B2 | 8/2014 | Bohn et al. |
| 8,810,913 B2 | 8/2014 | Simmonds et al. |
| 8,810,914 B2 | 8/2014 | Amitai |
| 8,814,691 B2 | 8/2014 | Haddick et al. |
| 8,816,578 B1 | 8/2014 | Peng et al. |
| 8,817,350 B1 | 8/2014 | Robbins et al. |
| 8,824,836 B2 | 9/2014 | Sugiyama |
| 8,830,143 B1 | 9/2014 | Pitchford et al. |
| 8,830,584 B2 | 9/2014 | Saarikko et al. |
| 8,830,588 B1 | 9/2014 | Brown et al. |
| 8,842,368 B2 | 9/2014 | Simmonds et al. |
| 8,859,412 B2 | 10/2014 | Jain |
| 8,872,435 B2 | 10/2014 | Kreitzer et al. |
| 8,873,149 B2 | 10/2014 | Bohn et al. |
| 8,873,150 B2 | 10/2014 | Amitai |
| D718,304 S | 11/2014 | Heinrich |
| D718,366 S | 11/2014 | Mehin et al. |
| 8,885,112 B2 | 11/2014 | Popovich et al. |
| 8,885,997 B2 | 11/2014 | Nguyen et al. |
| 8,903,207 B1 | 12/2014 | Brown et al. |
| 8,906,088 B2 | 12/2014 | Pugh et al. |
| 8,913,324 B2 | 12/2014 | Schrader |
| 8,913,865 B1 | 12/2014 | Bennett |
| 8,917,453 B2 | 12/2014 | Bohn |
| 8,929,589 B2 | 1/2015 | Publicover et al. |
| 8,933,144 B2 | 1/2015 | Enomoto et al. |
| 8,934,743 B2 | 1/2015 | Nishiwaki et al. |

(56) References Cited

U.S. PATENT DOCUMENTS

| | | |
|---|---|---|
| 8,937,771 B2 | 1/2015 | Robbins et al. |
| 8,937,772 B1 | 1/2015 | Burns et al. |
| 8,938,141 B2 | 1/2015 | Magnusson |
| 8,950,867 B2 | 2/2015 | Macnamara |
| 8,964,298 B2 | 2/2015 | Haddick et al. |
| 8,965,152 B2 | 2/2015 | Simmonds |
| D725,102 S | 3/2015 | Lee et al. |
| 8,985,803 B2 | 3/2015 | Bohn |
| 8,989,535 B2 | 3/2015 | Robbins |
| D726,180 S | 4/2015 | Roat et al. |
| 9,019,595 B2 | 4/2015 | Jain |
| 9,025,253 B2 | 5/2015 | Hadad et al. |
| 9,035,344 B2 | 5/2015 | Jain |
| D733,709 S | 7/2015 | Kawai |
| 9,075,184 B2 | 7/2015 | Popovich et al. |
| 9,081,178 B2 | 7/2015 | Simmonds et al. |
| 9,097,890 B2 | 8/2015 | Miller et al. |
| 9,103,978 B2 | 8/2015 | Nishiwaki et al. |
| 9,122,015 B2 | 9/2015 | Shimizu |
| 9,128,226 B2 | 9/2015 | Fattal et al. |
| 9,129,295 B2 | 9/2015 | Border et al. |
| 9,164,290 B2 | 10/2015 | Robbins et al. |
| 9,176,324 B1 | 11/2015 | Scherer et al. |
| 9,188,717 B2 | 11/2015 | Nishiwaki |
| 9,201,270 B2 | 12/2015 | Fattal et al. |
| 9,215,293 B2 | 12/2015 | Miller |
| D746,896 S | 1/2016 | Markovitz et al. |
| 9,239,507 B2 | 1/2016 | Chen et al. |
| 9,244,275 B1 | 1/2016 | Li |
| 9,244,280 B1 | 1/2016 | Tiana et al. |
| 9,244,281 B1 | 1/2016 | Zimmerman et al. |
| D749,074 S | 2/2016 | Cazalet et al. |
| 9,253,359 B2 | 2/2016 | Takahashi |
| 9,269,854 B2 | 2/2016 | Jain |
| D751,551 S | 3/2016 | Ho et al. |
| D752,129 S | 3/2016 | Lee et al. |
| 9,274,338 B2 | 3/2016 | Robbins et al. |
| 9,274,339 B1 | 3/2016 | Brown et al. |
| 9,274,349 B2 | 3/2016 | Popovich et al. |
| D754,782 S | 4/2016 | Kokinakis et al. |
| 9,310,566 B2 | 4/2016 | Valera et al. |
| 9,316,786 B2 | 4/2016 | Nishiwaki et al. |
| 9,329,325 B2 | 5/2016 | Simmonds et al. |
| 9,335,548 B1 | 5/2016 | Cakmakci et al. |
| 9,335,604 B2 | 5/2016 | Popovich et al. |
| 9,341,846 B2 | 5/2016 | Popovich et al. |
| 9,354,366 B2 | 5/2016 | Jain |
| 9,366,862 B2 | 6/2016 | Haddick et al. |
| 9,366,864 B1 | 6/2016 | Brown et al. |
| 9,372,347 B1 | 6/2016 | Levola et al. |
| 9,377,623 B2 | 6/2016 | Robbins et al. |
| 9,377,852 B1 | 6/2016 | Shapiro et al. |
| 9,389,415 B2 | 7/2016 | Fattal et al. |
| 9,400,395 B2 | 7/2016 | Travers et al. |
| 9,423,360 B1 | 8/2016 | Kostamo et al. |
| 9,429,692 B1 | 8/2016 | Saarikko et al. |
| 9,431,794 B2 | 8/2016 | Jain |
| 9,435,961 B2 | 9/2016 | Jiang |
| 9,456,744 B2 | 10/2016 | Popovich et al. |
| 9,459,451 B2 | 10/2016 | Saarikko et al. |
| 9,464,779 B2 | 10/2016 | Popovich et al. |
| 9,465,213 B2 | 10/2016 | Simmonds |
| 9,465,227 B2 | 10/2016 | Popovich et al. |
| 9,484,482 B2 | 11/2016 | Hsu et al. |
| 9,494,799 B2 | 11/2016 | Robbins et al. |
| 9,507,150 B1 | 11/2016 | Stratton et al. |
| 9,513,480 B2 | 12/2016 | Saarikko et al. |
| 9,516,193 B2 | 12/2016 | Aramaki |
| 9,519,089 B1 | 12/2016 | Brown et al. |
| 9,523,852 B1 | 12/2016 | Brown et al. |
| 9,535,253 B2 | 1/2017 | Levola et al. |
| 9,541,383 B2 | 1/2017 | Abovitz et al. |
| 9,541,763 B1 | 1/2017 | Heberlein et al. |
| 9,547,174 B2 | 1/2017 | Gao et al. |
| 9,551,468 B2 | 1/2017 | Jones |
| 9,551,874 B2 | 1/2017 | Amitai |
| 9,551,880 B2 | 1/2017 | Amitai |
| 9,599,813 B1 | 3/2017 | Stratton et al. |
| 9,612,403 B2 | 4/2017 | Abovitz et al. |
| 9,632,226 B2 | 4/2017 | Waldern et al. |
| 9,635,352 B1 | 4/2017 | Henry et al. |
| 9,648,313 B1 | 5/2017 | Henry et al. |
| 9,651,368 B2 | 5/2017 | Abovitz et al. |
| 9,664,824 B2 | 5/2017 | Simmonds et al. |
| 9,664,910 B2 | 5/2017 | Mansharof et al. |
| 9,671,612 B2 | 6/2017 | Kress et al. |
| 9,674,413 B1 | 6/2017 | Tiana et al. |
| 9,678,345 B1 | 6/2017 | Melzer et al. |
| 9,679,367 B1 | 6/2017 | Wald |
| 9,715,067 B1 | 7/2017 | Brown et al. |
| 9,715,110 B1 | 7/2017 | Brown et al. |
| D793,468 S | 8/2017 | Yu et al. |
| D795,865 S | 8/2017 | Porter et al. |
| D795,866 S | 8/2017 | Porter et al. |
| 9,726,540 B2 | 8/2017 | Popovich et al. |
| 9,727,772 B2 | 8/2017 | Popovich et al. |
| 9,733,475 B1 | 8/2017 | Brown et al. |
| 9,739,950 B2 | 8/2017 | Sqalli et al. |
| 9,746,688 B2 | 8/2017 | Popovich et al. |
| 9,754,507 B1 | 9/2017 | Wenger et al. |
| 9,762,895 B1 | 9/2017 | Henry et al. |
| 9,766,465 B1 | 9/2017 | Tiana et al. |
| 9,785,231 B1 | 10/2017 | Zimmerman |
| 9,791,694 B1 | 10/2017 | Haverkamp et al. |
| 9,791,696 B2 | 10/2017 | Woltman et al. |
| 9,804,316 B2 | 10/2017 | Drolet et al. |
| 9,804,389 B2 | 10/2017 | Popovich et al. |
| 9,823,423 B2 | 11/2017 | Waldern et al. |
| 9,857,605 B2 | 1/2018 | Popovich et al. |
| 9,874,931 B1 | 1/2018 | Koenck et al. |
| 9,899,800 B2 | 2/2018 | Ferrotti et al. |
| 9,915,825 B2 | 3/2018 | Robbins et al. |
| 9,933,684 B2 | 4/2018 | Brown et al. |
| 9,939,577 B2 | 4/2018 | Inoue et al. |
| 9,939,628 B2 | 4/2018 | Basset et al. |
| 9,977,247 B1 | 5/2018 | Brown et al. |
| D827,641 S | 9/2018 | Morisawa |
| 10,088,686 B2 | 10/2018 | Robbins et al. |
| 10,089,516 B2 | 10/2018 | Popovich et al. |
| 10,107,966 B1 | 10/2018 | Horibe et al. |
| 10,114,220 B2 | 10/2018 | Grey et al. |
| 10,156,681 B2 | 12/2018 | Waldern et al. |
| 10,162,181 B2 | 12/2018 | Webster et al. |
| 10,185,154 B2 | 1/2019 | Popovich et al. |
| D840,454 S | 2/2019 | Han et al. |
| 10,197,804 B2 | 2/2019 | Stenberg et al. |
| 10,209,517 B2 | 2/2019 | Popovich et al. |
| 10,216,061 B2 | 2/2019 | Popovich et al. |
| 10,234,696 B2 | 3/2019 | Popovich et al. |
| 10,241,330 B2 | 3/2019 | Popovich et al. |
| 10,241,332 B2 | 3/2019 | Vallius |
| 10,281,725 B2 | 5/2019 | Yokoyama |
| 10,330,777 B2 | 6/2019 | Popovich et al. |
| 10,345,519 B1 | 7/2019 | Miller et al. |
| 10,359,635 B2 | 7/2019 | Grey et al. |
| 10,359,736 B2 | 7/2019 | Popovich et al. |
| D855,687 S | 8/2019 | Villalpando |
| D859,510 S | 9/2019 | Harmon et al. |
| 10,409,144 B2 | 9/2019 | Popovich et al. |
| 10,423,222 B2 | 9/2019 | Popovich et al. |
| 10,423,813 B2 | 9/2019 | Popovich et al. |
| 10,437,051 B2 | 10/2019 | Popovich et al. |
| 10,437,064 B2 | 10/2019 | Popovich et al. |
| 10,444,510 B1 | 10/2019 | Lee et al. |
| 10,459,145 B2 | 10/2019 | Popovich et al. |
| 10,459,311 B2 | 10/2019 | Popovich et al. |
| D871,494 S | 12/2019 | Yamada et al. |
| D872,170 S | 1/2020 | Evans et al. |
| D872,794 S | 1/2020 | Wilkins |
| 10,527,797 B2 | 1/2020 | Waldern et al. |
| 10,532,594 B2 | 1/2020 | Akahane et al. |
| 10,545,346 B2 | 1/2020 | Waldern et al. |
| 10,569,449 B1 | 2/2020 | Curts et al. |
| 10,578,876 B1 | 3/2020 | Lam et al. |

(56) References Cited

U.S. PATENT DOCUMENTS

| | | |
|---|---|---|
| 10,598,938 B1 | 3/2020 | Huang et al. |
| D880,575 S | 4/2020 | Thixton |
| 10,613,268 B1 | 4/2020 | Colburn et al. |
| 10,642,058 B2 | 5/2020 | Popovich et al. |
| 10,649,119 B2 | 5/2020 | Mohanty et al. |
| 10,670,876 B2 | 6/2020 | Popovich et al. |
| 10,678,053 B2 | 6/2020 | Waldern et al. |
| 10,690,831 B2 | 6/2020 | Calafiore |
| 10,690,915 B2 | 6/2020 | Popovich et al. |
| 10,690,916 B2 | 6/2020 | Popovich et al. |
| 10,705,281 B2 | 7/2020 | Fattal et al. |
| 10,712,571 B2 | 7/2020 | Popovich et al. |
| 10,725,312 B2 | 7/2020 | Popovich et al. |
| 10,732,351 B2 | 8/2020 | Colburn et al. |
| 10,732,569 B2 | 8/2020 | Waldern et al. |
| 10,823,887 B1 | 11/2020 | Calafiore et al. |
| 10,859,768 B2 | 12/2020 | Popovich et al. |
| 10,890,707 B2 | 1/2021 | Waldern et al. |
| 10,942,430 B2 | 3/2021 | Waldern et al. |
| 10,983,257 B1 | 4/2021 | Colburn et al. |
| 10,983,340 B2 | 4/2021 | Popovich et al. |
| 11,009,699 B2 | 5/2021 | Popovich et al. |
| 11,103,892 B1 | 8/2021 | Liao et al. |
| 11,106,048 B2 | 8/2021 | Popovich et al. |
| 11,107,972 B2 | 8/2021 | Diest et al. |
| 11,137,603 B2 | 10/2021 | Zhang |
| 11,175,512 B2 | 11/2021 | Waldern et al. |
| 11,194,098 B2 | 12/2021 | Waldern et al. |
| 11,194,159 B2 | 12/2021 | Popovich et al. |
| 11,194,162 B2 | 12/2021 | Waldern et al. |
| 11,243,333 B1 | 2/2022 | Ouderkirk et al. |
| 11,281,013 B2 | 3/2022 | Popovich et al. |
| 11,306,193 B1 | 4/2022 | Lane et al. |
| 11,307,357 B2 | 4/2022 | Mohanty |
| 11,340,386 B1 | 5/2022 | Ouderkirk et al. |
| 11,391,950 B2 | 7/2022 | Calafiore |
| 11,442,222 B2 | 9/2022 | Waldern et al. |
| 11,592,614 B2 | 2/2023 | Waldern et al. |
| 11,899,238 B2 | 2/2024 | Waldern et al. |
| 2001/0024177 A1 | 9/2001 | Popovich |
| 2001/0036012 A1 | 11/2001 | Nakai et al. |
| 2001/0043163 A1 | 11/2001 | Waldern et al. |
| 2001/0046142 A1 | 11/2001 | Van Santen et al. |
| 2001/0050756 A1 | 12/2001 | Lipton et al. |
| 2002/0003509 A1 | 1/2002 | Lipton et al. |
| 2002/0009299 A1 | 1/2002 | Lipton |
| 2002/0011969 A1 | 1/2002 | Lipton et al. |
| 2002/0012064 A1 | 1/2002 | Yamaguchi |
| 2002/0021407 A1 | 2/2002 | Elliott |
| 2002/0021461 A1 | 2/2002 | Ono et al. |
| 2002/0036825 A1 | 3/2002 | Lipton et al. |
| 2002/0047837 A1 | 4/2002 | Suyama et al. |
| 2002/0075240 A1 | 6/2002 | Lieberman et al. |
| 2002/0076154 A1 | 6/2002 | Maisenhoelder et al. |
| 2002/0093701 A1 | 7/2002 | Zhang et al. |
| 2002/0110077 A1 | 8/2002 | Drobot et al. |
| 2002/0126332 A1 | 9/2002 | Popovich |
| 2002/0127497 A1 | 9/2002 | Brown et al. |
| 2002/0131175 A1 | 9/2002 | Yagi et al. |
| 2002/0150032 A1 | 10/2002 | Nishiuchi et al. |
| 2002/0150337 A1 | 10/2002 | Fujimaki |
| 2002/0167462 A1 | 11/2002 | Lewis et al. |
| 2002/0196332 A1 | 12/2002 | Lipton et al. |
| 2003/0007070 A1 | 1/2003 | Lipton et al. |
| 2003/0025881 A1 | 2/2003 | Hwang |
| 2003/0030912 A1 | 2/2003 | Gleckman et al. |
| 2003/0038912 A1 | 2/2003 | Broer et al. |
| 2003/0039442 A1 | 2/2003 | Bond et al. |
| 2003/0063042 A1 | 4/2003 | Friesem et al. |
| 2003/0063884 A1 | 4/2003 | Smith et al. |
| 2003/0067685 A1 | 4/2003 | Niv |
| 2003/0076590 A1 | 4/2003 | Kramer |
| 2003/0076950 A1 | 4/2003 | Usman et al. |
| 2003/0086670 A1 | 5/2003 | Moridaira et al. |
| 2003/0107809 A1 | 6/2003 | Chen et al. |
| 2003/0149346 A1 | 8/2003 | Arnone et al. |
| 2003/0175004 A1 | 9/2003 | Garito et al. |
| 2003/0184868 A1 | 10/2003 | Geist |
| 2003/0197154 A1 | 10/2003 | Manabe et al. |
| 2003/0197157 A1 | 10/2003 | Sutherland et al. |
| 2003/0202247 A1 | 10/2003 | Niv et al. |
| 2003/0206329 A1 | 11/2003 | Ikeda et al. |
| 2003/0228019 A1 | 12/2003 | Eichler et al. |
| 2004/0004767 A1 | 1/2004 | Song |
| 2004/0012833 A1 | 1/2004 | Newswanger et al. |
| 2004/0047938 A1 | 3/2004 | Kosuga et al. |
| 2004/0057138 A1 | 3/2004 | Tanijiri et al. |
| 2004/0075830 A1 | 4/2004 | Miyake et al. |
| 2004/0089842 A1 | 5/2004 | Sutehrland et al. |
| 2004/0108971 A1 | 6/2004 | Waldern et al. |
| 2004/0109234 A1 | 6/2004 | Levola |
| 2004/0112862 A1 | 6/2004 | Willson et al. |
| 2004/0125454 A1 | 7/2004 | Kawasaki et al. |
| 2004/0130797 A1 | 7/2004 | Leigh |
| 2004/0141217 A1 | 7/2004 | Endo et al. |
| 2004/0156008 A1 | 8/2004 | Reznikov et al. |
| 2004/0174348 A1 | 9/2004 | David |
| 2004/0175627 A1 | 9/2004 | Sutherland et al. |
| 2004/0179764 A1 | 9/2004 | Melikechi et al. |
| 2004/0184156 A1 | 9/2004 | Gunn, III et al. |
| 2004/0188617 A1 | 9/2004 | Devitt et al. |
| 2004/0208446 A1 | 10/2004 | Bond et al. |
| 2004/0208466 A1 | 10/2004 | Mossberg et al. |
| 2004/0225025 A1 | 11/2004 | Sullivan et al. |
| 2004/0263969 A1 | 12/2004 | Lipton et al. |
| 2004/0263971 A1 | 12/2004 | Lipton et al. |
| 2005/0007639 A1 | 1/2005 | Natarajan et al. |
| 2005/0018304 A1 | 1/2005 | Lipton et al. |
| 2005/0047705 A1 | 3/2005 | Domash et al. |
| 2005/0079663 A1 | 4/2005 | Masutani et al. |
| 2005/0083564 A1 | 4/2005 | Mallya et al. |
| 2005/0105909 A1 | 5/2005 | Stone |
| 2005/0122395 A1 | 6/2005 | Lipton et al. |
| 2005/0134404 A1 | 6/2005 | Kajiya et al. |
| 2005/0135747 A1 | 6/2005 | Greiner et al. |
| 2005/0136260 A1 | 6/2005 | Garcia |
| 2005/0141066 A1 | 6/2005 | Ouchi |
| 2005/0141811 A1 | 6/2005 | Yang et al. |
| 2005/0174321 A1 | 8/2005 | Ikeda et al. |
| 2005/0180687 A1 | 8/2005 | Amitai |
| 2005/0195276 A1 | 9/2005 | Lipton et al. |
| 2005/0218377 A1 | 10/2005 | Lawandy |
| 2005/0231774 A1 | 10/2005 | Hayashi et al. |
| 2005/0232530 A1 | 10/2005 | Kekas |
| 2005/0254752 A1 | 11/2005 | Domash et al. |
| 2005/0259217 A1 | 11/2005 | Lin et al. |
| 2005/0259302 A9 | 11/2005 | Metz et al. |
| 2005/0259944 A1 | 11/2005 | Anderson et al. |
| 2005/0265585 A1 | 12/2005 | Rowe |
| 2005/0269481 A1 | 12/2005 | David et al. |
| 2005/0271258 A1 | 12/2005 | Rowe |
| 2005/0286133 A1 | 12/2005 | Lipton |
| 2006/0002274 A1 | 1/2006 | Kihara et al. |
| 2006/0012878 A1 | 1/2006 | Lipton et al. |
| 2006/0013977 A1 | 1/2006 | Duke et al. |
| 2006/0043938 A1 | 3/2006 | O'Gorman et al. |
| 2006/0055993 A1 | 3/2006 | Kobayashi et al. |
| 2006/0093012 A1 | 5/2006 | Singh et al. |
| 2006/0093793 A1 | 5/2006 | Miyakawa et al. |
| 2006/0114564 A1 | 6/2006 | Sutherland et al. |
| 2006/0119837 A1 | 6/2006 | Raguin et al. |
| 2006/0119916 A1 | 6/2006 | Sutherland et al. |
| 2006/0126179 A1 | 6/2006 | Levola |
| 2006/0132914 A1 | 6/2006 | Weiss et al. |
| 2006/0142455 A1 | 6/2006 | Agarwal et al. |
| 2006/0146422 A1 | 7/2006 | Koike |
| 2006/0159864 A1 | 7/2006 | Natarajan et al. |
| 2006/0164593 A1 | 7/2006 | Peyghambarian et al. |
| 2006/0171647 A1 | 8/2006 | Ye et al. |
| 2006/0177180 A1 | 8/2006 | Tazawa et al. |
| 2006/0181683 A1 | 8/2006 | Bhowmik et al. |
| 2006/0191293 A1 | 8/2006 | Kuczma |
| 2006/0215244 A1 | 9/2006 | Yosha et al. |
| 2006/0215976 A1 | 9/2006 | Singh et al. |

(56) References Cited

U.S. PATENT DOCUMENTS

| | | |
|---|---|---|
| 2006/0221063 A1 | 10/2006 | Ishihara |
| 2006/0221448 A1 | 10/2006 | Nivon et al. |
| 2006/0228073 A1 | 10/2006 | Mukawa et al. |
| 2006/0262250 A1 | 11/2006 | Hobbs |
| 2006/0268104 A1 | 11/2006 | Cowan et al. |
| 2006/0268412 A1 | 11/2006 | Downing et al. |
| 2006/0279662 A1 | 12/2006 | Kapellner et al. |
| 2006/0284974 A1 | 12/2006 | Lipton et al. |
| 2006/0285205 A1 | 12/2006 | Lipton et al. |
| 2006/0291021 A1 | 12/2006 | Mukawa |
| 2006/0291052 A1 | 12/2006 | Lipton et al. |
| 2006/0292493 A1 | 12/2006 | Shinotsuka et al. |
| 2007/0012777 A1 | 1/2007 | Tsikos et al. |
| 2007/0019152 A1 | 1/2007 | Caputo et al. |
| 2007/0019297 A1 | 1/2007 | Stewart et al. |
| 2007/0041684 A1 | 2/2007 | Popovich et al. |
| 2007/0045596 A1 | 3/2007 | King et al. |
| 2007/0052929 A1 | 3/2007 | Allman et al. |
| 2007/0053032 A1 | 3/2007 | Popovich |
| 2007/0070476 A1 | 3/2007 | Yamada et al. |
| 2007/0070504 A1 | 3/2007 | Akutsu et al. |
| 2007/0070859 A1 | 3/2007 | Hirayama |
| 2007/0089625 A1 | 4/2007 | Grinberg et al. |
| 2007/0097502 A1 | 5/2007 | Lipton et al. |
| 2007/0109400 A1 | 5/2007 | Woodgate et al. |
| 2007/0109401 A1 | 5/2007 | Lipton et al. |
| 2007/0115553 A1 | 5/2007 | Chang-Hasnain et al. |
| 2007/0116409 A1 | 5/2007 | Bryan et al. |
| 2007/0127348 A1 | 6/2007 | Ooi et al. |
| 2007/0133089 A1 | 6/2007 | Lipton et al. |
| 2007/0133920 A1 | 6/2007 | Lee et al. |
| 2007/0133983 A1 | 6/2007 | Traff |
| 2007/0146624 A1 | 6/2007 | Duston et al. |
| 2007/0146625 A1 | 6/2007 | Ooi et al. |
| 2007/0154153 A1 | 7/2007 | Fomitchov et al. |
| 2007/0160325 A1 | 7/2007 | Son et al. |
| 2007/0177007 A1 | 8/2007 | Lipton et al. |
| 2007/0182915 A1 | 8/2007 | Osawa et al. |
| 2007/0183650 A1 | 8/2007 | Lipton et al. |
| 2007/0188602 A1 | 8/2007 | Cowan et al. |
| 2007/0188837 A1 | 8/2007 | Shimizu et al. |
| 2007/0195409 A1 | 8/2007 | Yun et al. |
| 2007/0206155 A1 | 9/2007 | Lipton |
| 2007/0211164 A1 | 9/2007 | Olsen et al. |
| 2007/0236560 A1 | 10/2007 | Lipton et al. |
| 2007/0237456 A1 | 10/2007 | Blauvelt et al. |
| 2007/0247687 A1 | 10/2007 | Handschy et al. |
| 2007/0258138 A1 | 11/2007 | Cowan et al. |
| 2007/0263169 A1 | 11/2007 | Lipton |
| 2008/0001909 A1 | 1/2008 | Lim |
| 2008/0018851 A1 | 1/2008 | Lipton et al. |
| 2008/0024598 A1 | 1/2008 | Perlin et al. |
| 2008/0043334 A1 | 2/2008 | Itzkovitch et al. |
| 2008/0049100 A1 | 2/2008 | Lipton et al. |
| 2008/0062259 A1 | 3/2008 | Lipton et al. |
| 2008/0089073 A1 | 4/2008 | Hikmet |
| 2008/0106775 A1 | 5/2008 | Amitai et al. |
| 2008/0106779 A1 | 5/2008 | Peterson et al. |
| 2008/0117289 A1 | 5/2008 | Schowengerdt et al. |
| 2008/0136916 A1 | 6/2008 | Wolff |
| 2008/0136923 A1 | 6/2008 | Inbar et al. |
| 2008/0138013 A1 | 6/2008 | Parriaux |
| 2008/0143964 A1 | 6/2008 | Cowan et al. |
| 2008/0143965 A1 | 6/2008 | Cowan et al. |
| 2008/0149517 A1 | 6/2008 | Lipton et al. |
| 2008/0151370 A1 | 6/2008 | Cook et al. |
| 2008/0151379 A1 | 6/2008 | Amitai |
| 2008/0186573 A1 | 8/2008 | Lipton |
| 2008/0186574 A1 | 8/2008 | Robinson et al. |
| 2008/0186604 A1 | 8/2008 | Amitai |
| 2008/0193085 A1 | 8/2008 | Singh et al. |
| 2008/0198471 A1 | 8/2008 | Amitai |
| 2008/0225187 A1 | 9/2008 | Yamanaka |
| 2008/0226281 A1 | 9/2008 | Lipton |
| 2008/0239067 A1 | 10/2008 | Lipton |
| 2008/0239068 A1 | 10/2008 | Lipton |
| 2008/0273081 A1 | 11/2008 | Lipton |
| 2008/0278812 A1 | 11/2008 | Amitai |
| 2008/0285137 A1 | 11/2008 | Simmonds et al. |
| 2008/0285140 A1 | 11/2008 | Amitai |
| 2008/0297731 A1 | 12/2008 | Powell et al. |
| 2008/0297807 A1 | 12/2008 | Feldman et al. |
| 2008/0298649 A1 | 12/2008 | Ennis et al. |
| 2008/0298740 A1 | 12/2008 | Hlousek et al. |
| 2008/0303895 A1 | 12/2008 | Akka et al. |
| 2008/0303896 A1 | 12/2008 | Lipton et al. |
| 2008/0304111 A1 | 12/2008 | Queenan et al. |
| 2008/0309586 A1 | 12/2008 | Vitale |
| 2008/0316303 A1 | 12/2008 | Chiu et al. |
| 2008/0316375 A1 | 12/2008 | Lipton et al. |
| 2009/0001632 A1 | 1/2009 | Stumpe et al. |
| 2009/0010135 A1 | 1/2009 | Ushiro et al. |
| 2009/0017424 A1 | 1/2009 | Yoeli et al. |
| 2009/0019222 A1 | 1/2009 | Verma et al. |
| 2009/0052017 A1 | 2/2009 | Sasaki |
| 2009/0052046 A1 | 2/2009 | Amitai |
| 2009/0052047 A1 | 2/2009 | Amitai |
| 2009/0067774 A1 | 3/2009 | Magnusson |
| 2009/0074356 A1 | 3/2009 | Sanchez et al. |
| 2009/0097122 A1 | 4/2009 | Niv |
| 2009/0097127 A1 | 4/2009 | Amitai |
| 2009/0116790 A1 | 5/2009 | Mossberg et al. |
| 2009/0121301 A1 | 5/2009 | Chang |
| 2009/0122413 A1 | 5/2009 | Hoffman et al. |
| 2009/0122414 A1 | 5/2009 | Amitai |
| 2009/0128495 A1 | 5/2009 | Kong et al. |
| 2009/0128781 A1 | 5/2009 | Li |
| 2009/0128902 A1 | 5/2009 | Niv et al. |
| 2009/0128911 A1 | 5/2009 | Itzkovitch et al. |
| 2009/0136246 A1 | 5/2009 | Murakami |
| 2009/0141324 A1 | 6/2009 | Mukawa |
| 2009/0153437 A1 | 6/2009 | Aharoni |
| 2009/0169152 A1 | 7/2009 | Oestergard |
| 2009/0190222 A1 | 7/2009 | Simmonds et al. |
| 2009/0213208 A1 | 8/2009 | Glatt |
| 2009/0237804 A1 | 9/2009 | Amitai et al. |
| 2009/0242021 A1 | 10/2009 | Petkie et al. |
| 2009/0296218 A1 | 12/2009 | Ryytty |
| 2009/0303599 A1 | 12/2009 | Levola |
| 2009/0316246 A1 | 12/2009 | Asai et al. |
| 2010/0014312 A1 | 1/2010 | Travis et al. |
| 2010/0039796 A1 | 2/2010 | Mukawa |
| 2010/0053565 A1 | 3/2010 | Mizushima et al. |
| 2010/0060551 A1 | 3/2010 | Sugiyama et al. |
| 2010/0060990 A1 | 3/2010 | Wertheim et al. |
| 2010/0065726 A1 | 3/2010 | Zhong et al. |
| 2010/0079841 A1 | 4/2010 | Levola |
| 2010/0079865 A1 | 4/2010 | Saarikko et al. |
| 2010/0084261 A1 | 4/2010 | Lee et al. |
| 2010/0086256 A1 | 4/2010 | Ben Bakir et al. |
| 2010/0092124 A1 | 4/2010 | Magnusson et al. |
| 2010/0096562 A1 | 4/2010 | Klunder et al. |
| 2010/0097674 A1 | 4/2010 | Kasazumi et al. |
| 2010/0097820 A1 | 4/2010 | Owen et al. |
| 2010/0103078 A1 | 4/2010 | Mukawa et al. |
| 2010/0134534 A1 | 6/2010 | Seesselberg et al. |
| 2010/0135615 A1 | 6/2010 | Ho et al. |
| 2010/0136319 A1 | 6/2010 | Imai et al. |
| 2010/0141555 A1 | 6/2010 | Rorberg et al. |
| 2010/0141905 A1 | 6/2010 | Burke |
| 2010/0149073 A1 | 6/2010 | Chaum et al. |
| 2010/0165465 A1 | 7/2010 | Levola |
| 2010/0165660 A1 | 7/2010 | Weber et al. |
| 2010/0171680 A1 | 7/2010 | Lapidot et al. |
| 2010/0177388 A1 | 7/2010 | Cohen et al. |
| 2010/0202725 A1 | 8/2010 | Popovich et al. |
| 2010/0214659 A1 | 8/2010 | Levola |
| 2010/0220293 A1 | 9/2010 | Mizushima et al. |
| 2010/0225834 A1 | 9/2010 | Li |
| 2010/0225876 A1 | 9/2010 | Escuti et al. |
| 2010/0231532 A1 | 9/2010 | Nho et al. |
| 2010/0231693 A1 | 9/2010 | Levola |
| 2010/0231705 A1 | 9/2010 | Yahav et al. |
| 2010/0232003 A1 | 9/2010 | Baldy et al. |

(56) References Cited

U.S. PATENT DOCUMENTS

| | | |
|---|---|---|
| 2010/0232016 A1 | 9/2010 | Landa et al. |
| 2010/0245756 A1 | 9/2010 | Sugihara et al. |
| 2010/0245757 A1 | 9/2010 | Sugihara et al. |
| 2010/0246003 A1 | 9/2010 | Simmonds et al. |
| 2010/0246004 A1 | 9/2010 | Simmonds |
| 2010/0246993 A1 | 9/2010 | Rieger et al. |
| 2010/0260030 A1 | 10/2010 | Yuyama et al. |
| 2010/0265117 A1 | 10/2010 | Weiss |
| 2010/0277803 A1 | 11/2010 | Pockett et al. |
| 2010/0284085 A1 | 11/2010 | Laakkonen |
| 2010/0284090 A1 | 11/2010 | Simmonds |
| 2010/0284180 A1 | 11/2010 | Popovich et al. |
| 2010/0296163 A1 | 11/2010 | Saarikko |
| 2010/0299814 A1 | 12/2010 | Celona et al. |
| 2010/0315719 A1 | 12/2010 | Saarikko et al. |
| 2010/0321781 A1 | 12/2010 | Levola et al. |
| 2010/0322555 A1 | 12/2010 | Vermeulen et al. |
| 2011/0001895 A1 | 1/2011 | Dahl |
| 2011/0002143 A1 | 1/2011 | Saarikko et al. |
| 2011/0013423 A1 | 1/2011 | Selbrede et al. |
| 2011/0019250 A1 | 1/2011 | Aiki et al. |
| 2011/0019874 A1 | 1/2011 | Jarvenpaa et al. |
| 2011/0026128 A1 | 2/2011 | Baker et al. |
| 2011/0026774 A1 | 2/2011 | Flohr et al. |
| 2011/0032602 A1 | 2/2011 | Rothenberg et al. |
| 2011/0032618 A1 | 2/2011 | Handerek et al. |
| 2011/0032706 A1 | 2/2011 | Mukawa |
| 2011/0038024 A1 | 2/2011 | Wang et al. |
| 2011/0050548 A1 | 3/2011 | Blumenfeld et al. |
| 2011/0063604 A1 | 3/2011 | Hamre et al. |
| 2011/0096401 A1 | 4/2011 | Levola |
| 2011/0102711 A1 | 5/2011 | Sutherland et al. |
| 2011/0103762 A1 | 5/2011 | Lee et al. |
| 2011/0109880 A1 | 5/2011 | Nummela |
| 2011/0157707 A1 | 6/2011 | Tilleman et al. |
| 2011/0164221 A1 | 7/2011 | Tilleman et al. |
| 2011/0187293 A1 | 8/2011 | Travis et al. |
| 2011/0211239 A1 | 9/2011 | Mukawa et al. |
| 2011/0216255 A1 | 9/2011 | Miyauchi et al. |
| 2011/0221656 A1 | 9/2011 | Haddick et al. |
| 2011/0232211 A1 | 9/2011 | Farahi |
| 2011/0235179 A1 | 9/2011 | Simmonds |
| 2011/0235365 A1 | 9/2011 | McCollum et al. |
| 2011/0236803 A1 | 9/2011 | Weiser et al. |
| 2011/0238399 A1 | 9/2011 | Ophir et al. |
| 2011/0242349 A1 | 10/2011 | Izuha et al. |
| 2011/0242661 A1 | 10/2011 | Simmonds |
| 2011/0242670 A1 | 10/2011 | Simmonds |
| 2011/0249309 A1 | 10/2011 | McPheters et al. |
| 2011/0274435 A1 | 11/2011 | Fini et al. |
| 2011/0299075 A1 | 12/2011 | Meade et al. |
| 2011/0310356 A1 | 12/2011 | Vallius |
| 2012/0007979 A1 | 1/2012 | Schneider et al. |
| 2012/0027347 A1 | 2/2012 | Mathal et al. |
| 2012/0033306 A1 | 2/2012 | Valera et al. |
| 2012/0044572 A1 | 2/2012 | Simmonds et al. |
| 2012/0044573 A1 | 2/2012 | Simmonds et al. |
| 2012/0062850 A1 | 3/2012 | Travis |
| 2012/0062998 A1 | 3/2012 | Schultz et al. |
| 2012/0075168 A1 | 3/2012 | Osterhout et al. |
| 2012/0081789 A1 | 4/2012 | Mukawa et al. |
| 2012/0092632 A1 | 4/2012 | McLeod et al. |
| 2012/0099203 A1 | 4/2012 | Boubis et al. |
| 2012/0105634 A1 | 5/2012 | Meidan et al. |
| 2012/0105740 A1 | 5/2012 | Jannard et al. |
| 2012/0120493 A1 | 5/2012 | Simmonds et al. |
| 2012/0127577 A1 | 5/2012 | Desserouer |
| 2012/0162549 A1 | 6/2012 | Gao et al. |
| 2012/0162764 A1 | 6/2012 | Shimizu |
| 2012/0176665 A1 | 7/2012 | Song et al. |
| 2012/0183888 A1 | 7/2012 | Oliveira et al. |
| 2012/0194420 A1 | 8/2012 | Osterhout et al. |
| 2012/0200532 A1 | 8/2012 | Powell et al. |
| 2012/0206811 A1 | 8/2012 | Mukawa et al. |
| 2012/0206937 A1 | 8/2012 | Travis et al. |
| 2012/0207432 A1 | 8/2012 | Travis et al. |
| 2012/0207434 A1 | 8/2012 | Large |
| 2012/0214089 A1 | 8/2012 | Hönel et al. |
| 2012/0214090 A1 | 8/2012 | Weiser et al. |
| 2012/0218481 A1 | 8/2012 | Popovich et al. |
| 2012/0224062 A1 | 9/2012 | Lacoste et al. |
| 2012/0235884 A1 | 9/2012 | Miller et al. |
| 2012/0235886 A1 | 9/2012 | Border et al. |
| 2012/0235900 A1 | 9/2012 | Border et al. |
| 2012/0242661 A1 | 9/2012 | Takagi et al. |
| 2012/0280956 A1 | 11/2012 | Yamamoto et al. |
| 2012/0281943 A1 | 11/2012 | Popovich et al. |
| 2012/0290973 A1 | 11/2012 | Robertson et al. |
| 2012/0294037 A1 | 11/2012 | Holman et al. |
| 2012/0300311 A1 | 11/2012 | Simmonds et al. |
| 2012/0320460 A1 | 12/2012 | Levola |
| 2012/0326950 A1 | 12/2012 | Park et al. |
| 2012/0328234 A1 | 12/2012 | Lu et al. |
| 2013/0016324 A1 | 1/2013 | Travis |
| 2013/0016362 A1 | 1/2013 | Gong et al. |
| 2013/0021392 A1 | 1/2013 | Travis |
| 2013/0021586 A1 | 1/2013 | Lippey |
| 2013/0027006 A1 | 1/2013 | Holloway et al. |
| 2013/0033485 A1 | 2/2013 | Kollin et al. |
| 2013/0039619 A1 | 2/2013 | Laughlin |
| 2013/0044376 A1 | 2/2013 | Valera et al. |
| 2013/0051730 A1 | 2/2013 | Travers et al. |
| 2013/0059233 A1 | 3/2013 | Askham |
| 2013/0069850 A1 | 3/2013 | Mukawa et al. |
| 2013/0077049 A1 | 3/2013 | Bohn |
| 2013/0088637 A1 | 4/2013 | Duparre |
| 2013/0093893 A1 | 4/2013 | Schofield et al. |
| 2013/0101253 A1 | 4/2013 | Popovich et al. |
| 2013/0107186 A1 | 5/2013 | Ando et al. |
| 2013/0117377 A1 | 5/2013 | Miller |
| 2013/0125027 A1 | 5/2013 | Abovitz et al. |
| 2013/0128230 A1 | 5/2013 | Macnamara |
| 2013/0138275 A1 | 5/2013 | Nauman et al. |
| 2013/0141937 A1 | 6/2013 | Katsuta et al. |
| 2013/0143336 A1 | 6/2013 | Jain |
| 2013/0163089 A1 | 6/2013 | Bohn |
| 2013/0163928 A1 | 6/2013 | Wang et al. |
| 2013/0170031 A1 | 7/2013 | Bohn et al. |
| 2013/0176704 A1 | 7/2013 | Lanman et al. |
| 2013/0184904 A1 | 7/2013 | Gadzinski |
| 2013/0200710 A1 | 8/2013 | Robbins |
| 2013/0207887 A1 | 8/2013 | Raffle et al. |
| 2013/0224634 A1 | 8/2013 | Berneth et al. |
| 2013/0229717 A1 | 9/2013 | Amitai |
| 2013/0249895 A1 | 9/2013 | Westerinen et al. |
| 2013/0250207 A1 | 9/2013 | Bohn |
| 2013/0250380 A1 | 9/2013 | Fujikawa et al. |
| 2013/0250430 A1 | 9/2013 | Robbins et al. |
| 2013/0250431 A1 | 9/2013 | Robbins et al. |
| 2013/0257848 A1 | 10/2013 | Westerinen et al. |
| 2013/0258701 A1 | 10/2013 | Westerinen et al. |
| 2013/0267309 A1 | 10/2013 | Robbins et al. |
| 2013/0271731 A1 | 10/2013 | Popovich et al. |
| 2013/0277890 A1 | 10/2013 | Bowman et al. |
| 2013/0286053 A1 | 10/2013 | Fleck et al. |
| 2013/0300997 A1 | 11/2013 | Popovich et al. |
| 2013/0301014 A1 | 11/2013 | DeJong et al. |
| 2013/0305437 A1 | 11/2013 | Weller et al. |
| 2013/0312811 A1 | 11/2013 | Aspnes et al. |
| 2013/0314789 A1 | 11/2013 | Saarikko et al. |
| 2013/0314793 A1 | 11/2013 | Robbins et al. |
| 2013/0322810 A1 | 12/2013 | Robbins |
| 2013/0328948 A1 | 12/2013 | Kunkel et al. |
| 2013/0342525 A1 | 12/2013 | Benko et al. |
| 2014/0002514 A1 | 1/2014 | Richards |
| 2014/0003762 A1 | 1/2014 | Macnamara |
| 2014/0009809 A1 | 1/2014 | Pyun et al. |
| 2014/0022616 A1 | 1/2014 | Popovich et al. |
| 2014/0024159 A1 | 1/2014 | Jain |
| 2014/0027006 A1 | 1/2014 | Foley et al. |
| 2014/0037242 A1 | 2/2014 | Popovich et al. |
| 2014/0043672 A1 | 2/2014 | Clarke et al. |
| 2014/0043689 A1 | 2/2014 | Mason |
| 2014/0055845 A1 | 2/2014 | Jain |

(56) References Cited

U.S. PATENT DOCUMENTS

| | | |
|---|---|---|
| 2014/0063055 A1 | 3/2014 | Osterhout et al. |
| 2014/0064655 A1 | 3/2014 | Nguyen et al. |
| 2014/0071538 A1 | 3/2014 | Muller |
| 2014/0098010 A1 | 4/2014 | Travis |
| 2014/0104665 A1 | 4/2014 | Popovich et al. |
| 2014/0104685 A1 | 4/2014 | Bohn et al. |
| 2014/0118647 A1 | 5/2014 | Momonoi et al. |
| 2014/0126029 A1 | 5/2014 | Fuetterer |
| 2014/0126175 A1 | 5/2014 | Amitai et al. |
| 2014/0130132 A1 | 5/2014 | Cahill et al. |
| 2014/0140653 A1 | 5/2014 | Brown et al. |
| 2014/0140654 A1 | 5/2014 | Brown et al. |
| 2014/0146394 A1 | 5/2014 | Tout et al. |
| 2014/0152778 A1 | 6/2014 | Ihlenburg et al. |
| 2014/0154614 A1 | 6/2014 | Xie et al. |
| 2014/0160576 A1 | 6/2014 | Robbins et al. |
| 2014/0168055 A1 | 6/2014 | Smith |
| 2014/0168260 A1 | 6/2014 | O'Brien et al. |
| 2014/0168735 A1 | 6/2014 | Yuan et al. |
| 2014/0168783 A1 | 6/2014 | Luebke et al. |
| 2014/0172296 A1 | 6/2014 | Shtukater |
| 2014/0176528 A1 | 6/2014 | Robbins |
| 2014/0177023 A1 | 6/2014 | Gao et al. |
| 2014/0185286 A1 | 7/2014 | Popovich et al. |
| 2014/0198128 A1 | 7/2014 | Hong et al. |
| 2014/0198896 A1 | 7/2014 | Hemmendorff et al. |
| 2014/0204455 A1 | 7/2014 | Popovich et al. |
| 2014/0211322 A1 | 7/2014 | Bohn et al. |
| 2014/0218468 A1 | 8/2014 | Gao et al. |
| 2014/0218801 A1 | 8/2014 | Simmonds et al. |
| 2014/0232759 A1 | 8/2014 | Simmonds et al. |
| 2014/0240834 A1 | 8/2014 | Mason |
| 2014/0240842 A1 | 8/2014 | Nguyen et al. |
| 2014/0255662 A1 | 9/2014 | Enomoto et al. |
| 2014/0267420 A1 | 9/2014 | Schowengerdt et al. |
| 2014/0268017 A1 | 9/2014 | Sweis et al. |
| 2014/0268353 A1 | 9/2014 | Fujimura et al. |
| 2014/0300947 A1 | 10/2014 | Fattal et al. |
| 2014/0300960 A1 | 10/2014 | Santori et al. |
| 2014/0300966 A1 | 10/2014 | Travers et al. |
| 2014/0327970 A1 | 11/2014 | Bohn et al. |
| 2014/0330159 A1 | 11/2014 | Costa et al. |
| 2014/0367719 A1 | 12/2014 | Jain |
| 2014/0375542 A1 | 12/2014 | Robbins et al. |
| 2014/0375789 A1 | 12/2014 | Lou et al. |
| 2014/0375790 A1 | 12/2014 | Robbins et al. |
| 2015/0001677 A1 | 1/2015 | Palumbo et al. |
| 2015/0003796 A1 | 1/2015 | Bennett |
| 2015/0009550 A1 | 1/2015 | Misago et al. |
| 2015/0010265 A1 | 1/2015 | Popovich et al. |
| 2015/0015946 A1 | 1/2015 | Muller |
| 2015/0016777 A1 | 1/2015 | Abovitz et al. |
| 2015/0035744 A1 | 2/2015 | Robbins et al. |
| 2015/0036068 A1 | 2/2015 | Fattal et al. |
| 2015/0058791 A1 | 2/2015 | Robertson et al. |
| 2015/0062675 A1 | 3/2015 | Ayres et al. |
| 2015/0062707 A1 | 3/2015 | Simmonds et al. |
| 2015/0086163 A1 | 3/2015 | Valera et al. |
| 2015/0086907 A1 | 3/2015 | Mizuta et al. |
| 2015/0107671 A1 | 4/2015 | Bodan et al. |
| 2015/0109763 A1 | 4/2015 | Shinkai et al. |
| 2015/0125109 A1 | 5/2015 | Robbins et al. |
| 2015/0148728 A1 | 5/2015 | Sallum et al. |
| 2015/0160529 A1 | 6/2015 | Popovich et al. |
| 2015/0167868 A1 | 6/2015 | Boncha |
| 2015/0177443 A1 | 6/2015 | Faecke et al. |
| 2015/0177686 A1 | 6/2015 | Lee et al. |
| 2015/0177688 A1 | 6/2015 | Popovich et al. |
| 2015/0185475 A1 | 7/2015 | Saarikko et al. |
| 2015/0211960 A1 | 7/2015 | Shimizu |
| 2015/0219834 A1 | 8/2015 | Nichol et al. |
| 2015/0235447 A1 | 8/2015 | Abovitz et al. |
| 2015/0235448 A1 | 8/2015 | Schowengerdt et al. |
| 2015/0243068 A1 | 8/2015 | Solomon |
| 2015/0247975 A1 | 9/2015 | Abovitz et al. |
| 2015/0260994 A1 | 9/2015 | Akutsu et al. |
| 2015/0262424 A1 | 9/2015 | Tabaka et al. |
| 2015/0268399 A1 | 9/2015 | Futterer |
| 2015/0268415 A1 | 9/2015 | Schowengerdt et al. |
| 2015/0277375 A1 | 10/2015 | Large et al. |
| 2015/0285682 A1 | 10/2015 | Popovich et al. |
| 2015/0288129 A1 | 10/2015 | Jain |
| 2015/0289762 A1 | 10/2015 | Popovich et al. |
| 2015/0309264 A1 | 10/2015 | Abovitz et al. |
| 2015/0316768 A1 | 11/2015 | Simmonds |
| 2015/0338689 A1 | 11/2015 | Min et al. |
| 2015/0346490 A1 | 12/2015 | Tekolste et al. |
| 2015/0346495 A1 | 12/2015 | Welch et al. |
| 2015/0355394 A1 | 12/2015 | Leighton et al. |
| 2016/0003847 A1 | 1/2016 | Ryan et al. |
| 2016/0004090 A1 | 1/2016 | Popovich et al. |
| 2016/0018673 A1 | 1/2016 | Wang |
| 2016/0026253 A1 | 1/2016 | Bradski et al. |
| 2016/0033705 A1 | 2/2016 | Fattal |
| 2016/0033706 A1 | 2/2016 | Fattal et al. |
| 2016/0038992 A1 | 2/2016 | Arthur et al. |
| 2016/0041387 A1 | 2/2016 | Valera et al. |
| 2016/0055822 A1 | 2/2016 | Bell |
| 2016/0077338 A1 | 3/2016 | Robbins et al. |
| 2016/0085008 A1 | 3/2016 | Banerjee et al. |
| 2016/0085300 A1 | 3/2016 | Robbins et al. |
| 2016/0097959 A1 | 4/2016 | Bruizeman et al. |
| 2016/0116739 A1 | 4/2016 | TeKolste et al. |
| 2016/0124223 A1 | 5/2016 | Shinbo et al. |
| 2016/0124241 A1 | 5/2016 | Popovich et al. |
| 2016/0132025 A1 | 5/2016 | Taff et al. |
| 2016/0147067 A1 | 5/2016 | Hua et al. |
| 2016/0170226 A1 | 6/2016 | Popovich et al. |
| 2016/0178901 A1 | 6/2016 | Ishikawa |
| 2016/0195664 A1 | 7/2016 | Fattal et al. |
| 2016/0209648 A1 | 7/2016 | Haddick et al. |
| 2016/0209657 A1 | 7/2016 | Popovich et al. |
| 2016/0231568 A1 | 8/2016 | Saarikko et al. |
| 2016/0231570 A1 | 8/2016 | Levola et al. |
| 2016/0238772 A1 | 8/2016 | Waldern et al. |
| 2016/0266398 A1 | 9/2016 | Poon et al. |
| 2016/0274356 A1 | 9/2016 | Mason |
| 2016/0274362 A1 | 9/2016 | Tinch et al. |
| 2016/0283773 A1 | 9/2016 | Popovich et al. |
| 2016/0291328 A1 | 10/2016 | Popovich et al. |
| 2016/0299344 A1 | 10/2016 | Dobschal et al. |
| 2016/0320536 A1 | 11/2016 | Simmonds et al. |
| 2016/0327705 A1 | 11/2016 | Simmonds et al. |
| 2016/0336033 A1 | 11/2016 | Tanaka |
| 2016/0341964 A1 | 11/2016 | Amitai |
| 2016/0363840 A1 | 12/2016 | Mizoguchi et al. |
| 2016/0370615 A1 | 12/2016 | Wu et al. |
| 2016/0377879 A1 | 12/2016 | Popovich et al. |
| 2017/0003505 A1 | 1/2017 | Vallius et al. |
| 2017/0010466 A1 | 1/2017 | Klug et al. |
| 2017/0010488 A1 | 1/2017 | Klug et al. |
| 2017/0030550 A1 | 2/2017 | Popovich et al. |
| 2017/0031160 A1 | 2/2017 | Popovich et al. |
| 2017/0031171 A1 | 2/2017 | Vallius et al. |
| 2017/0032166 A1 | 2/2017 | Raguin et al. |
| 2017/0034435 A1 | 2/2017 | Vallius |
| 2017/0038579 A1 | 2/2017 | Yeoh et al. |
| 2017/0052374 A1 | 2/2017 | Waldern et al. |
| 2017/0052376 A1 | 2/2017 | Amitai et al. |
| 2017/0059759 A1 | 3/2017 | Ayres et al. |
| 2017/0059775 A1 | 3/2017 | Coles et al. |
| 2017/0102543 A1 | 4/2017 | Vallius |
| 2017/0115487 A1 | 4/2017 | Travis et al. |
| 2017/0123208 A1 | 5/2017 | Vallius |
| 2017/0131460 A1 | 5/2017 | Lin et al. |
| 2017/0131545 A1 | 5/2017 | Wall et al. |
| 2017/0131546 A1 | 5/2017 | Woltman et al. |
| 2017/0131551 A1 | 5/2017 | Robbins et al. |
| 2017/0138789 A1 | 5/2017 | Ivanov |
| 2017/0160546 A1 | 6/2017 | Bull et al. |
| 2017/0180404 A1 | 6/2017 | Bersch et al. |
| 2017/0180408 A1 | 6/2017 | Yu et al. |
| 2017/0192246 A9 | 7/2017 | Popovich et al. |
| 2017/0192499 A1 | 7/2017 | Trail |

(56) References Cited

U.S. PATENT DOCUMENTS

| | | |
|---|---|---|
| 2017/0199333 A1 | 7/2017 | Waldern et al. |
| 2017/0212295 A1 | 7/2017 | Vasylyev |
| 2017/0219841 A1 | 8/2017 | Popovich et al. |
| 2017/0255257 A1 | 9/2017 | Tiana et al. |
| 2017/0276940 A1 | 9/2017 | Popovich et al. |
| 2017/0299793 A1 | 10/2017 | Fattal |
| 2017/0299794 A1 | 10/2017 | Fattal |
| 2017/0299860 A1 | 10/2017 | Wall et al. |
| 2017/0307800 A1 | 10/2017 | Fattal |
| 2017/0322426 A1 | 11/2017 | Tervo |
| 2017/0356801 A1 | 12/2017 | Popovich et al. |
| 2017/0357841 A1 | 12/2017 | Popovich et al. |
| 2018/0003805 A1 | 1/2018 | Popovich et al. |
| 2018/0011324 A1 | 1/2018 | Popovich et al. |
| 2018/0052277 A1 | 2/2018 | Schowengerdt et al. |
| 2018/0059305 A1 | 3/2018 | Popovich et al. |
| 2018/0067251 A1 | 3/2018 | Baldwin et al. |
| 2018/0074265 A1 | 3/2018 | Waldern et al. |
| 2018/0074352 A1 | 3/2018 | Popovich et al. |
| 2018/0081190 A1 | 3/2018 | Lee et al. |
| 2018/0107011 A1 | 4/2018 | Lu et al. |
| 2018/0112097 A1 | 4/2018 | Raghavanpillai et al. |
| 2018/0113303 A1 | 4/2018 | Popovich et al. |
| 2018/0120669 A1 | 5/2018 | Popovich et al. |
| 2018/0129060 A1 | 5/2018 | Lee et al. |
| 2018/0143438 A1 | 5/2018 | Oh |
| 2018/0143449 A1 | 5/2018 | Popovich et al. |
| 2018/0172995 A1 | 6/2018 | Lee et al. |
| 2018/0188542 A1 | 7/2018 | Waldern et al. |
| 2018/0188691 A1 | 7/2018 | Fattal |
| 2018/0210198 A1 | 7/2018 | Brown et al. |
| 2018/0210396 A1 | 7/2018 | Popovich et al. |
| 2018/0232048 A1 | 8/2018 | Popovich et al. |
| 2018/0246354 A1 | 8/2018 | Popovich et al. |
| 2018/0252869 A1 | 9/2018 | Ayres et al. |
| 2018/0265774 A1 | 9/2018 | Huang et al. |
| 2018/0275350 A1 | 9/2018 | Oh et al. |
| 2018/0275402 A1 | 9/2018 | Popovich et al. |
| 2018/0275410 A1 | 9/2018 | Yeoh et al. |
| 2018/0284440 A1 | 10/2018 | Popovich et al. |
| 2018/0348524 A1 | 12/2018 | Blum et al. |
| 2018/0373115 A1 | 12/2018 | Brown et al. |
| 2019/0041634 A1 | 2/2019 | Popovich et al. |
| 2019/0042827 A1 | 2/2019 | Popovich et al. |
| 2019/0064735 A1 | 2/2019 | Waldern et al. |
| 2019/0072723 A1 | 3/2019 | Waldern et al. |
| 2019/0094548 A1 | 3/2019 | Nicholson et al. |
| 2019/0113751 A9 | 4/2019 | Waldern et al. |
| 2019/0113829 A1 | 4/2019 | Waldern et al. |
| 2019/0114484 A1 | 4/2019 | Keech et al. |
| 2019/0121027 A1 | 4/2019 | Popovich et al. |
| 2019/0129085 A1 | 5/2019 | Waldern et al. |
| 2019/0162962 A1 | 5/2019 | Leighton et al. |
| 2019/0162963 A1 | 5/2019 | Leighton et al. |
| 2019/0171031 A1 | 6/2019 | Popovich et al. |
| 2019/0179153 A1 | 6/2019 | Popovich et al. |
| 2019/0187538 A1 | 6/2019 | Popovich et al. |
| 2019/0188471 A1 | 6/2019 | Osterhout et al. |
| 2019/0212195 A9 | 7/2019 | Popovich et al. |
| 2019/0212557 A1 | 7/2019 | Waldern et al. |
| 2019/0212573 A1 | 7/2019 | Popovich et al. |
| 2019/0212588 A1 | 7/2019 | Waldern et al. |
| 2019/0212589 A1 | 7/2019 | Waldern et al. |
| 2019/0212596 A1 | 7/2019 | Waldern et al. |
| 2019/0212597 A1* | 7/2019 | Waldern ............ G03F 7/027 |
| 2019/0212698 A1 | 7/2019 | Waldern et al. |
| 2019/0212699 A1 | 7/2019 | Waldern et al. |
| 2019/0219822 A1 | 7/2019 | Popovich et al. |
| 2019/0226830 A1 | 7/2019 | Edwin et al. |
| 2019/0243142 A1 | 8/2019 | Tekolste et al. |
| 2019/0265486 A1 | 8/2019 | Hansotte et al. |
| 2019/0278224 A1 | 9/2019 | Schlottau et al. |
| 2019/0285796 A1 | 9/2019 | Waldern et al. |
| 2019/0293880 A1 | 9/2019 | Nishiwaki et al. |
| 2019/0319426 A1 | 10/2019 | Lu et al. |
| 2019/0339558 A1 | 11/2019 | Waldern et al. |
| 2019/0361096 A1 | 11/2019 | Popovich et al. |
| 2020/0026074 A1 | 1/2020 | Waldern et al. |
| 2020/0033190 A1 | 1/2020 | Popovich et al. |
| 2020/0033801 A1 | 1/2020 | Waldern et al. |
| 2020/0033802 A1 | 1/2020 | Popovich et al. |
| 2020/0041787 A1 | 2/2020 | Popovich et al. |
| 2020/0041791 A1 | 2/2020 | Shipton et al. |
| 2020/0057353 A1 | 2/2020 | Popovich et al. |
| 2020/0064637 A1 | 2/2020 | Popovich et al. |
| 2020/0081317 A1 | 3/2020 | Popovich et al. |
| 2020/0089319 A1 | 3/2020 | Popovich et al. |
| 2020/0103661 A1 | 4/2020 | Kamakura |
| 2020/0142131 A1 | 5/2020 | Waldern et al. |
| 2020/0159023 A1 | 5/2020 | Bhargava et al. |
| 2020/0159026 A1 | 5/2020 | Waldern et al. |
| 2020/0183163 A1 | 6/2020 | Waldern et al. |
| 2020/0201042 A1 | 6/2020 | Wang et al. |
| 2020/0201051 A1 | 6/2020 | Popovich et al. |
| 2020/0225471 A1 | 7/2020 | Waldern et al. |
| 2020/0241304 A1 | 7/2020 | Popovich et al. |
| 2020/0247016 A1 | 8/2020 | Calafiore |
| 2020/0249484 A1 | 8/2020 | Waldern et al. |
| 2020/0249491 A1 | 8/2020 | Popovich et al. |
| 2020/0249568 A1 | 8/2020 | Rao et al. |
| 2020/0264378 A1 | 8/2020 | Grant et al. |
| 2020/0271973 A1 | 8/2020 | Waldern et al. |
| 2020/0292745 A1 | 9/2020 | Waldern et al. |
| 2020/0292840 A1 | 9/2020 | Popovich et al. |
| 2020/0333606 A1 | 10/2020 | Popovich et al. |
| 2020/0341194 A1 | 10/2020 | Waldern et al. |
| 2020/0341272 A1 | 10/2020 | Popovich et al. |
| 2020/0348519 A1 | 11/2020 | Waldern et al. |
| 2020/0348531 A1 | 11/2020 | Popovich et al. |
| 2020/0363771 A1 | 11/2020 | Waldern et al. |
| 2020/0386947 A1 | 12/2020 | Waldern et al. |
| 2020/0409151 A1 | 12/2020 | Calafiore |
| 2021/0033857 A1 | 2/2021 | Waldern et al. |
| 2021/0055551 A1 | 2/2021 | Chi et al. |
| 2021/0063634 A1 | 3/2021 | Waldern et al. |
| 2021/0088705 A1 | 3/2021 | Drazic et al. |
| 2021/0109285 A1 | 4/2021 | Jiang et al. |
| 2021/0191122 A1 | 6/2021 | Yaroshchuk et al. |
| 2021/0199873 A1 | 7/2021 | Shi et al. |
| 2021/0199971 A1 | 7/2021 | Lee et al. |
| 2021/0216040 A1 | 7/2021 | Waldern et al. |
| 2021/0231874 A1 | 7/2021 | Popovich et al. |
| 2021/0231955 A1 | 7/2021 | Waldern et al. |
| 2021/0238374 A1 | 8/2021 | Ye et al. |
| 2021/0239984 A1 | 8/2021 | Popovich et al. |
| 2021/0247620 A1 | 8/2021 | Popovich et al. |
| 2021/0255463 A1 | 8/2021 | Popovich et al. |
| 2021/0278739 A1 | 9/2021 | Brown et al. |
| 2021/0349328 A1 | 11/2021 | Popovich et al. |
| 2021/0405299 A1 | 12/2021 | Grant et al. |
| 2021/0405365 A1 | 12/2021 | Popovich et al. |
| 2021/0405514 A1 | 12/2021 | Waldern et al. |
| 2022/0019015 A1 | 1/2022 | Calafiore et al. |
| 2022/0082739 A1 | 3/2022 | Franke et al. |
| 2022/0091323 A1 | 3/2022 | Yaroshchuk et al. |
| 2022/0155623 A1 | 5/2022 | Waldern et al. |
| 2022/0204790 A1 | 6/2022 | Zhang et al. |
| 2022/0206232 A1 | 6/2022 | Zhang et al. |
| 2022/0283378 A1 | 9/2022 | Waldern et al. |
| 2023/0078253 A1 | 3/2023 | Waldern et al. |

FOREIGN PATENT DOCUMENTS

| | | |
|---|---|---|
| CN | 1066936 A | 12/1992 |
| CN | 1320217 A | 10/2001 |
| CN | 1886680 A | 12/2006 |
| CN | 200944140 Y | 9/2007 |
| CN | 101103297 A | 1/2008 |
| CN | 101151562 A | 3/2008 |
| CN | 101263412 A | 9/2008 |
| CN | 100492099 C | 5/2009 |
| CN | 101589326 A | 11/2009 |
| CN | 101688977 A | 3/2010 |
| CN | 101726857 A | 6/2010 |

(56) References Cited

FOREIGN PATENT DOCUMENTS

| | | |
|---|---|---|
| CN | 101793555 A | 8/2010 |
| CN | 101881936 A | 11/2010 |
| CN | 101910900 A | 12/2010 |
| CN | 101945612 A | 1/2011 |
| CN | 102314092 A | 1/2012 |
| CN | 102360093 A | 2/2012 |
| CN | 102498425 A | 6/2012 |
| CN | 102608762 A | 7/2012 |
| CN | 102782563 A | 11/2012 |
| CN | 102928981 A | 2/2013 |
| CN | 103000188 A | 3/2013 |
| CN | 103031557 A | 4/2013 |
| CN | 103562802 A | 2/2014 |
| CN | 103777282 A | 5/2014 |
| CN | 103823267 A | 5/2014 |
| CN | 103959133 A | 7/2014 |
| CN | 104035157 A | 9/2014 |
| CN | 104040308 A | 9/2014 |
| CN | 104040410 A | 9/2014 |
| CN | 104076424 A | 10/2014 |
| CN | 104136952 A | 11/2014 |
| CN | 104204901 A | 12/2014 |
| CN | 303019849 | 12/2014 |
| CN | 104520751 A | 4/2015 |
| CN | 303217936 | 5/2015 |
| CN | 104956252 A | 9/2015 |
| CN | 105074537 A | 11/2015 |
| CN | 105074539 A | 11/2015 |
| CN | 105190407 A | 12/2015 |
| CN | 105229514 A | 1/2016 |
| CN | 105393159 A | 3/2016 |
| CN | 105408801 A | 3/2016 |
| CN | 105408802 A | 3/2016 |
| CN | 105408803 A | 3/2016 |
| CN | 105531716 A | 4/2016 |
| CN | 105705981 A | 6/2016 |
| CN | 106125308 A | 11/2016 |
| CN | 106716223 A | 5/2017 |
| CN | 106842397 A | 6/2017 |
| CN | 106950744 A | 7/2017 |
| CN | 107466372 A | 12/2017 |
| CN | 107533137 A | 1/2018 |
| CN | 107873086 A | 4/2018 |
| CN | 108107506 A | 6/2018 |
| CN | 108474945 A | 8/2018 |
| CN | 108780224 A | 11/2018 |
| CN | 109073889 A | 12/2018 |
| CN | 109154717 A | 1/2019 |
| CN | 208621784 U | 3/2019 |
| CN | 103823267 B | 5/2019 |
| CN | 110383117 A | 10/2019 |
| CN | 107873086 B | 3/2020 |
| CN | 111025657 A | 4/2020 |
| CN | 111323867 A | 6/2020 |
| CN | 111386495 A | 7/2020 |
| CN | 111566571 A | 8/2020 |
| CN | 305973971 S | 8/2020 |
| CN | 111615655 A | 9/2020 |
| CN | 111684362 A | 9/2020 |
| CN | 111902768 A | 11/2020 |
| CN | 107466372 B | 1/2021 |
| CN | 109073889 B | 4/2021 |
| CN | 108780224 B | 8/2021 |
| CN | 113424095 A | 9/2021 |
| CN | 108474945 B | 10/2021 |
| CN | 113692544 A | 11/2021 |
| CN | 113759555 A | 12/2021 |
| CN | 114450608 A | 5/2022 |
| CN | 117321495 A | 12/2023 |
| DE | 19751190 A1 | 5/1999 |
| DE | 10221837 A1 | 12/2003 |
| DE | 102006003785 A1 | 7/2007 |
| DE | 102006036831 A1 | 2/2008 |
| DE | 102012108424 A1 | 3/2014 |
| DE | 102013209436 A1 | 11/2014 |
| EM | 001747551-0002 | 8/2012 |
| EM | 007234190-0001 | 11/2019 |
| EP | 0795775 A2 | 9/1997 |
| EP | 0822441 A2 | 2/1998 |
| EP | 1347641 A1 | 9/2003 |
| EP | 1413972 A1 | 4/2004 |
| EP | 1526709 A2 | 4/2005 |
| EP | 1748305 A1 | 1/2007 |
| EP | 1938152 A1 | 7/2008 |
| EP | 1413972 B1 | 10/2008 |
| EP | 2110701 A1 | 10/2009 |
| EP | 2196729 A1 | 6/2010 |
| EP | 2225592 A1 | 9/2010 |
| EP | 2244114 A1 | 10/2010 |
| EP | 2326983 A1 | 6/2011 |
| EP | 2381290 A1 | 10/2011 |
| EP | 1828832 B1 | 5/2013 |
| EP | 2733517 A1 | 5/2014 |
| EP | 1573369 B1 | 7/2014 |
| EP | 2748670 A1 | 7/2014 |
| EP | 2634605 B1 | 10/2015 |
| EP | 2929378 A1 | 10/2015 |
| EP | 2748670 B1 | 11/2015 |
| EP | 2995986 A1 | 3/2016 |
| EP | 1402298 B1 | 9/2016 |
| EP | 2995986 B1 | 4/2017 |
| EP | 3198192 A1 | 8/2017 |
| EP | 3245444 A1 | 11/2017 |
| EP | 3245551 A2 | 11/2017 |
| EP | 3248026 A1 | 11/2017 |
| EP | 3256888 A1 | 12/2017 |
| EP | 3359999 A1 | 8/2018 |
| EP | 2494388 B1 | 11/2018 |
| EP | 3398007 A1 | 11/2018 |
| EP | 3433658 A1 | 1/2019 |
| EP | 3433659 A1 | 1/2019 |
| EP | 2842003 B1 | 2/2019 |
| EP | 3499278 A1 | 6/2019 |
| EP | 3245551 B1 | 9/2019 |
| EP | 3548939 A2 | 10/2019 |
| EP | 3698214 | 8/2020 |
| EP | 3710876 A1 | 9/2020 |
| EP | 3710887 A1 | 9/2020 |
| EP | 3710893 A1 | 9/2020 |
| EP | 3710894 A1 | 9/2020 |
| EP | 3245444 B1 | 9/2021 |
| EP | 3894938 A1 | 10/2021 |
| EP | 3924759 A1 | 12/2021 |
| EP | 4022370 A1 | 7/2022 |
| EP | 4288831 A1 | 12/2023 |
| FI | 20176157 A1 | 6/2019 |
| FI | 20176161 A1 | 6/2019 |
| FR | 2677463 A1 | 12/1992 |
| FR | 2975506 A1 | 11/2012 |
| GB | 2115178 A | 9/1983 |
| GB | 2140935 A | 12/1984 |
| GB | 2508661 A | 6/2014 |
| GB | 2509536 A | 7/2014 |
| GB | 2512077 A | 9/2014 |
| GB | 2514658 A | 12/2014 |
| HK | 1204684 A1 | 11/2015 |
| HK | 1205563 A1 | 12/2015 |
| HK | 1205793 A1 | 12/2015 |
| HK | 1206101 A1 | 12/2015 |
| JP | 57089722 A | 6/1982 |
| JP | 02186319 A | 7/1990 |
| JP | 03239384 A | 10/1991 |
| JP | 05066427 A | 3/1993 |
| JP | 5-224018 A | 9/1993 |
| JP | 06294952 A | 10/1994 |
| JP | 7-66383 A | 3/1995 |
| JP | 07098439 A | 4/1995 |
| JP | H07239412 A | 9/1995 |
| JP | 0990312 A | 4/1997 |
| JP | 2689851 B2 | 12/1997 |
| JP | 10503279 A | 3/1998 |
| JP | 10096903 A | 4/1998 |
| JP | H10105030 A | 4/1998 |
| JP | H1164636 A | 3/1999 |

(56) References Cited

FOREIGN PATENT DOCUMENTS

| | | |
|---|---|---|
| JP | 11109320 A | 4/1999 |
| JP | 11142806 A | 5/1999 |
| JP | 2953444 B2 | 9/1999 |
| JP | 2000056259 A | 2/2000 |
| JP | 2000511306 A | 8/2000 |
| JP | 2000261706 A | 9/2000 |
| JP | 2000267042 A | 9/2000 |
| JP | 2000515996 A | 11/2000 |
| JP | 2001027739 A | 1/2001 |
| JP | 2001296503 A | 10/2001 |
| JP | 2002090858 A | 3/2002 |
| JP | 2002122906 A | 4/2002 |
| JP | 2002156617 A | 5/2002 |
| JP | 2002162598 A | 6/2002 |
| JP | 2002520648 A | 7/2002 |
| JP | 2002523802 A | 7/2002 |
| JP | 2002529790 A | 9/2002 |
| JP | 2002311379 A | 10/2002 |
| JP | 2003066428 A | 3/2003 |
| JP | 2003270419 A | 9/2003 |
| JP | 2003315540 A | 11/2003 |
| JP | 2004021071 A | 1/2004 |
| JP | 2004133074 A | 4/2004 |
| JP | 2004157245 A | 6/2004 |
| JP | 2006350129 A | 12/2006 |
| JP | 2007011057 A | 1/2007 |
| JP | 2007094175 A | 4/2007 |
| JP | 2007219106 A | 8/2007 |
| JP | 2008511702 A | 4/2008 |
| JP | 2008112187 A | 5/2008 |
| JP | 2008517323 A | 5/2008 |
| JP | 2008233226 A | 10/2008 |
| JP | 2009036955 A | 2/2009 |
| JP | 2009515225 A | 4/2009 |
| JP | 2009132221 A | 6/2009 |
| JP | 2009133999 A | 6/2009 |
| JP | 2009211091 A | 9/2009 |
| JP | 4367775 B2 | 11/2009 |
| JP | 2009281870 A * | 12/2009 ............... G01D 5/38 |
| JP | 2010044326 A | 2/2010 |
| JP | 2010256631 A | 11/2010 |
| JP | 2011505052 A | 2/2011 |
| JP | 2011158907 A | 8/2011 |
| JP | 2011523452 A | 8/2011 |
| JP | 2011187108 A | 9/2011 |
| JP | 2012137616 A | 7/2012 |
| JP | 2012163642 A | 8/2012 |
| JP | 2012533089 A | 12/2012 |
| JP | 2013061480 A | 4/2013 |
| JP | 5303928 B2 | 10/2013 |
| JP | 2013235256 A | 11/2013 |
| JP | 2014132328 A | 7/2014 |
| JP | 5588794 B2 | 8/2014 |
| JP | 5646748 B2 | 11/2014 |
| JP | 2015053163 A | 3/2015 |
| JP | 2015523586 A | 8/2015 |
| JP | 2015172713 A | 10/2015 |
| JP | 2016030503 A | 3/2016 |
| JP | 2018508037 A | 3/2018 |
| JP | 2018512562 A | 5/2018 |
| JP | 2018131608 A | 8/2018 |
| JP | 2018533069 A | 11/2018 |
| JP | 2019512745 A | 5/2019 |
| JP | 2019520595 A | 7/2019 |
| JP | 6598269 B2 | 10/2019 |
| JP | 6680793 B2 | 3/2020 |
| JP | 2020512578 A | 4/2020 |
| JP | 2020514783 A | 5/2020 |
| JP | 1664536 S | 7/2020 |
| JP | 6734933 B2 | 7/2020 |
| JP | 2020-537187 A | 12/2020 |
| JP | 2021509488 A | 3/2021 |
| JP | 2021509736 A | 4/2021 |
| JP | 6895451 B2 | 6/2021 |
| JP | 2022513896 A | 2/2022 |
| JP | 2022546413 A | 11/2022 |
| KR | 20060132474 A | 12/2006 |
| KR | 100803288 B1 | 2/2008 |
| KR | 20100092059 A | 8/2010 |
| KR | 20140140063 A | 12/2014 |
| KR | 20140142337 A | 12/2014 |
| KR | 20170031357 A | 3/2017 |
| KR | 301061010 S | 5/2020 |
| KR | 20200104402 A | 9/2020 |
| KR | 20200106170 A | 9/2020 |
| KR | 20200106932 A | 9/2020 |
| KR | 20200108030 A | 9/2020 |
| KR | 20210100174 A | 8/2021 |
| KR | 20210138609 A | 11/2021 |
| KR | 20220054386 A | 5/2022 |
| KR | 20230153459 A | 11/2023 |
| TW | 200535633 A | 11/2005 |
| TW | 200801583 A | 1/2008 |
| TW | 201314263 A | 4/2013 |
| TW | 201600943 A | 1/2016 |
| TW | 201604601 A | 2/2016 |
| WO | 1997001133 A1 | 1/1997 |
| WO | 1997027519 A1 | 7/1997 |
| WO | 1998004650 A1 | 2/1998 |
| WO | 1999009440 A1 | 2/1999 |
| WO | 9931658 A1 | 6/1999 |
| WO | 1999052002 A1 | 10/1999 |
| WO | 2000016136 A1 | 3/2000 |
| WO | 2000023830 | 4/2000 |
| WO | 2000023832 A1 | 4/2000 |
| WO | 2000023847 | 4/2000 |
| WO | 2000028369 A2 | 5/2000 |
| WO | 2000028369 A3 | 10/2000 |
| WO | WO-0062104 A * | 10/2000 ............... G02B 5/32 |
| WO | 2001050200 A2 | 7/2001 |
| WO | 2001090822 A1 | 11/2001 |
| WO | 2002082168 A1 | 10/2002 |
| WO | 2003081320 A1 | 10/2003 |
| WO | 2004023174 A2 | 3/2004 |
| WO | 2004053531 A3 | 11/2004 |
| WO | 2004102226 A2 | 11/2004 |
| WO | 2004109349 A2 | 12/2004 |
| WO | 2005001753 A1 | 1/2005 |
| WO | 2005006065 A8 | 1/2005 |
| WO | 2005006065 A3 | 2/2005 |
| WO | 2005073798 A1 | 8/2005 |
| WO | 2006002870 A1 | 1/2006 |
| WO | 2006064301 A1 | 6/2006 |
| WO | 2006064325 A1 | 6/2006 |
| WO | 2006064334 A1 | 6/2006 |
| WO | 2006102073 A2 | 9/2006 |
| WO | 2006132614 A1 | 12/2006 |
| WO | 2006102073 A3 | 1/2007 |
| WO | 2007015141 A2 | 2/2007 |
| WO | 2007029032 A1 | 3/2007 |
| WO | 2007085682 A1 | 8/2007 |
| WO | 2007130130 A2 | 11/2007 |
| WO | 2007141587 A1 | 12/2007 |
| WO | 2007141589 A1 | 12/2007 |
| WO | 2008011066 A2 | 1/2008 |
| WO | 2008011066 A9 | 5/2008 |
| WO | 2008081070 A1 | 7/2008 |
| WO | 2008100545 A2 | 8/2008 |
| WO | 2008011066 A3 | 12/2008 |
| WO | 2009013597 A2 | 1/2009 |
| WO | 2009013597 A3 | 1/2009 |
| WO | 2009077802 A1 | 6/2009 |
| WO | 2009077803 A1 | 6/2009 |
| WO | 2009101238 A1 | 8/2009 |
| WO | 2007130130 A3 | 9/2009 |
| WO | 2009155437 A1 | 12/2009 |
| WO | 2009155437 A8 | 3/2010 |
| WO | 2010023444 A1 | 3/2010 |
| WO | 2010057219 A1 | 5/2010 |
| WO | 2010067114 A1 | 6/2010 |
| WO | 2010067117 A1 | 6/2010 |
| WO | 2010078856 A1 | 7/2010 |
| WO | 2010104692 A2 | 9/2010 |
| WO | 2010122330 A1 | 10/2010 |

(56) References Cited

FOREIGN PATENT DOCUMENTS

| | | | | |
|---|---|---|---|---|
| WO | 2010125337 | A2 | 11/2010 | |
| WO | 2010125337 | A3 | 11/2010 | |
| WO | 2010131046 | A1 | 11/2010 | |
| WO | WO-2010125926 | A1 * | 11/2010 | ............... C09D 1/00 |
| WO | 2011012825 | A1 | 2/2011 | |
| WO | 2011032005 | A2 | 3/2011 | |
| WO | 2011042711 | A2 | 4/2011 | |
| WO | 2011051660 | A1 | 5/2011 | |
| WO | 2011055109 | A2 | 5/2011 | |
| WO | 2011042711 | A3 | 6/2011 | |
| WO | 2011073673 | A1 | 6/2011 | |
| WO | 2011107831 | A1 | 9/2011 | |
| WO | 2011110821 | A1 | 9/2011 | |
| WO | 2011131978 | A1 | 10/2011 | |
| WO | 2012052352 | A1 | 4/2012 | |
| WO | 2012062658 | A1 | 5/2012 | |
| WO | 2012136970 | A1 | 10/2012 | |
| WO | 2012158950 | A1 | 11/2012 | |
| WO | 2012172295 | A1 | 12/2012 | |
| WO | 2013027004 | A1 | 2/2013 | |
| WO | 2013027006 | A1 | 2/2013 | |
| WO | 2013033274 | A1 | 3/2013 | |
| WO | 2013034879 | A1 | 3/2013 | |
| WO | 2013049012 | A1 | 4/2013 | |
| WO | 2013054972 | A1 | 4/2013 | |
| WO | 2013102759 | A2 | 7/2013 | |
| WO | 2013163347 | A1 | 10/2013 | |
| WO | 2013167864 | A1 | 11/2013 | |
| WO | 2013190257 | A1 | 12/2013 | |
| WO | 2014064427 | A1 | 5/2014 | |
| WO | 2014080155 | A1 | 5/2014 | |
| WO | 2014085734 | A1 | 6/2014 | |
| WO | 2014090379 | A1 | 6/2014 | |
| WO | 2014091200 | A1 | 6/2014 | |
| WO | 2014093601 | A1 | 6/2014 | |
| WO | 2014100182 | A1 | 6/2014 | |
| WO | 2014113506 | A1 | 7/2014 | |
| WO | 2014116615 | A1 | 7/2014 | |
| WO | 2014130383 | A1 | 8/2014 | |
| WO | 2014144526 | A2 | 9/2014 | |
| WO | 2014159621 | A1 | 10/2014 | |
| WO | 2014164901 | A1 | 10/2014 | |
| WO | 2014176695 | A1 | 11/2014 | |
| WO | 2014179632 | A1 | 11/2014 | |
| WO | 2014188149 | A1 | 11/2014 | |
| WO | 2014209733 | A1 | 12/2014 | |
| WO | 2014209819 | A1 | 12/2014 | |
| WO | 2014209820 | A1 | 12/2014 | |
| WO | 2014209821 | A1 | 12/2014 | |
| WO | 2014210349 | A1 | 12/2014 | |
| WO | 2015006784 | A2 | 1/2015 | |
| WO | 2015015138 | A1 | 2/2015 | |
| WO | 2015017291 | A1 | 2/2015 | |
| WO | 2015069553 | A1 | 5/2015 | |
| WO | 2015081313 | A2 | 6/2015 | |
| WO | 2015117039 | A1 | 8/2015 | |
| WO | 2015145119 | A1 | 10/2015 | |
| WO | 2016010289 | A1 | 1/2016 | |
| WO | 2016020630 | A2 | 2/2016 | |
| WO | 2016020643 | A1 | 2/2016 | |
| WO | 2016025350 | A1 | 2/2016 | |
| WO | 2016020630 | A3 | 3/2016 | |
| WO | 2016042283 | A1 | 3/2016 | |
| WO | 2016044193 | A1 | 3/2016 | |
| WO | 2016046514 | A1 | 3/2016 | |
| WO | 2016048729 | A1 | 3/2016 | |
| WO | 2016054092 | A1 | 4/2016 | |
| WO | 2016069606 | A1 | 5/2016 | |
| WO | 2016087442 | A1 | 6/2016 | |
| WO | 2016103263 | A1 | 6/2016 | |
| WO | 2016111706 | A1 | 7/2016 | |
| WO | 2016111707 | A1 | 7/2016 | |
| WO | 2016111708 | A1 | 7/2016 | |
| WO | 2016111709 | A1 | 7/2016 | |
| WO | 2016113533 | A2 | 7/2016 | |
| WO | 2016113534 | A1 | 7/2016 | |
| WO | 2016116733 | A1 | 7/2016 | |
| WO | 2016118107 | A1 | 7/2016 | |
| WO | 2016122679 | A1 | 8/2016 | |
| WO | 2016130509 | A1 | 8/2016 | |
| WO | 2016135434 | A1 | 9/2016 | |
| WO | 2016113533 | A3 | 10/2016 | |
| WO | 2016156776 | A1 | 10/2016 | |
| WO | 2016181108 | A1 | 11/2016 | |
| WO | 2016046514 | A8 | 4/2017 | |
| WO | 2017060665 | A1 | 4/2017 | |
| WO | 2017094129 | A1 | 6/2017 | |
| WO | 2017120320 | A1 | 7/2017 | |
| WO | 2017134412 | A1 | 8/2017 | |
| WO | 2017160367 | A1 | 9/2017 | |
| WO | 2017162999 | A1 | 9/2017 | |
| WO | 2017178781 | A1 | 10/2017 | |
| WO | 2017180403 | A1 | 10/2017 | |
| WO | 2017182771 | A1 | 10/2017 | |
| WO | 2017203200 | A1 | 11/2017 | |
| WO | 2017203201 | A1 | 11/2017 | |
| WO | 2017207987 | A1 | 12/2017 | |
| WO | 2018102834 | A2 | 6/2018 | |
| WO | 2018102834 | A3 | 6/2018 | |
| WO | 2018096359 | A3 | 7/2018 | |
| WO | 2018129398 | A1 | 7/2018 | |
| WO | 2017162999 | A8 | 8/2018 | |
| WO | 2018150163 | A1 | 8/2018 | |
| WO | 2018206487 | A1 | 11/2018 | |
| WO | 2019046649 | A1 | 3/2019 | |
| WO | 2019077307 | A1 | 4/2019 | |
| WO | 2019079350 | A2 | 4/2019 | |
| WO | 2019079350 | A3 | 4/2019 | |
| WO | 2019046649 | A8 | 5/2019 | |
| WO | 2019122806 | A1 | 6/2019 | |
| WO | 2019135784 | A1 | 7/2019 | |
| WO | 2019135796 | A1 | 7/2019 | |
| WO | 2019135837 | A1 | 7/2019 | |
| WO | 2019136470 | A1 | 7/2019 | |
| WO | 2019136471 | A1 | 7/2019 | |
| WO | 2019136473 | A1 | 7/2019 | |
| WO | 2019171038 | A1 | 9/2019 | |
| WO | 2019185973 | A1 | 10/2019 | |
| WO | 2019185975 | A1 | 10/2019 | |
| WO | 2019185976 | A1 | 10/2019 | |
| WO | 2019185977 | A1 | 10/2019 | |
| WO | 2019217453 | A1 | 11/2019 | |
| WO | 2020023779 | A1 | 1/2020 | |
| WO | 2020123506 | A1 | 6/2020 | |
| WO | 2020149956 | A1 | 7/2020 | |
| WO | 2020168348 | A1 | 8/2020 | |
| WO | 2020172681 | A1 | 8/2020 | |
| WO | 2020186113 | A1 | 9/2020 | |
| WO | 2020212682 | A1 | 10/2020 | |
| WO | 2020219092 | A1 | 10/2020 | |
| WO | 2020227236 | A1 | 11/2020 | |
| WO | 2020247930 | A1 | 12/2020 | |
| WO | 2021021926 | A1 | 2/2021 | |
| WO | 2021032982 | A1 | 2/2021 | |
| WO | 2021032983 | A1 | 2/2021 | |
| WO | 2021041949 | A1 | 3/2021 | |
| WO | 2021044121 | A1 | 3/2021 | |
| WO | 2021138607 | A1 | 7/2021 | |
| WO | 2021242898 | A1 | 12/2021 | |
| WO | 2021262759 | A1 | 12/2021 | |
| WO | 2022015878 | A1 | 1/2022 | |
| WO | 2022187870 | A1 | 9/2022 | |
| WO | 2022187870 | A9 | 10/2022 | |
| WO | 2024059644 | A2 | 3/2024 | |

OTHER PUBLICATIONS

Extended European Search Report for European Application No. 13765610.4 dated Feb. 16, 2016, 6 pgs.
Extended European Search Report for European Application No. 15187491.4, search completed Jan. 15, 2016, mailed Jan. 28, 2016, 5 pgs.

(56) References Cited

OTHER PUBLICATIONS

Extended European Search Report for European Application No. 18867522.7, Search completed Sep. 15, 2021, Mailed Sep. 24, 2021, 9 pgs.
Extended European Search Report for European Application No. 19736108.2, Search completed Sep. 15, 2021, Mailed Sep. 27, 2021, 8 pgs.
Extended European Search Report for European Application No. 18727645.6, Search completed Oct. 14, 2020, Mailed Oct. 23, 2020, 13 pgs.
Supplementary Partial European Search Report for European Application No. 18727645.6, Search completed Jul. 2, 2020, Mailed Jul. 13, 2020, 13 pgs.
International Preliminary Report on Patentability for International Application No. PCT/GB2010/000835, issued Nov. 1, 2011, mailed Nov. 10, 2011, 9 pgs.
International Preliminary Report on Patentability for International Application No. PCT/GB2010/001920, issued Apr. 11, 2012, mailed Apr. 19, 2012, 10 pgs.
International Preliminary Report on Patentability for International Application No. PCT/GB2010/001982, report issued May 1, 2012, mailed May 10, 2012, 7 pgs.
International Preliminary Report on Patentability for International Application No. PCT/GB2013/000273, issued Dec. 23, 2014, mailed Dec. 31, 2014, 8 pgs.
International Preliminary Report on Patentability for International Application No. PCT/GB2015/000203, issued Mar. 21, 2017, mailed Mar. 30, 2017, 8 pgs.
International Preliminary Report on Patentability for International Application No. PCT/GB2016/000005, Report issued Jul. 18, 2017, Mailed Jul. 27, 2017, 7 pgs.
International Preliminary Report on Patentability for International Application No. PCT/GB2016/000036, issued Aug. 29, 2017, mailed Sep. 8, 2017, 8 pgs.
International Preliminary Report on Patentability for International Application No. PCT/GB2016/000051, Report issued Sep. 19, 2017, Mailed Sep. 28, 2017, 7 Pgs.
International Preliminary Report on Patentability for International Application No. PCT/GB2016/000065, issued Oct. 3, 2017, mailed Oct. 12, 2017, 8 pgs.
International Preliminary Report on Patentability for International Application No. PCT/IB2008/001909, Report issued Jan. 26, 2010, Mailed Jan. 26, 2010, 5 Pgs.
International Preliminary Report on Patentability for International Application No. PCT/US2018/012227, Report issued Jul. 30, 2019, Mailed Aug. 8, 2019, 7 Pgs.
International Preliminary Report on Patentability for International Application No. PCT/US2018/037410, Report issued Jul. 14, 2020, Mailed Jul. 23, 2020, 7 Pgs.
International Preliminary Report on Patentability for International Application No. PCT/US2018/048636, Report issued Jul. 14, 2020, Mailed Jul. 23, 2020, 9 Pgs.
International Preliminary Report on Patentability for International Application No. PCT/US2018/062835, Report issued Jul. 14, 2020, Mailed Jul. 23, 2020, 7 Pgs.
International Preliminary Report on Patentability for International Application No. PCT/US2019/012758, Report issued Jul. 14, 2020, Mailed Jul. 23, 2020, 4 Pgs.
International Preliminary Report on Patentability for International Application No. PCT/US2019/012759, Report issued Jul. 14, 2020, Mailed Jul. 23, 2020, 6 Pgs.
International Preliminary Report on Patentability for International Application PCT /US2018/015553, Report issued Jun. 4, 2019, Mailed Jun. 13, 2019, 6 pgs.
International Preliminary Report on Patentability for International Application PCT/GB2009/051676, issued Jun. 14, 2011, mailed Jun. 23, 2011, 6 pgs.
International Preliminary Report on Patentability for International Application PCT/GB2011/000349, issued Sep. 18, 2012, mailed Sep. 27, 2012, 10 pgs.
International Preliminary Report on Patentability for International Application PCT/GB2012/000331, issued Oct. 8, 2013, mailed Oct. 17, 2013, 8 pgs.
International Preliminary Report on Patentability for International Application PCT/GB2012/000677, issued Feb. 25, 2014, mailed Mar. 6, 2014, 5 pgs.
International Preliminary Report on Patentability for International Application PCT/GB2013/000005, issued Jul. 8, 2014, mailed Jul. 17, 2014, 12 pgs.
International Preliminary Report on Patentability for International Application PCT/GB2013/000210, issued Nov. 11, 2014, Mailed Nov. 20, 2014, 6 pgs.
International Preliminary Report on Patentability for International Application PCT/GB2014/000197, issued Nov. 24, 2015, mailed Dec. 3, 2015, 7 pgs.
International Preliminary Report on Patentability for International Application PCT/GB2014/000295, issued Feb. 2, 2016, mailed Feb. 11, 2016, 4 pgs.
International Preliminary Report on Patentability for International Application PCT/GB2015/000225, issued Feb. 14, 2017, mailed Feb. 23, 2017, 8 pgs.
International Preliminary Report on Patentability for International Application PCT/GB2015/000228, issued Feb. 14, 2017, mailed Feb. 23, 2017, 11 pgs.
International Preliminary Report on Patentability for International Application PCT/GB2015/000274, Issued Mar. 28, 2017, mailed Apr. 6, 2017, 8 pgs.
International Preliminary Report on Patentability for International Application PCT/GB2016/000003, issued Jul. 18, 2017, mailed Jul. 27, 2017, 11 Pgs.
International Preliminary Report on Patentability for International Application PCT/GB2016/000014, issued Jul. 25, 2017, mailed Aug. 3, 2017, 7 pgs.
International Preliminary Report on Patentability for International Application PCT/GB2017/000015, Report Completed Aug. 7, 2018, Mailed Aug. 16, 2018, 7 pgs.
International Preliminary Report on Patentability for International Application PCT/GB2017/000040, Report issued Sep. 25, 2018, Mailed Oct. 4, 2018, 7 pgs.
International Preliminary Report on Patentability for International Application PCT/GB2017/000055, issued Oct. 16, 2018, Mailed Oct. 25, 2018, 9 pgs.
International Preliminary Report on Patentability for International Application PCT/US2014/011736, issued Jul. 21, 2015, mailed Jul. 30, 2015, 9 pgs.
International Preliminary Report on Patentability for International Application PCT/US2016/017091, issued Aug. 15, 2017, mailed Aug. 24, 2017, 5 pgs.
International Preliminary Report on Patentability for International Application PCT/US2018/012691, issued Jul. 9, 2019, Mailed Jul. 18, 2019, 10 pgs.
International Preliminary Report on Patentability for International Application PCT/US2018/048960, Report issued on Mar. 3, 2020, Mailed on Mar. 12, 2020, 7 pgs.
International Preliminary Report on Patentability for International Application PCT/US2018/056150, Report Issued on Apr. 21, 2020, Mailed on Apr. 30, 2020, 6 pgs.
International Preliminary Report on Patentability for International Application PCT/US2019/012764, Report issued Jul. 14, 2020, Mailed Jul. 23, 2020, 5 pgs.
International Preliminary Report on Patentability for International Application PCT/US2019/031163, Report issued Nov. 10, 2020, Mailed Nov. 19, 2020, 6 pgs.
International Preliminary Report on Patentability for International Application PCT/US2019/047097 issued Sep. 28, 2021, Mailed on Nov. 4, 2021, 7 pgs.
International Preliminary Report on Patentability for International Application PCT/US2019/064765, Report issued Oct. 19, 2020, Mailed Oct. 28, 2020, 27 Pgs.
International Preliminary Report on Patentability for International Application PCT/US2019/065478, Report issued Jun. 8, 2021, Mailed on Jun. 24, 2021, 9 Pgs.

(56) References Cited

OTHER PUBLICATIONS

International Preliminary Report on Patentability for International Application PCT/US2020/018686, Report issued Aug. 10, 2021, Mailed on Aug. 26, 2021, 6 Pgs.
International Preliminary Report on Patentability for International Application PCT/US2020/031363, issued Nov. 2, 2021, Mailed Nov. 18, 2021, 7 pgs.
International Preliminary Report on Patentability for International Application PCT/US2020/036654, Report issued Dec. 7, 2021, Mailed Dec. 16, 2021, 9 Pgs.
International Preliminary Report on Patentability for International Application PCT/US2020/048590, Report issued Mar. 1, 2022, Mailed on Mar. 10, 2022, 12 Pgs.
International Preliminary Report on Patentability for PCT Application No. PCT/US2013/038070, dated Oct. 28, 2014, 6 pgs.
International Search Report and Written Opinion for International Application No. PCT/US2022/071007, Search completed May 2, 2022, Mailed May 23, 2022, 13 pgs.
International Search Report and Written Opinion for International Application No. PCT/GB2010/000835, completed Oct. 26, 2010, mailed Nov. 8, 2010, 12 pgs.
International Search Report and Written Opinion for International Application No. PCT/GB2010/001920, completed Mar. 29, 2011, mailed Apr. 6, 2011, 15 pgs.
International Search Report and Written Opinion for International Application No. PCT/GB2015/000228, Search completed May 4, 2011, Mailed Jul. 15, 2011, 15 Pgs.
International Search Report and Written Opinion for International Application No. PCT/GB2016/000036, completed Jul. 4, 2016, mailed Jul. 13, 2016, 10 pgs.
International Search Report and Written Opinion for International Application No. PCT/GB2016/000065, completed Jul. 14, 2016, mailed Jul. 27, 2016, 10 pgs.
International Search Report and Written Opinion for International Application No. PCT/GB2017/000015, Search completed Apr. 25, 2017, Mailed May 8, 2017, 10 pgs.
International Search Report and Written Opinion for International Application No. PCT/GB2017/000055, Search completed Jul. 19, 2017, Mailed Jul. 26, 2017, 12 pgs.
International Search Report and Written Opinion for International Application No. PCT/IB2008/001909, Search completed Feb. 4, 2009, Mailed Feb. 17, 2009, 6 Pgs.
International Search Report and Written Opinion for International Application No. PCT/US2013/038070, completed Aug. 12, 2013, mailed Aug. 14, 2013, 12 pgs.
International Search Report and Written Opinion for International Application No. PCT/US2014/011736, completed Apr. 18, 2014, mailed May 8, 2014, 10 pgs.
International Search Report and Written Opinion for International Application No. PCT/US2018/012227, Search completed Feb. 28, 2018, Mailed Mar. 14, 2018, 8 Pgs.
International Search Report and Written Opinion for International Application No. PCT/US2018/012691, completed Mar. 10, 2018, mailed Mar. 28, 2018, 16 pgs.
International Search Report and Written Opinion for International Application No. PCT/US2018/015553, completed Aug. 6, 2018, Mailed Sep. 19, 2018, 12 pgs.
International Search Report and Written Opinion for International Application No. PCT/US2018/037410, Search completed Aug. 16, 2018, Mailed Aug. 30, 2018, 11 pgs.
International Search Report and Written Opinion for International Application No. PCT/US2018/048636, Search completed Nov. 1, 2018, Mailed Nov. 15, 2018, 16 pgs.
International Search Report and Written Opinion for International Application No. PCT/US2018/048960, Search completed Dec. 14, 2018, Mailed Jan. 8, 2019, 14 pgs.
International Search Report and Written Opinion for International Application No. PCT/US2018/056150, Search completed Dec. 4, 2018, Mailed Dec. 26, 2018, 10 pgs.
International Search Report and Written Opinion for International Application No. PCT/US2018/062835, Search completed Jan. 14, 2019, Mailed Jan. 31, 2019, 14 pgs.
International Search Report and Written Opinion for International Application No. PCT/US2019/012758, completed Mar. 12, 2019, mailed Mar. 27, 2019, 9 pgs.
International Search Report and Written Opinion for International Application No. PCT/US2019/012764, completed Mar. 1, 2019, mailed Mar. 18, 2019, 9 pgs.
International Search Report and Written Opinion for International Application No. PCT/US2019/031163, Search completed Jul. 9, 2019, Mailed Jul. 29, 2019, 11 pgs.
International Search Report and Written Opinion for International Application No. PCT/US2019/043496, Search completed Sep. 28, 2019, Mailed Nov. 14, 2019, 12 pgs.
International Search Report and Written Opinion for International Application No. PCT/US2019/064765, Search completed Feb. 3, 2020, Mailed Mar. 18, 2020, 11 Pgs.
International Search Report and Written Opinion for International Application No. PCT/US2019/065478, Search completed Jan. 29, 2020, Mailed Feb. 11. 2020, 14 pgs.
International Search Report and Written Opinion for International Application No. PCT/US2020/018686, Search completed Apr. 25, 2020, Mailed May 22, 2020, 11 Pgs.
International Search Report and Written Opinion for International Application No. PCT/US2020/019549, Search completed Apr. 14, 2020, Mailed May 22, 2020, 12 pgs.
International Search Report and Written Opinion for International Application No. PCT/US2020/022482, Search completed May 12, 2020, Mailed Jun. 9, 2020, 11 pgs.
International Search Report and Written Opinion for International Application No. PCT/US2020/031363, completed May 28, 2020, Mailed Jun. 10, 2020, 8 pgs.
International Search Report and Written Opinion for International Application No. PCT/US2020/036654, Search completed Aug. 21, 2020, Mailed Sep. 4, 2020, 14 Pgs.
International Search Report and Written Opinion for International Application No. PCT/US2020/043107, Search completed Sep. 28, 2020, Mailed Oct. 15, 2020, 12 pgs.
International Search Report and Written Opinion for International Application No. PCT/US2020/044060, Search completed Oct. 9, 2020, Mailed Nov. 9, 2020, 12 pgs.
International Search Report and Written Opinion for International Application No. PCT/US2020/048590, Search completed Dec. 7, 2020, Mailed Jan. 11, 2021, 19 pgs.
International Search Report and Written Opinion for International Application No. PCT/US2020/067737, Search completed Mar. 3, 2021, Mailed Mar. 25, 2021, 12 pgs.
International Search Report and Written Opinion for International Application No. PCT/US2021/038542, search Completed Sep. 21, 2021, Mailed Oct. 20, 2021 16 pgs.
International Search Report and Written Opinion for International Application No. PCT/US2021/072548, Search completed Jan. 25, 2022, Mailed Feb. 8, 2022, 15 Pgs.
International Search Report and Written Opinion for International Application PCT/GB2009/051676, completed May 10, 2010, mailed May 18, 2010, 7 pgs.
International Search Report and Written Opinion for International Application PCT/GB2016/000181, completed Dec. 21, 2016, mailed Feb. 27, 2017, 21 pgs.
International Search Report and Written Opinion for International Application PCT/US2016/017091, completed by the European Patent Office on Apr. 20, 2016, 7 pgs.
International Search Report and Written Opinion for International Application PCT/US2019/012759, completed Mar. 14, 2019, mailed Apr. 15, 2019, 12 pgs.
International Search Report and Written Opinion for International Application PCT/US2019/047097, completed Nov. 22, 2015, mailed Dec. 16, 2019, 10 pgs.
International Search Report for International Application PCT/GB2014/000295, completed Nov. 18, 2014, mailed Jan. 5, 2015, 4 pgs.

(56) References Cited

OTHER PUBLICATIONS

International Search Report for International Application PCT/GB2017/000040, mailed Jul. 18, 2017, completed Jul. 10, 2017, 3 pgs.
International Search Report for PCT/GB2010/001982, completed by the European Patent Office on Feb. 24, 2011, 4 pgs.
International Search Report for PCT/GB2011/000349, completed by the European Patent Office on Aug. 17, 2011, 4 pgs.
International Search Report for PCT/GB2012/000331, completed by the European Patent Office on Aug. 29, 2012, 4 pgs.
International Search Report for PCT/GB2012/000677, completed by the European Patent Office on Dec. 10, 2012, 4 pgs.
International Search Report for PCT/GB2013/000005, completed by the European Patent Office on Jul. 16, 2013, 3 pgs.
International Search Report for PCT/GB2013/000210, completed by the European Patent Office on Aug. 12, 2013, 3 pgs.
International Search Report for PCT/GB2013/000273, completed by the European Patent Office on Aug. 30, 2013, 4 pgs.
International Search Report for PCT/GB2014/000197, Completed by the European Patent Office on Jul. 31, 2014, 3 pgs.
International Search Report for PCT/GB2015/000203, completed by the European Patent Office on Oct. 9, 2015, 4 pgs.
International Search Report for PCT/GB2015/000225, completed by the European Patent Office on Nov. 10, 2015, mailed Dec. 2, 2016, 5 pgs.
International Search Report for PCT/GB2015/000274, completed by the European Patent Office on Jan. 7, 2016, 4 pgs.
Harding et al., "Reactive Liquid Crystal Materials for Optically Anisotropic Patterned Retarders", Merck, Iicrivue, 2008, ME-GR-RH-08-010, 20 pgs.
Harding et al., "Reactive Liquid Crystal Materials for Optically Anisotropic Patterned Retarders", SPIE Lithography Asia—Taiwan, 2008, Proceedings vol. 7140, Lithography Asia 2008; 71402J, doi: 10.1117/12.805378.
Hariharan, "Optical Holography: Principles, techniques and applications", Cambridge University Press, 1996, pp. 231-233.
Harris, "Photonic Devices", EE 216 Principals and Models of Semiconductor Devices, Autumn 2002, 20 pgs.
Harrold et al., "3D Display Systems Hardware Research at Sharp Laboratories of Europe: an update", Sharp Laboratories of Europe, Ltd., received May 21, 1999, 7 pgs.
Harthong et al., "Speckle phase averaging in high-resolution color holography", J. Opt. Soc. Am. A, vol. 14, No. 2, Feb. 1997, pp. 405-409.
Hasan et al., "Tunable-focus lens for adaptive eyeglasses", Optics Express, Jan. 23, 2017, vol. 25, No. 2, 1221, 13 pgs.
Hasman et al., "Diffractive Optics: Design, Realization, and Applications", Fiber and Integrated Optics, vol. 16, 1997, pp. 1-25.
Hata et al., "Holographic nanoparticle-polymer composites based on step-growth thiol-ene photopolymerization", Optical Materials Express, vol. 1, No. 2, Jun. 1, 2011, pp. 207-222.
He et al., "Dynamics of peristrophic multiplexing in holographic polymer-dispersed liquid crystal", Liquid Crystals, Mar. 26, 2014, vol. 41, No. 5, pp. 673-684.
He et al., "Holographic 3D display based on polymer-dispersed liquid-crystal thin films", Proceedings of China Display/Asia Display 2011, pp. 158-160.
He et al., "Properties of Volume Holograms Recording in Photopolymer Films with Various Pulse Exposures Repetition Frequencies", Proceedings of SPIE vol. 5636, Bellingham, WA, 2005, pp. 842-848, doi: 10.1117/12.580978.
He et al., "Transmission Holographic Gratings Using Siloxane Containing Liquid Crystalline Compounds, Importance of Chemical Structure of Polymer Matrix Components", Polymer Journal, Jun. 9, 2006, vol. 38, No. 7, pp. 678-685.
Herman et al., "Production and Uses of Diffractionless Beams", J. Opt. Soc. Am. A., Jun. 1991, vol. 8, No. 6, pp. 932-942.
Hisano, "Alignment layer-free molecular ordering induced by masked photopolymerization with nonpolarized light", Appl. Phys. Express 9, Jun. 6, 2016, pp. 072601-1-072601-4.
Hoepfner et al., "LED Front Projection Goes Mainstream", Luminus Devices, Inc., Projection Summit, 2008, 18 pgs.
Holmes et al., "Controlling the Anisotropy of Holographic Polymer-Dispersed Liquid-Crystal Gratings", Physical Review E, Jun. 11, 2002, vol. 65, 066603-1-066603-4.
Hoyle et al., "Advances in the Polymerization of Thiol-Ene Formulations", Heraeus Noblelight Fusion UV Inc., 2003 Conference, 6 pgs.
Hua, "Sunglass-like displays become a reality with free-form optical technology", Illumination & Displays 3D Visualization and Imaging Systems Laboratory (3DVIS) College of Optical Sciences University of Arizona Tucson, AZ. 2014, 3 pgs.
Huang et al., "Diffraction properties of substrate guided-wave holograms", Optical Engineering, Oct. 1995, vol. 34, No. 10, pp. 2891-2899.
Huang et al., "Theory and characteristics of holographic polymer dispersed liquid crystal transmission grating with scaffolding morphology", Applied Optics, Jun. 20, 2012, vol. 51, No. 18, pp. 4013-4020.
Iannacchione et al., "Deuterium NMR and morphology study of copolymer-dispersed liquid-crystal Bragg gratings", Europhysics Letters, 1996, vol. 36, No. 6, pp. 425-430.
Irie, "Photochromic diarylethenes for photonic devices", Pure and Applied Chemistry, 1996, pp. 1367-1371, vol. 68, No. 7, IUPAC.
Jang et al., "Low Driving Voltage Holographic Polymer Dispersed Liquid Crystals with Chemically Incorporated Graphene Oxide", Journal of Materials Chemistry, 2011, vol. 21, pp. 19226-19232, doi.10.1039/1jm13827h.
Jeng et al., "Aligning liquid crystal molecules", SPIE, 2012, 10.1117/2.1201203.004148, 2 pgs.
Jeong et al., "Memory Effect of Polymer Dispersed Liquid Crystal by Hybridization with Nanoclay", express Polymer Letters, vol. 4, No. 1, 2010, pp. 39-46, DOI: 10.3144/expresspolymlett.2010.7.
Jo et al., "Control of Liquid Crystal Pretilt Angle using Polymerization of Reactive Mesogen", IMID 2009 Digest, P1-25, 2009, pp. 604-606.
Juhl, "Interference Lithography for Optical Devices and Coatings", Dissertation, University of Illinois at Urbana-Champaign, 2010.
Juhl et al., "Holographically Directed Assembly of Polymer Nanocomposites", ACS Nano, Oct. 7, 2010, vol. 4, No. 10, pp. 5953-5961.
Jurbergs et al., "New recording materials for the holographic industry", Proc. of SPIE, 2009 vol. 7233, pp. 72330K-1-72330L-10, doi: 10.1117/12.809579.
Kahn et al., "Private Line Report on Large Area Display", Kahn International, Jan. 7, 2003, vol. 8, No. 10, 9 pgs.
Kakiuchida et al., "Multiple Bragg Diffractions with Different Wavelengths and Polarizations Composed of Liquid Crystal/Polymer Periodic Phases", ACS Omega, Sep. 22, 2017, pp. 6081-6090, doi: 10.1021/acsomega.7b01149.
Karasawa et al., "Effects of Material Systems on the Polarization Behavior of Holographic Polymer Dispersed Liquid Crystal Gratings", Japanese Journal of Applied Physics, Oct. 1997, vol. 36, No. 10, pp. 6388-6392.
Karp et al., "Planar micro-optic solar concentration using multiple imaging lenses into a common slab waveguide", Proc. of SPIE vol. 7407, 2009 SPIE, pp. 74070D-1-74070D-11, CCC code: 0277-786X/09, doi: 10.1117/12.826531.
Karp et al., "Planar micro-optic solar concentrator", Optics Express, Jan. 18, 2010, vol. 18, No. 2, pp. 1122-1133.
Kato et al., "Alignment-Controlled Holographic Polymer Dispersed Liquid Crystal (HPDLC) for Reflective Display Devices", SPIE,1998, vol. 3297, pp. 52-57.
Kessler, "Optics of Near to Eye Displays (NEDs)", Oasis 2013, Tel Aviv, Feb. 19, 2013, 37 pgs.
Keuper et al., "26.1: RGB LED Illuminator for Pocket-Sized Projectors", SID 04 Digest, 2004, ISSN/0004-0966X/04/3502, pp. 943-945.
Keuper et al., "P-126: Ultra-Compact LED based Image Projector for Portable Applications", SID 03 Digest, 2003, ISSN/0003-0966X/03/3401-0713, pp. 713-715.

(56) References Cited

OTHER PUBLICATIONS

Kim et al., "Effect of Polymer Structure on the Morphology and Electro optic Properties of UV Curable PNLCs", Polymer, Feb. 2000, vol. 41, pp. 1325-1335.

Kim et al., "Enhancement of electro-optical properties in holographic polymer-dispersed liquid crystal films by incorporation of multiwalled carbon nanotubes into a polyurethane acrylate matrix", Polym. Int., Jun. 16, 2010, vol. 59, pp. 1289-1295.

Kim et al., "Fabrication of Reflective Holographic PDLC for Blue", Molecular Crystals and Liquid Crystals Science, 2001, vol. 368, pp. 3845-3853.

Kim et al., "Optimization of Holographic PDLC for Green", Mol. Cryst. Liq. Cryst., vol. 368, 2001, pp. 3855-3864.

Klein, "Optical Efficiency for Different Liquid Crystal Colour Displays", Digital Media Department, HPL-2000-83, Jun. 29, 2000, 18 pgs.

Kogelnik, "Coupled Wave Theory for Thick Hologram Gratings", The Bell System Technical Journal, vol. 48, No. 9, Nov. 1969, pp. 2909-2945.

Kotakonda et al., "Electro-optical Switching of the Holographic Polymer-dispersed Liquid Crystal Diffraction Gratings", Journal of Optics A: Pure and Applied Optics, Jan. 1, 2009, vol. 11, No. 2, 11 pgs.

Kress et al., "Diffractive and Holographic Optics as Optical Combiners in Head Mounted Displays", UbiComp '13, Sep. 9-12, 2013, Session: Wearable Systems for Industrial Augmented Reality Applications, pp. 1479-1482.

Kwon et al., "Polymer waveguide notch filter using two stacked thermooptic long-period gratings", IEEE Photonics Technology Letters, Apr. 4, 2005, vol. 17, Issue 4, pp. 792-794, DOI: 10.1109/LPT.2005.844008.

Lauret et al., "Solving the Optics Equation for Effective LED Applications", Gaggione North America, LLFY System Design Workshop 2010, Oct. 28, 2010, 26 pgs.

Lee, "Patents Shows Widespread Augmented Reality Innovation", PatentVue, May 26, 2015, 5 pgs.

Levin et al., "A Closed Form Solution to Natural Image Matting", Illumination & Displays 3D Visualization and Imaging Systems Laboratory (3DVIS) College of Optical Sciences University of Arizona Tucson, 2014, 8 pgs.

Levola, "Diffractive optics for virtual reality displays", Journal of the SID, 2006, 14/5, pp. 467-475.

Levola et al., "Near-to-eye display with diffractive exit pupil expander having chevron design", Journal of the SID, 2008, 16/8, pp. 857-862.

Levola et al., "Replicated slanted gratings with a high refractive index material for in and outcoupling of light", Optics Express, vol. 15, Issue 5, 2007, pp. 2067-2074.

Tao et al., "TiO2 nanocomposites with high refractive index and transparency", J. Mater. Chem., Oct. 4, 2011, vol. 21, pp. 18623-18629.

Titus et al., "Efficient, Accurate Liquid Crystal Digital Light Deflector", Proc. SPIE 3633, Diffractive and Holographic Technologies, Systems, and Spatial Light Modulators VI, 1 Jun. 1, 1999, doi: 10.1117/12.349334, 10 pgs.

Tiziani, "Physical Properties of Speckles", Speckle Metrology, Chapter 2, Academic Press, Inc., 1978, pp. 5-9.

Tominaga et al., "Fabrication of holographic polymer dispersed liquid crystals doped with gold nanoparticles", 2010 Japanese Liquid Crystal Society Annual Meeting, 2 pgs.

Tomita, "Holographic assembly of nanoparticles in photopolymers for photonic applications", The International Society for Optical Engineering, SPIE Newsroom, 2006, 3 pgs., doi: 10.1117/2.1200612.0475.

Tondiglia et al., "Holographic Formation of Electro-Optical Polymer-Liquid Crystal Photonic Crystals", Advanced Materials, 2002, Published Online Nov. 8, 2001, vol. 14, No. 3, pp. 187-191.

Trisnadi, "Hadamard Speckle Contrast Reduction", Optics Letters, Jan. 1, 2004, vol. 29, No. 1, pp. 11-13.

Trisnadi, "Speckle contrast reduction in laser projection displays", Proc. SPIE 4657, 2002, 7 pgs.

Tzeng et al., "Axially symmetric polarization converters based on photo-aligned liquid crystal films", Optics Express, Mar. 17, 2008, vol. 16, No. 6, pp. 3768-3775.

Upatnieks et al., "Color Holograms for white light reconstruction", Applied Physics Letters, Jun. 1, 1996, vol. 8, No. 11, pp. 286-287.

Urey, "Diffractive exit pupil expander for display applications", Applied Optics, Nov. 10, 2001, vol. 40, Issue 32, pp. 5840-5851.

Ushenko, "The Vector Structure of Laser Biospeckle Fields and Polarization Diagnostics of Collagen Skin Structures", Laser Physics, 2000, vol. 10, No. 5, pp. 1143-1149.

Valoriani, "Mixed Reality: Dalle demo a un prodotto", Disruptive Technologies Conference, Sep. 23, 2016, 67 pgs.

Van Gerwen et al., "Nanoscaled interdigitated electrode arrays for biochemical sensors", Sensors and Actuators, Mar. 3, 1998, vol. B 49, pp. 73-80.

Vecchi, "Studi Esr Di Sistemi Complessi Basati Su Cristalli Liquidi", Thesis, University of Bologna, Department of Physical and Inorganic Chemistry, 2004-2006, 110 pgs.

Veltri et al., "Model for the photoinduced formation of diffraction gratings in liquid-crystalline composite materials", Applied Physics Letters, May 3, 2004, vol. 84, No. 18, pp. 3492-3494.

Vita, "Switchable Bragg Gratings", Thesis, Universita degli Studi di Napoli Federico II, Nov. 2005, 103 pgs.

Vuzix, "M3000 Smart Glasses, Advanced Waveguide Optics", brochure, Jan. 1, 2017, 2 pgs.

Waldern et al., "Waveguide Optics for All Day Wearable Displays", Jun. 20, 2017, 35 pgs.

Wang et al., "Liquid-crystal blazed-grating beam deflector", Applied Optics, Dec. 10, 2000, vol. 39, No. 35, pp. 6545-6555.

Wang et al., "Optical Design of Waveguide Holographic Binocular Display for Machine Vision", Applied Mechanics and Materials, Sep. 27, 2013, vols. 427-429, pp. 763-769.

Wang et al., "Speckle reduction in laser projection systems by diffractive optical elements", Applied Optics, Apr. 1, 1998, vol. 37, No. 10, pp. 1770-1775.

Weber et al., "Giant Birefringent Optics in Multilayer Polymer Mirrors", Science, Mar. 31, 2000, vol. 287, pp. 2451-2456.

Wei AN, "Industrial Applications of Speckle Techniques", Doctoral Thesis, Royal Institute of Technology, Department of Production Engineering, Chair of Industrial Metrology & Optics, Stockholm, Sweden 2002, 76 pgs.

Welde et al., "Investigation of methods for speckle contrast reduction", Master of Science in Electronics, Jul. 2010, Norwegian University of Science and Technology, Department of Electronics and Telecommunications, 127 pgs.

White, "Influence of thiol-ene polymer evolution on the formation and performance of holographic polymer dispersed liquid crystals", The 232nd ACS National Meeting, San Francisco, CA, Sep. 10-14, 2006, 1 pg.

Wicht et al., "Nanoporous Films with Low Refractive Index for Large-Surface Broad-Band Anti-Reflection Coatings", Macromol. Mater. Eng., 2010, 295, DOI: 10.1002/mame.201000045, 9 pgs.

Wilderbeek et al., "Photoinitiated Bulk Polymerization of Liquid Crystalline Thiolene Monomers", Macromolecules, 2002, vol. 35, pp. 8962-8969.

Wilderbeek et al., "Photo-Initiated Polymerization of Liquid Crystalline Thiol-Ene Monomers in Isotropic and Anisotropic Solvents", J. Phys. Chem. B, 2002, vol. 106, No. 50, pp. 12874-12883.

Wisely, "Head up and head mounted display performance improvements through advanced techniques in the manipulation of light", Proc. of SPIE, 2009, 10 pages, vol. 7327.

Wofford et al., "Liquid crystal bragg gratings: dynamic optical elements for spatial light modulators", Hardened Materials Branch, Survivability and Sensor Materials Division, AFRL-ML-WP-TP-2007-551, Air Force Research Laboratory, Jan. 2007, Wright-Patterson Air Force Base, OH, 17 pgs.

Yang et al., "Robust and Accurate Surface Measurement Using Structured Light", IEEE, Apr. 30, 2008, vol. 57, Issue 6, pp. 1275-1280, DOI:10.1109/TIM.2007.915103.

(56) References Cited

OTHER PUBLICATIONS

Yaqoob et al., "High-speed two-dimensional laser scanner based on Bragg grating stored in photothermorefractive glass", Applied Optics, Sep. 10, 2003, vol. 42, No. 26, pp. 5251-5262.
Yaroshchuk et al., "Stabilization of liquid crystal photoaligning layers by reactive mesogens", Applied Physics Letters, Jul. 14, 2009, vol. 95, pp. 021902-1-021902-3.
Ye, "Three-dimensional Gradient Index Optics Fabricated in Diffusive Photopolymers", Thesis, Department of Electrical, Computer and Energy Engineering, University of Colorado, 2012, 224 pgs.
Yemtsova et al., "Determination of liquid crystal orientation in holographic polymer dispersed liquid crystals by linear and non-linear optics", Journal of Applied Physics, Oct. 13, 2008, vol. 104, pp. 073115-1-073115-4.
Yeralan et al., "Switchable Bragg grating devices for telecommunications applications", Opt. Eng., Aug. 2012, vol. 41, No. 8, pp. 1774-1779.
Yokomori, "Dielectric surface-relief gratings with high diffraction efficiency", Applied Optics, Jul. 15, 1984, vol. 23; No. 14, pp. 2303-2310.
Yoshida et al., "Nanoparticle-Dispersed Liquid Crystals Fabricated by Sputter Doping", Adv. Mater., 2010, vol. 22, pp. 622-626.
Youcef et al., "Phase Behavior of Poly(N-Butyl Acrylate) and Poly(2-Ethylhexyl Acrylate) in Nematic Liquid Crystal E7", Macromol. Symp. 2011, vol. 303, pp. 10-16, doi: 10.1002/masy.201150502.
Zeller et al., "Laminated Air Structured and Fluid Infiltrated Polymer Waveguides", in IEEE Photonics Technology Letters, Nov. 2, 2011, vol. 23, Issue: 21, pp. 1564-1566, first published Aug. 12, 2011, DOI: 10.1109/LPT.2011.2164396.
Zhang et al., "Dynamic Holographic Gratings Recorded by Photopolymerization of Liquid Crystalline Monomers", J. Am. Chem. Soc., 1994, vol. 116, pp. 7055-7063.
Zhang et al., "Switchable Liquid Crystalline Photopolymer Media for Holography", J. Am. Chem. Soc., 1992, vol. 114, pp. 1506-1507.
Zhao et al., "Designing Nanostructures by Glancing Angle Deposition", Proc. of SPIE, Oct. 27, 2003, vol. 5219, pp. 59-73.
Zhao et al., "Diffusion Model of Hologram Formation in Dry Photopolymer Materials", Journal of Modern Optics, 1994. vol. 41, No. 10, pp. 1929-1939, https://doi.org/10.1080/09500349414551831.
Zhao et al., "Extension of a diffusion model for holographic photopolymers", Journal of Modern Optics, 1995, vol. 42, No. 12, pp. 2571-2573, https://doi.org/10.1080/713824349.
Zheng et al., "Holographic Polymer-Dispersed Liquid Crystal Grating with Low Scattering Losses", Liquid Crystals, Mar. 2012, vol. 39, Issue 3, pp. 387-391, , http://dx.doi.org/10.1080/02678292.2012.656716.
Zlębacz, "Dynamics of nano and micro objects in complex liquids", Ph.D. dissertation, Institute of Physical Chemistry of the Polish Academy of Sciences, Warsaw 2011, 133 pgs.
Zou et al., "Functionalized nano interdigitated electrodes arrays on polymer with integrated microfluidics for direct bio-affinity sensing using impedimetric measurement", Sensors and Actuators A, Jan. 16, 2007, vol. 136, pp. 518-526, doi:10.1016/j.sna.2006.12.006.
Zyga, "Liquid crystals controlled by magnetic fields may lead to new optical applications", Nanotechnology, Nanophysics, Retrieved from http://phys.org/news/2014-07-liquid-crystals-magnetic-fields-optical.html, Jul. 9, 2014, 3 pgs.
"Secondary Optics Design Considerations for SuperFlux LEDs", Lumileds, application brief AB20-5, Sep. 2002, 23 pgs.
"Solid-State Optical Mouse Sensor with Quadrature Outputs", IC Datasheet, UniqueICs, Jul. 15, 2004, 11 pgs.
"SVGA TransparentVLSITM Microdisplay Evaluation Kit", Radiant Images, Inc., Product Data Sheet, 2003, 3 pgs.
"Technical Data Sheet LPR1", Luminus Devices, Inc., Luminus Projection Chipset, Release 1, Preliminary, Revision B, Sep. 21, 2004, 9 pgs.
"The Next Generation of TV", SID Information Display, Nov./Dec. 2014, vol. 30, No. 6, 56 pgs.
"Thermal Management Considerations for SuperFlux LEDs", Lumileds, application brief AB20-4, Sep. 2002, 14 pgs.
"USAF Awards SBG Labs an SBIR Contract for Wide Field of View HUD", Press Release, SBG Labs DigiLens, Apr. 2014, 2 pgs.
"UVTOP240", Roithner LaserTechnik GmbH, v 2.0, Jun. 24, 2013, 6 pgs.
"UVTOP310", Roithner LaserTechnik GmbH, v 2.0, Jun. 24, 2013, 6 pgs.
"Velodyne's HDL-64E: A High Definition Lidar Sensor for 3-D Applications", High Definition Lidar, white paper, Oct. 2007, 7 pgs.
"VerLASE Gets Patent for Breakthrough Color Conversion Technology That Enables Full Color MicroLED Arrays for Near Eye Displays", Cision PRweb, Apr. 28, 2015, Retrieved from the Internet http://www.prweb.com/releases/2015/04/prweb12681038.htm, 3 pgs.
"Webster's Third New International Dictionary 433", (1986), 3 pages.
"X-Cubes—Revisited for LCOS", Basid, RAF Electronics Corp. Rawson Optics, Inc., Oct. 24, 2002, 16 pgs.
Aachen, "Design of plastic optics for LED applications", Optics Colloquium 2009, Mar. 19, 2009, 30 pgs.
Abbate et al., "Characterization of LC-polymer composites for opto-electronic application", Proceedings of OPTOEL'03, Leganes-Madrid, Spain, Jul. 14-16, 2003, 4 pgs.
Al-Kalbani et al., "Ocular Microtremor laser speckle metrology", Proc. of SPIE, 2009, vol. 7176 717606-1, 12 pgs., doi:10.1117/12.808855.
Almanza-Workman et al., "Planarization coating for polyimide substrates used in roll-to-roll fabrication of active matrix backplanes for flexible displays", HP Laboratories, HPL-2012-23, Feb. 6, 2012, 12 pgs.
Amitai et al., "Visor-display design based on planar holographic optics", Applied Optics, vol. 34, No. 8, Mar. 10, 1995, pp. 1352-1356.
Amundson et al., "Morphology and electro-optic properties of polymer-dispersed liquid-crystal films", Physical Review E, Feb. 1997, vol. 55. No. 2, pp. 1646-1654.
An et al., "Speckle suppression in laser display using several partially coherent beams", Optics Express, Jan. 5, 2009, vol. 17, No. 1, pp. 92-103, first published Dec. 22, 2008.
Apter et al., "Electrooptical Wide-Angle Beam Deflector Based on Fringing-Field-Induced Refractive Inhomogeneity in a Liquid Crystal Layer", 23rd IEEE Convention of Electrical and Electronics Engineers in Israel, Sep. 6-7, 2004, pp. 240-243.
Arnold et al., "52.3: An Improved Polarizing Beamsplitter LCOS Projection Display Based on Wire-Grid Polarizers", Society for Information Display, Jun. 2001, pp. 1282-1285.
Ayras et al., "Exit pupil expander with a large field of view based on diffractive optics", Journal of the Society for Information Display, May 18, 2009, vol. 17, No. 8, pp. 659-664, DOI: 10.1889/JSID17.8.659.
Baets et al., "Resonant-Cavity Light-Emitting Diodes: a review", Proceedings of SPIE, 2003, vol. 4996, pp. 74-86.
Bayer et al., "Introduction to Helmet-Mounted Displays", 2016, pp. 47-108.
Beckel et al., "Electro-optic properties of thiol-ene polymer stabilized ferroelectric liquid crystals", Liquid Crystals, vol. 30, No. 11, Nov. 2003, pp. 1343-1350, DOI: 10.1080/02678290310001605910.
Bergkvist, "Biospeckle-based Study of the Line Profile of Light Scattered in Strawberries", Master Thesis, Lund Reports on Atomic Physics, LRAP-220, Lund 1997, pp. 1-62.
Bernards et al., "Nanoscale porosity in polymer films: fabrication and therapeutic applications", Soft Matter, Jan. 1, 2010, vol. 6, No. 8, pp. 1621-1631, doi:10.1039/B922303G.
Bhuvaneshwaran et al., "Spectral response of Bragg gratings in multimode polymer waveguides", Applied Optics, Dec. 1, 2017, vol. 56. No. 34, pp. 9573-9582, doi: 10.1364/AO.56.009573.
Bleha et al., "Binocular Holographic Waveguide Visor Display", SID Symposium Digest of Technical Papers, Holoeye Systems Inc., Jun. 2014, San Diego, CA, 4 pgs.
Bleha et al., "D-ILA Technology for High Resolution Projection Displays", Sep. 10, 2003, Proceedings, vol. 5080, 11 pgs., doi: 10.1117/12.497532.

(56) References Cited

OTHER PUBLICATIONS

Bone, "Design Obstacles for LCOS Displays in Projection Applications "Optics architectures for LCOS are still evolving"", Aurora Systems Inc., Bay Area SID Seminar, Mar. 27, 2001, 22 pgs.
Born et al., "Optics of Crystals", Principles of Optics 5th Edition 1975, pp. 705-707.
Bourzac, "Magic Leap Needs to Engineer a Miracle", Intelligent Machines, Jun. 11, 2015, 7 pgs.
Bowen et al., "Optimisation of interdigitated electrodes for piezoelectric actuators and active fibre composites", J Electroceram, Jul. 2006, vol. 16, pp. 263-269, DOI 10.1007/s10832-006-9862-8.
Bowley et al., "Variable-wavelength switchable Bragg gratings formed in polymer-dispersed liquid crystals", Applied Physics Letters, Jul. 2, 2001, vol. 79, No. 1, pp. 9-11, DOI: 10.1063/1.1383566.
Bronnikov et al., "Polymer-Dispersed Liquid Crystals: Progress in Preparation, Investigation and Application", Journal of Macromolecular Science Part B, published online Sep. 30, 2013, vol. 52, pp. 1718-1738, DOI: 10.1080/00222348.2013.808926.
Brown, "Waveguide Displays", Rockwell Collins, 2015, 11 pgs.
Bruzzone et al., "Compact, high-brightness LED illumination for projection systems", Journal of the Society for Information Display, vol. 17, No. 12, Dec. 2009, pp. 1043-1049, DOI: 10.1189/JSID17.12.1043.
Buckley, "Colour holographic laser projection technology for heads-up and instrument cluster displays", Conference: Proc. SID Conference 14th Annual Symposium on Vehicle Displays, Jan. 2007, 5 pgs.
Buckley, "Pixtronix DMS technology for head-up displays", Pixtronix, Inc., Jan. 2011, 4 pgs.
Buckley et al., "Full colour holographic laser projector HUD", Light Blue Optics Ltd., Aug. 10, 2015, 5 pgs.
Buckley et al., "Rear-view virtual image displays", in Proc. SID Conference 16th Annual Symposium on Vehicle Displays, Jan. 2009, 5 pgs.
Bunning et al., "Effect of gel-point versus conversion on the real-time dynamics of holographic polymer-dispersed liquid crystal (HPDLC) formation", Proceedings of SPIE—vol. 5213, Liquid Crystals VII, Iam-Choon Khoo, Editor, Dec. 2003, pp. 123-129.
Bunning et al., "Electro-optical photonic crystals formed in H-PDLCs by thiol-ene photopolymerization", American Physical Society, Annual APS, Mar. 3-7, 2003, abstract #R1.135.
Bunning et al., "Holographic Polymer-Dispersed Liquid Crystals (H-PDLCs)1", Annual Review of Material Science, 2000, vol. 30, pp. 83-115.
Bunning et al., "Morphology of Anisotropic Polymer Dispersed Liquid Crystals and the Effect of Monomer Functionality", Journal of Polymer Science: Part B: Polymer Physics, Jul. 30, 1997, vol. 35, pp. 2825-2833.
Busbee et al., "SiO2 Nanoparticle Sequestration via Reactive Functionalization in Holographic Polymer-Dispersed Liquid Crystals", Advanced Materials, Sep. 2009, vol. 21, pp. 3659-3662, DOI: 10.1002/adma.200900298.
Butler et al., "Diffractive Properties of Highly Birefringent Volume Gratings: Investigation", Journal of Optical Society of America, Feb. 2002, vol. 19, No. 2, pp. 183-189.
Cai et al., "Recent advances in antireflective surfaces based on nanostructure arrays", Materials Horizons, 2015, vol. 2, pp. 37-53, DOI: 10.1038/c4mh00140k.
Cameron, "Optical Waveguide Technology & Its Application in Head Mounted Displays", Proc. of SPIE, May 22, 2012, vol. 8383, pp. 83830E-1-83830E-11, doi: 10.1117/12.923660.
Cameron, "The Application of Holographic Optical Waveguide Technology to Q-Sight™ Family of Helmet Mounted Displays", Proc. of SPIE, 2009, vol. 7326, 11 pages, doi:10.1117/12.818581.
Caputo et al., "Policryps Composite Materials: Features and Applications", Advances in Composite Materials—Analysis of Natural and Man-Made Materials, www.intechopen.com, Sep. 2011, pp. 93-118.
Caputo et al., "Policryps Switchable Holographic Grating: A Promising Grating Electro-Optical Pixel for High Resolution Display Application", Journal of Display Technology, Mar. 2006, vol. 2, No. 1, pp. 38-51, DOI: 10.1109/JDT.2005.864156.
Caputo et al., "Policryps: a liquid crystal composed nano/microstructure with a wide range of optical and electro-optical applications", Journal of Optics A: Pure and Applied Optics, Jan. 15, 2009, vol. 11, No. 2, 13 pgs., doi:10.1088/1464-4258/11/2/024017.
Carclo Optics, "Guide to choosing secondary optics", Carclo Optics, Dec. 15, 2014, www.carclo-optics.com, 48 pgs.
Osredkar et al., "Planarization methods in IC fabrication technologies", Informacije MIDEM, 2002, vol. 32, 3, ISSN0352-9045, 5 pgs.
Ou et al., "A Simple LCOS Optical System (Late News)", Industrial Technology Research Institute/OES Lab. Q100/Q200, SID 2002, Boston, USA, 2 pgs.
Paolini et al., "High-Power LED Illuminators in Projection Displays", Lumileds, Aug. 7, 2001, 19 pgs.
Park et al., "Aligned Single-Wall Carbon Nanotube Polymer Composites Using an Electric Field", Journal of Polymer Science: Part B: Polymer Physics, Mar. 24, 2006, DOI 10.1002/polb.20823, pp. 1751-1762.
Park et al., "Fabrication of Reflective Holographic Gratings with Polyurethane Acrylates (PUA)", Current Applied Physics, Jun. 2002, vol. 2, pp. 249-252.
Peng et al., "Low Voltage Driven and Highly Diffractive Holographic Polymer Dispersed Liquid Crystals with Spherical Morphology", RSC Advances, 2017, vol. 7, pp. 51847-51857, doi: 10.1039/c7ra08949.
Pierantoni et al., "Efficient modeling of 3-D photonic crystals for integrated optical devices", IEEE Photonics Technology Letters, Feb. 2006, vol. 18, No. 2, pp. 319-321, DOI: 10.1109/LPT.2005.861991.
Plawsky et al., "Engineered nanoporous and nanostructured films", Materials Today, Jun. 2009, vol. 12, No. 6, pp. 36-45.
Pogue et al., "Electrically Switchable Bragg Gratings from Liquid Crystal/Polymer Composites", Applied Spectroscopy, 2000, vol. 54, Issue 1, pp. 12A-28A.
Potenza, "These smart glasses automatically focus on what you're looking at", The Verge, Voc Media, Inc., Jan. 29, 2017, https://www.theverge.com/2017/1/29/14403924/smart-glasses-automatic-focus-presbyopia-ces-2017, 6 pgs.
Presnyakov et al., "Electrically tunable polymer stabilized liquid-crystal lens", Journal of Applied Physics, Apr. 29, 2005, vol. 97, pp. 103101-1-103101-6.
Prokop et al., "Air-Suspended SU-8 Polymer Waveguide Grating Couplers", Journal of Lightwave Technology, Sep. 1, 2016, vol. 34, No. 17, pp. 3966-3971, DOI: 10.1109/JLT.2016.2593025.
Qi et al., "P-111: Reflective Display Based on Total Internal Reflection and Grating-Grating Coupling", Society for Information Display Digest, May 2003, pp. 648-651, DOI: 10.1889/1.1832359.
RAMóN, "Formation of 3D micro- and nanostructures using liquid crystals as a template", Technische Universiteit Eindhoven, Apr. 17, 2008, Thesis, 117 pgs., DOI:http://dx.doi.org/10.6100/IR634422.
Ramsey, "Holographic Patterning of Polymer Dispersed Liquid Crystal Materials for Diffractive Optical Elements", Thesis, The University of Texas at Arlington, Dec. 2006, 166 pgs.
Ramsey et al., "Holographically recorded reverse-mode transmission gratings in polymer-dispersed liquid crystal cells", Applied Physics B: Laser and Optics, Sep. 10, 2008, vol. 93, Nos. 2-3, pp. 481-489.
Reid, "Thin film silica nanocomposites for anti-reflection coatings", Oxford Advance Surfaces, www.oxfordsurfaces.com, Oct. 18, 2012, 23 pgs.
Riechert, "Speckle Reduction in Projection Systems", Dissertation, University Karlsruhe, 2009, 178 pgs.
Rossi et al., "Diffractive Optical Elements for Passive Infrared Detectors", Submitted to OSA Topical Meeting "Diffractive Optics and Micro-Optics", Quebec, Jun. 18-22, 2000, 3 pgs.
Roussel et al., "Photopolymerization Kinetics and Phase Behavior of Acrylate Based Polymers Dispersed Liquid Crystals", Liquid Crystals, 1998, vol. 24, Issue 4, pp. 555-561.
Sabel et al., "Simultaneous formation of holographic surface relief gratings and volume phase gratings in photosensitive polymer",

(56) References Cited

OTHER PUBLICATIONS

Materials Research Letters, May 30, 2019, vol. 7, No. 10, pp. 405-411, doi: 10.1080/21663831.2019.1621956.
Sagan et al., "Electrically Switchable Bragg Grating Technology for Projection Displays", Proc. SPIE. vol. 4294, Jan. 24, 2001, pp. 75-83.
Sakhno et al., "Deep surface relief grating in azobenzene-containing materials using a low-intensity 532 nm laser", Optical Materials: X, Jan. 23, 2019, 100006, pp. 3-7, doi: 10.1016/j.omx.2019.100006.
Saleh et al., "Fourier Optics: 4.1 Propagation of light in free space, 4.2 Optical Fourier Transform, 4.3 Diffraction of Light, 4.4 Image Formation, 4.5 Holography", Fundamentals of Photonics 1991, Chapter 4, pp. 108-143.
Saraswat, "Deposition & Planarization", EE 311 Notes, Aug. 29, 2017, 28 pgs.
Schechter et al., "Compact beam expander with linear gratings", Applied Optics, vol. 41, No. 7, Mar. 1, 2002, pp. 1236-1240.
Schreiber et al., "Laser display with single-mirror MEMS scanner", Journal of the SID 17/7, 2009, pp. 591-595.
Seiberle et al., "Photo-aligned anisotropic optical thin films", Journal of the SID 12/1, 2004, 6 pgs.
Serebriakov et al., "Correction of the phase retardation caused by intrinsic birefringence in deep UV lithography", Proc. of SPIE, May 21, 2010, vol. 5754, pp. 1780-1791.
Shi et al., "Design considerations for high efficiency liquid crystal decentered microlens arrays for steering light", Applied Optics, vol. 49, No. 3, Jan. 20, 2010, pp. 409-421.
Shriyan et al., "Analysis of effects of oxidized multiwalled carbon nanotubes on electro-optic polymer/liquid crystal thin film gratings", Optics Express, Nov. 12, 2010, vol. 18, No. 24, pp. 24842-24852.
Simonite, "How Magic Leap's Augmented Reality Works", Intelligent Machines, Oct. 23, 2014, 7 pgs.
Smith et al., "RM-Plus—Overview", Licrivue, Nov. 5, 2013, 16 pgs.
Sony Global, "Sony Releases the Transparent Lens Eyewear 'SmartEyeglass Developer Edition'", printed Oct. 19, 2017, Sony Global—News Releases, 5 pgs.
Steranka et al., "High-Power LEDs—Technology Status and Market Applications", Lumileds, Jul. 2002, 23 pgs.
Stumpe et al., "Active and Passive LC Based Polarization Elements", Mol. Cryst. Liq. Cryst., 2014, vol. 594: pp. 140-149.
Stumpe et al., "New type of polymer-LC electrically switchable diffractive devices—POLIPHEM", May 19, 2015, p. 97.
Subbarayappa et al., "Bistable Nematic Liquid Crystal Device", Jul. 30, 2009, 14 pgs.
Sun et al., "Effects of multiwalled carbon nanotube on holographic polymer dispersed liquid crystal", Polymers Advanced Technologies, Feb. 19, 2010, DOI: 10.1002/pat.1708, 8 pgs.
Sun et al., "Low-birefringence lens design for polarization sensitive optical systems", Proceedings of SPIE, 2006, vol. 6289, pp. 6289DH-1-6289DH-10, doi: 10.1117/12.679416.
Sun et al., "Transflective multiplexing of holographic polymer dispersed liquid crystal using Si additives", eXPRESS Polymer Letters, 2011, vol. 5, No. 1, pp. 73-81.
Sutherland et al., "Bragg Gratings in an Acrylate Polymer Consisting of Periodic Polymer-Dispersed Liquid-Crystal Planes", Chem. Mater., 1993, vol. 5, pp. 1533-1538.
Sutherland et al., "Electrically switchable volume gratings in polymer-dispersed liquid crystals", Applied Physics Letters, Feb. 28, 1994, vol. 64, No. 9, pp. 1074-1076.
Sutherland et al., "Enhancing the electro-optical properties of liquid crystal nanodroplets for switchable Bragg gratings", Proc. of SPIE, 2008, vol. 7050, pp. 705003-1-705003-9, doi: 10.1117/12.792629.
Sutherland et al., "Liquid crystal bragg gratings: dynamic optical elements for spatial light modulators", Hardened Materials Branch, Hardened Materials Branch, AFRL-ML-WP-TP-2007-514, Jan. 2007, Wright-Patterson Air Force Base, OH, 18 pgs.
Sutherland et al., "Phenomenological model of anisotropic volume hologram formation in liquid-crystal-photopolymer mixtures", Journal of Applied Physics, Jun. 30, 2004, vol. 96, No. 2, pp. 951-965, https://doi.org/10.1063/1.1762713.
Sutherland et al., "The physics of photopolymer liquid crystal composite holographic gratings", presented at SPIE: Diffractive and Holographic Optics Technology San Jose, CA, 1996, SPIE, vol. 2689, pp. 158-169.
Sweatt, "Achromatic triplet using holographic optical elements", Applied Optics, May 1977, vol. 16, No. 5, pp. 1390-1391.
Tahata et al., "Effects of Polymer Matrix on Electro-Optic Properties of Liquid Crystal Mixed With Polymer", Proc SPIE, Mar. 11, 1996, vol. 2651, pp. 101-106, doi: 10.1117/12.235342.
Talukdar, "Technology Forecast: Augmented reality", Changing the economics of Smartglasses, Issue 2, 2016, 5 pgs.
Ahmadi et al., "Influence of an Al2O3 surface coating on the response of polymeric waveguide sensors", Optics Exp, Oct. 16, 2017, vol. 25, No. 21, pp. 25102-25112.
Carothers, "Polymers and polyfunctionality", Transactions of the Faraday Society, Jan. 1, 1936, vol. 32, pp. 39-49, doi:10.1039/TF9363200039.
Chen et al, "Polarization rotators fabricated by thermally-switched liquid crystal alignments based on rubbed poly(N-vinyl carbazole) films", Optics Express, Apr. 11, 2011, vol. 19, No. 8, pp. 7553-7558, first published Apr. 5, 2011.
Cheng et al., "Design of an ultra-thin near-eye display with geometrical waveguide and freeform optics", Optics Express, Aug. 2014, 16 pgs., DOI:10.1364/OE.22.020705.
Chi et al., "Ultralow-refractive-index optical thin films through nanoscale etching of ordered mesoporous silica films", Optic Letters, May 1, 2012, vol. 37, No. 9, pp. 1406-1408, first published Apr. 19, 2012.
Chigrinov et al., "Photo-aligning by azo-dyes: Physics and applications", Liquid Crystals Today, Sep. 6, 2006, http://www.tandfonline.com/action/journalInformation?journalCode=tlcy20, 15 pgs.
Cho et al., "Electro-optic Properties of CO2 Fixed Polymer/Nematic LC Composite Films", Journal of Applied Polymer Science, Nov. 5, 2000, vol. 81, Issue 11, pp. 2744-2753.
Cho et al., "Optimization of Holographic Polymer Dispersed Liquid Crystals for Ternary Monomers", Polymer International, Nov. 1999, vol. 48, pp. 1085-1090.
Colegrove et al., "P-59: Technology of Stacking HPDLC for Higher Reflectance", SID 00 Digest, May 2000, pp. 770-773.
Crawford, "Electrically Switchable Bragg Gratings", Optics & Photonics News, Apr. 2003, pp. 54-59.
Cruz-Arreola et al., "Diffraction of beams by infinite or finite amplitude-phase gratings", Investigacio' N Revista Mexicana De Fi'sica, Feb. 2011, vol. 57, No. 1, pp. 6-16.
Dabrowski, "High Birefringence Liquid Crystals", Crystals, Sep. 3, 2013, vol. 3, No. 3, pp. 443-482, doi:10.3390/cryst3030443.
Dainty, "Some statistical properties of random speckle patterns in coherent and partially coherent illumination", Optica Acta, Mar. 12, 1970, vol. 17, No. 10, pp. 761-772.
Date, "Alignment Control in Holographic Polymer Dispersed Liquid Crystal", Journal of Photopolymer Science and Technology, Nov. 2, 2000, vol. 13, No. 2, pp. 289-294.
Date et al., "52.3: Direct-viewing Display Using Alignment-controlled PDLC and Holographic PDLC", Society for Information Display Digest, May 2000, pp. 1184-1187, DOI: 10.1889/1.1832877.
Date et al., "Full-color reflective display device using holographically fabricated polymer-dispersed liquid crystal (HPDLC)", Journal of the SID, 1999, vol. 7, No. 1, pp. 17-22.
De Bitetto, "White light viewing of surface holograms by simple dispersion compensation", Applied Physics Letters, Dec. 15, 1966, vol. 9, No. 12, pp. 417-418.
De Sarkar et al., "Effect of Monomer Functionality on the Morphology and Performance of Holographic Transmission Gratings Recorded on Polymer Dispersed Liquid Crystals", Macromolecules, 2003, vol. 36, No. 3, pp. 630-638.
Developer World, "Create customized augmented reality solutions", printed Oct. 19, 2017, LMX-001 holographic waveguide display, Sony Developer World, 3 pgs.

(56) References Cited

OTHER PUBLICATIONS

Dhar et al., "Recording media that exhibit high dynamic range for digital holographic data storage", Optics Letters, Apr. 1, 1999, vol. 24, No. 7, pp. 487-489.
Domash et al., "Applications of switchable Polaroid holograms", SPIE Proceedings, vol. 2152, Diffractive and Holographic Optics Technology, Jan. 23-29, 1994, Los Angeles, CA, pp. 127-138, ISBN: 0-8194-1447-6.
Doolittle, "Studies in Newtonian Flow. II. The Dependence of the Viscosity of Liquids on Free-Space", Journal of Applied Physics, 1951, vol. 22, Issue 12, pp. 1471-1475, published online Apr. 29, 2004, https://doi.org/10.1063/1.1699894.
Drake et al., "Waveguide Hologram Fingerprint Entry Device", Optical Engineering, Sep. 1996, vol. 35, No. 9, pp. 2499-2505.
Drevensek-Olenik et al., "In-Plane Switching of Holographic Polymer-Dispersed Liquid Crystal Transmission Gratings", Mol. Cryst. Liq. Cryst., 2008, vol. 495, pp. 177/[529]-185/[537], DOI: 10.1080/15421400802432584.
Drevensek-Olenik et al., "Optical diffraction gratings from polymer-dispersed liquid crystals switched by interdigitated electrodes", Journal of Applied Physics, Dec. 1, 2004, vol. 96, No. 11, pp. 6207-6212, DOI: 10.1063/1.1807027.
Ducharme, "Microlens diffusers for efficient laser speckle generation", Optics Express, Oct. 29, 2007, vol. 15, No. 22, pp. 14573-14579.
Duong et al., "Centrifugal Deposition of Iron Oxide Magnetic Nanorods for Hyperthermia Application", Journal of Thermal Engineering, Yildiz Technical University Press, Istanbul, Turkey, Apr. 2015, vol. 1, No. 2, pp. 99-103.
Escuti et al., "Holographic photonic crystals", Society of Photo-Optical Instrumentation Engineers, Sep. 2004, vol. 43, No. 9, pp. 1973-1987, DOI: 10.1117/1.1773773.
Fattal et al., "A multi directional backlight for a wide-angle glasses-free three-dimensional display", Nature, Mar. 21, 2012, vol. 495, pp. 348-351.
Flory, "Molecular size distribution in three-dimensional polymers. I. Gelation", J. Am. Chem. Soc., Nov. 1941, vol. 63, pp. 3083-3090.
Fontecchio et al., "Spatially Pixelated Reflective Arrays from Holographic Polymer Dispersed Liquid Crystals", SID 00 Digest, May 2000, pp. 774-776.
Forman et al., "Materials development for PhotoINhibited Super-Resolution (PINSR) lithography", Proc. of SPIE, 2012, vol. 8249, pp. 824904-1-824904-9, doi: 10.1117/12.908512.
Forman et al., "Radical diffusion limits to photoinhibited super-resolution lithography", Phys. Chem. Chem. Phys., May 31, 2013, vol. 15, pp. 14862-14867, DOI: 10.1039/c3cp51512.
Friedrich-Schiller, "Spatial Noise and Speckle", Version 1.12.2011, Dec. 2011, Abbe School of Photonics, Jena, Germany, 27 pgs.
Fries et al., "Real-time beam shaping without additional optical elements", Light Science & Applications, Jun. 20, 2018, vol. 7, No. 18, doi: 10.1038/s41377-018-0014-0.
Fuh et al., "Thermally and Electrically Switchable Gratings Based Upon the Polymer-Balls Type Polymer-Dispersed Liquid Crystal Films", Appl. Phys. vol. 41, No. 22, Aug. 1, 2002, pp. 4585-4589.
Fujii et al., "Nanoparticle-polymer-composite volume gratings incorporating chain-transfer agents for holography and slow-neutron optics", Optics Letters, Apr. 25, 2014, vol. 39, Issue 12, 5 pgs.
Funayama et al., "Proposal of a new type thin film light-waveguide display device using", The International Conference on Electrical Engineering, 2008, No. P-044, 5 pgs.
Gabor, "Laser Speckle and its Elimination", BM Research and Development, Eliminating Speckle Noise, Sep. 1970, vol. 14, No. 5, pp. 509-514.
Gardiner et al., "Bistable liquid-crystals reduce power consumption for high-efficiency smart glazing", SPIE, 2009, 10.1117/2.1200904.1596, 2 pgs.
Gerritsen et al., "Application of Kogelnik's two-wave theory to deep, slanted, highly efficient, relief transmission gratings", Applied Optics, Mar. 1, 1991, vol. 30; No. 7, pp. 807-814.
Giancola, "Holographic Diffuser, Makes Light Work of Screen Tests", Photonics Spectra, 1996, vol. 30, No. 8, pp. 121-122.
Golub et al., "Bragg properties of efficient surface relief gratings in the resonance domain", Optics Communications, Feb. 24, 2004, vol. 235, pp. 261-267, doi: 10.1016/j.optcom.2004.02.069.
Goodman, "Introduction to Fourier Optics", Second Edition, Jan. 1996, 457 pgs.
Goodman, "Some fundamental properties of speckle", J. Opt. Soc. Am., Nov. 1976, vol. 66, No. 11, pp. 1145-1150.
Goodman, "Statistical Properties of Laser Speckle Patterns", Applied Physics, 1975, vol. 9, Chapter 2, Laser Speckle and Related Phenomena, pp. 9-75.
Goodman et al., "Speckle Reduction by a Moving Diffuser in Laser Projection Displays", The Optical Society of America, 2000, 15 pgs.
Guldin et al., "Self-Cleaning Antireflective Optical Coatings", Nano Letters, Oct. 14, 2013, vol. 13, pp. 5329-5335.
Guo et al., "Analysis of the effects of viscosity, volume, and temperature in photopolymer material for holographic applications", Proc. SPIE, May 2013, vol. 8776, pp. 87760J-1-87760-J15, DOI:10.1117/12.2018330.
Guo et al., "Review Article: A Review of the Optimisation of Photopolymer Materials for Holographic Data Storage", Physics Research International, vol. 2012, Article ID 803439, Academic Editor: Sergi Gallego, 16 pages, http://dx.doi.org/10.1155/2012/803439, May 4, 2012.
Han et al., "Study of Holographic Waveguide Display System", Advanced Photonics for Communications, 2014, 4 pgs.
Harbers et al., "I-15.3: LED Backlighting for LCD-HDTV", Journal of the Society for Information Display, 2002, vol. 10, No. 4, pp. 347-350.
Harbers et al., "Performance of High Power LED Illuminators in Color Sequential Projection Displays", Lumileds Lighting, 2007, 4 pgs.
Harbers et al., "Performance of High Power LED Illuminators in Color Sequential Projection Displays", Lumileds, Aug. 7, 2001, 11 pgs.
Harbers et al., "Performance of High-Power LED illuminators in Projection Displays", Proc. Int. Disp. Workshops, Japan. vol. 10, 2003, pp. 1585-1588.
International Search Report for PCT/GB2016/000003, Completed by the European Patent Office May 31, 2016, 6 pgs.
International Search Report for PCT/GB2016/000005, completed by the European Patent Office on May 27, 2016, 4 pgs.
International Search Report for PCT/GB2016/000014, completed by the European Patent Office on Jun. 27, 2016, 4 pgs.
International Search Report for PCT/GB2016/000051, Completed Aug. 11, 2016, 3 Pgs.
Written Opinion for International Application No. PCT/GB2010/001982, search completed Feb. 24, 2011, mailed Mar. 8, 2011, 6 pgs.
Written Opinion for International Application No. PCT/GB2011/000349, completed Aug. 17, 2011, mailed Aug. 25, 2011, 9 pgs.
Written Opinion for International Application No. PCT/GB2012/000331, completed Aug. 29, 2012, mailed Sep. 6, 2012, 7 pgs.
Written Opinion for International Application No. PCT/GB2012/000677, completed Dec. 10, 2012, mailed Dec. 17, 2012, 4 pgs.
Written Opinion for International Application No. PCT/GB2013/000005, search completed Jul. 16, 2013, mailed Jul. 24, 2013, 11 pgs.
Written Opinion for International Application No. PCT/GB2013/000273, completed Aug. 30, 2013, mailed Sep. 9, 2013, 7 pgs.
Written Opinion for International Application No. PCT/GB2014/000197, Search completed Jul. 31, 2014, Mailed Aug. 7, 2014, 6 Pgs.
Written Opinion for International Application No. PCT/GB2014/000295, search completed Nov. 18, 2014, mailed Jan. 5, 2015, 3 pgs.
Written Opinion for International Application No. PCT/GB2015/000203, completed Oct. 29, 2015, mailed Nov. 16, 2015, 7 pgs.
Written Opinion for International Application No. PCT/GB2015/000225, search completed Nov. 10, 2015, mailed Feb. 4, 2016, 7 pgs.

(56) References Cited

OTHER PUBLICATIONS

Written Opinion for International Application No. PCT/GB2015/000274, search completed Jan. 7, 2016, mailed Jan. 19, 2016, 7 pgs.
Written Opinion for International Application No. PCT/GB2016/000014, search completed Jun. 27, 2016, mailed Jul. 7, 2016, 6 pgs.
Written Opinion for International Application No. PCT/GB2016/000051, Search completed Aug. 11, 2016, Mailed Aug. 22, 2016, 6 Pgs.
Written Opinion for International Application No. PCT/GB2017/000040, search completed Jul. 10, 2017, mailed Jul. 18, 2017, 6 pgs.
Written Opinion for International Application PCT/GB2013/000210, completed Aug. 12, 2013, Mailed Aug. 20, 2013, 5 pgs.
Written Opinion for International Application PCT/GB2016/000003, completed May 31, 2016, mailed Aug. 12, 2016, 10 pgs.
Written Opinion for International Application PCT/GB2016/000005, search completed May 27, 2016, mailed Jun. 6, 2016, 6 pgs.
Google search: "digilens waveguide" [site visited Sep. 14, 2020], https://www.google.com/search?q=digilens+waveguide&sxsrf=ALeKk02RFwZAZ0vrlxVH0M_2fiXFkhW1 FA:1604777621684&source=lnms&tbm=isch&sa=X&ved=2ah UKEwjjyNXAlvHsAh U Rh HI EHTufCvsQ_AUoAnoECBwQBA&biw=1200&bih=1777.
Digi Lens: Waveguides, announced unknown, [online], [site visited Nov. 6, 2020]. Available from Internet, <URL: https://www.digilens.com/technology/waveguides/> (Year: 2020).
Google search: "eyewear display devices" [site visited Sep. 14, 2020], https://www.google.com/search?q=eyewear+display+devices&sxsrf=ALeKk01 WWfnOAgsQR_bhydJaYK3e37r J Lg:1604779001617&source=lnms&tbm=isch&sa=X&ved=2ah U KEwi99txSm_HsAhVaoH IEHawtD8QQ_AUoAnoECC8QBA&biw=1200&bih=1777.
Google search: "smart glasses" [site visited Sep. 14, 2020], https://www.google.com/search?q=smart+glasses&sxsrf=ALeKk01 KN 1wj23-NqP -KCnrcsUpCgxyKA:1604779046920&source=lnms&tbm=isch&sa=X&ved=2ah U KEwipkqPom_HsAhVKhXI EHQGFBp8Q_AUoBHoECCgQBg&biw=1200&bih=1777.
"Agilent ADNS-2051 Optical Mouse Sensor: Data Sheet", Agilent Technologies, Jan. 9, 2002, 40 pgs.
"Application Note—Moxtek ProFlux Polarizer use with LCOS displays", CRL Opto Limited, http://www.crlopto.com, 2003, 6 pgs.
"Application Note AN16: Optical Considerations for Bridgelux LED Arrays", BridgeLux, Jul. 31, 2010, 23 pgs.
"Application Note: Variable Attenuator for Lasers", Technology and Applications Center, Newport Corporation, www.newport.com, 2006, DS-08067, 6 pgs.
"Bae Systems to Unveil Q-Sight Family of Helmet-Mounted Display at AUSA Symposium", Released on Tuesday, Oct. 9, 2007, 1 pg.
"Beam Steering Using Liquid Crystals", Boulder Nonlinear Systems, Inc., info@bnonlinear.com, May 8, 2001, 4 pgs.
"BragGrate—Deflector: Transmitting Volume Bragg Grating for angular selection and magnification", 2015, www.OptiGrate.com.
"Cree XLamp XP-E LEDs", Cree, Inc., Retrieved from www.cree.com/Xlamp, CLD-DS18 Rev 17, 2013, 17 pgs.
"Desmodur N 3900", Bayer MaterialScience AG, Mar. 18, 2013, www.bayercoatings.com, 4 pgs.
"Digilens—Innovative Augmented Reality Display and Sensor Solutions for OEMs", Jun. 6, 2017, 31 pgs.
"Exotic Optical Components", Building Electro-Optical Systems, Making It All Work, Chapter 7, John Wiley & Sons, Inc., pp. 233-261.
"FHS Lenses Series", Fraen Corporation, www.fraen.com, Jun. 16, 2003, 10 pgs.
"FLP Lens Series for Luxeontm Rebel and Rebel ES LEDs", Fraen Corporation, www.fraensrl.com, Aug. 7, 2015, 8 pgs.
"Head-up Displays, See-through display for military aviation", BAE Systems, 2016, 3 pgs.
"Holder for Luxeon Rebel—Part No. 180", Polymer Optics Ltd., 2008, 12 pgs.
"LED 7-Segment Displays", Lumex, uk.digikey.com, 2003, UK031, 36 pgs.
"LED325W UVTOP UV LED with Window", Thorlabs, Specifications and Documentation, 21978-S01 Rev. A, Apr. 8, 2011, 5 pgs.
"Liquid Crystal Phases", Phases of Liquid Crystals, http://plc.cwru.edu/tutorial/enhanced/files/lc/phase, Retrieved on Sep. 21, 2004, 6 pgs.
"LiteHUD Head-up display", BAE Systems, 2016, 2 pgs.
"LiteHUD Head-up display infographic", BAE Systems, 2017, 2 pgs.
"Luxeon C: Power Light Source", Philips Lumileds, www.philipslumileds.com, 2012, 18 pgs.
"Luxeon Rebel ES: Leading efficacy and light output, maximum design flexibility", Luxeon Rebel ES Datasheet DS61 20130221, www.philipslumileds.com, 2013, 33 pgs.
"Mobile Display Report", Insight Media, LLC, Apr. 2012, vol. 7, No. 4, 72 pgs.
"Molecular Imprints Imprio 55", Engineering at Illinois, Micro + Nanotechnology Lab, Retrieved from https://mntl.illinois.edu/facilities/cleanrooms/equipment/Nano-Imprint.asp, Dec. 28, 2015, 2 pgs.
"Navy awards SGB Labs a contract for HMDs for simulation and training", Press releases, DigiLens, Oct. 2012, pp. 1-2.
"Optical measurements of retinal flow", Industrial Research Limited, Feb. 2012, 18 pgs.
"Osterhout Design Group Develops Next-Generation, Fully-integrated Smart Glasses Using Qualcomm Technologies", ODG, www.osterhoutgroup.com, Sep. 18, 2014, 2 pgs.
"Plastic has replaced glass in photochromic lens", www.plastemart.com, 2003, 1 page.
"Range Finding Using Pulse Lasers", Osram, Opto Semiconductors, Sep. 10, 2004, 7 pgs.
"Response time in Liquid-Crystal Variable Retarders", Meadowlark Optics, Inc., 2005, 4 pgs.
Li et al., "A low cost, label-free biosensor based on a novel double-sided grating waveguide coupler with sub-surface cavities", Sensors and Actuators B: Chemical, Jan. 2015, vol. 206, pp. 371-380, https://doi.org/10.1016/j.snb.2014.09.065.
Li et al., "Design and Optimization of Tapered Light Pipes", Proceedings vol. 5529, Nonimaging Optics and Efficient Illumination Systems, Sep. 29, 2004, doi: 10.1117/12.559844, 10 pgs.
Li et al., "Dual Paraboloid Reflector and Polarization Recycling Systems for Projection Display", Proceedings vol. 5002, Projection Displays IX, Mar. 28, 2003, doi: 10.1117/12.479585, 12 pgs.
Li et al., "Light Pipe Based Optical Train and its Applications", Proceedings vol. 5524, Novel Optical Systems Design and Optimization VII, Oct. 24, 2004, doi: 10.1117/12.559833, 10 pgs.
Li et al., "Novel Projection Engine with Dual Paraboloid Reflector and Polarization Recovery Systems", Wavien Inc., SPIE EI 5289-38, Jan. 21, 2004, 49 pgs.
Li et al., "Polymer crystallization/melting induced thermal switching in a series of holographically patterned Bragg reflectors", Soft Matter, Jul. 11, 2005, vol. 1, pp. 238-242.
Lin et al., "Ionic Liquids in Photopolymerizable Holographic Materials", in book: Holograms—Recording Materials and Applications, Nov. 9, 2011, 21 pgs.
Liu et al., "Effect of Surfactant on the Electro-Optical Properties of Holographic Polymer Dispersed Liquid Crystal Bragg Gratings", Optical Materials, 2005, vol. 27, pp. 1451-1455, available online Dec. 25, 2004, doi: 10.1016/j.optmat.2004.10.010.
Liu et al., "Holographic Polymer Dispersed Liquid Crystals" Materials, Formation and Applications, Advances in OptoElectronics, Nov. 30, 2008, vol. 2008, Article ID 684349, 52 pgs.
Liu et al., "Realization and Optimization of Holographic Waveguide Display System", Acta Optica Sinica, vol. 37, Issue 5, Issuing date—May 10, 2017, pp. 310-317.
Lorek, "Experts Say Mass Adoption of augmented and Virtual Reality is Many Years Away", Siliconhills, Sep. 9, 2017, 4 pgs.
Lougnot et al., "Polymers for holographic recording: VI. Some basic ideas for modelling the kinetics of the recording process", Pure and Applied Optics: Journal of the European Optical Society Part A, 1997, vol. 6, No. 2, pp. 225-245, https://doi.org/10.1088/0963-9659/6/2/007.

(56) References Cited

OTHER PUBLICATIONS

Lowenthal et al., "Speckle Removal by a Slowly Moving Diffuser Associated with a Motionless Diffuser", Journal of the Optical Society of America, Jul. 1971, vol. 61, No. 7, pp. 847-851.
Lu et al., "Polarization switch using thick holographic polymer-dispersed liquid crystal grating", Journal of Applied Physics, vol. 95, No. 3, Feb. 1, 2004, pp. 810-815.
Lu et al., "The Mechanism of electric-field-induced segregation of additives in a liquid-crystal host", Phys Rev E Stat Nonlin Soft Matter Phys., Nov. 27, 2012, 14 pgs.
Ma et al., "Holographic Reversed-Mode Polymer-Stabilized Liquid Crystal Grating", Chinese Phys. Lett., 2005, vol. 22, No. 1, pp. 103-106.
Mach et al., "Switchable Bragg diffraction from liquid crystal in colloid-templated structures", Europhysics Letters, Jun. 1, 2002, vol. 58, No. 5, pp. 679-685.
Magarinos et al., "Wide Angle Color Holographic infinity optics display", Air Force Systems Command, Brooks Air Force Base, Texas, AFHRL-TR-80-53, Mar. 1981, 100 pgs.
Marino et al., "Dynamical Behaviour of Policryps Gratings", Electronic-Liquid Crystal Communications, Feb. 5, 2004, 10 pgs.
Massenot et al., "Multiplexed holographic transmission gratings recorded in holographic polymer-dispersed liquid crystals: static and dynamic studies", Applied Optics, 2005, vol. 44, Issue 25, pp. 5273-5280.
Matay et al., "Planarization of Microelectronic Structures by Using Polyimides", Journal of Electrical Engineering, 2002, vol. 53, No. 3-4, pp. 86-90.
Mathews, "The LED FAQ Pages", Jan. 31, 2002, 23 pgs.
Matic, "Blazed phase liquid crystal beam steering", Proc. of the SPIE, 1994, vol. 2120, pp. 194-205.
Mcleod, "Axicons and Their Uses", Journal of the Optical Society of America, Feb. 1960, vol. 50, No. 2, pp. 166-169.
Mcmanamon et al., "A Review of Phased Array Steering for Narrow-Band Electrooptical Systems", Proceedings of the IEEE, Jun. 2009, vol. 97, No. 6, pp. 1078-1096.
Mcmanamon et al., "Optical Phased Array Technology", Proceedings of the IEEE, Feb. 1996, vol. 84, Issue 2, pp. 268-298.
Miller, "Coupled Wave Theory and Waveguide Applications", The Bell System Technical Journal, Short Hills, NJ, Feb. 2, 1954, 166 pgs.
Missinne et al., "Flexible thin polymer waveguide Bragg grating sensor foils for strain sensing", Proc. SPIE, 10101, Organic Photonic Materials and Devices, Feb. 16, 2017, https://doi.org/10.1117/12.2250823.
Moffitt, "Head-Mounted Display Image Configurations", retrieved from the internet on Dec. 19, 2014, dated May 2008, 25 pgs.
Moharam et al., "Diffraction characteristics of photoresist surface-relief gratings", Applied Optics, Sep. 15, 1984, vol. 23, pp. 3214-3220.
Mulik, "Adhesion Enhancement of Polymeric Films on Glass Surfaces by a Silane Derivative of Azobisisobutyronitrile (AIBN).", Polymer Preprints, American Chemical Society (ACS), Jan. 2008, 3 pgs.
Nair et al., "Enhanced Two-Stage Reactive Polymer Network Forming Systems", Polymer (Guildf). May 25, 2012, vol. 53, No. 12, pp. 2429-2434, doi:10.1016/j.polymer.2012.04.007.
Nair et al., "Two-Stage Reactive Polymer Network Forming Systems", Advanced Functional Materials, 2012, pp. 1-9, DOI: 10.1002/adfm.201102742.
Naqvi et al., "Concentration-dependent toxicity of iron oxide nanoparticles mediated by increased oxidative stress", International Journal of Nanomedicine, Dovepress, Nov. 13, 2010, vol. 5, pp. 983-989.
Natarajan et al., "Electro Optical Switching Characteristics of Volume Holograms in Polymer Dispersed Liquid Crystals", Journal of Nonlinear Optical Physics and Materials, 1997, vol. 5, No. 1, pp. 666-668.
Natarajan et al., "Electro-Optical Switching Characteristics of Volume Holograms in Polymer Dispersed Liquid Crystals", Journal of Nonlinear Optical Physics and Materials, Jan. 1996, vol. 5, No. 1, pp. 89-98.
Natarajan et al., "Holographic polymer dispersed liquid crystal reflection gratings formed by visible light initiated thiol-ene photopolymerization", Polymer, vol. 47, May 8, 2006, pp. 4411-4420.
Naydenova et al., "Low-scattering Volume Holographic Material", DIT PhD Project, http://www.dit.ie/ieo/, Oct. 2017, 2 pgs.
Neipp et al., "Non-local polymerization driven diffusion based model: general dependence of the polymerization rate to the exposure intensity", Optics Express, Aug. 11, 2003, vol. 11, No. 16, pp. 1876-1886.
Nielsen et al., "Grating Couplers for Fiber-to-Fiber Characterizations of Stand-Alone Dielectric Loaded Surface Plasmon Waveguide Components", Journal of Lightwave Technology, Oct. 1, 2012, vol. 30, No. 19, pp. 3118-3125, DOI: 10.1109/JLT.2012.2212418.
Nishikawa et al., "Mechanically and Light Induced Anchoring of Liquid Crystal on Polyimide Film", Mol. Cryst. Liq. Cryst., Aug. 1999, vol. 329, 8 pgs.
Nishikawa et al., "Mechanism of Unidirectional Liquid-Crystal Alignment on Polyimides with Linearly Polarized Ultraviolet Light Exposure", Applied Physics Letters, May 11, 1998, vol. 72, No. 19, 4 pgs.
Nordin et al., "Diffraction Properties of Stratified Volume Holographic Optical Elements", Journal of the Optical Society of America A., vol. 9, No. 12, Dec. 1992, pp. 2206-2217.
Ogiwara et al., "Temperature Dependence of Anisotropic Diffraction in Holographic Polymer-Dispersed Liquid Crystal Memory", Applied Optics, Sep. 10, 2013, vol. 52, No. 26, pp. 6529-6536.
Ogiwara et al., "Thermo-Driven Light Controller by Using Thermal Modulation of Diffraction Wavelength in Holographic Polymer Dispersed Liquid Crystal Grating", Proc. SPIE, Feb. 19, 2014, 9004, Article 90040Q, 8 pgs., doi: 10.1117/12.2039104.
Oh et al., "Achromatic diffraction from polarization gratings with high efficiency", Optic Letters, Oct. 15, 2008, vol. 33, No. 20, pp. 2287-2289.
Olson et al., "Templating Nanoporous Polymers with Ordered Block Copolymers", Chemistry of Materials, Web publication Nov. 27, 2007, vol. 20, pp. 869-890.
Ondax, Inc., "Volume Holographic Gratings (VHG)", 2005, 7 pgs.
Orcutt, "Coming Soon: Smart Glasses That Look Like Regular Spectacles", Intelligent Machines, Jan. 9, 2014, 4 pgs.
Osredkar, "A study of the limits of spin-on-glass planarization process", Informacije MIDEM, 2001, vol. 31, 2, ISSN0352-9045, pp. 102-105.
Extended European Search Report for European Application No. 20856729.7, Search completed Jul. 18, 2023, Mailed Jul. 28, 2023, 11 pgs.
International Preliminary Report on Patentability for International Application No. PCT/US2022/071007, Report issued Aug. 29, 2023, Mailed Sep. 14, 2023, 06 pgs.
Emoto et al., "Formation of Positive and Negative Anisotropic Holographic Gratings Depending on Recording Energy in Photoreactive Liquid Crystalline Copolymer Films", Applied Physics B ; Lasers and Optics, Mar. 31, 2012, vol. 107, No. 3, pp. 741-748, XP035071884, ISSN: 1432-0649, DOI:10.1007/S00340-012-4977-X.
Kawatsuki et al., "Surface Relief Formation with Molecular Orientation in Photoreactive Liquid Crystalline Polymer Film", Journal of Photopolymer Science and Technology, Aug. 15, 2006, vol. 19, No. 2, pp. 151-156, XP093064657, ISSN: 0914-9244, DOI: 10.2494/photopolymer.19.151.
International Search Report and Written Opinion for International Application No. PCT/US2023/074088, Search completed Jan. 17, 2024, Mailed Mar. 1, 2024, 9 Pgs.

\* cited by examiner

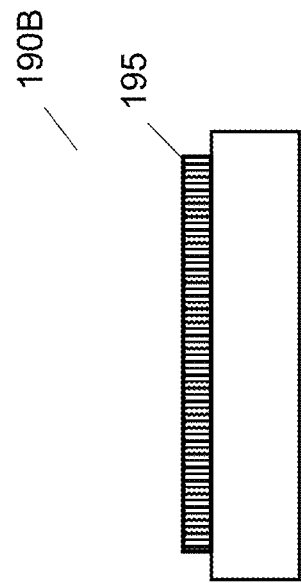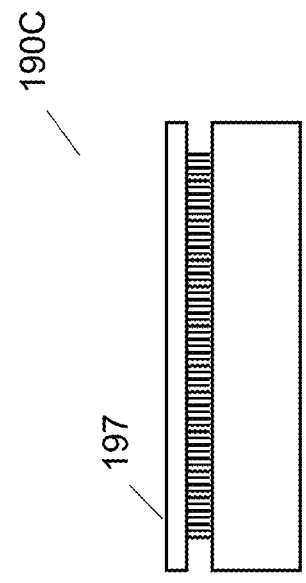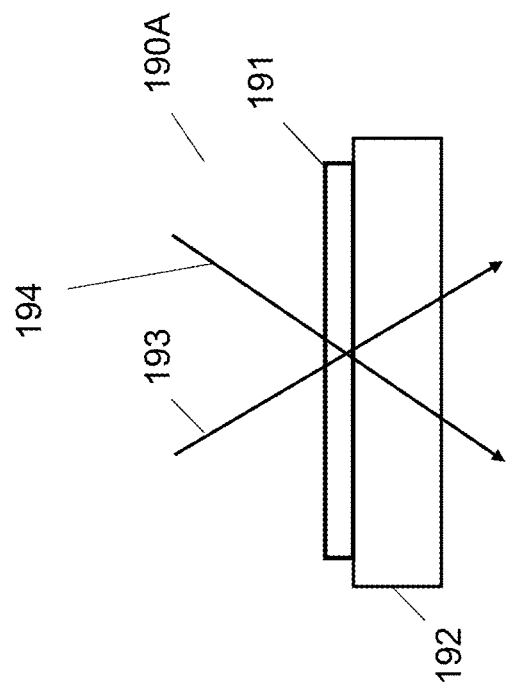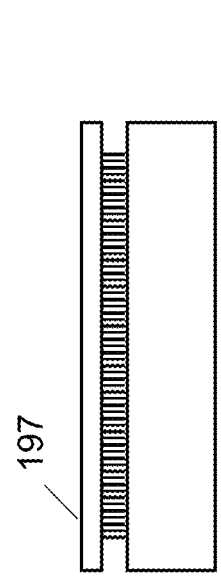

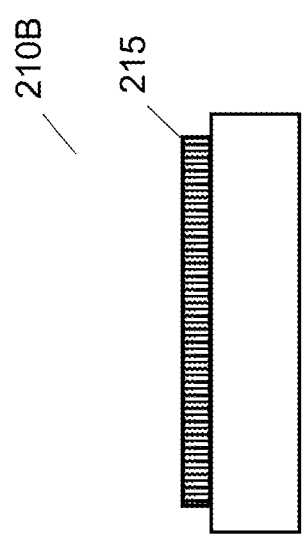
FIG. 4B
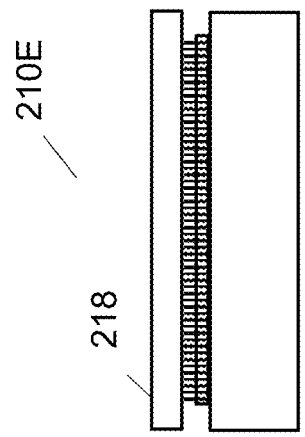
FIG. 4E
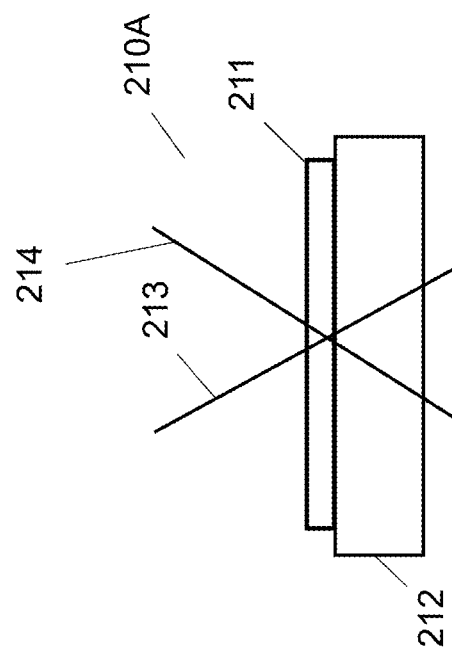
FIG. 4A
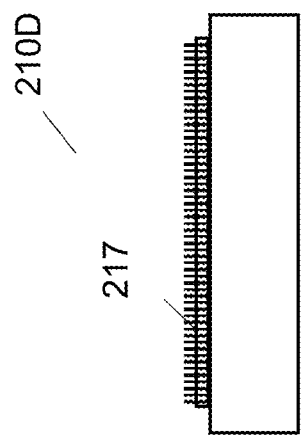
FIG. 4D
FIG. 4C

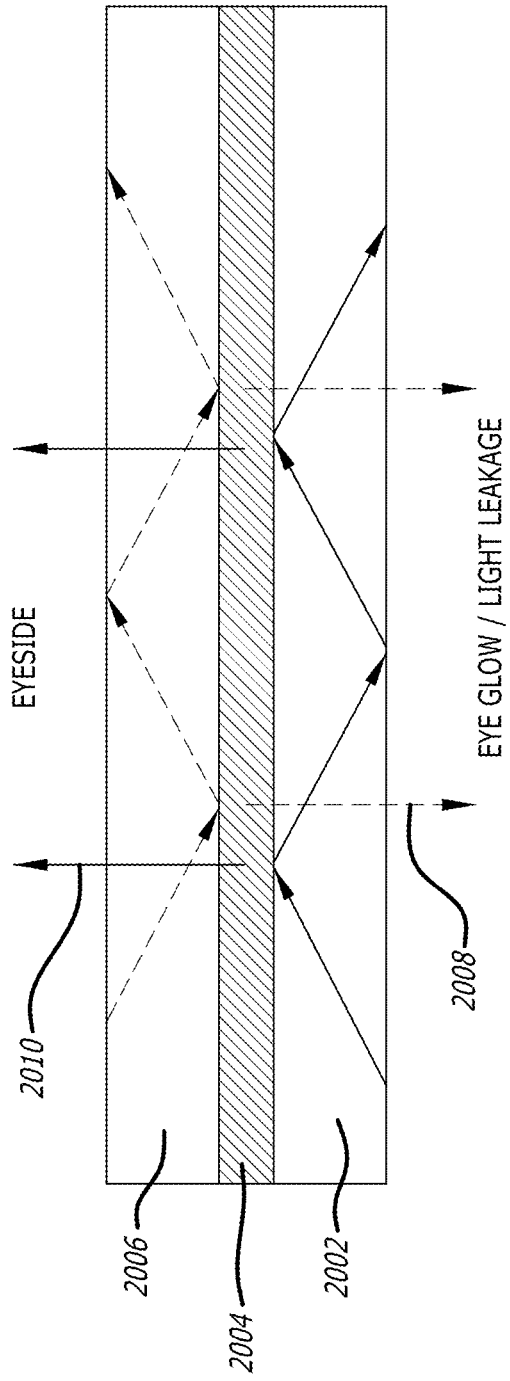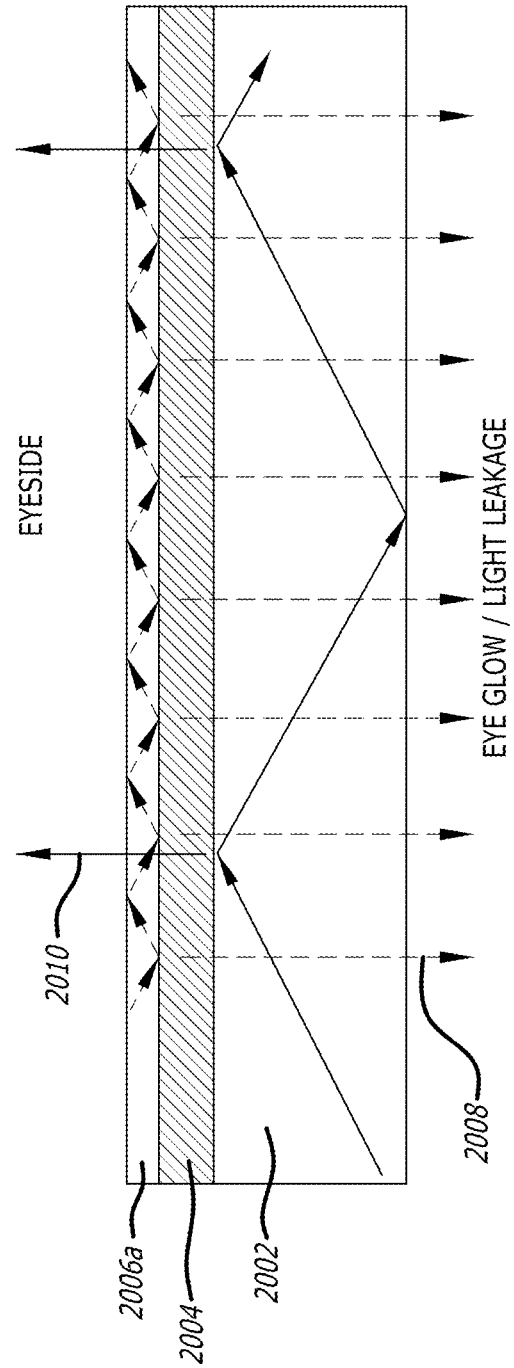

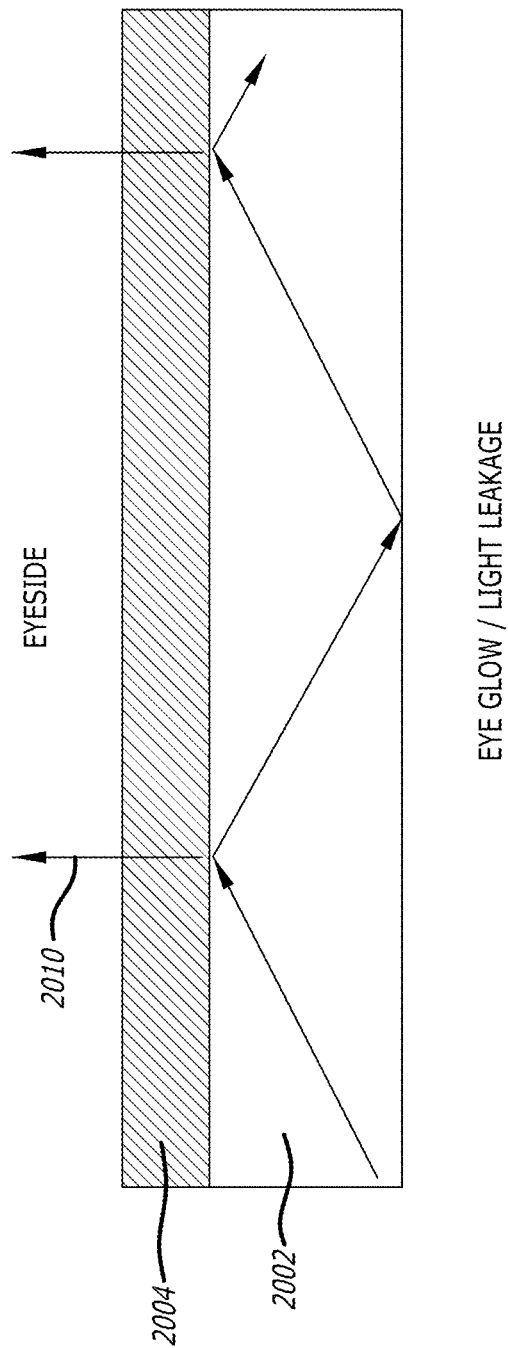

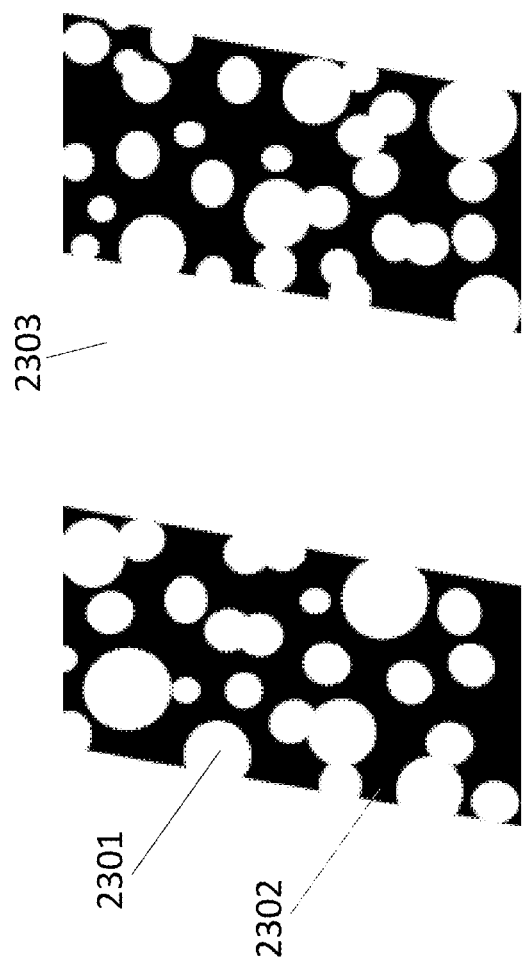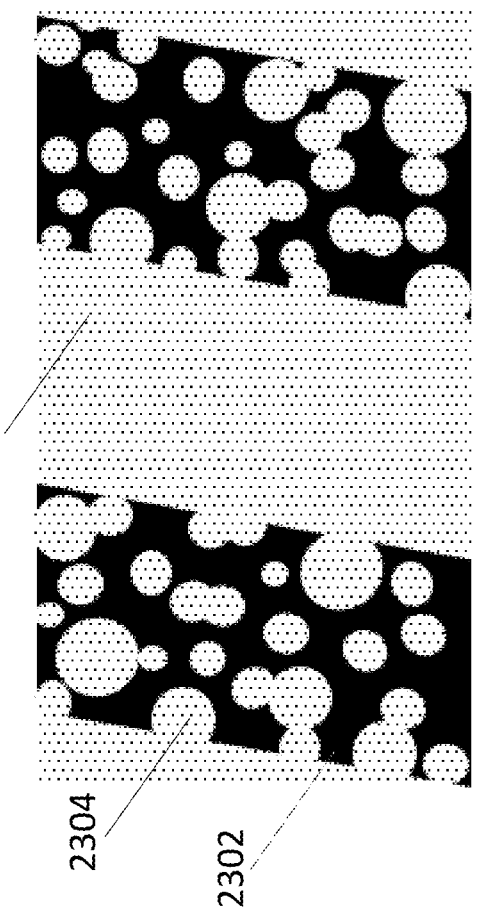
FIG. 23A
FIG. 23B

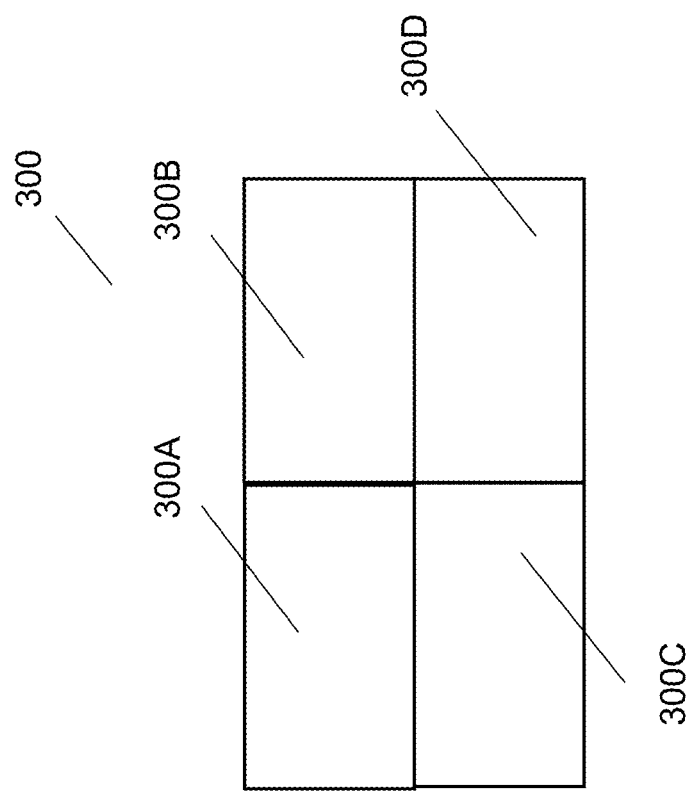

EVACUATED PERIODIC STRUCTURES AND METHODS OF MANUFACTURING

CROSS-REFERENCED APPLICATIONS

This application claims priority to U.S. Provisional Application 63/157,467 filed on Mar. 5, 2021, U.S. Provisional Application 63/174,401 filed on Apr. 13, 2021, and U.S. Provisional Application 63/223,311 filed on Jul. 19, 2021, the disclosures of which are incorporated by reference in their entirety.

FIELD OF THE DISCLOSURE

The present invention generally relates to waveguides and methods for fabricating waveguides and more specifically to waveguide displays containing gratings formed in a multi-component mixture from which one material component is removed and methods for fabricating said gratings.

BACKGROUND

Waveguides can be referred to as structures with the capability of confining and guiding waves (i.e., restricting the spatial region in which waves can propagate). One subclass includes optical waveguides, which are structures that can guide electromagnetic waves, typically those in the visible spectrum. Waveguide structures can be designed to control the propagation path of waves using a number of different mechanisms. For example, planar waveguides can be designed to utilize diffraction gratings to diffract and couple incident light into the waveguide structure such that the in-coupled light can proceed to travel within the planar structure via total internal reflection (TIR).

Fabrication of waveguides can include the use of material systems that allow for the recording of holographic optical elements within or on the surface of the waveguides. One class of such material includes polymer dispersed liquid crystal (PDLC) mixtures, which are mixtures containing photopolymerizable monomers and liquid crystals. A further subclass of such mixtures includes holographic polymer dispersed liquid crystal (HPDLC) mixtures. Holographic optical elements, such as volume phase gratings, can be recorded in such a liquid mixture by illuminating the material with two mutually coherent laser beams. During the recording process, the monomers polymerize, and the mixture undergoes a photopolymerization-induced phase separation, creating regions densely populated by liquid crystal (LC) micro-droplets, interspersed with regions of clear polymer. The alternating liquid crystal-rich and liquid crystal-depleted regions form the fringe planes of the grating.

Waveguide optics, such as those described above, can be considered for a range of display and sensor applications. In many applications, waveguides containing one or more grating layers encoding multiple optical functions can be realized using various waveguide architectures and material systems, enabling new innovations in near-eye displays for Augmented Reality (AR) and Virtual Reality (VR), compact Heads Up Displays (HUDs) for aviation and road transport, and sensors for biometric and laser radar (LIDAR) applications. As many of these applications are directed at consumer products, there is a growing requirement for efficient low cost means for manufacturing holographic waveguides in large volumes.

SUMMARY OF THE DISCLOSURE

Many embodiments are directed to polymer grating structures, their design, methods of manufacture, and materials.

Various embodiments are directed to a method for fabricating a periodic structure, the method including: providing a holographic mixture on a base substrate; sandwiching the holographic mixture between the base substrate and a cover substrate, where the holographic mixture forms a holographic mixture layer on the base substrate; applying holographic recording beams to the holographic mixture layer to form a holographic polymer dispersed liquid crystal periodic structure comprising alternating polymer rich regions and liquid crystal rich regions; and removing the cover substrate from the holographic polymer dispersed liquid crystal periodic structure, wherein the cover substrate has different properties than the base substrate to allow for the cover substrate to adhere to the unexposed holographic mixture layer while capable of being removed from the formed holographic polymer dispersed liquid crystal periodic structure after exposure.

Further, various embodiments are directed to a method for fabricating periodic structures, the method including: providing a first holographic mixture on a first base substrate; sandwiching the first holographic mixture between the first base substrate and a cover substrate, where the first holographic mixture forms a first holographic mixture layer on the first base substrate; applying holographic recording beams to the first holographic mixture layer to form a first holographic polymer dispersed liquid crystal periodic structure comprising alternating polymer rich regions and liquid crystal rich regions; removing the cover substrate from the holographic polymer dispersed liquid crystal periodic structure; providing a second holographic mixture on a second base substrate; sandwiching the second holographic mixture between the second base substrate and the cover substrate, wherein the second holographic mixture forms a second holographic mixture layer on the second base substrate; and applying holographic recording beams to the second holographic mixture layer to form a second holographic polymer dispersed liquid crystal periodic structure comprising alternating polymer rich regions and liquid crystal rich regions.

Further, various embodiments are directed to a device for fabricating a deep surface relief grating (SRG) including: a holographic mixture sandwiched between a base substrate and a cover substrate, where the holographic mixture is configured to form a holographic polymer dispersed liquid crystal grating comprising alternating polymer rich regions and liquid crystal rich regions when exposed to holographic recording beams, and where the base substrate and the cover substrate have different properties to allow the cover substrate to adhere to the unexposed holographic mixture layer while capable of being removed from the formed holographic polymer dispersed liquid crystal grating after exposure.

Further, various embodiments are directed to a waveguide device including: a waveguide supporting a polymer grating structure for diffracting light propagating in total internal reflection in said waveguide, where the polymer grating structure includes: a polymer regions; air gaps between adjacent portions of the polymer regions; and a coating disposed on the tops of the polymer regions and the tops of the waveguide.

Further, various embodiments are directed to a waveguide device including: a waveguide supporting a polymer grating structure for diffracting light propagating in total internal reflection in said waveguide, where the polymer grating structure includes: a polymer regions; air gaps between adjacent portions of the polymer regions; an optical layer disposed between the polymer regions and the waveguide;

and a coating disposed on the tops of the polymer regions and the tops of the optical layer.

Further, various embodiments are directed to a waveguide device including: a waveguide supporting a polymer grating structure for diffracting light propagating in total internal reflection in said waveguide, where the polymer grating structure includes: a polymer regions; air gaps between adjacent portions of the polymer regions; and an optical layer disposed between the polymer regions and the waveguide.

Further, various embodiments are directed to a waveguide device including: a waveguide supporting a polymer grating structure for diffracting light propagating in total internal reflection in said waveguide, where the polymer grating structure includes: a polymer regions; and air gaps between adjacent portions of the polymer regions, where the polymer regions and air gaps directly contact the waveguide.

Further, various embodiments are directed to a method for fabricating a grating, the method including: providing a mixture of monomer and a nonreactive material; providing a substrate; coating a layer of the mixture on a surface of the substrate; applying holographic recording beams to the layer to form a holographic polymer dispersed grating including alternating polymer rich regions and nonreactive material rich regions; removing at least a portion of the nonreactive material in the nonreactive material rich regions to form a polymer surface relief grating including alternating polymer regions and air regions; and applying a coating to the top surfaces of the polymer regions and the top surfaces of the substrate in the air regions.

Further, various embodiments are directed to a method for fabricating a grating, the method including: providing a mixture of monomer and a nonreactive material; providing a substrate; coating a layer of the mixture on a surface of the substrate; applying holographic recording beams to the layer to form a holographic polymer dispersed grating including alternating polymer rich regions and nonreactive material rich regions; removing at least a portion of the nonreactive material in the nonreactive material rich regions to form a polymer surface relief grating including alternating polymer regions and air regions, wherein an optical layer is disposed between the polymer regions and the substrate; and applying a coating to the top surfaces of the polymer regions and the top surfaces of the optical layer in the air regions.

Further, various embodiments are directed to a method for fabricating a grating, the method including: providing a mixture of monomer and a nonreactive material; providing a substrate; coating a layer of the mixture on a surface of the substrate; applying holographic recording beams to the layer to form a holographic polymer dispersed grating including alternating polymer rich regions and nonreactive material rich regions; removing at least a portion of the nonreactive material in the nonreactive material rich regions to form a polymer surface relief grating including alternating polymer regions and air regions; and performing a plasma ashing process to remove at least a portion of polymer from the polymer regions.

BRIEF DESCRIPTION OF THE DRAWINGS

The description will be more fully understood with reference to the following figures and data graphs, which are presented as exemplary embodiments of the invention and should not be construed as a complete recitation of the scope of the invention.

FIG. 1A conceptually illustrates a step of a method for fabricating a surface relief grating in which a mixture of monomer and liquid crystal deposited on a transparent substrate is exposed to holographic exposure beams in accordance with an embodiment of the invention.

FIG. 1B conceptually illustrates a step of a method for fabricating a surface relief grating from an HPDLC grating formed on a transparent substrate in accordance with an embodiment of the invention.

FIG. 1C conceptually illustrates a step of a method for fabricating a surface relief grating in which liquid crystal is removed from an HPDLC grating to form a polymer surface relief grating in accordance with an embodiment of the invention.

FIG. 1D conceptually illustrates a step of a method for covering a surface relief grating with a protective layer in accordance with an embodiment of the invention.

FIG. 4A conceptually illustrates a step of a method for fabricating a surface relief grating in which a mixture of monomer and liquid crystal deposited on a transparent substrate is exposed to holographic exposure beams in accordance with an embodiment of the invention.

FIG. 4B conceptually illustrates a step of a method for fabricating a surface relief grating from an HPDLC periodic structure formed on a transparent substrate in accordance with an embodiment of the invention.

FIG. 4C conceptually illustrates a step of a method for fabricating a surface relief grating in which liquid crystal is removed from an HPDLC periodic structure to form a polymer surface relief grating in accordance with an embodiment of the invention.

FIG. 4D conceptually illustrates a step of a method for fabricating a surface relief grating in which the surface relief grating is partially refilled with liquid crystal to form a hybrid surface relief-periodic structure in accordance with an embodiment of the invention.

FIG. 4E conceptually illustrates a step of a method for fabricating a surface relief grating in which a hybrid surface relief-periodic structure is covered with a protective layer in accordance with an embodiment of the invention.

FIGS. 21A-21C conceptually illustrate three embodiments of waveguides in which evanescent coupling into a grating can occur.

FIG. 23A illustrates a schematic representation of a grating in accordance with an embodiment of the invention.

FIG. 23B illustrates a schematic representation of a grating in accordance with an embodiment of the invention.

FIG. 39H conceptually illustrates a portion of a pixel pattern having rectangular elements with horizontally biased aspect ratios for use in an emissive display panel in accordance with an embodiment of the invention.

DETAILED DESCRIPTION

Figure 2:
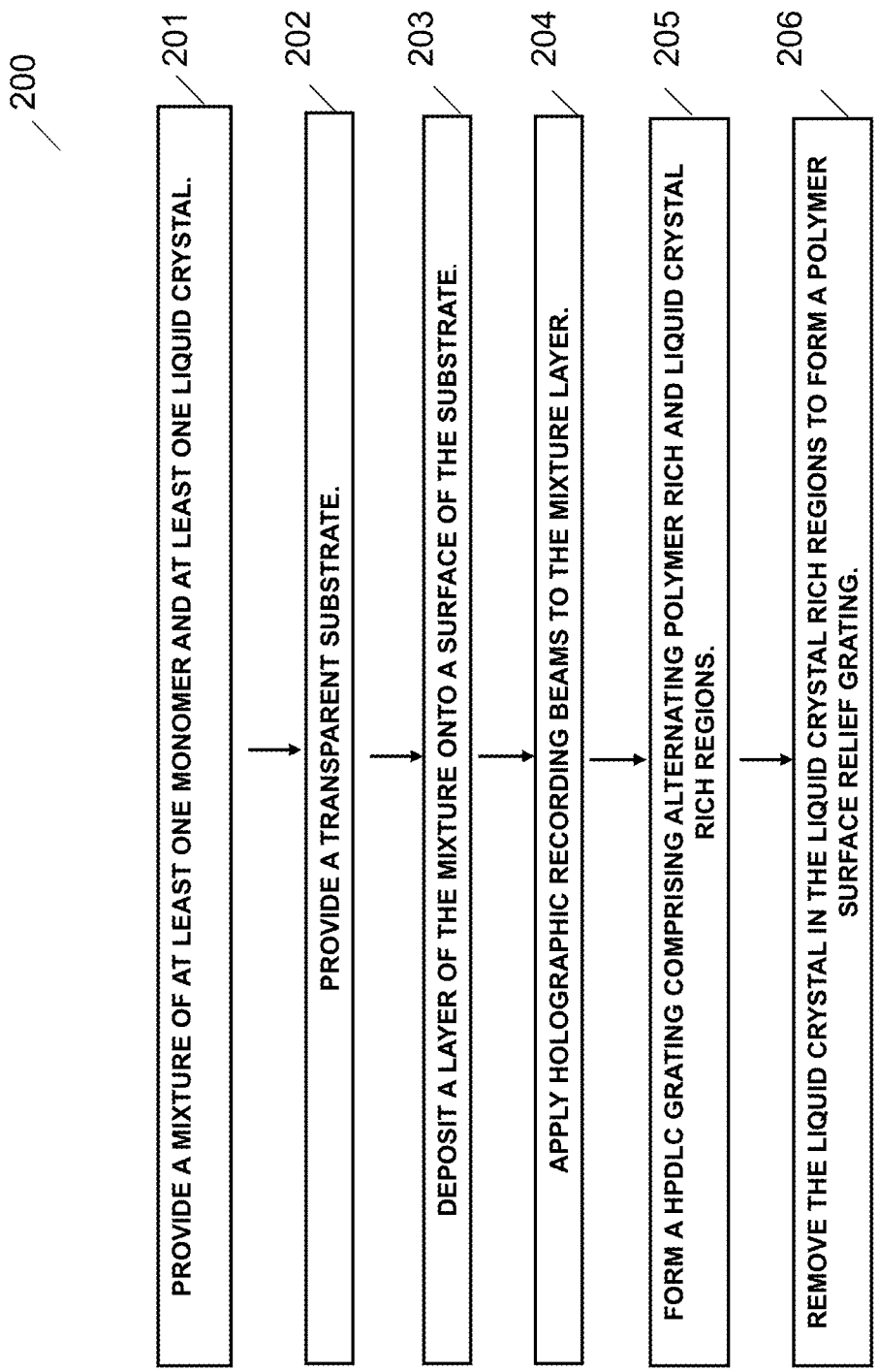
FIG. 2 is a flow chart conceptually illustrating a method for forming a polymer surface relief grating from an HPDLC grating formed on a transparent substrate in accordance with an embodiment of the invention.

There is a growing interest in the use of various periodic structure (e.g. gratings) on waveguides in order to provide a variety of functions. These periodic structure may include angle multiplexed gratings, color multiplexed gratings, fold gratings, dual interaction gratings, rolled K-vector gratings, crossed fold gratings, tessellated gratings, chirped gratings, gratings with spatially varying refractive index modulation, gratings having spatially varying grating thickness, gratings having spatially varying average refractive index, gratings with spatially varying refractive index modulation tensors, and gratings having spatially varying average refractive index tensors. In specific examples, gratings for diffraction of various polarizations of light (e.g. S-polarized light and P-polarized light) may be beneficial. It would be specifically advantageous to have a grating which diffracts either S-polarized light or P-polarized light. Specific applications for this technology include waveguide-based displays such as augmented reality displays and virtual reality displays. One example is input gratings which may be used to input one or both of S-polarized light or P-polarized light into the waveguide. However, in many cases, it would be advantageous to have a grating which diffracts either S-polarized light and P-polarized light. For example, waveguide displays using unpolarized light sources such as OLED light sources produce both S-polarized and P-polarized light and thus it would be advantageous to have gratings which can diffract both S-polarized and P-polarized light.

One specific class of gratings includes surface relief gratings (SRGs) which may be used to diffract either P-polarized light or S-polarized light. Another class of gratings are surface relief gratings (SRGs) which are normally P-polarization selective, leading to a 50% efficiency loss with unpolarized light sources such as organic light emitting diodes (OLEDs) and light emitting diodes (LEDs). Combining a mixture of S-polarization diffracting and P-polarization diffracting gratings may provide a theoretical 2× improvement over waveguides using P-diffracting gratings only. Thus, it would be advantageous to have a high efficiency S-polarization diffraction grating. In many embodiments, an S-polarization diffracting grating can be provided by a periodic structure formed in a holographic photopolymer. One periodic structure includes a grating such as a Bragg grating. In some embodiments, an S-polarization diffracting grating can be provided by a periodic structure formed in a holographic polymer dispersed liquid crystal (HPDLC) with birefringence altered using an alignment layer or other processes for realigning the liquid crystal (LC) directors. In several embodiments, an S-polarization diffracting periodic structure can be formed using liquid crystals, monomers, and other additives that naturally organize into S-diffracting periodic structures under phase separation. In some embodiments, these HPDLC periodic structures may form deep SRGs which have superior S-polarization diffraction efficiency.

Figure 8:
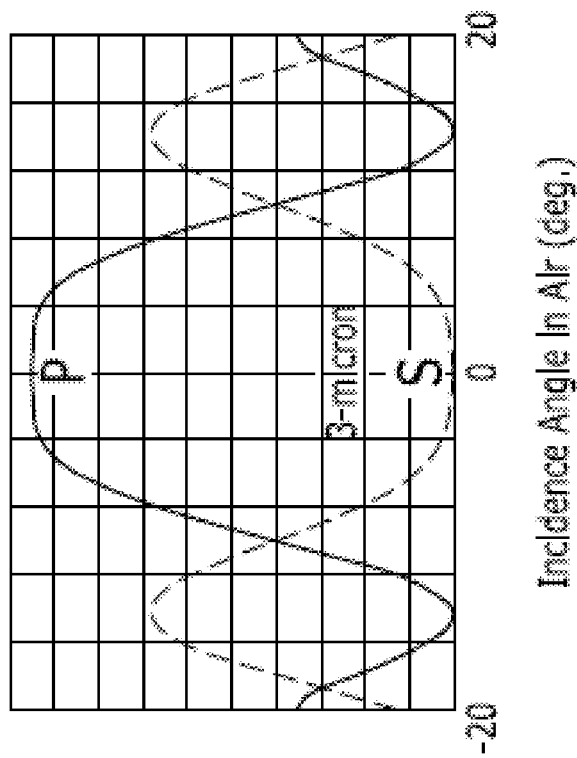
FIG. 8 is a graph showing calculated P-polarized and S-polarized diffraction efficiency versus incidence angle for a 3-micrometer thickness deep surface relief grating in accordance with an embodiment of the invention.

One class of deep SRGs are polymer-air SRGs or evacuated periodic structure (EPSs) which may exhibit high S-diffraction efficiency (up to 99%) and low P-diffraction efficiency and may be implemented as input gratings for waveguides. The EPSs may be evacuated Bragg gratings (EBGs). Such periodic structures can be formed by removing the liquid crystal from HPDLC periodic structures formed from holographic phase separation of a liquid crystal and monomer mixture. Deep SRGs formed by such a process typically have a thickness in the range 1-3 micrometers with a fringe spacing 0.35 to 0.80 micrometers. In some embodiments, the ratio of grating depth to fringe spacing may be 1:1 to 5:1. As can readily be appreciated, such gratings can be formed with different dimensions depending on the specific requirements of the given application. Examples of how the thickness of SRGs may yield different resultant diffraction efficiencies are described in connection with FIGS. 6-8.

In many embodiments, the condition for a deep SRGs is characterized by a high grating depth to fringe spacing ratio. In some embodiments, the condition for the formation of a deep SRGs is that the grating depth is approximately twice the grating period. Modelling such deep SRGs using the Kogelnik theory can give reasonably accurate estimates of diffraction efficiency, avoiding the need for more advanced modelling, which typically entails the numerical solution of Maxwell's equations. The grating depths that can be achieved using liquid crystal removal from HPDLC periodic structures greatly surpass those possible using conventional nanoimprint lithographic methods, which cannot achieve the conditions for deep SRGs (typically providing only 250-300 nm depth for grating periods 350-460 nm). (Pekka Äyräs, Pasi Saarikko, Tapani Levola, "Exit pupil expander with a large field of view based on diffractive optics", Journal of the SID 17/8, (2009), pp 659-664). It should be emphasized here that, although the S-polarization diffracting deep SRGs are emphasized within the present application, deep SRGs can, as will be discussed below, provide a range of polarization response characteristics depending on the thickness of the grating prescription and, in particular, the grating depth. As such, deep SRGs can be implemented in a variety of different applications.

The literature supports equivalence of deep SRGs and periodic structures. One reference (Kiyoshi Yokomori, "Dielectric surface-relief gratings with high diffraction efficiency" Applied Optics; Vol. 23; Issue 14; (1984); pp. 2303-2310), discloses the investigation of the diffraction properties of dielectric surface-relief gratings by solving Maxwell's equations numerically. The diffraction efficiency of a grating with a groove depth about twice as deep as the grating period was found to be comparable with the efficiency of a volume phase grating. The modelling by Yokomori predicted that dielectric surface-relief gratings interferometrically recorded in photoresist can possess a high diffraction efficiency of up to 94% (throughput efficiency 85%). The equivalence of deep SRGs and periodic structures is also discussed in another article by Golub (M. A. Golub, A. A. Friesem, L. Eisen "Bragg properties of efficient surface relief gratings in the resonance domain", Optics Communications; 235; (2004); pp 261-267). A further article by Gerritsen discusses the formation of Bragg-like SRGs in photoresist (Gerritsen H J, Thornton D K, Bolton S R; "Application of Kogelnik's two-wave theory to deep, slanted, highly efficient, relief transmission gratings" Applied Optics; Vol. 30; Issue 7; (1991); pp 807-814).

Many embodiments of this disclosure provide for methods of making SRGs such as deep SRGs that can offer very significant advantages over nanoimprint lithographic process particularly for slanted gratings. Periodic structures of any complexity can be made using interference or master and contact copy replication. In some embodiments, after removing the LC, the SRGs can be back filled with a material with different properties to the LC. This allows a periodic structure with modulation properties that are not limited by the grating chemistry needed for grating formation.

In some embodiments the backfill material may not be a LC material. In some embodiments, the backfill material may have a higher index of refraction than air which may increase the angular bandwidth of a waveguide. In several embodiments, the deep SRGs can be partially backfilled with LC to provide a hybrid SRG/periodic structure. Alternatively, in some embodiments, the refill step can be avoided by removing just a portion of the LC from the LC rich regions of the HPDLC to provide a hybrid SRG/periodic structure. The refill approach has the advantage that a different LC can be used to form the hybrid periodic structures. The materials can be deposited using an inkjet deposition process.

In some embodiments, the methods described herein may be used to create photonic crystals. Photonic crystals may be implemented to create a wide variety of diffracting structures including periodic structures such as Bragg gratings. Periodic structures may be used as diffraction gratings to provide functionality including but not limited to input gratings, output gratings, beam expansion gratings, diffract more than one primary color. A photonic crystal can be a three-dimensional lattice structure that can have diffractive capabilities not achievable with a basic periodic structures. Photonic crystals can include many structures including all 2-D and 3-D Bravais lattices. Recording of such structures may benefit from more than two recording beams.

In some embodiments, waveguides incorporating photonic crystals can be arranged in stacks of waveguides, each having a grating prescription for diffracting a unique spectral bandwidth. In many embodiments, a photonic crystal formed by liquid crystal extraction provide a deep SRG. In many embodiments, a deep SRG formed using a liquid crystal extraction process can typically have a thickness in the range 1-3 micron with a fringe spacing 0.35 micron to 0.80 micron. The fringe spacing may be a Bragg fringe spacing. In many embodiments, the condition for a deep SRG is characterized by a high grating depth to fringe spacing ratio. In some embodiments the condition for the formation of a deep SRG is that the grating depth can be approximately twice the grating period. It should be emphasized here that, although S-polarization diffracting deep SRGs are described in the present application, deep SRGs can, as will be discussed below, provide a range of polarization response characteristics depending on the thickness of the grating prescription and, in particular, the grating depth. Deep SRGs can also be used in conjunction with conventional Bragg gratings to enhance the color, uniformity and other properties of waveguide displays.

Deep SRGs have been fabricated in glassy monomeric azobenzene materials using laser holographic exposure (O. Sakhno, L. M. Goldenberg, M. Wegener, J. Stumpe, "Deep surface relief grating in azobenzene-containing materials using a low intensity 532 nm laser", Optical Materials: X, 1, (2019), 100006, pp 3-7. The Sakhno reference also discloses how SRGs can be recorded in a holographic photopolymer using two linearly orthogonally polarized laser beams.

The disclosure provides a method for making a surface relief grating that can offer very significant advantages over nanoimprint lithographic process particularly for slanted gratings. Periodic structures of any complexity can be made using interference or master and contact copy replication. In some embodiments after removing the LC the SRG can be back filled with a material with different properties to the LC. This allows a periodic structure with modulation properties that are not limited by the grating chemistry needed for grating formation. In some embodiments the SRGs can be partially backfilled with LC to provide a hybrid SRG/periodic structure. Alternatively, in some embodiments, the refill step can be avoided by removing just a portion of the LC from the LC rich regions of the HPDLC to provide a hybrid SRG/periodic structure. The refill approach has the advantage that a different LC can be used to form the hybrid grating. The materials can be deposited using an inkjet process. In some embodiments, the refill material may have a higher index of refraction than air which may increase diffraction efficiency of the periodic structure.

While this disclosure has been made in the context of fabricating deep SRGs, it is appreciated that many other grating structures may be produced using the techniques described herein. For example, any type of SRG including SRGs in which the grating depth is smaller than the grating frequency (e.g. Raman-Nath gratings) may be fabricated as well.

FIGS. 1A-1D illustrate a processing apparatus that can be used in a method for fabricating deep SRGs or EPSs in accordance with an embodiment. FIG. 1A conceptually illustrates an apparatus 190A that can be used in a step of a method for fabricating a surface relief grating in which a mixture 191 of monomer and liquid crystal deposited on a transparent substrate 192 is exposed to holographic exposure beams 193, 194, in accordance with an embodiment of the invention. The holographic exposure beams 193, 194 may be deep UV beams. In some examples, the mixture 191 may also include at least one of a photoinitiator, a coinitiator, a multifunctional thiol, adhesion promoter, surfactant, and/or additional additives.

The mixture 191 may include nanoparticles. The mixture 191 may include photoacids. The mixture 191 may be a monomer diluted with a non-reactive polymer. The mixture 191 may include more than one monomer. In some embodiments, the monomer may be isocyanate-acrylate based or thiolene based. In some embodiments, the liquid crystal may be a full liquid crystal mixture or a liquid crystal single. A liquid crystal single may only include a portion of a full liquid crystal mixture. Various examples, liquid crystal singles may include one or all of cyanobiphenyls, alkyl, alkoxy, cyanobiphenyls, and/or terphenyls. The liquid crystal mixture may be a cholesteric liquid crystal. The liquid crystal mixture may include chiral dopants which may control the grating period. The liquid crystal mixture may include photo-responsive and/or halogen bonded liquid crystals. In some embodiments, liquid crystal may be replaced with another substance that phase separates with the monomer during exposure to create polymer rich regions and substance rich regions. Advantageously, the substance and liquid crystal singles may be a cost-effective substitute to full liquid crystal mixtures which are removed at a later step as described below.

In some embodiments, the liquid crystal in the mixture 191 may have a different between an extraordinary refractive index and an ordinary refractive index of less than 0.01. In some embodiments, the liquid crystal in the mixture 191 may have a different between an extraordinary refractive index and an ordinary refractive index of less than 0.025. In some embodiments, the liquid crystal in the mixture 191 may have a different between an extraordinary refractive index and an ordinary refractive index of less than 0.05.

FIG. 1B conceptually illustrates an apparatus 190B that can be used in a step of a method for fabricating a surface relief grating from an HPDLC Bragg grating 195 formed on a transparent substrate using the holographic exposure beams, in accordance with an embodiment of the invention. The holographic exposure beams may transform the monomer into a polymer in some areas. The holographic exposure beams may include intersecting recording beams and include alternating bright and dark illumination regions. A polymerization-driven diffusion process may cause the diffusion of monomers and LC in opposite directions, with the monomers undergoing gelation to form polymer-rich regions (in the bright regions) and the liquid crystal becoming trapped in a polymer matrix to form liquid crystal rich regions (in the dark regions).

FIG. 1C conceptually illustrates an apparatus 190C that can be used in a step of a method for fabricating a deep polymer surface relief grating 196 or EPS in which liquid crystal is removed from an HPDLC periodic structure of FIG. 1B to form a polymer surface relief grating in accordance with an embodiment of the invention. Advantageously, a polymer surface relief grating 196 may include a large depth with a comparatively small grating period in order to form a deep SRG. The liquid crystal may be removed by washing with a solvent such as isopropyl alcohol (IPA). The solvent may be strong enough to wash away the liquid crystal but weak enough to maintain the polymer. In some embodiments, the solvent may be chilled below room temperature before washing the grating. FIG. 1D conceptually illustrates an apparatus 190D that can be used in a step of a method for fabricating a polymer surface relief grating in which the polymer surface relief grating is covered with a protective layer 197 in accordance with an embodiment of the invention.

FIG. 2 conceptually illustrates a method for forming deep SRGs from a HPDLC periodic structure formed on a transparent substrate in accordance with an embodiment of the invention. As shown, a method 200 of forming deep SRGs or EPSs is provided. Referring to the flow diagram, the method 200 includes providing (201) a mixture of at least one monomer and at least one liquid crystal. The at least one monomer may include an isocyanate-acrylate monomer or thiolene. For example, the mixture may include a liquid crystal and a thiolene based photopolymer. In some embodiments, the mixture may include a liquid crystal and an acrylate-based photopolymer. In some embodiments, the at least one liquid crystal may be a full liquid crystal mixture or may be a liquid crystal single which may include only a portion of the liquid crystal mixture such as a single component of the liquid crystal mixture. In some embodiments, the at least one liquid crystal may be substituted for a solution which phase separates with the monomer during exposure. The criteria for such a solution may include ability to phase separate with the monomer during exposure, ease of removal after curing and during washing, and ease of handing. Example substitute solutions include solvents, non-reactive monomers, inorganics, and nanoparticles.

Providing the mixture of the monomer and the liquid crystal may also include mixing one or more of the following with the at least one monomer and the liquid crystal: initiators such as photoinitiators or coinitiators, multifunctional thiol, dye, adhesion promoters, surfactants, and/or additional additives such as other cross linking agents. This mixture may be allowed to rest in order to allow the coinitiator to catalyze a reaction between the monomer and the thiol. The rest period may occur in a dark space or a space with red light (e.g. infrared light) at a cold temperature (e.g. 20° C.) for a period of approximately 8 hours. After resting, additional monomers may be mixed into the monomer. This mixture may be then strained or filtered through a filter with a small pore size (e.g. 0.45 μm pore size). After straining, this mixture may be stored at room temperature in a dark space or a space with red light before coating.

Next, a transparent substrate can be provided (202). In certain embodiments, the transparent substrate may be a glass substrate or a plastic substrate. In some embodiments, the transparent substrate may be a flexible substrate to facilitate roll to roll processing. In some embodiments, the EPS may be manufactured on a flexible substrate through a roll to roll process and then peeled off and adhered to a rigid substrate. In some embodiments, the EPS may be manufactured on a flexible substrate and a second flexible release layer may be peeled off and discarded which would leave the EPS on a flexible layer. The flexible layer may be then bonded to another rigid substrate.

A layer of the mixture can be deposited or coated (203) onto a surface of the substrate. The layer of mixture may be deposited using inkjet printing. In some embodiments, the mixture is sandwiched between the transparent substrate and another substrate using glass spacers to maintain internal dimensions. A non-stick coating may be applied to the other substrate before the mixture is sandwiched. The non-stick coating may include a fluoropolymer such as OPTOOL UD509 (produced by Daikin Chemicals), Dow Corning 2634, Fluoropel (produced by Cytonix), and EC200 (produced by PPG Industries, Inc). Holographic recording beams can be applied (204) to the mixture layer. holographic recording beams may be a two-beam interference pattern which may cause phase separation of the LC and the polymer. In response to the holographic recording beam, the liquid monomer changes to a solid polymer whereas the neutral, non-reactive substance (e.g. LC) diffuses during holographic exposure in response to a change in chemical potential driven by polymerization. While LC may be one implementation of the neutral, non-reactive substance, other substances may also be used. The substance and the monomer may form a miscible mixture prior to the holographic exposure and become immiscible upon holographic exposure.

After applying the holographic recording beams, the mixture may be cured. The curing process may include leaving the mixture under low-intensity white light for a period of time until the mixture fully cures. The low intensity white light may also cause a photo-bleach dye process to occur. Thus, a HPDLC periodic structure having alternating polymer rich and liquid crystal rich regions can be formed (205). In some embodiments, the curing process may occur in two hours or less. After curing, one of the substrates may be removed exposing the HPDLC periodic structure. Advantageously, the non-stick coating may allow the other substrate to be removed while the HPDLC periodic structure remaining.

HPDLC periodic structure may include alternating sections of liquid crystal rich regions and polymer regions. The liquid crystal in the liquid crystal rich regions can be removed (206) to form polymer surface relief gratings or EPSs which may be used as deep SRGs. The liquid crystal may be removed by gently immersing the grating into a solvent such as IPA. The IPA may be chilled and may be kept at a temperature lower than room temperature while the grating is immersed in the IPA. The periodic structure may be then removed from the solvent and dried. In some embodiments, the periodic structure is dried using a high flow air source such as compressed air. After the LC is removed from the periodic structure, a polymer-air surface relief grating is formed.

As shown in FIGS. 1A-1D, the formed surface relief grating can further be covered with a protective layer. In some instances, the protective layer may be a moisture and oxygen barrier with scratch resistance capabilities. In some instances, the protective layer may be a coating that does not fill in air gap regions where LC that was removed once existed. The coating may be deposited using a low temperature process. In some implementations, the protective layer may have anti-reflective (AR) properties. The coating may be a silicate or silicon nitride. The coating process may be performed by a plasma assisted chemical vapor deposition (CVD) process such as a nanocoating process. The coating may be a parylene coating. The protective layer may be a glass layer. A vacuum or inert gas may fill the gaps where LC that was removed once existed before the protective layer is applied. In some embodiments, the coating process may be integrated with the LC removal process (206). For example, a coating material may be mixed with the solvent which is used to wash the LC from the periodic structure.

Figure 3A:
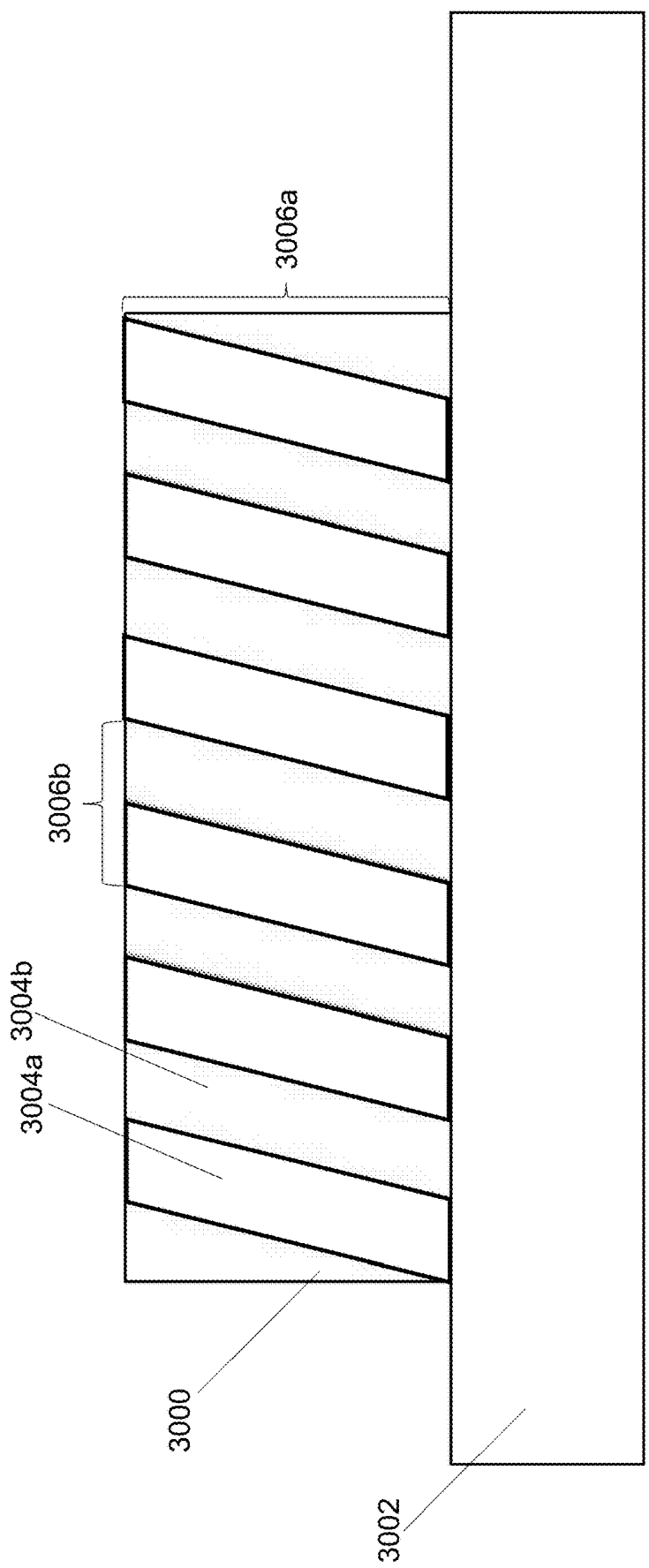
FIG. 3A is an example implementation of a polymer surface relief grating or evacuated periodic structure.

FIG. 3A illustrates a cross sectional schematic view of an exemplary embodiment of a polymer-air periodic structure 3000 implemented on a waveguide 3002. The polymer-air surface relief grating 3000 includes periodic polymer sections 3004a. Adjacent polymer sections 3004a sandwich air sections 3004b. The air sections 3004b are sandwiched by polymer sections 3004a. The air sections 3004b and polymer sections 3004a have different indexes of refraction. Advantageously, the polymer-air surface relief Bragg grating 3000 may be formed with a high grating depth 3006a to Bragg fringe spacing 3006b ratio which may create a deep SRG. As illustrated, the polymer sections 3004a and the air sections 3004b extend all the way to the waveguide 3002 to directly contact the waveguide 3002. As illustrated, there may be no bias layer between the polymer sections 3004a and the air sections 3004b and the waveguide 3002. As discussed previously, deep SRGs may exhibit many beneficial qualities such as high 5-diffraction efficiency which may not be present within the typical SRGs.

In one example, a polymer-air surface relief Bragg grating 3000 may have a Bragg fringe spacing 3006b of 0.35 µm to 0.8 µm and a grating depth of 1 µm to 3 µm. In some embodiments, a grating depth of 1 µm to 3 µm may be too thick for most EPS (with ashing and ALD) for fold and output gratings for waveguide applications, where leaky structures are needed. Values in the ranges of 0.1 µm to 0.5 µm might be more suitable for leaky structures, particularly when modulation is increased with ashing and ALD. For example, Input structures may include a depth in the range of 0.4 µm up to 1 µm. Structures with a depth from 1 µm to 3 µm may be advantageous for display cases, and structures even taller may be advantageous for non-display applications. Structures with half period (e.g. a critical dimension) to height ratio of 7:1 or even 8:1 have been demonstrated with advantageous effects.

In some embodiments, the polymer sections 3004a may include at least some residual liquid crystal when the liquid crystal is not completely removed during step 206 described in connection with FIG. 2. In some embodiments, the presence of residual LC within the polymer rich regions may increase refractive index modulation of the final polymer SRG. In some embodiments, the air sections 3004b may include some residual liquid crystal if the liquid crystal is not completely removed during step 206 from these air sections 3004b. In some embodiments, by leaving some residual liquid crystal within the air sections 3004b, a hybrid grating as described in connection with FIGS. 4-5 may be created.

Figure 3B:
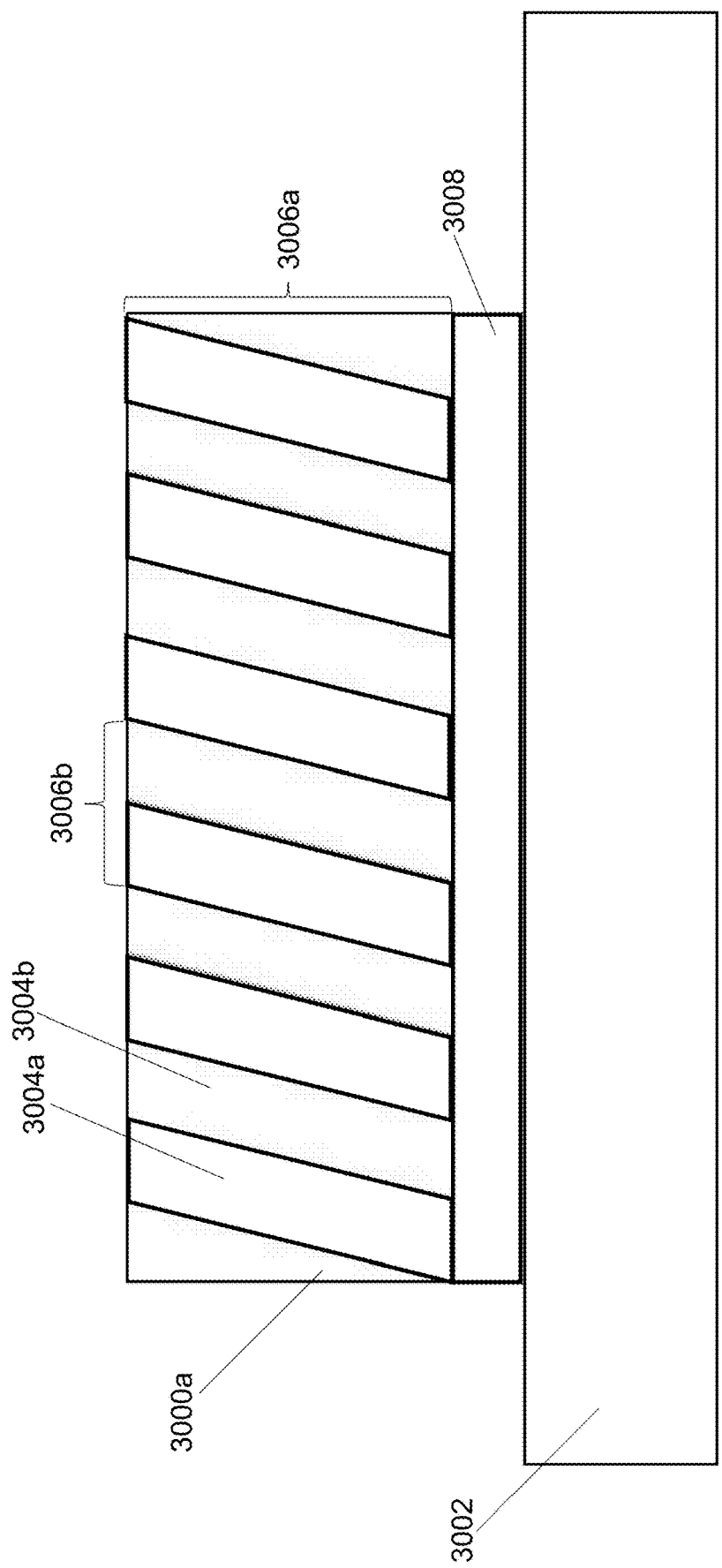
FIG. 3B illustrates a cross sectional schematic view of a polymer-air periodic structure 3000a in accordance with an embodiment of the invention.

In some embodiments, an optical layer 3008 may also exist between the polymer sections 3004a and the air sections 3004b and the waveguide 3002. The optical layer 3008 may be a bias layer between the polymer sections 3004a and the air sections 3004b and the waveguide 3002. FIG. 3B illustrates a cross sectional schematic view of a polymer-air periodic structure 3000a in accordance with an embodiment of the invention. The polymer-air periodic structure 3000a includes many identically numbered components with the polymer-air periodic structure 3000 of FIG. 3A. The description of these components is applicable with the polymer-air periodic structure 3000a described in connection with FIG. 3B and this description will not be repeated in detail. As illustrated, an optical layer 3008 is positioned between the polymer sections 3004a and the air sections 3004b and the waveguide 3002. The waveguide may include a substrate 3002 and an optical layer 3008 (e.g. the bias layer) sandwiched by the substrate 3002 and the polymer periodic structure and wherein the polymer periodic structure extends all the way to the optical layer to directly contact the optical layer. The polymer periodic structure includes the polymer sections 3004a and the air sections 3004b.

In some examples, an optical layer 3008 may be formed when gratings are formed using Nano Imprint Lithography (NIL). The grating pattern may be imprinted in a resin leaving a thin layer underneath the period structure which is a few microns thick. This optical layer 3008, which may be a few microns in thickness, may reside between the waveguide (e.g. glass) substrate and the period grating layer and may not be removed without damaging the NIL grating structure. When the bias refractive index is lower than that of the waveguide substrate the bias layer may confine light for some field angles (furthest from TIR in the waveguide) to the high index substrate which may be analogous to cladding on an optical fiber core. This may cause the field supported in the waveguide to be clipped and hence not supported by the waveguide. Elimination of the bias layer can offer grating coupling from a high index substrate with a grating structure of lower index than the substrate which may not be possible with the bias layer present.

In formation of EPSs, since the phase separation process leading to grating formation may take place through the entire holographic recording material layer, gratings may be formed throughout the volume of the cell gap resulting in no optical layer 3008. The elimination of the optical layer 3008 can allow wider fields of view to be realized when using high index waveguide substrates. Wide field of view angular content may be propagated with lower refractive index grating structures. EPSs may deliver similar optical performance characteristics to nanoimprinted SRGs by offering taller structures albeit at lower peak refractive index. This may open up the possibility of low-cost fabrication of diffractive structures for high efficiency waveguides.

Although the elimination of the optical layer 3008 from a waveguide grating device can offer the field of view benefits as discussed above, in some embodiments, a optical layer 3008 may be present in EPSs. The present disclosure allows for waveguide grating devices with or without the optical layer 3008.

In some embodiments, having the optical layer 3008 can be an advantage as the evanescent coupling between the waveguide and the grating is a function of the indices of the gratings structure (e.g. the grating depth the angles of the faces making up the structure and the grating depth), the waveguide core, and the optical layer 3008 (if present). In some embodiments, the optical layer 3008 may be used as a tuning parameter for optimizing the overall waveguide design for better efficiency and bandwidth. Unlike nanograting SRGs, a bias layer used with an EPS may not be of the same index as the grating structure.

Figure 3C:
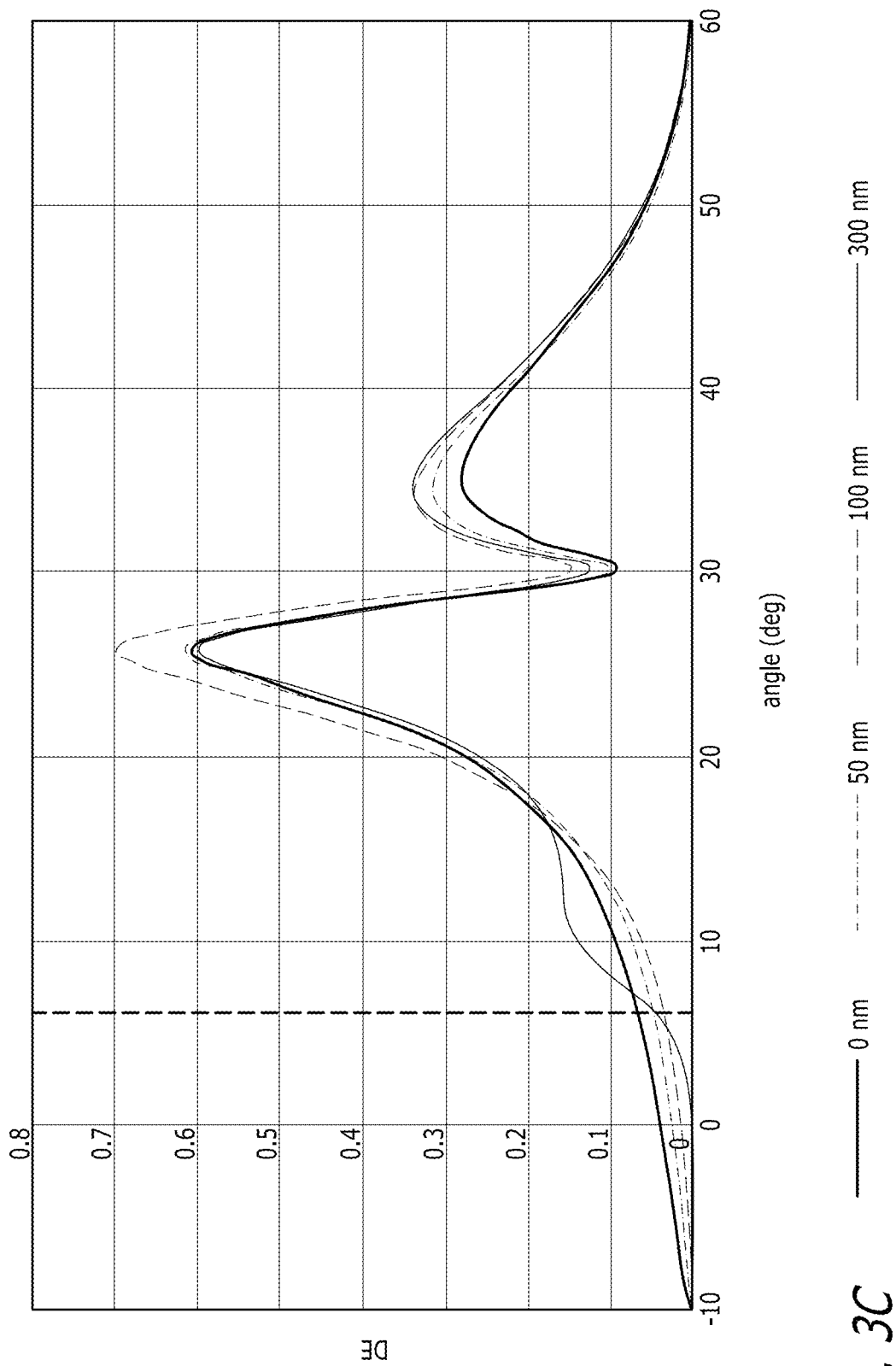
FIG. 3C is a graph illustrating the effect of optical layer thickness on the diffraction efficiency versus incident angle.

FIG. 3C is a graph illustrating the effect of optical layer 3008 thickness on the diffraction efficiency versus incident angle. The dotted line 3052 represents an incident angle of +6 degrees. Evanescent coupling may begin (towards negative angles) at an angle of approximately +6 degrees. The various plots represent different thicknesses of optical layer 3008. The plots show that the optical layer 3008 thickness can be used to increase the diffractive coupling (e.g. for an optical layer thickness of 300 nm) over the approximate angular range from +6 degrees to +16 degrees. There may be lower coupling over the approximate angular range from 0 degrees to +6 degrees. The S-shaped characteristic can be altered by replacing the 300 nm optical layer with a thicker or thinner bias layer as shown in FIG. 3C. In some embodiments, the thickness of the optical layer may be 2 µm to 3 µm, 1 µm to 2 µm, or 0.5 µm to 1 µm.

In some embodiments, the EPS may be fabricated as part of a stacked grating structure. Examples of stacked grating structures are discussed in International Pub. No. WO 2022015878, entitled "Nanoparticle-based holographic photopolymer materials and related applications" and filed Jul. 14, 2021, which is hereby incorporated by reference in its entirety for all purposes. In some embodiments, the EPS may include a multilayer structure including a release layer. Release layers may be used in a grating stacking process that may reduce the number of glass layers. The release layer may be applied at each exposure step to allow the deposition of a new layer of recording material. Similar processes may also allow angular bandwidth to be increased by stacking multiple gratings with different slant angles.

As discussed above, in many the embodiments, the invention also provides a method for fabricating a hybrid surface relief/periodic structure. FIG. 4A conceptually illustrates an apparatus 210A that can be used in a step of a method for fabricating hybrid surface relief gratings (hybrid SRGs) in which a mixture 211 of monomer and liquid crystal deposited on a transparent substrate 212 is exposed to holographic exposure beams 213,214, in accordance with an embodiment of the invention. FIG. 4B conceptually illustrates an apparatus 210B that can be used in a step of a method for fabricating hybrid SRGs from an HPDLC periodic structure 215 formed on the transparent substrate using the holographic exposure beams in accordance with an embodiment of the invention. FIG. 4C conceptually illustrates an apparatus 210C that can be used in a step of a method for fabricating a surface relief grating in which liquid crystal is removed from an HPDLC periodic structure 215 to form polymer-air SRGs 216 in accordance with an embodiment of the invention. These polymer-air SRGs 216 or EPSs may be deep SRGs. It is appreciated that the steps illustrated in and described in connection with FIGS. 4A-4C roughly correspond to the steps illustrated in and described in connection with FIGS. 2A-2C in the process to create a polymer-air SRG and thus the previous description will be applicable to FIGS. 4A-4C.

In addition, FIG. 4D conceptually illustrates an additional step which may be performed to create a hybrid grating. The apparatus 210D can be used in a step of a method for fabricating a surface relief grating in which a surface relief grating is at least partially refilled with liquid crystal to form a hybrid SRGs 217, in accordance with an embodiment of the invention. The refilled liquid crystal may be of different consistency to the previously removed liquid crystal that was previously removed in FIG. 4C. Further, it is appreciated that the liquid crystal removed in FIG. 3C may only be partially removed in an alternative method to forming hybrid SRGs 217. In addition, FIG. 4E conceptually illustrates an apparatus 210E can be used in a step of a method for fabricating a surface relief grating in which hybrid SRGs 217 formed in the step illustrated in FIG. 4D is covered with a protective layer 218, in accordance with an embodiment of the invention. In the hybrid EPSs, the air sections 3004b of FIGS. 3A and 3B may be replaced with a backfill material as discussed above.

Figure 5:
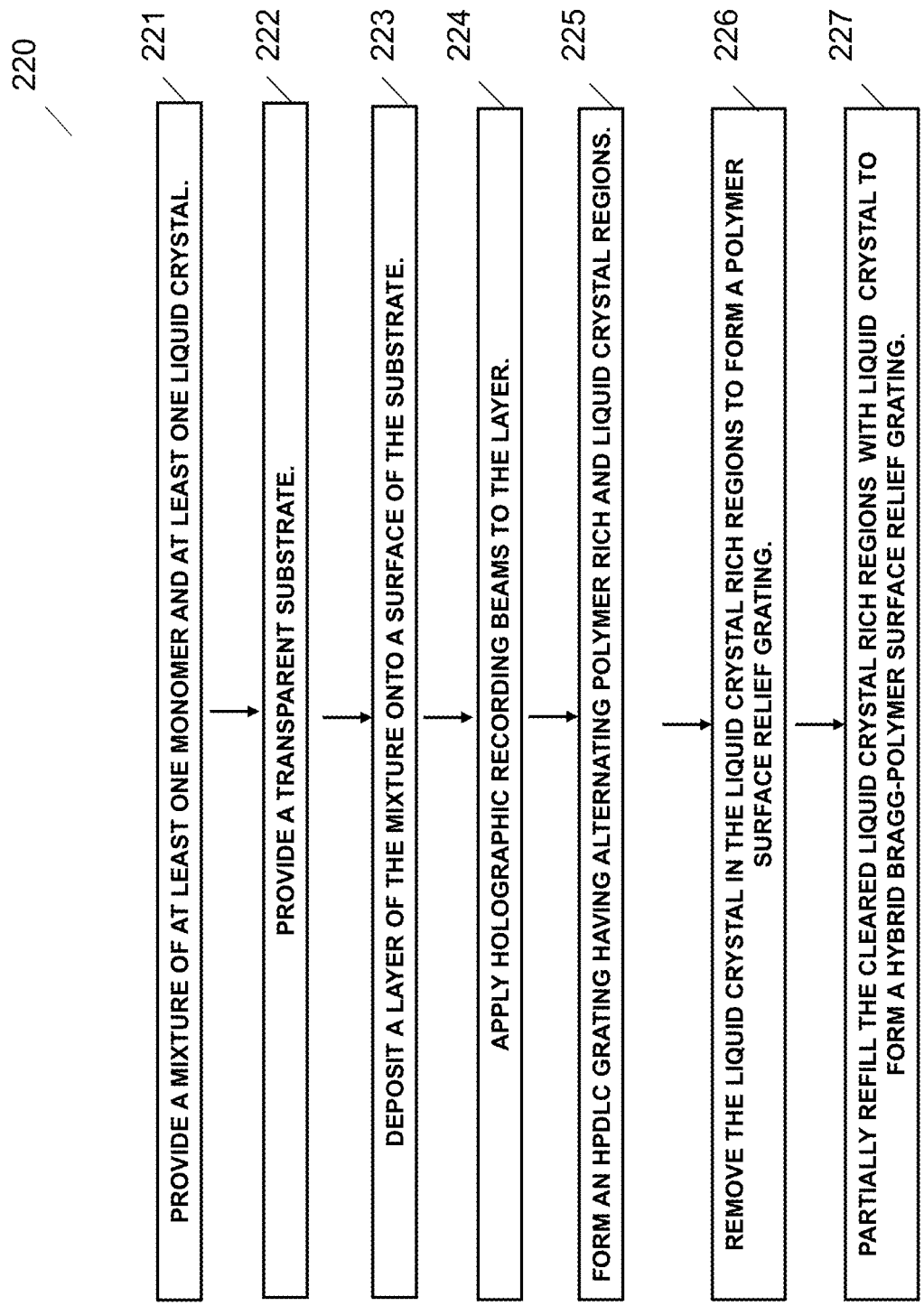
FIG. 5 is a flow chart conceptually illustrating a method for forming a hybrid surface relief-periodic structure in accordance with an embodiment of the invention.

FIG. 5 is a flowchart showing an exemplary method for forming a hybrid surface relief-periodic structure from a HPDLC periodic structure formed on a transparent substrate in accordance with an embodiment of the invention. As shown, the method 220 of forming hybrid surface relief-periodic structure is provided. Referring to the flow diagram, method 220 includes providing (221) a mixture of at least one monomer and at least one liquid crystal. The at least one monomer may include an isocyanate-acrylate monomer. Providing the mixture of the monomer and the liquid crystal may also include mixing one or more of the following with the at least one monomer and the liquid crystal: photoinitiator, coinitiator, multifunctional thiol, and/or additional additives. This mixture may be allowed to rest in order to allow the coinitiator to catalyze a reaction between the monomer and the thiol. The rest period may occur in a dark space or a space with red light (e.g. infrared light) at a cold temperature (e.g. 20° C.) for a period of approximately 8 hours. After resting, additional monomers may be mixed into the monomer. This mixture may be then strained or filtered through a filter with a small pore size (e.g. 0.45 µm pore size). After straining this mixture may be stored at room temperature in a dark space or a space with red light before coating.

Next, a transparent substrate can be provided (222). In certain embodiments, the transparent substrate may be a glass substrate or a plastic substrate. A non-stick coating may be applied to the transparent substrate before the mixture is coated on the substrate. The non-stick coating may be a release layer which allows the transparent substrate to easily release from the exposed periodic structure. Various examples of release layers are discussed below. A layer of the mixture can be deposited (223) onto a surface of the substrate. In some embodiments, the mixture is sandwiched between the transparent substrate and another substrate using glass spacers to maintain internal dimensions. Holographic recording beams can be applied (224) to the mixture layer. The holographic recording beams may be a two-beam interference pattern which may cause phase separation of the LC and the polymer. After applying the holographic recording beams, the mixture may be cured. The curing process may include leaving the mixture under low-intensity white light for a period of time under the mixture fully cures. The low intensity white light may also cause a photo-bleach dye process to occur. Thus, an HPDLC periodic structure having alternating polymer rich and liquid crystal rich regions can be formed (225). In some embodiments, the curing process may occur in 2 hours or less. After curing, one of the substrates may be removed exposing the HPDLC periodic structure. The release layer may aid in allowing the one of the substrates to not stick to the exposed periodic structure.

HPDLC grating may include alternating sections of liquid crystal rich regions and polymer regions. The liquid crystal in the liquid crystal rich regions can be removed (226) to form polymer surface relief gratings or EPSs which is a form of deep SRGs. The liquid crystal may be removed by gently immersing the exposed periodic structure into a solvent such as isopropyl alcohol (IPA). The IPA may be kept at a lower temperature while the periodic structure is immersed in the IPA. The periodic structure is them removed from the solvent and dried. In some embodiments, the periodic structure is dried using a high flow air source such as compressed air. After the LC is removed from the grating, a polymer-air surface relief periodic structure is formed. The resulting periodic structure may be the periodic structure described in connection with FIGS. 3A and 3B. There may or may not be a bias layer present as illustrated in FIG. 3A or 3B. The steps 221-226 of FIG. 5 roughly correspond to the steps described in connection with FIG. 2 in creating a polymer-air SRG and thus these descriptions are applicable to FIG. 5.

Further, method 220 includes at least partially refilling (227) cleared liquid crystal rich regions with liquid crystal to form hybrid SRGs. The refilled liquid crystal may be of different consistency to the previously removed liquid crystal that was previously removed in step 226. Further, it is appreciated that the liquid crystal removed in step 226 may only be partially removed in an alternative method to forming hybrid SRGs. Advantageously, hybrid SRGs may provide the ability to tailor specific beneficial characteristics of the SRGs. One particular characteristic that may be improved by the inclusion of at least some liquid crystal within the SRGs is a decrease in haze properties. In some embodiments, the cleared liquid crystal rich regions may be backfilled with a different refractive material than liquid crystal. The backfill material may have a different refractive index than the remaining polymer rich regions.

As shown in FIG. 4E, the formed surface relief grating can further be covered with a protective layer. In some instances, the protective layer may be a moisture and oxygen barrier with scratch resistance capabilities. In some instances, the protective layer may be a coating that does not fill in air gap regions where LC that was removed once existed. The coating may be deposited using a low temperature process. In some implementations, the protective layer may have anti-reflective (AR) properties. The coating may be a silicate or silicon nitride. The coating process may be performed by a plasma assisted chemical vapor deposition (CVD) process such as a plasma-treat nanocoating process. The coating may be a parylene coating. The protective layer may be a glass layer. A vacuum or inert gas may fill the gaps where LC that was removed once existed before the protective layer is implemented. In some embodiments, the coating process may be integrated with the LC removal process (226). For example, a coating material may be mixed with the solvent which is used to wash the LC from the grating. In some implementations, the coating material may be a material with a lower or higher refractive index than the polymer and fill the spaces between adjacent polymer portions. The refractive index difference between the polymer and the coating material may allow the polymer SRGs to continue to diffract.

Although FIGS. 1-5 illustrate specific methods and apparatus for forming deep SRGs and hybrid surface relief/Bragg gratings, various manufacturing methods implementing different steps or modifications of such steps can be utilized. As can readily be appreciated, the specific process utilized can depend on the specific requirements of the given application. For example, many embodiments utilize another periodic structure as a protective layer.

Hybrid SRG/periodic structure with shallow SRG structures may lead to low SRG diffraction efficiencies. The methods disclosed in the present disclosure allows for more effective SRG structures to be formed by optimizing the depth of the liquid crystal in the liquid crystal rich regions such that the SRGs has a high depth to grating pitch ratio while allowing the periodic structure to be sufficiently thick for efficient diffraction. In many embodiments, the periodic structure component of the hybrid grating can have a thickness in the range 1-3 micrometer. In some embodiments, the SRG component of the hybrid grating can have a thickness in the range 0.25-3 micrometer. The initial HPDLC periodic structure would have a thickness equal to the sum of the final SRG and periodic structure components. As can readily be appreciated, the thickness ratio of the two periodic structure components can depend on the waveguide application. In some embodiments, the combination of an SRG with a periodic structure may be used to fine-tune angular bandwidth of the periodic structure. In some cases, the SRG can increase the angular bandwidth of the periodic structure.

In many embodiments, in the hybrid SRGs illustrated in FIGS. 4A-4E, the refill depth of the liquid crystal regions of the periodic structure can be varied across the periodic structure to provide spatially varying relative SRG/periodic structure strengths. In some embodiments, during the liquid crystal removal and refill as defined in steps 206, 226, and 227, the liquid crystal in the liquid crystal rich grating regions can be totally or partially removed. In several embodiments, the liquid crystal used to refill or partially refill the liquid crystal-cleared regions can have a different chemical composition to the liquid crystal used to form the initial HPDLC periodic structure. In various embodiments, a first liquid crystal with phase separation properties compatible with the monomer can be specified to provide a HPDLC grating with optimal modulation and grating definitions while a second refill liquid crystal can be specified to provide desired index modulation properties in the final hybrid grating. In a number of embodiments, the polymer portion of the hybrid grating can be switchable with electrodes applied to surfaces of the substrate and the cover layer. In many embodiments, the refill liquid crystals can contain additives which may include but are not limited to the features of improving switching voltage, switching time, polarization, transparency, and other parameters. A hybrid grating formed using a refill process would have the further advantages that the LC would form a continuum (rather than an assembly of LC droplets), thereby reducing haze. In some embodiments the backfill material may be a material with a different refractive index than the polymer regions. The backfill material may not be a liquid crystal material.

While deep SRGs, EPSs, and/or hybrid SRGs may be described in the context of S-diffracting gratings and P-diffracting gratings, these periodic structures have applicability in many other periodic structure types. These include but are not limited to angle multiplexed gratings, color multiplexed gratings, fold gratings, dual interaction gratings, rolled K-vector gratings, crossed fold gratings, tessellated gratings, chirped gratings, gratings with spatially varying refractive index modulation, gratings having spatially varying grating thickness, gratings having spatially varying average refractive index, gratings with spatially varying refractive index modulation tensors, and gratings having spatially varying average refractive index tensors. Further, deep SRGs, EPSs, and/or hybrid SRGs may be switchable or non-switchable periodic structures depending on their specific implementation. Deep SRGs, EPSs, and/or hybrid SRGs may be fabricated on a plastic substrate or a glass substrate. These periodic structures may also be fabricated on one substrate and transferred to another substrate.

In some embodiments, EPSs may be either unslanted or slanted, or spatially varying slanted structures (e.g., rolled K-vector type with very large height to period aspect ratio, typically in the range of 2 to 12). Slanted EPSs will be illustrated in various examples below. An EPS may include a height of 2.0 μm with a 0.400 μm period (e.g. aspect ratio=5). The combination of controlled, repeatable, slant angles and tall aspect ratios may provide EPS structures Bragg properties which enable high efficiency waveguide designs. Moreover, EPSs can be fabricated with or without bias layers. EPSs may be made using a phase separation process that can be implemented using ink jet printing processes and offers significant economic advantages in mass production over the complex wafer etching and nano imprint lithographic process used to produce some SRG display waveguides.

In some embodiments, EPSs may be configured as at least one of multiplexed grating, a slanted grating, a photonic crystal, mixed modulation grating, a hybrid polymer grating structure, a sinusoidal grating (e.g. formed by plasma ashing of isotropic photopolymer gratings), a metasurface, or a grating structure combining a slanted volume grating overlaid by a surface relief grating. Slanted volume grating overlaid by a surface relief grating may include a grating structure which is substantially a volume grating with the grating thickness of the low index regions having a slight smaller grating thickness than the high index regions. The variation of the grating thickness may be tens of nanometers while the average volume grating thickness may be from 1-10 micron depending on the application. The configuration is equivalent to an SRG layer sitting on top of a volume grating layer. In some embodiments, the SRG and volume grating may combine the benefit of the wider angular bandwidth of the SRG and the higher efficiency of the volume grating. This is more likely to be the case when the volume grating is thinner. The surface relief structure can arise naturally as a result of non-linearity in the diffusion process at the extremities of the grating. The effect may be controlled using plasma ashing or some other type of etching processed applied to the grating. A combined SRG and volume grating can also be formed by fabricating an EPS and then partially backfilling it with another material. Such a configuration is discussed as a hybrid grating throughout the current disclosure.

In some embodiments, the EPS is formed using different diffusion regimes having different diffusion constants in at least two different directions. In complex grating structures such as photonic crystals the spacing of the diffracting nodes may lead to nonuniformities in the modulation of the finished grating. Material components with different diffusion time constants may allow more efficient grating formation along different directions. In some embodiments, the EPS is formed to provide a photonic structure incorporating a slanted grating structure and a photonic crystal structure including diffracting nodes. Grating configurations including regions in which the grating includes slanted (or unslanted) planar fringes and photonic crystal regions where the diffracting structures comprising diffracting nodes may include elongate elements such as cylinders which many may be tilted. The photonic crystal regions may include a 3D diffracting node structure. In some embodiments, the EPS is formed to provide a photonic crystal including slanted diffracting features wherein the principle nodes of the photonic crystal are formed by multiplexed gratings wherein plasma ashing is applied along tracks parallel to principal crystal directions. The photonic crystal may be formed by multiplexing two or more gratings such that the intersection regions of the bright fringes form modulation peaks. The regions around these peaks may be eroded using plasma ashing applied along the low modulation tracks which are parallel to the principle crystal directions. The cross-section geometry of the nodes may depend on the number of gratings and their relative orientations. For example, crossing two gratings at ninety degrees may result in square cross section nodes. Tilted photonic crystal nodes may be formed using slanted gratings. This principle can be extended to three dimensional photonic crystals.

In some embodiments, the polymer grating structure may be formed to provide photonic crystal formed by three-beam-recorded Bravais lattices and other structures, the process including plasma ashing. All five two dimensional Bravais lattices (e.g. square, triangular, rhombic) may be recoded using a three-beam exposure system. The techniques for fabricating two dimensional photonic crystals may also be applied to more complex three-dimensional structures, including 3D Bravais lattices and other structures. All fourteen of the Bravais lattice can be recorded using three beams or even two beams using more multiple exposure techniques. Dual-beam multiple exposure schemes may be used with the recording medium undergoing a single axis rotation between each exposure.

Discussion of Various Implementations of Deep SRGs or EPSs

In many embodiments, deep SRGs can provide a means for controlling polarization in a waveguide. SBGs are normally P-polarization selective, leading to a 50% efficiency loss with unpolarized light sources such as OLEDs and LEDs. Hence, combining S-polarization diffracting and P-polarization diffracting periodic structures can provide a theoretical 2× improvement over waveguides using P-diffracting periodic structures only. In some embodiments, an S-polarization diffracting periodic structures can be provided by a periodic structure formed in a conventional holographic photopolymer. In some embodiments an S-polarization diffracting periodic structures can be provided by a periodic structure formed in a HPDLC with birefringence altered using an alignment layer or other process for realigning the liquid crystal directors. In some embodiments, an S-polarization diffracting periodic structure can be formed using liquid crystals, monomers and other additives that naturally organize into S-diffracting periodic structures under phase separation. In many embodiments, an S-polarization diffracting periodic structures can be provided by SRGs. Using the processes described above, a deep SRG exhibiting high S-diffraction efficiency (up to 99%) and low P-diffraction efficiency can be formed by removing the liquid crystal from SBGs formed from holographic phase separation of a liquid crystal and monomer mixture.

Figure 6:
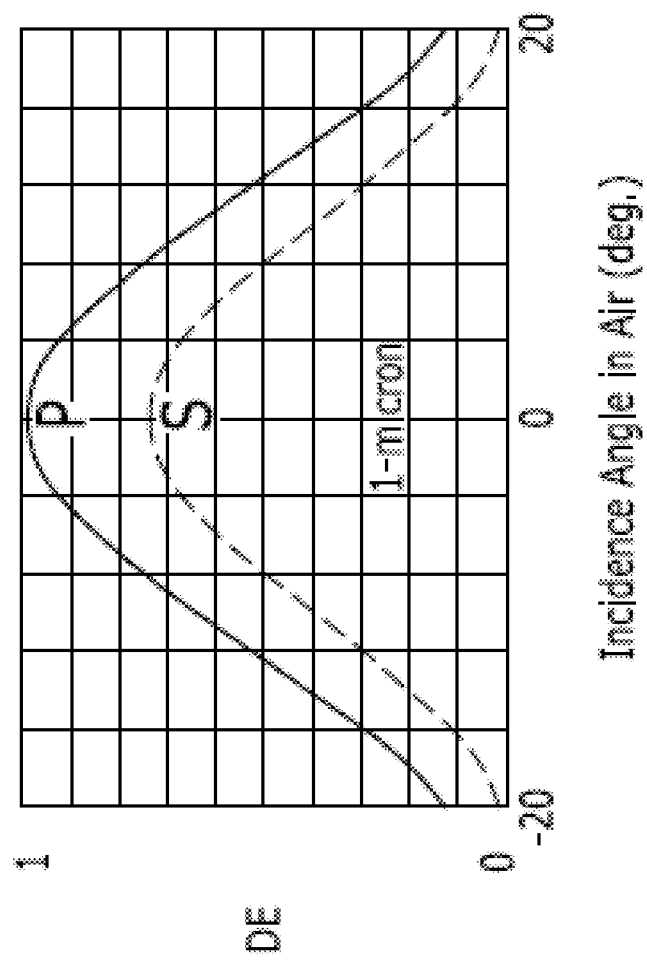
FIG. 6 is a graph showing calculated P-polarized and S-polarized diffraction efficiency versus incidence angle for a 1-micrometer thickness deep surface relief grating in accordance with an embodiment of the invention.
Figure 7:
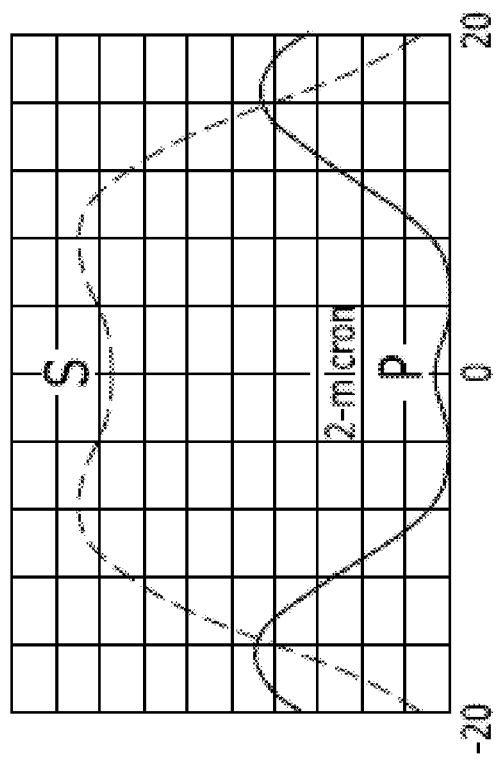
FIG. 7 is a graph showing calculated P-polarized and S-polarized diffraction efficiency versus incidence angle for a 2-micrometer thickness deep surface relief grating in accordance with an embodiment of the invention.

Deep SRGs can also provide other polarization response characteristics. Several prior art theoretical studies such as an article by Moharam (Moharam M. G. et al. "Diffraction characteristics of photoresist surface-relief gratings", Applied Optics, Vol. 23, page 3214, Sep. 15, 1984) point to deep surface relief gratings having both S and P sensitivity with S being dominant. In some embodiments, deep SRGs demonstrate the capability of providing an S-polarization response. However, deep SRGs may also provide other polarization response characteristics. In many embodiments, deep surface relief gratings having both S and P sensitivity with S being dominant are implemented. In some embodiments, the thickness of the SRG can be adjusted to provide a variety of S and P diffraction characteristics. In several embodiments, diffraction efficiency can be high for P across a spectral bandwidth and angular bandwidth and low for S across the same spectral bandwidth and angular bandwidth. In number of embodiments, diffraction efficiency can be high for S across the spectral bandwidth and angular bandwidth and low for P across the same spectral bandwidth and angular bandwidth. In some embodiments, high efficiency for both S and P polarized light can be provided. A theoretical analysis of an SRG of refractive index 1.6 immersed in air (hence providing an average grating index of 1.3) of period 0.48 micron, with a 0 degrees incidence angle and 45 degree diffracted angle for a wavelength of 0.532 micron is shown in FIGS. 5-7. FIG. 5 is a graph showing calculated P-polarized and S-polarized diffraction efficiency versus incidence angle for a 1-micrometer thickness deep surface relief grating, demonstrating that in this case high S and P response can be achieved. FIG. 6 is a graph showing calculated P-polarized and S-polarized diffraction efficiency versus incidence angle for a 2-micrometer thickness deep surface relief grating, demonstrating that in this case the S-polarization response is dominant over most of the angular range of the grating. FIG. 7 is a graph showing calculated P-polarized and S-polarized diffraction efficiency versus incidence angle for a 3-micrometer thickness, demonstrating that in this case the P-polarization response is dominant over a substantial portion of the angular range of the grating.

In many embodiments, a photonic crystal can be a reflection periodic structure or deep SRG formed by a LC extraction process. A reflection deep SRG made using phase separation followed by LC subtraction can enable wide angular and spectral bandwidth. In many embodiments replacing the current input SBG with a reflection photonic crystal can be used to reduce the optical path from a picture generation unit (PGU) to a waveguide. In some embodiments, a PGU pupil and the waveguide can be in contact. In many embodiments, the reflection deep SRG can be approximately 3 microns in thickness. The diffracting properties of an LC extracted periodic structure mainly result from the index gap between the polymer and air (not from the depth of the periodic structure as in the case of a typical SRG).

Discussion of Thiol Additives within Initial Mixture

Figure 9B:
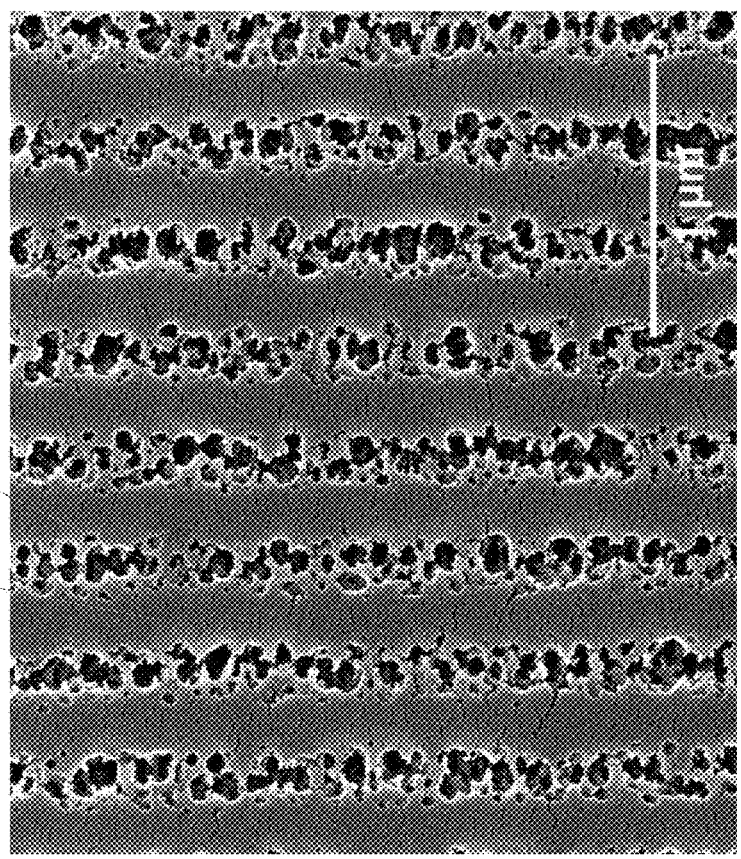
FIGS. 9A and 9B illustrate scanning electron microscope images of multiple embodiments including different thiol concentrations.
Figure 9A:
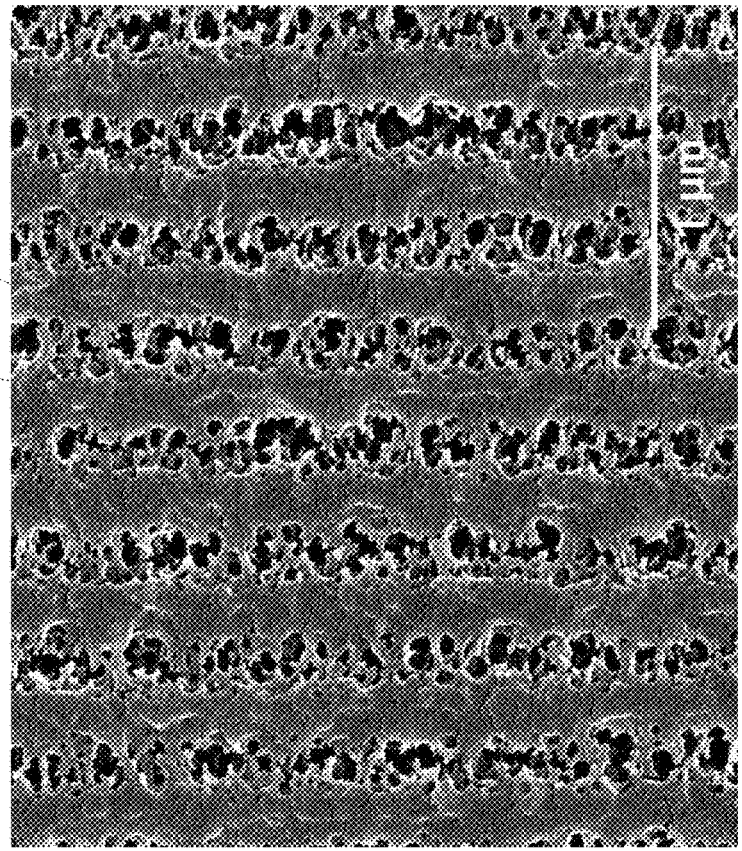

FIGS. 9A and 9B illustrate comparative scattering electron microscopy (SEM) images of example mixtures used to fabricate polymer-air SRGs. As discussed previously, the monomer within the initial mixture may be acrylate or thiolene based. It has been discovered that with some monomers such as acrylate-based monomers, after holographic exposure, during washing, the solvent not only removes liquid crystal material but also polymer which is unideal. It has been discovered that a multifunctional thiol additive may solve this issue by strengthening the polymer and thus allowing it to be strong enough to withstand the solvent wash. Without limiting to any particular theory, thiol additive may improve the mechanical strength of formulations consisting of low functionality acrylate monomers which tend to form mechanically weak polymers due to reduced cross-linking. Acrylate monomer formulations may be advantageous because they may exhibit high diffraction efficiency with lower haze. Thus, adding thiol could allow Acrylate monomer formations to be a viable option in fabrication of polymer SRGs.

There may be a trade-off between phase separation, periodic structure formation, and mechanical strength between different formulations. Periodic structure formation may benefit from mixtures that contain low functionality monomers that react slower, form fewer cross-linkages, and allow greater diffusion of non-reactive components (e.g. LC) during holographic exposure. Conversely, mixtures consisting of high functionality monomers may exhibit better phase separation and polymer mechanical strength due to greater cross-linking, but may react so rapidly that the non-reactive components do not have sufficient time to diffuse and thus may exhibit lower diffraction efficiency as a result.

Without limitation to any particular theory, the thiol additives may get around these limitations by reacting with acrylates or isocyanate-acrylates to form a loose scaffolding prior to holographic exposure. This scaffolding may improve the mechanical strength and uniformity of the cured polymer. Thus, the mechanical strength may be tuned through slight adjustments of the thiol functionality and concentration without significantly raising the average functionality of the monomer mixture and disrupting grating formation.

FIG. 9A illustrates an initial mixture whereas FIG. 9B illustrate a comparative mixture which includes 1.5 wt % thiol. However, other weight percentages of thiol additive have been contemplated. For example, a weight percentage of thiol additive may be 1 to 4% or 1.5% to 3%. In some embodiments, the multifunctional thiol may be trimethylolpropane tris(3-mercaptopropionate). Both FIGS. 9A and 9B include polymer dense regions 902a/902b and air regions 904a/904b. As illustrated, the added thiol may produce a denser polymer structure within the polymer dense regions 902a of FIG. 9B than the polymer dense regions 902b of FIG. 9A which may increase grating performance. It has been discovered that the weight percentage of thiol additive should be balanced in order to provide stability within the polymer structure to withstand the solvent wash however not to be rigid as to not allow the liquid crystal to be released during the solvent wash.

Figure 10B:
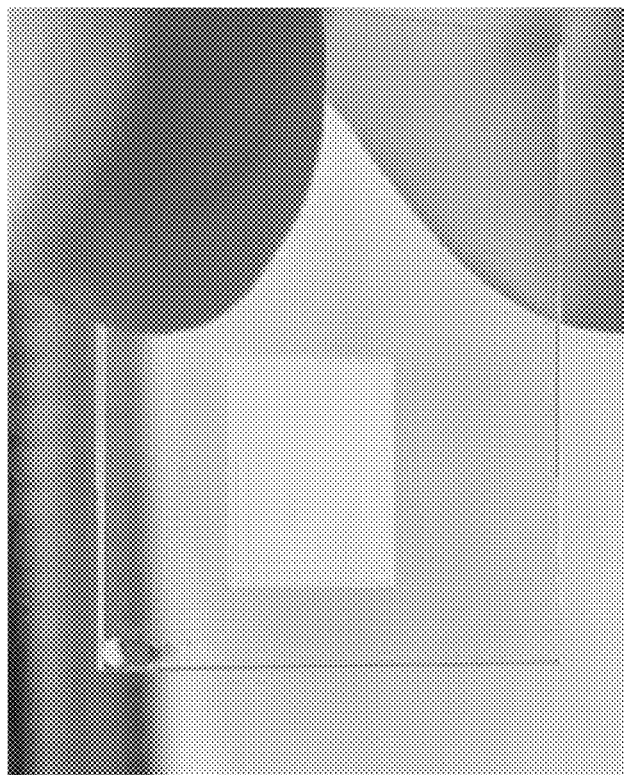
FIGS. 10A and 10B are images comparing an HPDLC periodic structure and a polymer surface relief grating or evacuated periodic structure.
Figure 10A:
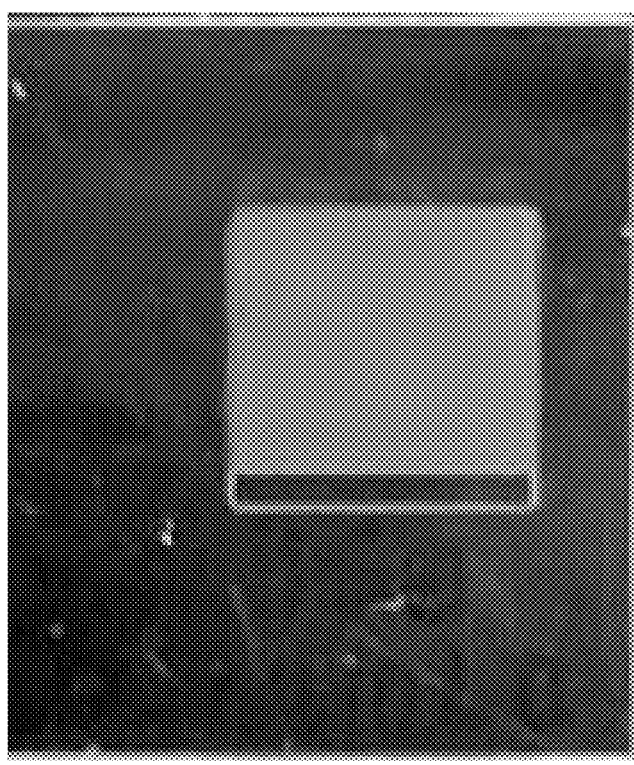

Comparison Between HPDLC Periodic Structure Performance with Polymer-Air SRG Performance FIGS. 10A and 10B illustrates images of comparative examples of an HPDLC grating and a polymer SRG or EPS. FIG. 10A illustrates performance for an example HPDLC periodic structure where liquid crystal has not been removed. The periodic structure of FIG. 10A includes a 20-30% P-diffraction efficiency while exhibiting a nominal or almost 0% S-diffraction efficiency. FIG. 10B illustrates performance of an example polymer-air SRG where the LC has been removed. The periodic structure of FIG. 10B includes a 18-28% P-diffraction efficiency while exhibiting a S-diffraction efficiency of 51-77%. Thus, polymer-air SRGs where LC has been removed demonstrate a comparatively high S-diffraction efficiency while maintaining a comparable P-diffraction efficiency. Further, the grating of FIG. 10B includes a P-diffraction haze of 0.11-0.15% and a S-diffraction haze of 0.12-0.16%.

Figure 11B:
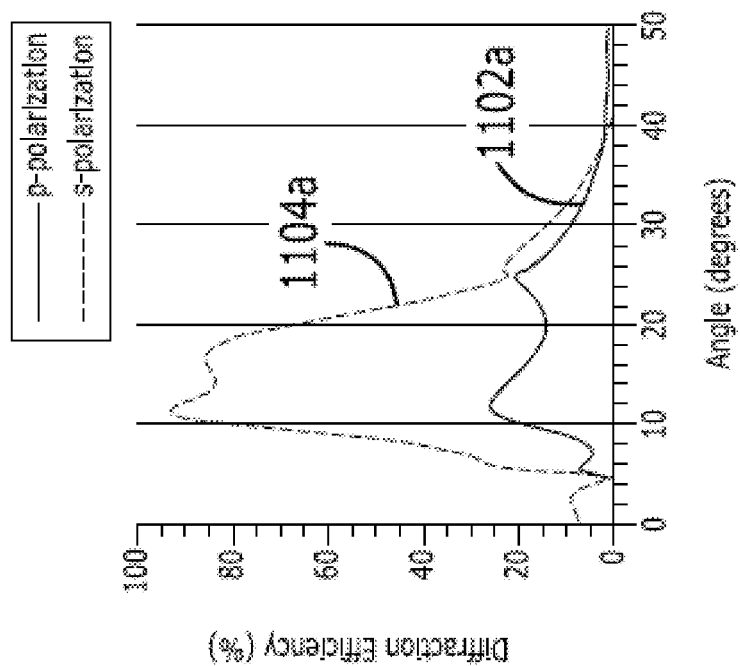
FIGS. 11A and 11B are two plots comparing an HPDLC periodic structure and a polymer surface relief grating or evacuated periodic structure.
Figure 11A:
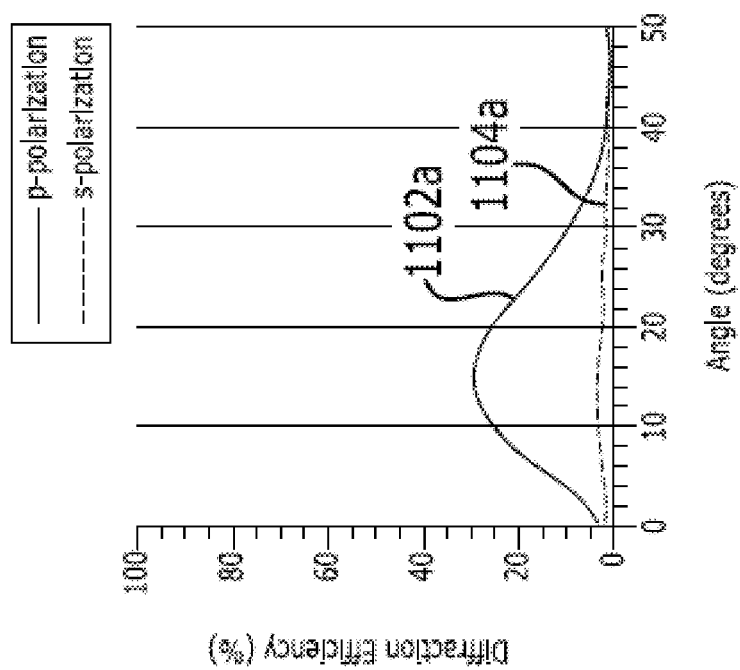

FIGS. 11A and 11B illustrates plots of comparative examples of an HPDLC periodic structure where liquid crystal has not been removed and a polymer SRG or EPS where liquid crystal has been removed. FIG. 11A illustrates the P-diffraction efficiency and S-diffraction efficiency for an HPDLC periodic structure where liquid crystal remains. A first line 1102a corresponds to P-diffraction efficiency and a second line 1104a corresponds to S-diffraction efficiency. FIG. 11B illustrates the P-diffraction efficiency and S-diffraction efficiency for a polymer SRG or EPS where liquid crystal has been removed. A first line 1102b corresponds to P-diffraction efficiency and a second line 1104b corresponds to S diffraction efficiency. As illustrated, S-diffraction efficiency dramatically increases after liquid crystal has been removed while P-diffraction efficiency remains relatively similar. In some embodiments, the ratio of S-diffraction efficiency to P-diffraction efficiency may be adjusted by using different grating periods, grating slant angles, and grating thicknesses.

Various Example Deep SRG Depths

Figure 12B:
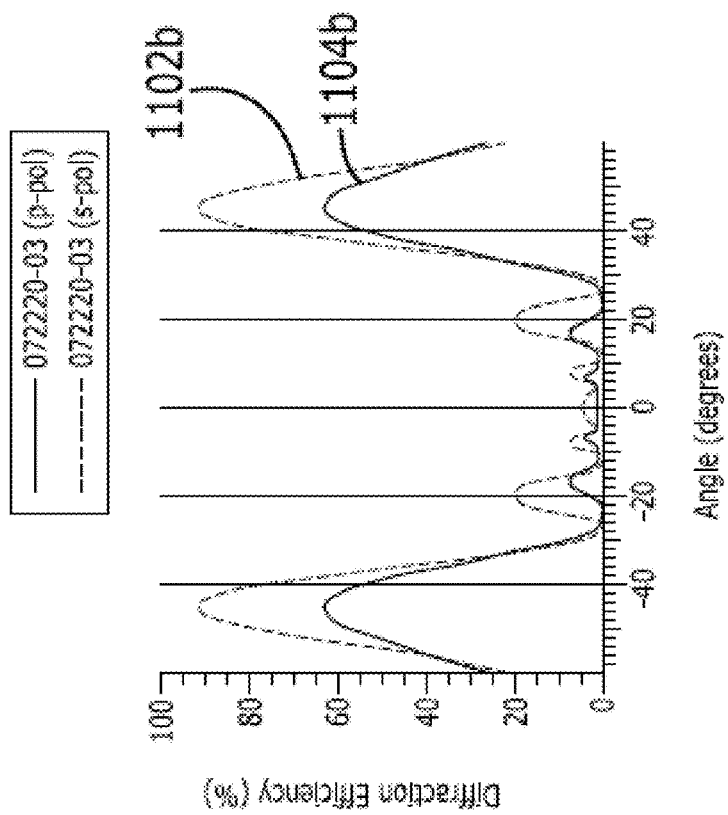
FIGS. 12A and 12B are two plots of S-diffraction efficiency and P-diffraction efficiency of two example polymer surface relief gratings with different depths.
Figure 12A:
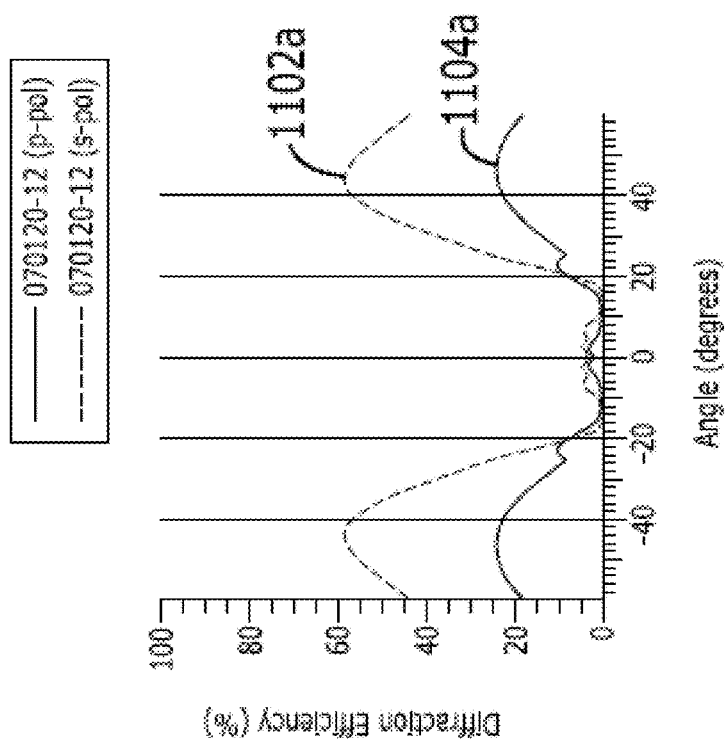

FIGS. 12A and 12B illustrate various comparative examples of P-diffraction and S-diffraction efficiencies with deep SRGs of various depths. Each of these plots show diffraction efficiency vs. angle. In FIG. 12A, the deep SRG has a depth of approximately 1.1 μm. The first line 1102a represents S-diffraction efficiency and the second line 1104a represents P-diffraction efficiency. As illustrated the peak S-diffraction efficiency is approximately 58% and the peak P-diffraction efficiency is 23%. It is noted that the haze for S-diffraction is 0.12% and haze for P-diffraction is 0.11% for this example. Such high diffraction efficiency with low haze may make deep SRGs with a depth of approximately 1.1 μm particularly suitable for multiplexed gratings.

In FIG. 12B, the deep SRG has a depth of approximately 1.8 μm. The first line 1102b represents S-diffraction efficiency and the second line 1104b represents P-diffraction efficiency. As illustrated the peak S-diffraction efficiency is approximately 92% and the peak P-diffraction efficiency is 63%. It is noted that the haze for S-diffraction is 0.34% and haze for P-diffraction is 0.40% for this example. Thus, both S-diffraction and P-diffraction efficiency increase dramatically with an increased grating depth. It is noted that haze appears to increase with the increased grating depth.

In some embodiments, an EPS may be spatially variable depth for a single EPS grating. In some embodiments, different EPSs on the same substrate may have different depths from each other not forgoing the modulation variation mentioned above on one or more of a multiplicity of EPS gratings on a single substrate. In some embodiments, one or more EPSs may be positioned on each side of a same substrate. In some embodiments, a mixture of planar and multiplexed EPSs may be positioned on a same waveguide.

In some embodiments, multiple EPSs may be positioned on a substrate including spacially varied duty cycle, grating shape, slant, and/or ALD coating properties. The different ALD coating properties may spatially affect modulation.

Various Example Initial LC Concentrations in Mixture

Figure 13B:
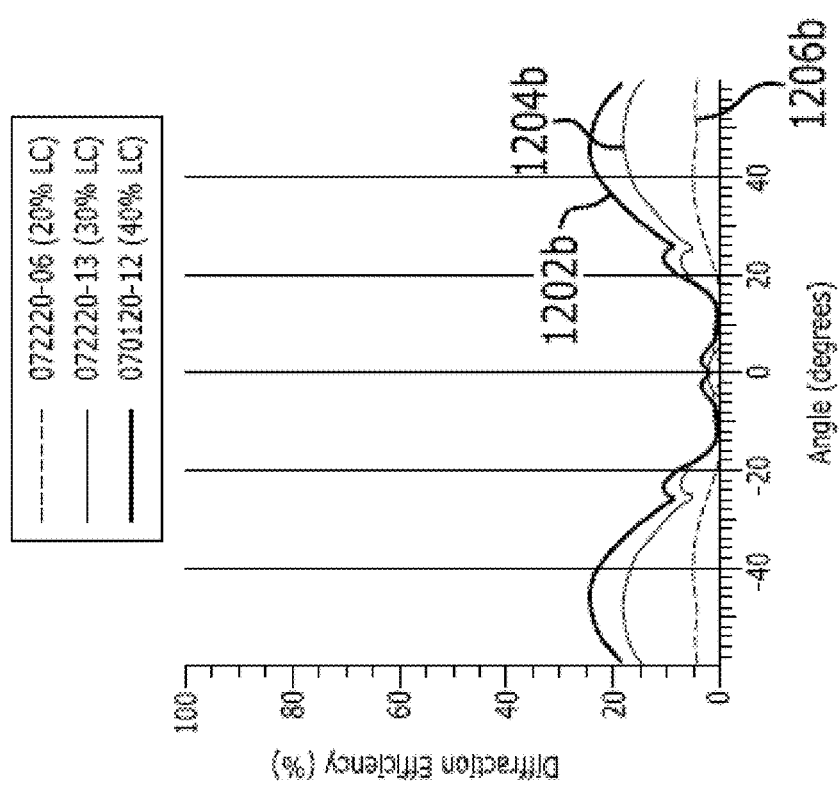
FIGS. 13A and 13B are two different plots of S-diffraction efficiency and P-diffraction efficiency of various example polymer surface relief gratings produced with different initial liquid crystal concentrations.
Figure 13A:
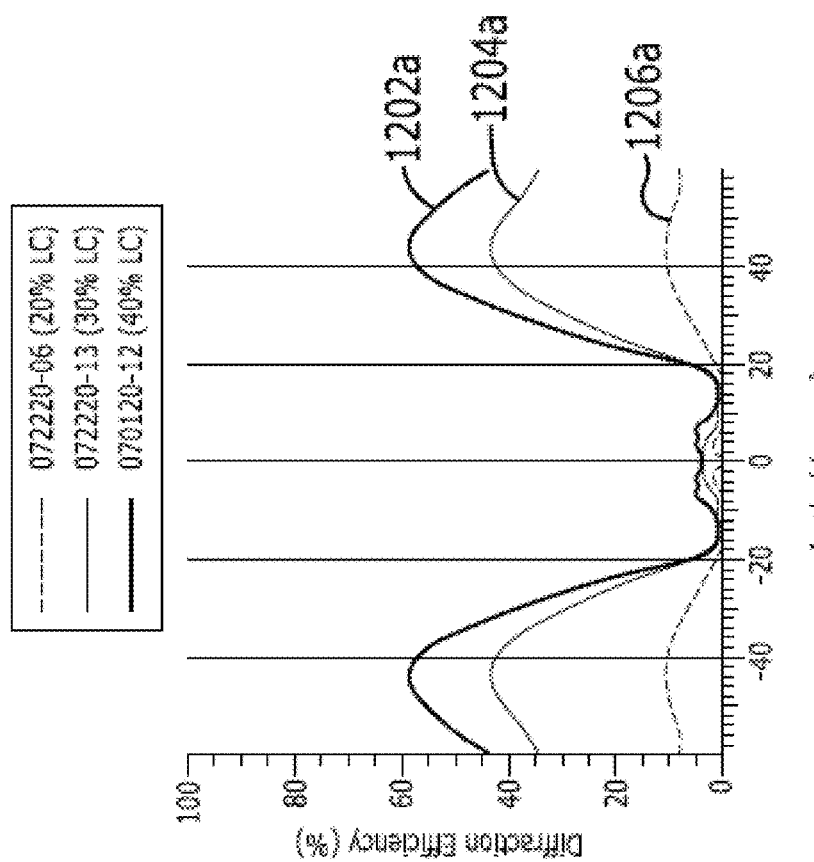

FIGS. 13A and 13B illustrate the results of a comparative study of various EPSs with various initial LC concentrations in the initial mixture. FIG. 13A illustrates S-diffraction efficiency vs. angle. FIG. 13B illustrates P-diffraction efficiency vs. angle. In FIG. 13A, a first line 1202a corresponds to 20% initial LC content, a second line 1204a corresponds to 30% initial LC content, and a third line 1206a corresponds to 40% initial LC content. In FIG. 13B, a first line 1202b corresponds to 20% initial LC content, a second line 1204b corresponds to 30% initial LC content, and a third line 1206b corresponds to 40% initial LC content. Table 1 illustrates a summary of various results of the comparative study.

TABLE 1

| Initial LC Content in Mixture | Maximum S-Diffraction Efficiency | Maximum P-Diffraction Efficiency | S-Diffraction Haze | P-Diffraction Haze |
|---|---|---|---|---|
| 20% | 10% | 5% | 0.10% | 0.12% |
| 30% | ≥40% | 18% | 0.14% | 0.13% |
| 40% | ≥55% | 23% | 0.12% | 0.11% |

As is illustrated in FIGS. 13A and 13B and noted in Table 1, the maximum 5-diffraction and maximum P-diffraction appear to both increase with higher initial LC content while the S-diffraction haze and P-diffraction haze stay approximately constant.

Figure 14B:
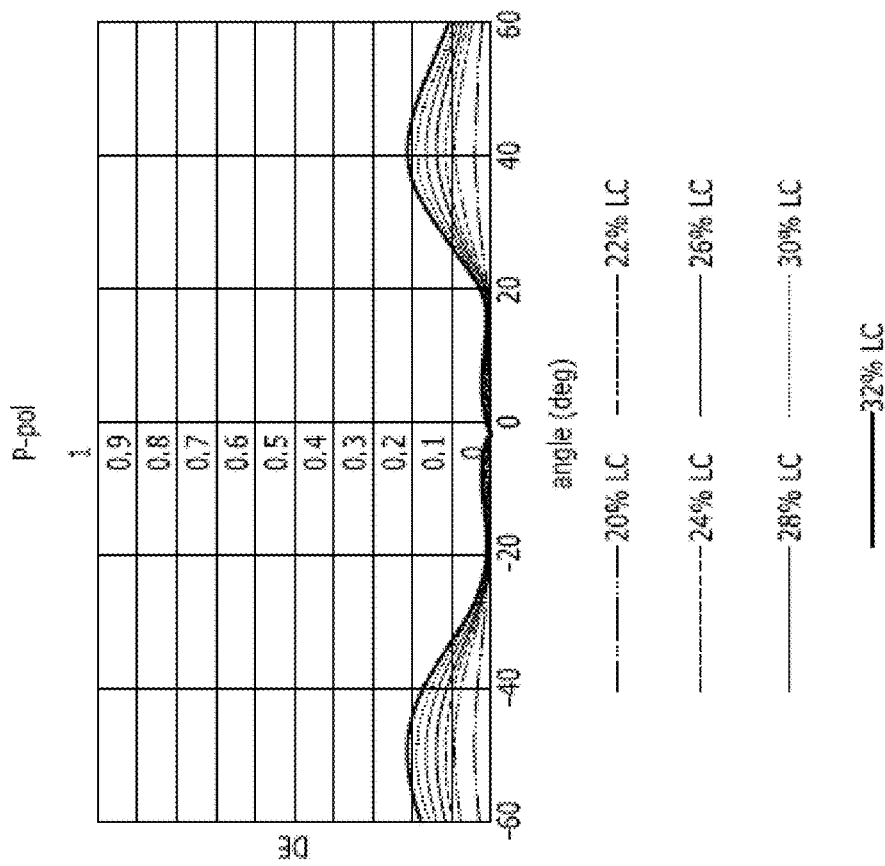
FIGS. 14A and 14B are two different plots of S-diffraction efficiency and P-diffraction efficiency of various example polymer surface relief gratings produced with different initial liquid crystal concentrations.
Figure 14A:
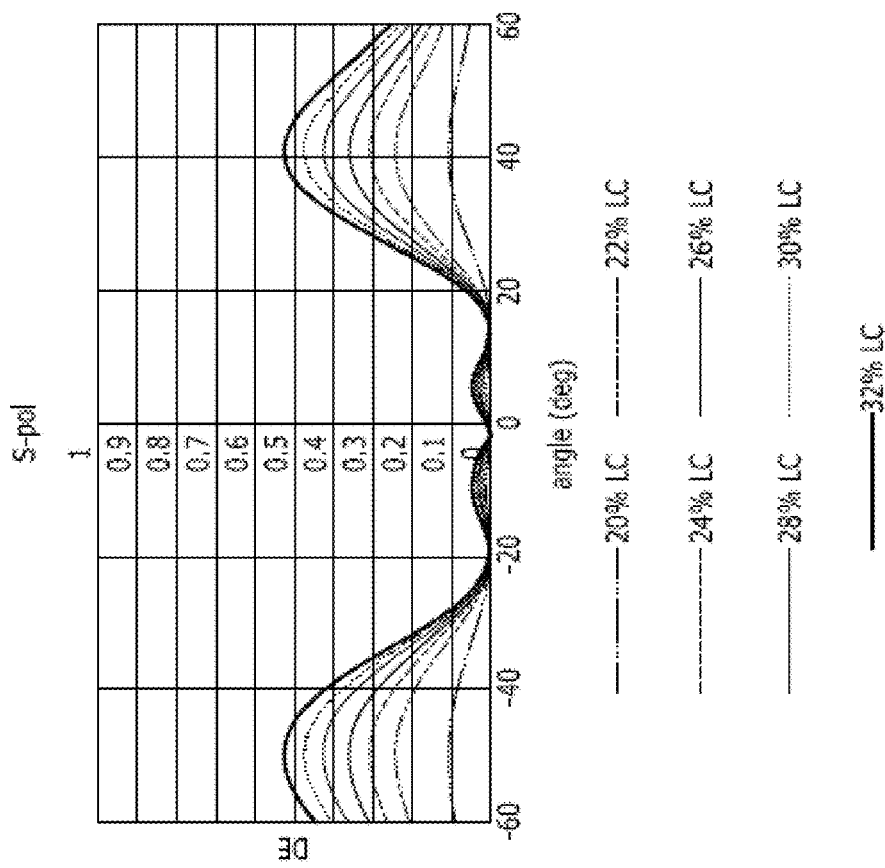

FIGS. 14A and 14B illustrate additional example S-diffraction and P-diffraction efficiencies for various initial LC concentrations. FIG. 14A illustrates S-diffraction efficiency for various example EPSs including various initial LC contents. FIG. 14B illustrate P-diffraction efficiency for various example EPSs including various LC contents. For both FIGS. 14A and 14B, sequentially from top to bottom the lines represent: 32% LC content, 30% LC content, 28% LC content, 26% LC content, 24% LC content, 22% LC content, and 20% LC content. As illustrated, the S-diffraction and P-diffraction efficiencies are directly related to the amount of LC content (e.g. higher LC content yields higher 5-diffraction and P-diffraction efficiencies).

Without being limited to any particular theory, the initial LC content relates to the amount of phase separation between the LC and the monomer that occurs during the holographic exposure process and polymerization process. Thus, a higher LC content will increase the amount of LC rich regions which are removed to make more air regions after washing. The increased air regions make greater refractive index differences (Δn) between the air regions (formerly liquid crystal rich regions) and the polymer rich regions which increases both S-diffraction and P-diffraction efficiencies. In some embodiments, the average refractive index of the polymer SRGs may be adjusted by adjusting the initial neutral substance (e.g. LC) content, thereby either increasing or decreasing the volume of polymer after removal of the neutral substance. Further, increasing the initial neutral substance content may impact the mechanical strength. Thus, an increase or decrease in mechanical strengthener such as thiol additive may be used to balance out the increase or decrease in mechanical strength.

Various Example Grating Thicknesses

Figure 15:
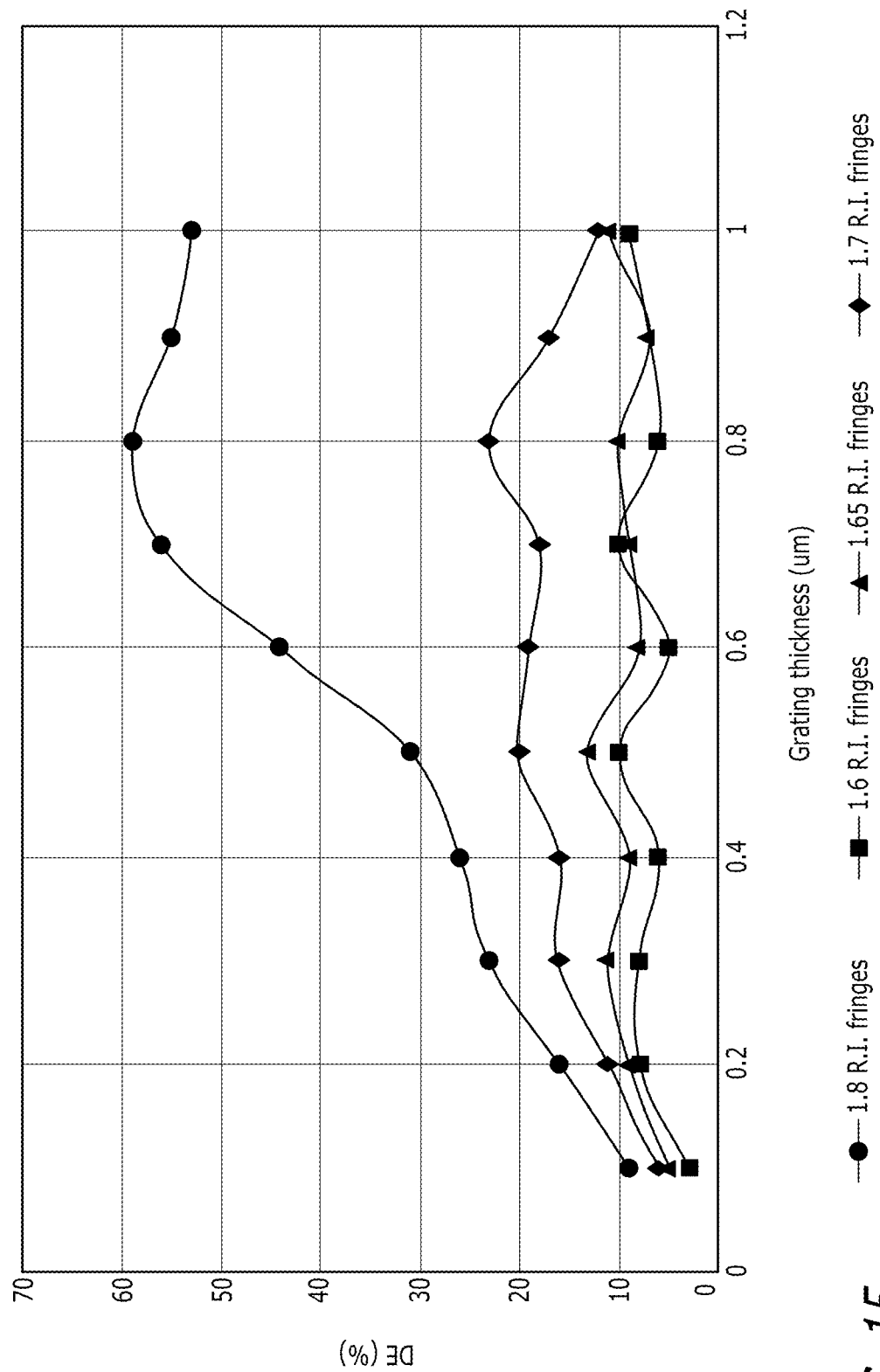
FIG. 15 is a graph of diffraction efficiency versus grating layer thickness showing the dependence of evanescent coupling on the grating layer thickness.

FIG. 15 is a graph of diffraction efficiency versus grating layer thickness showing the dependence of evanescent coupling on the grating layer thickness. The duty cycle refers to the ratio of the width of a polymer fringe to the width of the air gap between neighboring polymer fringes. In other words, a 90% duty cycle means 90% of the grating is polymer and 10% is air.

Note that increased grating thickness may lead to increased coupling when fringe and substrate refractive indices are matched. For poor refractive index match to substrate (e.g. 1.6 refractive index fringes on 1.8 refractive index substrate) there may be only evanescent coupling, so increasing fringe depth may not affect coupling significantly. The plots in FIG. 15 show that a grating structure of refractive index 1.6 with a 90% duty cycle gives an average refractive index of 1.54. Increasing the grating index to 1.65 at the same duty cycle results in an average refractive index of 1.59. No diffraction efficiency exists in either case. Increase the grating refractive index may result in a diffraction efficiency. For example, for a grating structure of index 1.7 and 1.8 with a 90% duty cycle with resulting average refractive indices of 1.63 and 1.72 respectively both provide diffractive efficiency. In some embodiments, there may be grating structures on a 1.8 index substrate with input light incident at 0 degrees to the grating normal.

Embodiments Manufactured Using Various Substrate Configurations

In various embodiments, a pair of substrates may sandwich an unexposed holographic mixture. The pair of substrates may include a base substrate and a cover substrate. Advantageously, the cover substrate may have different properties than the base substrate to allow for the cover substrate to adhere to the unexposed holographic mixture layer while capable of being removed from the formed holographic polymer dispersed liquid crystal periodic structure after exposure. The formed holographic polymer dispersed liquid crystal grating may remain on the base substrate after the cover substrate is removed.

FIGS. 16A-16G illustrate an example process flow for fabricating deep SRGs in accordance with an embodiment of the invention. This process flow is similar to the process flows described in connection with FIGS. 1A-1D and FIGS. 4A-4E and includes many of the same references numbers the description of which is applicable to the description of FIGS. 15A-15G. Further, FIGS. 15A-15G also includes a cover substrate 1502, the function of which will be described in detail below.

Figure 16C:
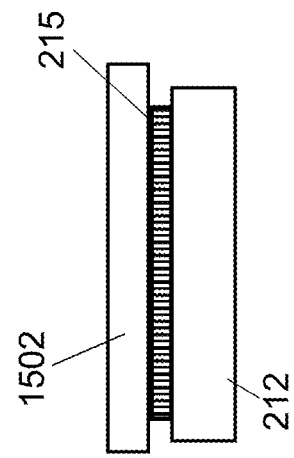
FIGS. 16A-16G illustrate various stages of manufacture of a surface relief grating implementing a cover substrate in accordance with an embodiment of the invention.
Figure 16F:
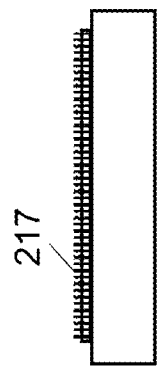
Figure 16B:
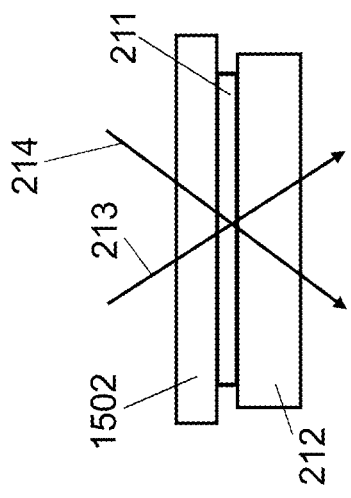
Figure 16E:
Figure 16G:
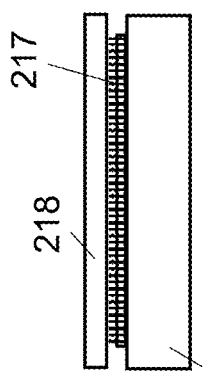
Figure 16A:
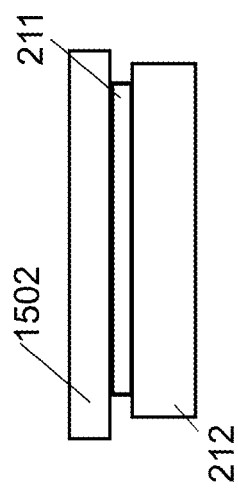

In FIG. 16A, a pair of substrate 212, 1502 sandwiches an unexposed holographic mixture layer 211. The pair of substrate 212, 1502 may include a base substrate 212 and a cover substrate 1502. The cover substrate 1502 may have different properties than the base substrate 212 to allow for the cover substrate to adhere to the unexposed holographic mixture layer 211 while capable of being removed from the formed holographic polymer dispersed liquid crystal grating after exposure.

Figure 16D:
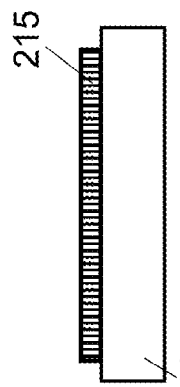

In FIG. 16B, the holographic mixture layer 211 is exposed by a pair of holographic recording beams 213,214. As illustrated in FIG. 16C, the holographic recording beams 213,214 expose the holographic mixture layer 211 to form a holographic polymer dispersed liquid crystal grating 215. The holographic polymer dispersed liquid crystal grating 215 may include alternating polymer rich regions and liquid crystal rich regions. In FIG. 16D, the cover substrate 1502 may be removed exposing the holographic polymer dispersed liquid crystal grating 215.

Advantageously, the cover substrate 1502 may have different properties than the base substrate 212 such as different materials or different surface properties. For example, the base substrate 212 may be made out of plastic whereas the cover substrate 1502 may be made out of glass. The cover substrate 1502 may be removed allowing the holographic polymer dispersed liquid crystal grating 215 to remain on the base substrate without damaging the holographic polymer dispersed liquid crystal grating 215 during removal.

In some embodiments, the base substrate 212 may be treated on the surface contacting the holographic mixture layer 211 with an adhesion promotion layer such as reagents.

As illustrated in FIG. 16E, the liquid crystal may be removed or evacuated from the liquid crystal rich regions between the polymer rich regions leaving air regions. The polymer rich regions and the air regions form polymer-air SRGs 216. In FIG. 16F, a material of different refractive index from the polymer rich regions may be refilled into the air regions to form hybrid SRGs 217. In some embodiments, the material may be a liquid crystal material. The liquid crystal material may be different from the liquid crystal material removed or evacuated from the liquid crystal rich regions. In some embodiments, a portions of the liquid crystal in the liquid crystal rich regions may be left between the polymer rich regions to form the hybrid SRGs 217.

In FIG. 16G, a protective substrate 218 may be positioned such that the hybrid SRGs 217 are between the protective substrate 218 and the base substrate 212. The protective substrate 218 may be used to protect the hybrid SRGs 217. The protective substrate 218 may be omitted in some instances. The protective substrate 218 and the cover substrate 1502 may have different properties where the protective substrate 218 may add more protection when the grating is implemented into a usable device than the cover substrate 1502.

In some embodiments, the polymer-air SRGs 216 may be manufactured as described in connection with FIGS. 1A-1D. In these embodiments, the protective substrate 218 may be used to protect the polymer-air SRGs 216.

In some embodiments the base substrate 212 may be a glass, quartz, or silica substrate including a glass surface. In some embodiments, the base substrate 212 may be a plastic substrate and may be coated with a silicon oxide coating (e.g. $SiO_2$) which may act similar to a glass surface. The silicon oxide coating or the glass surface may include hydroxyl groups on the top surface. The adhesion promotion material may be coated on top of the silicon oxide coating. The hydroxyl groups may be beneficial in allowing the adhesion promotion material to adhere to the base substrate 212.

Figure 17:
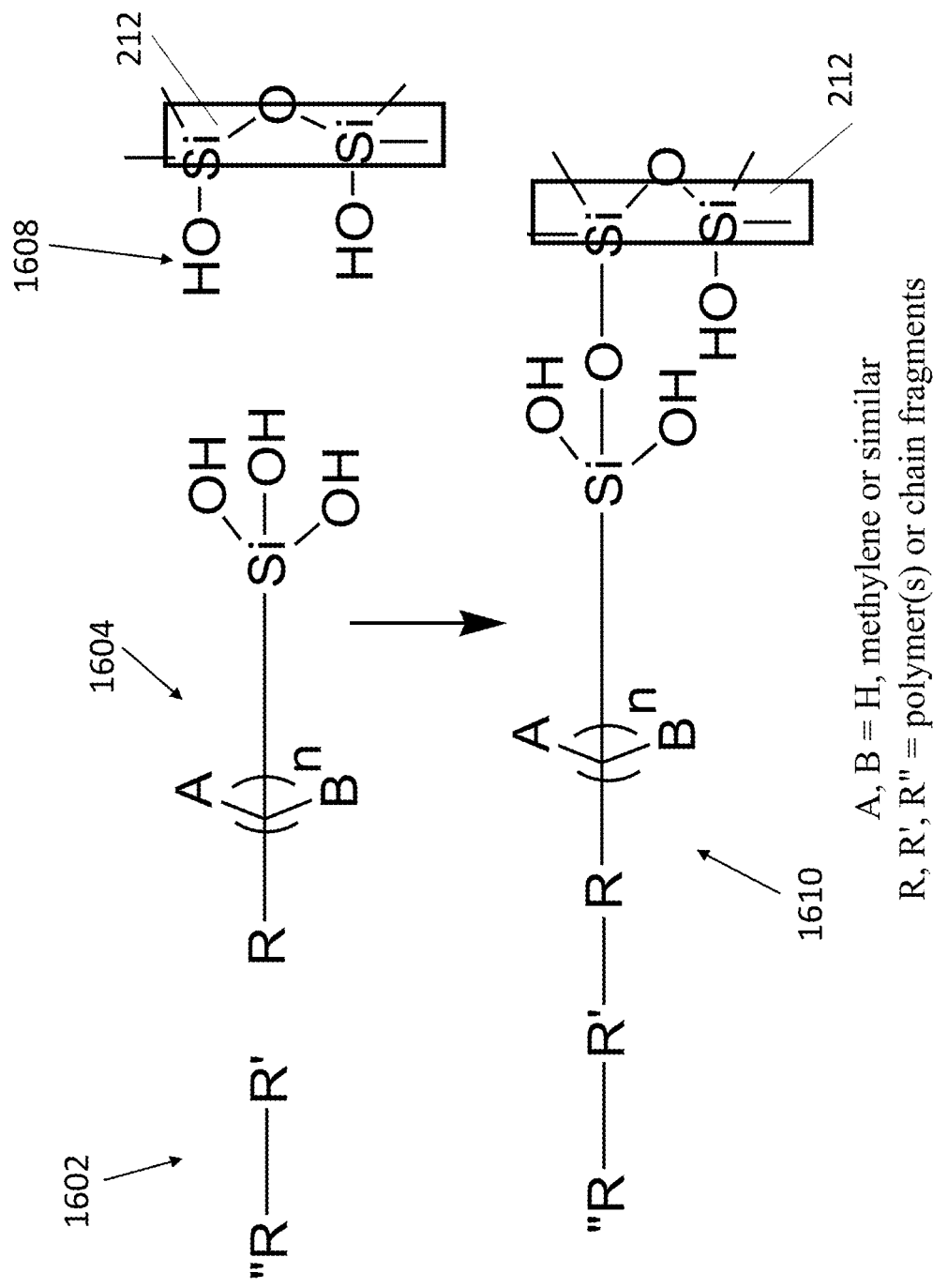
FIG. 17 illustrates an example reaction forming a holographic mixture layer in accordance with an embodiment of the invention.

In some embodiments, the base substrate 212 may include a glass surface including hydroxyl groups and may be reacted with reagents such that the reagents react with the hydroxyl groups. FIG. 17 illustrates an example reaction where the base substrate 212 is exposed to reagents 1604 in accordance with an embodiment of the invention. The base substrate 212 may include hydroxyl groups 1608 on the surface. The base substrate 212 is exposed to reagents 1604 and a holographic mixture material 1602 including polymer. The reagents 1604 may be a silane coupling agent. In some embodiments, the reagents 1604 include $(R'O)_3$—Si—R where R'O— is an alkoxy group and —R is an organofunctional group. The alkoxy groups may condense with the hydroxyl groups 1608 available on the surface resulting in surfaces decorated with organofunctional —R groups, which may promote formation of covalent bonding of the coupling agent with polymeric networks within the holographic polymer dispersed liquid crystal grating 215. The reagents 1604 may adhere to the hydroxyl groups 1608 and to the holographic mixture material 1602 creating improved adhesion when compared to the adhesion of the holographic mixture material 1602 without the reagents 1604. The holographic mixture material 1602 may form a holographic mixture layer 1610 on the surface of the base substrate 212.

Figure 18:
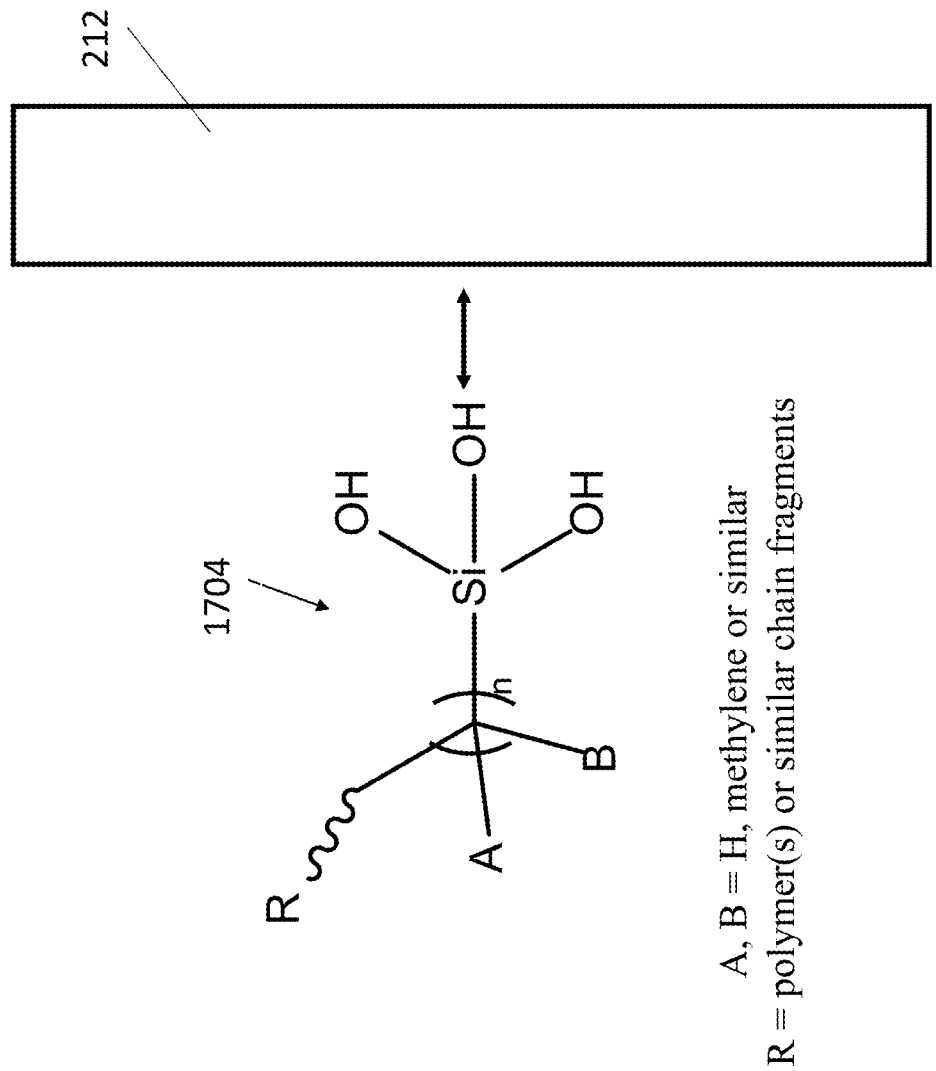
FIG. 18 illustrates a reaction between reagents and a base substrate in accordance with an embodiment of the invention.

FIG. 18 illustrates an example reaction where reagents 1704 are exposed to the base substrate 212. The reagents 1704 may include a silane coupling agent as illustrated and may couple to hydroxyl groups on the surface of a glass surface of the base substrate 212.

In some embodiments the cover substrate 1502 may be a glass, quartz, or silica substrate including a glass surface. In some embodiments, the cover substrate 1502 may be a plastic substrate and may be coated with a silicon oxide coating (e.g. $SiO_2$) which may act similar to a glass surface. A release layer may be coated on top of the glass surface. In some embodiments, similar to the base substrate 212 discussed above, the cover substrate 1502 may include a glass surface including hydroxyl groups and may be reacted with reactants such that the reactants bond with the hydroxyl groups to form the release layer.

Figure 19:
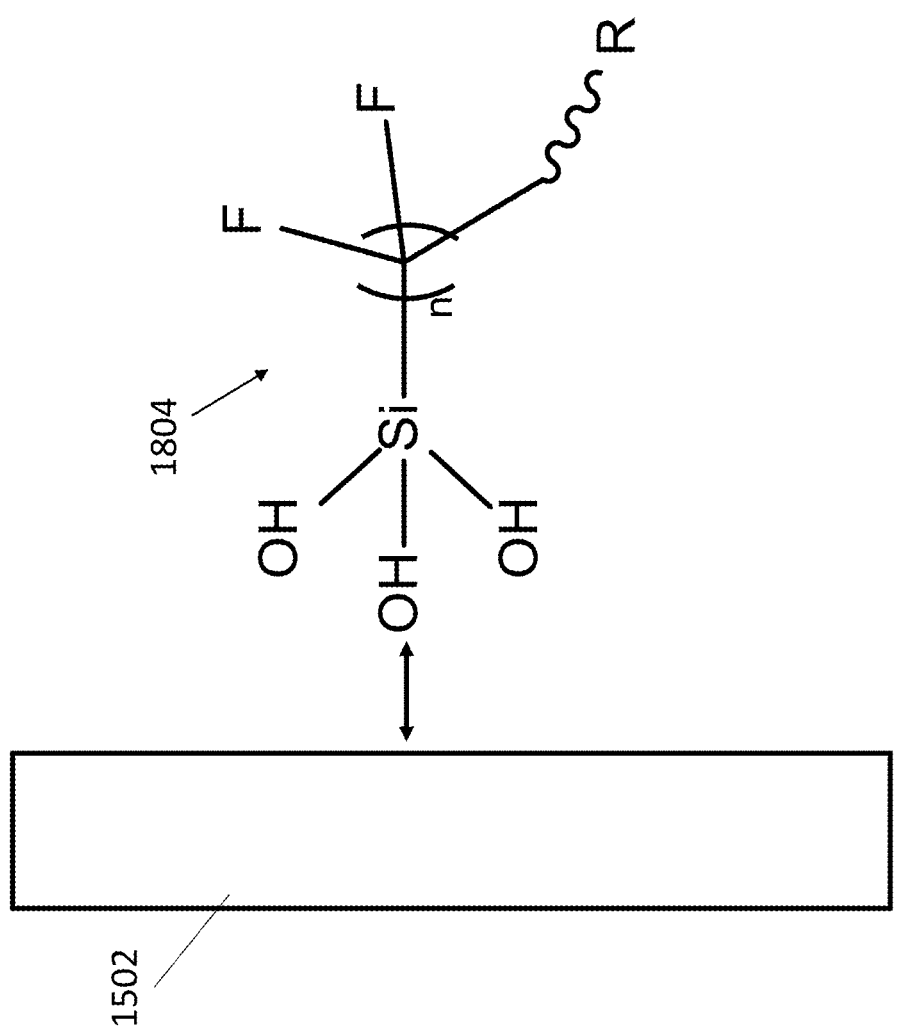
FIG. 19 illustrates a reaction between release material and a cover substrate in accordance with an embodiment of the invention.

FIG. 19 illustrates an example process for forming the release layer. The cover substrate 1502 may be exposed to a release material 1804. The release material 1804 may include a silane based fluoropolymer or fluoro monomer reactant as illustrated. The release material 1804 may include a fluoropolymer such as OPTOOL UD509 (produced by Daikin Chemicals), Dow Corning 2634, Fluoropel (produced by Cytonix), and EC200 (produced by PPG Industries, Inc) or a fluoro monomer. In some embodiments, the release material 1804 may include a polysiloxane coating. A polysiloxane coating may adhere better to materials such as plastic that do not have hydroxyl groups on the surface. A polysiloxane coating may be more robust and processable, and may be more environmentally-friendly to produce than a fluoropolymer. The release material 1804 may be applied through vapor deposition, spin coating, or spraying. In some embodiments, the cover substrate 1502 may be reusable and thus after removal after holographic exposure, the cover substrate 1502 may be placed on another holographic mixture layer which may be exposed with holographic beams.

In some embodiments, the cover substrate 1502 and/or the base substrate 212 may be a substrate that does not include $SiO_2$ as discussed above. In these instances, a very thin layer of $SiO_2$ may be applied to the surface to facilitate bonding/adhesion of the applied reagent hence enabling silane chemistry. When the cover substrate 1502 and/or the base substrate 212 is a substrate that does not include $SiO_2$ any surface modification followed by bonding can provide adhesion. Surface modification may include treating with reagents to introduce reactive functional groups including but not limited to hydroxyl groups. In some embodiments, the cover substrate 1502 and/or the base substrate 212 may not be a glass substrate but may still include hydroxyl groups on the surface. For example, the cover substrate 1502 and/or the base substrate 212 may be sapphire or silicate which may include hydroxyl groups on the surface. In this case, the hydroxyl groups may help facilitate adhesion of the reagent and thus the thin layer of $SiO_2$ would not be present. Examples of silicate substrates are manufactured by: Corning Inc. of Corning, NY, Schott AG of Mainz, Germany, Ohara Inc. of Chuo-ku, Sagamihara, Kanagawa, Japan, Hoya Inc. of Japan, AGC Inc. of Marunouchi, Chiyoda-ku, Tokyo, Japan, and CDGM Glass of Central Islip, NY.

In some embodiments, the cover substrate 1502 and/or the base substrate 212 may include Cleartran which is a form of chemical vapor deposited (CVD) zinc sulfide. A thin layer of $SiO_2$ may be applied to the Cleartran substrate to facilitate bonding/adhesion of the applied reagent. In some embodiments, the cover substrate 1502 and/or the base substrate 212 may be a transparent ceramic such as aluminum oxynitride or magnesium aluminate. A thin layer of $SiO_2$ may be applied to the transparent ceramic substrate to facilitate bonding/adhesion of the applied reagent. In some embodiments, the cover substrate 1502 and/or the base substrate 212 may include plastic such as PMMA, acrylic, polystyrene, polycarbonate, cyclic olefin copolymer, cyclo olefin polymer, polyester. A thin layer of $SiO_2$ may be applied to the plastic substrate to facilitate bonding/adhesion of the applied reagent.

Application of Ashing and/or Atomic Layer Deposition Processes in EPS Fabrication In some embodiments, a further post treatment of the EPSs might be used to remove more of the weak polymer network regions. The post treatment may include using a plasma ashing, to reduce or eliminate this vestigial polymer network. The plasma ashing may be similar to the plasma ashing in semiconductor manufacturing for removing the photoresist from an etched wafer. Exemplary equipment and processes are supplied by Plasma Etch, Inc. incorporated in CA, USA. In plasma ashing, a monatomic (single atom) substance known as a reactive species may be generated from a plasma source and may be introduced into a vacuum chamber where it is used to oxidize or plasma ash the material to be removed. The reactive species may include oxygen or fluorine during the plasma ashing. Advantageously, for processing slanted gratings, the plasma beam can be directional. In some embodiments, the plasma ashing may be inductively coupled plasma ashing which is a process that allows independent control of chemical and physical contributions to the ashing process by forming reactive species and ions. A RF bias on a substrate electrode may be used to control the acceleration of the ions to match the requirements of different surface structures. Electrons and ions in a plasma have different mobilities resulting in a direct current (DC) bias. Electrons, with their low mass, may respond quickly to RF fields, resulting in a fast electron flow to surfaces which in turn imparts a net negative dc bias to the (wafer) surface in contact with the plasma. The voltage difference between the plasma and the wafer surface accelerates positive ions to the surface. The negative DC bias may be used to fine tune many features of the ashing process, such as ashing rate, anisotropy, angular/spatial selectivity and others. In some embodiments, a surface treatment of chemical additives may be applied to the EPS before plasma ashing which may enhance DC bias application. In some embodiments, the EPS may be placed in the presence of a gas such as a noble gas during plasma ashing. The noble gas may be argon. In some embodiments, the plasma ashing may be used to adjust at least one of fringe shape and spatial variation of the polymer grating structure. In some embodiments, the plasma ashing beam intensity may be variable to provide spatially varying modulation depths. Angular variation of the intensity of the plasma ashing beam may be used for fringe shaping. In some embodiments, the plasma ashing may be applied along more than one intersecting direction for forming a photonic crystal. In some embodiments, a high functionality acrylate around the edge of the diffracting features may change the density of a diffracting feature of the EPS with the plasma ashing rate being controlled at a spatial resolution comparable to the EPS spatial frequency. The morphology of the EPS may be modified to improve grating performance and increase the efficiency of processes such as ashing, improve the grating definition, change the surface structure to reduce haze adding materials for increasing the chemical affinity with gases present during the plasma ashing process, and/or change the effective refractive index of the grating. In some embodiments, the modulation depth of the EPS may be determined by the plasma ashing time since the greater the plasma ashing time the more material is removed.

In some embodiments, oxygen and/or fluorine may be used as reactive species in the plasma ashing process. In some embodiments, hydrogen plasmas may be used in the plasma washing process. In some embodiments, ashing rates in oxygen plasma may be controlled by additives in the HPDLC mixture such as nitrogen. In some embodiments, a plasma ashing process for ashing organic material may use a gas mixture of oxygen and $NH_3$. An oxygen based process may suffer from substrate surface oxidation. In some embodiments, the plasma ashing process may include oxygen free plasmas which may include mixtures of nitrogen and hydrogen to overcome surface oxidation. Such plasma mixtures may further comprise fluorine.

In some embodiments, post coating the EPSs with a very thin atomic layer of high index material can enhance the diffractive properties (e.g. the refractive index modulation) of the grating. The coating may be a metallic layer or a dielectric layer. One such process, Atomic Layer Deposition (ALD), involves coating the gratings with $TiO_2$ or $ZnO_2$ or similar. The coating may provide a grating structure that is more robust against temperature variations and various other environmental conditions. The ALD process can also provide a large effective index even when the grating structures are made of lower index materials. This technique may be similarly applied to the fabrication of nanoimprinted SRGs where a few nanometer thick ALD can protect the resin into which the SRG is stamped and can also improve the effective refractive index modulation. The use of Atomic Layer Deposition (ALD) on top of an EPS may yield further performance improvement. In many embodiments, the duty cycle of the EPS might not be optimal for weak polymer networks. In some embodiments, the duty cycle of the EPS may be 30% polymer.

Figure 20A:
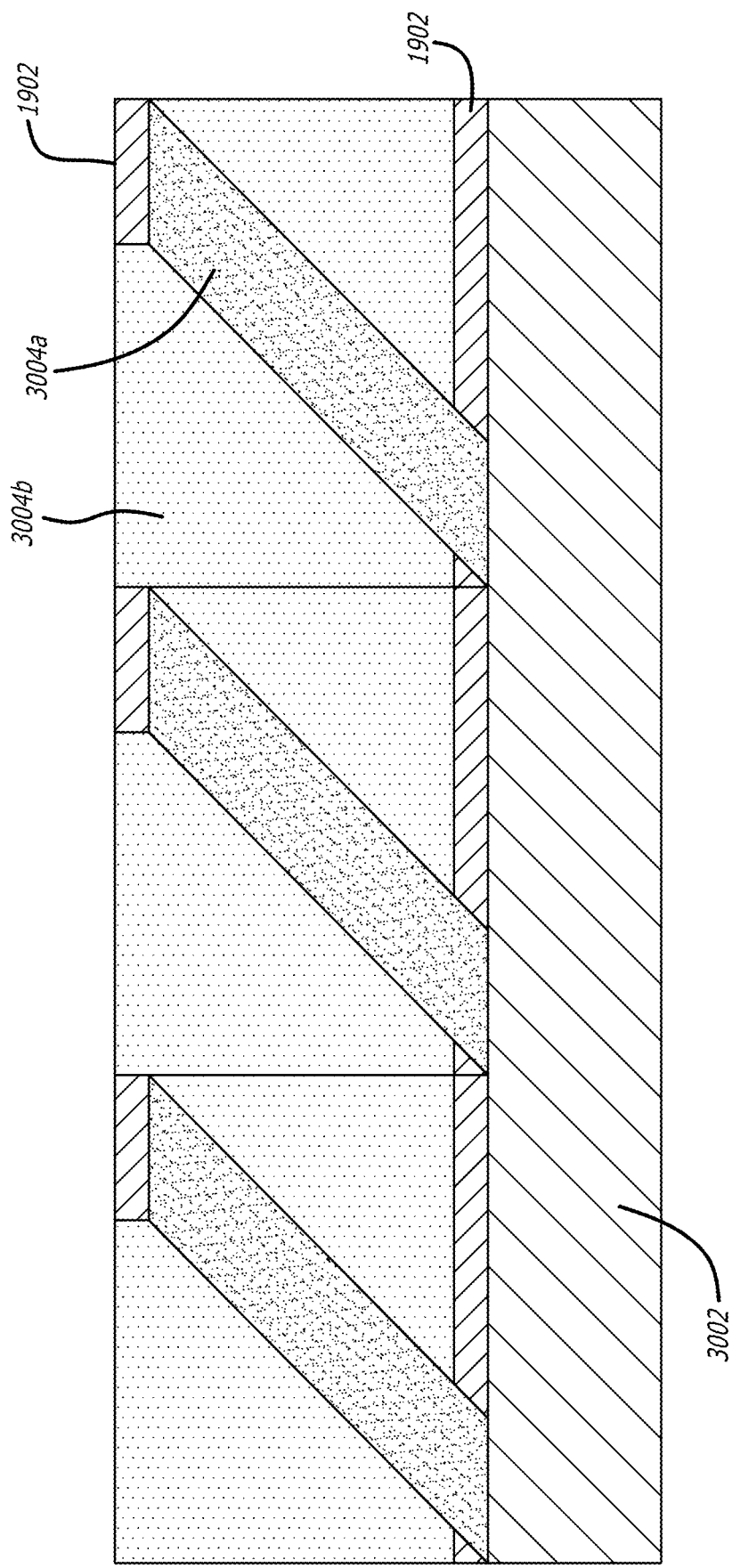
FIGS. 20A and 20B illustrate various grating in accordance with an embodiment of the invention.
Figure 20B:
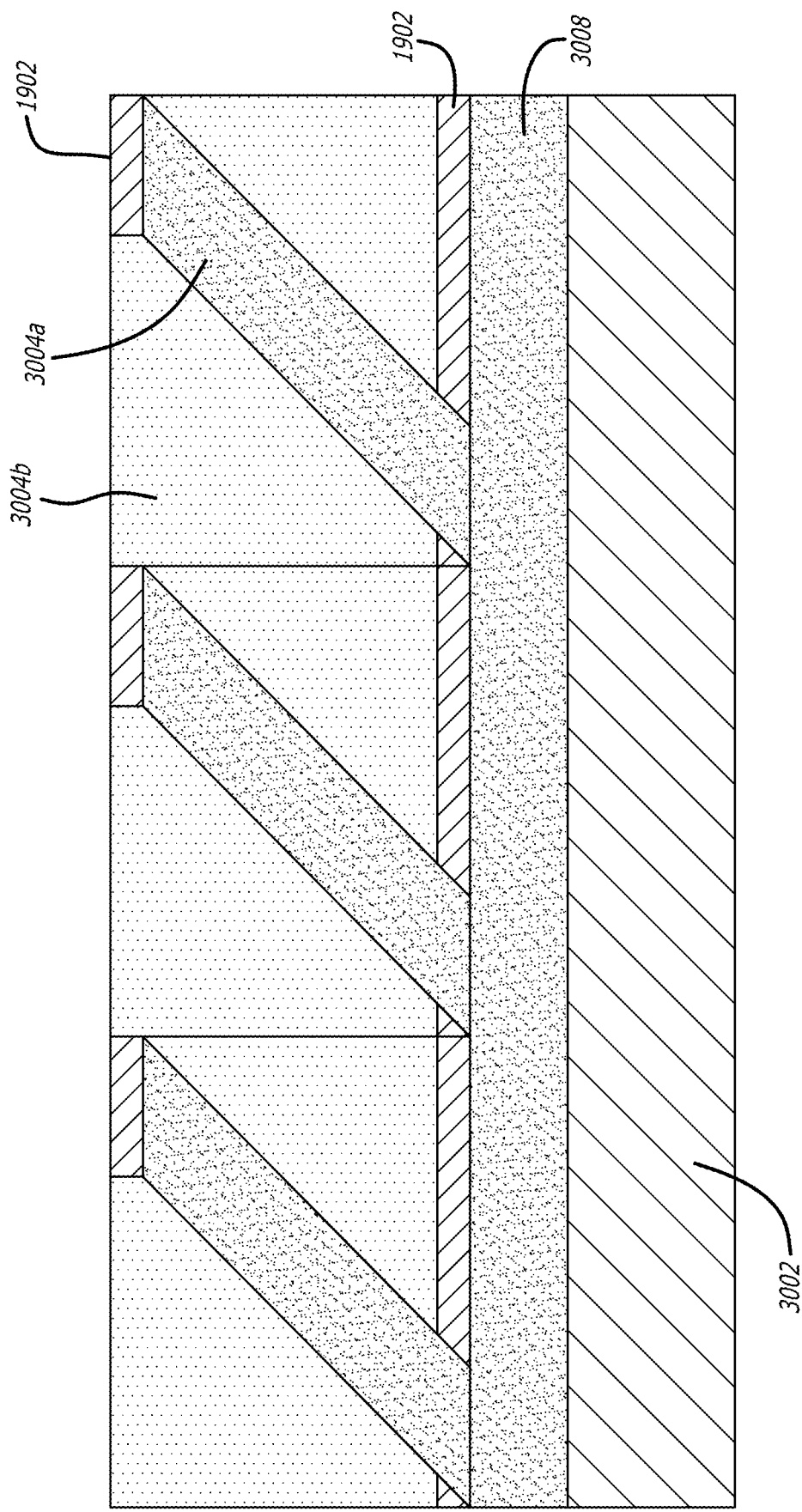

Various EPS manufacturing processes are described above in FIGS. 1A-1D. FIGS. 3A and 3B illustrate various EPSs after manufacturing. FIGS. 20A and 20B illustrate various grating in accordance with an embodiment of the invention. The grating includes many identically numbered elements to those of FIGS. 3A and 3B. The description of these elements of FIGS. 3A and 3B are applicable to the gratings of FIGS. 19A and 19B and will not be repeated in detail. The gratings may be EPSs which are manufactured using processes described in connection with FIGS. 1A-1D and FIG. 2. The gratings may also be hybrid gratings which are manufactured using processes described in connection with FIGS. 4A-4E and 5. As illustrated in FIGS. 19A and 19B, the grating may include a coating 1902. The coating 1902 may be present on the horizontal surfaces such as the top of the polymer regions 3004a and the substrate 3002. As illustrated, FIG. 19B includes an optical layer 3008 which is in direction contact with the substrate 3002 such that the optical layer 3008 is positioned between the polymer regions 3004a and the substrate 3002. The coating 1902 may be positioned on the optical layer 3008. The coating 1902 may be deposited using a process such as ALD. The coating 1902 may not have step coverage and thus only be deposited on the horizontal surfaces such as the top of the polymer regions 3004a and the substrate 3002 or optical layer 3008. In some embodiments, the coating 1902 may be deposited using a process that includes step coverage such that the coating 1902 is present on the sidewalls of the polymer regions 3004a. In some embodiments, the coating 1902 may be $TiO_2$ or $ZnO_2$. The coating 1902 may be multilayered to include multiple different layered materials. In some embodiments, an additional passivation coating may be applied to the surfaces of the polymer grating structure over the coating 1902. The additional passivation coating may provide environmental protection (e.g. protection from moisture and/or contamination).

Figure 20C:
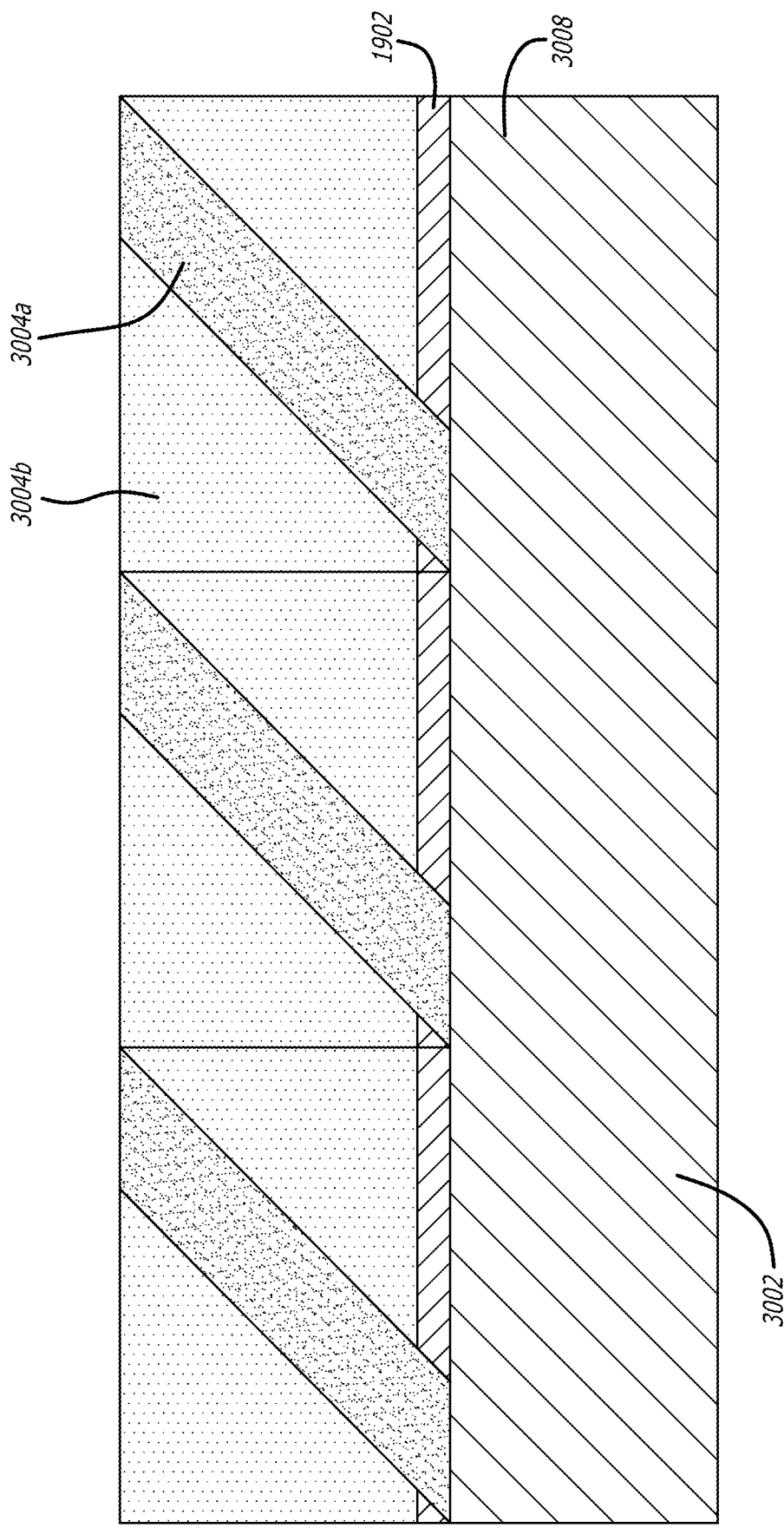
FIG. 20C illustrates a grating in accordance with an embodiment of the invention.

In some embodiments, the coating 1902 may be present on the substrate 3002 or optical layer 3008 and not the top of the polymer regions 3004a. FIG. 20C illustrates a grating in accordance with an embodiment of the invention. The grating includes many identically numbered elements to those of FIGS. 3A and 3B. The description of these elements of FIGS. 3A and 3B are applicable to the gratings of FIG. 20C and will not be repeated in detail. As illustrated, the grating of FIG. 20C includes a coating 1902 similar to FIGS. 20A and 19B. However, the coating 1902 is only present on the substrate 3002 and not the tops of the polymer regions 3004a as is the case in FIGS. 20A and 20B. In embodiments with an optical layer 3008, the coating 1902 may only be present on the optical layer 3008 and not on the tops of the polymer regions 3004a. In some embodiments, the coating 1902 may be removed off the tops of the polymer regions 3004a or the coating 1902 may be selectively deposited on the substrate 3002. The coating 1902 may function as a bias layer similar to the optical layer 3008.

Embodiments Including Slanted EPSs

In some embodiments, the gratings include slanted EPSs making up slanted gratings. Slanted gratings can be configured as binary gratings, blazed gratings, and/or multilevel gratings and other structures. Slanted gratings may couple monochromatic angular light into waveguides with high diffraction efficiency. They also allow angular content to be managed more efficiency once the light is inside the waveguide. When configured with stepwise or continuously spatially varying K-vectors the angular bandwidth that can be coupled into a waveguide may be increased.

Embodiments Including Eyeglow Suppression

In waveguide-based displays light may be diffracted toward the user and also away from the user. Eye glow may include unwanted light emerging from the front face of a display waveguide (e.g. the waveguide face furthest from the eye) and originating at a reflective surface of the eye, a waveguide reflective surface and a surface of grating (due to leakage, stray light diffractions, scatter, and other effects). The light that is diffracted away is commonly called "eyeglow" and poses a liability for security, privacy, and social acceptability. "Eye glow" may refer to the phenomenon in which a user's eyes appear to glow or shine through an eye display caused by leakage of light from the display, which creates an aesthetic that can be unsettling to some people. In addition to concerns regarding social acceptability in a fashion sense, eye glow can present a different issue where, when there is sufficient clarity to the eye glow, a viewer looking at the user may be able to see the projected image intended for only the user. As such, eye glow can pose a serious security concern for many users. A discussion of various eyeglow suppression systems is discussed in detail in WO 2021/242898, entitled "Eye Glow Suppression in Waveguide Based Displays" and filed May 26, 2021, which is hereby incorporated by reference in its entirety for all purposes.

FIGS. 21A-21C conceptually illustrate three embodiments of waveguides in which evanescent coupling into a grating can occur. In these embodiments, a grating layer 2004 is positioned on a substrate 2002. In FIG. 21A, two identical substrates 2002, 2006 sandwich the grating layer 2004. In FIG. 21B, a thin substrate 2006a and a thick substrate 2006 sandwich the grating layer 2004. In FIG. 21C, a thick substrate 2002 supports the grating layer 2004 without the presence of a top substrate. The top substrate 2006, 2006a may be a cover substrate or coating. In other embodiments, a thin protective coating can be applied to the grating layer 2004. The upper surface of each the waveguide embodiments faces the user's eye. The grating layer 2004 may eject light 2010 from the waveguide towards the user's eye. Unwanted eyeglow light 2008 may also be ejected towards the environment as illustrated in the cases of FIGS. 21A and 21B.

Eyeglow and/or light leakage can be reduced from the opposing outer surface by eliminating the top substrate as illustrated in FIG. 21C. The elimination of an upper substrate may result in less eyeglow/light leakage than the other two embodiments. Note that, in each embodiment illustrated, all rays shown undergoing TIR are at TIR angles that may be evanescently coupled to the grating layer 2004. Zero order light rays are indicated by dashed lines. In some embodiments, the evanescent grating coupling may result in eyeside output light substantially normal to the waveguide, as shown.

Where the grating average refractive index is lower than the substrates, then for high angles (far from TIR) where only evanescent coupling can occur, zero order TIR light cannot pass through the grating layer 2004 to TIR off both air interfaces. Light propagating in TIR can therefore get trapped on one side of the grating or the other. Grating depth in the thickness of the waveguide may affect the amount of light that is coupled to the desired eyeside, and the undesired non-eye side where light is lost as eyeglow/light leakage. In some embodiments, evanescent coupling may result in at least a portion of the coupled light being converted to guided modes within at least one the grating and the eye side waveguide substrate 2006, 2006a. The evanescent coupling behaviors may be a function of the TIR angle, grating thickness, modulation, average index and the index and thickness of the eyeside substrate 2006, 2006a.

In some embodiments, a slanted EPS may also provide eyeglow suppression. One advantage to the use of EPSs in the context of eyeglow suppression and other stray light control applications such as glint suppression, is that a variety of grating types can be implemented on a waveguide substrate to provide different types of beam angular selectivity for dealing with the stray light present in various regions of the waveguide. In some regions of a waveguide where wide angle capability is desired, an EPS may be configured as a Raman-Nath grating, which may have a modulation depth less than the grating pitch across at least a portion of the polymer grating structure. In other regions where high diffraction efficiency for certain beam angles is required, an EPS may operate in the Bragg regime.

Embodiments Including Inverse Gratings

Figure 22A:
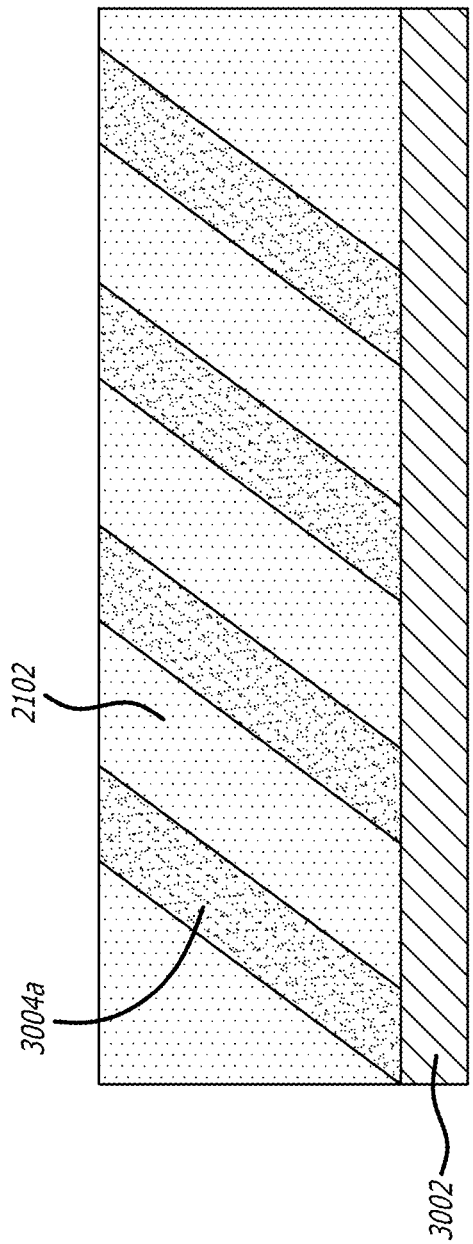
FIGS. 22A-22D illustrate various stages of manufacturing an inverse grating in accordance with an embodiment of the invention.

In some embodiments, the gratings disclosed in connection with FIGS. 20A and 20B may be used to create inverse gratings. These inverse gratings may be thin film gratings. FIGS. 22A-22D illustrate various stages of manufacturing an inverse grating in accordance with an embodiment of the invention. The various stages of manufacturing includes many identically numbered elements to those of FIGS. 3A, 3B, 20A, and 20B. The description of these elements of FIGS. 3A, 3B, 20A, and 20B are applicable to the gratings of FIG. 20C and will not be repeated in detail. FIG. 22A corresponds to the structure created in FIG. 1B which includes polymer regions 3004a separated by phase separated material 2102. The phase separation grating may be formed from a mixture of monomer and a second component deposited onto the substrate 3002 using the recording process described above. The second component can include a liquid crystal or a suspension of nanoparticles. Other materials capable of phase separation can be used. After exposure, a grating may be created including alternating fringes rich in polymer and fringes rich in the second component.

Figure 22B:
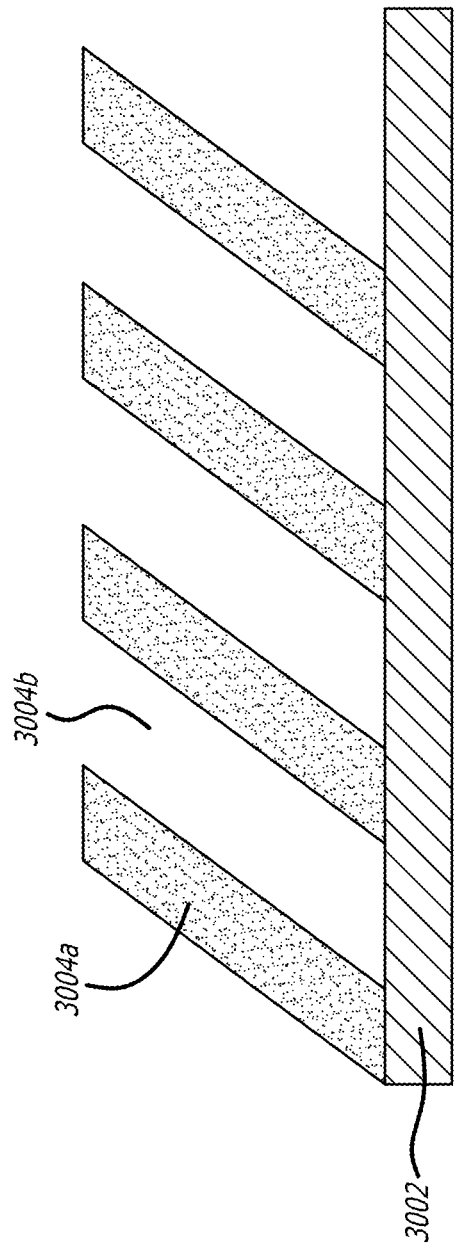

In FIG. 22B, the phase separated material 2102 is removed to create air gap regions 3004b to create an EPS. The EPS structure created in FIG. 22B corresponds to the EPS structure in FIG. 3A. In this step, the second component can be removed to form a polymer surface relief grating including polymer regions separated by air spaces.

Figure 22C:
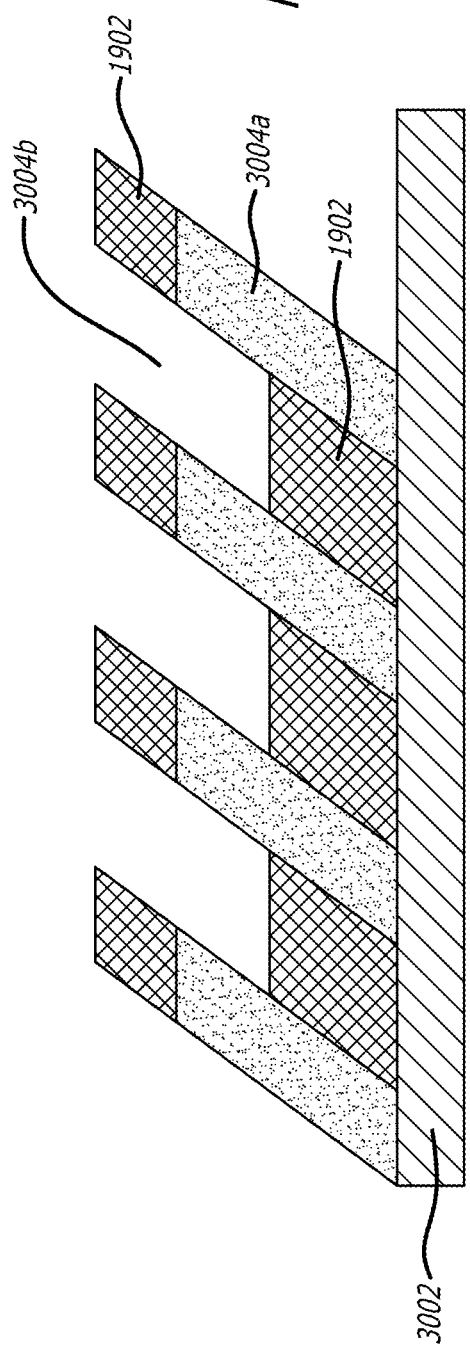

In FIG. 22C, a coating 1902 is applied to the surfaces of the substrate 3002 and the tops of the polymer regions 3004a. In some embodiments, the coating 1902 may be applied through an ALD process. The structure created in FIG. 22C corresponds to the structure in FIG. 19A. In some embodiments, the air regions 3004b can be at least partially backfilled with a material of refractive index differing from that of the polymer regions 3004a. The backfilling can be performed by applying an ALD coating similar to the one described above. In some embodiments, the ALD coating may be higher thickness than the thin coatings described in connection with FIGS. 20A-20C. Other methods of backfilling the grating may be used depending on the type of material and the thickness of backfilled layer. The backfill material can have an index higher or lower than that of the polymer regions 3004a, according to the intended grating application. At the end of this step, the polymer surface relief grating may be partially filled with the backfill material as shown in FIG. 22C. As illustrated, some of the backfill material may adhere to the top faces of the polymer regions 3004a. Some of the backfill material may also adhere to the upper portions of the polymer regions 3004a.

Figure 22D:
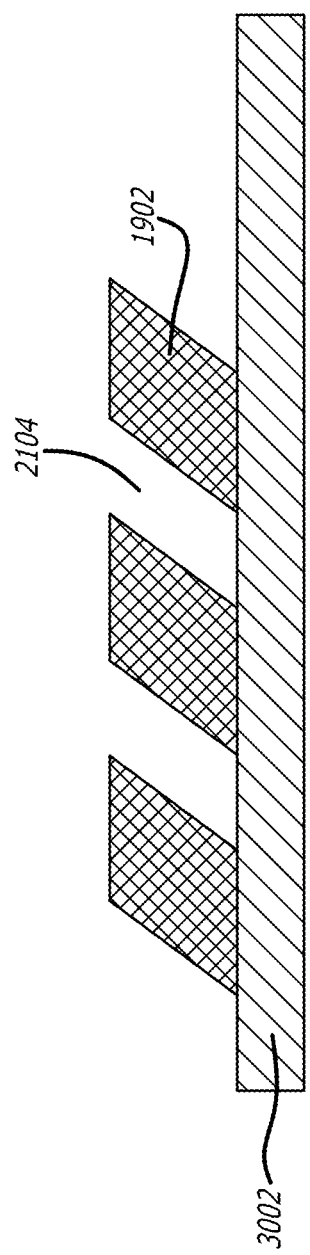

In FIG. 22D, the polymer regions 3004a are removed. The coating 1902 on the tops of the polymer regions 3004a is removed as well. The remaining coating 1902 disposed on the substrate 3002 may be used as an inverse grating. The remaining coating 1902 alternates with air regions 2104. In this step, the polymer regions 3004a and unwanted coating 1902 can be removed using an etching process such as a plasma ashing process to reveal a slanted Bragg surface relief grating composed of the coating 1902 supported by the substrate 3002. In some embodiments, the polymer regions 3004a may be removed through a plasma ashing technique. The inverse grating may be a thin film Bragg surface relief grating.

Embodiments for Fabricating a Surface Relief Grating with Improved Grating Definition One strategy for reducing haze is to reduce the surface roughness of SRGs. In many embodiments, a composite grating with improved surface definition, e.g. low surface roughness. FIG. 23A illustrates a schematic representation of a grating in accordance with an embodiment of the invention. In a first step, the grating may be formed using phase separation of a starting mixture including a material A and a material B using the procedures discussed earlier. Material A may be a polymer. After curing of the grating, component B may be extracted to leave a grating including high index regions containing voids 2301 embedded in polymer 2302 and low index regions containing a weak polymer structure and other residues resulting from incomplete phase separation. The polymer structure and other residues may be further removed using a process such as plasma ashing to leave air regions 2303.

FIG. 23B illustrates a schematic representation of a grating in accordance with an embodiment of the invention. The grating may be manufactured with a process starting with the process described in connection of FIG. 23A. In a next step, the grating is immersed in a material C which fills the voids 2304 and air regions 2305. The material C may be cured using a process such as UV exposure.

Figure 23C:
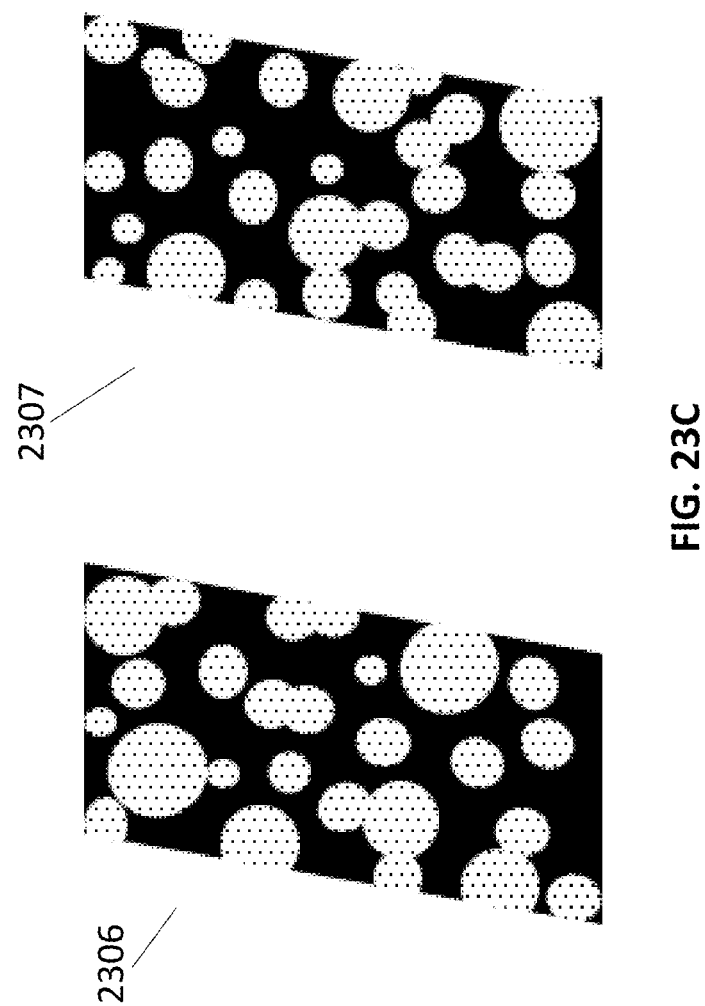
FIG. 23C illustrates a schematic representation of a grating in accordance with an embodiment of the invention.

FIG. 23C illustrates a schematic representation of a grating in accordance with an embodiment of the invention. The grating may be manufactured with a process starting with the process described in connection of FIG. 23B. In a next step, material C may be removed from the gap regions by a process such as plasma ashing to leave composite polymer and material C regions 2306 separated by air gaps 2307. The plasma ashing step may be separate from the plasma ashing step described in connection with FIG. 30A. After plasma ashing, the composite material may have a smoother surface the polymer 2302 described in connection with FIG. 23A. Material A and material C may provide a refractive index contrast that is low enough to minimise scattering while providing a desired refractive index modulation.

In many embodiments bulk scatter may be strongly influenced by the refractive index contrast within the high index region while surface scattering may be dependent on the surface texture. In many embodiments, by filling surface voids as in the process discussed in FIGS. 23A-23C in combination with ashing may result in a smoother surface structure. In many embodiments, the above process may be used to eliminate the bulk scatter contributions that may arise from voids within the polymer regions 2304.

Figure 24:
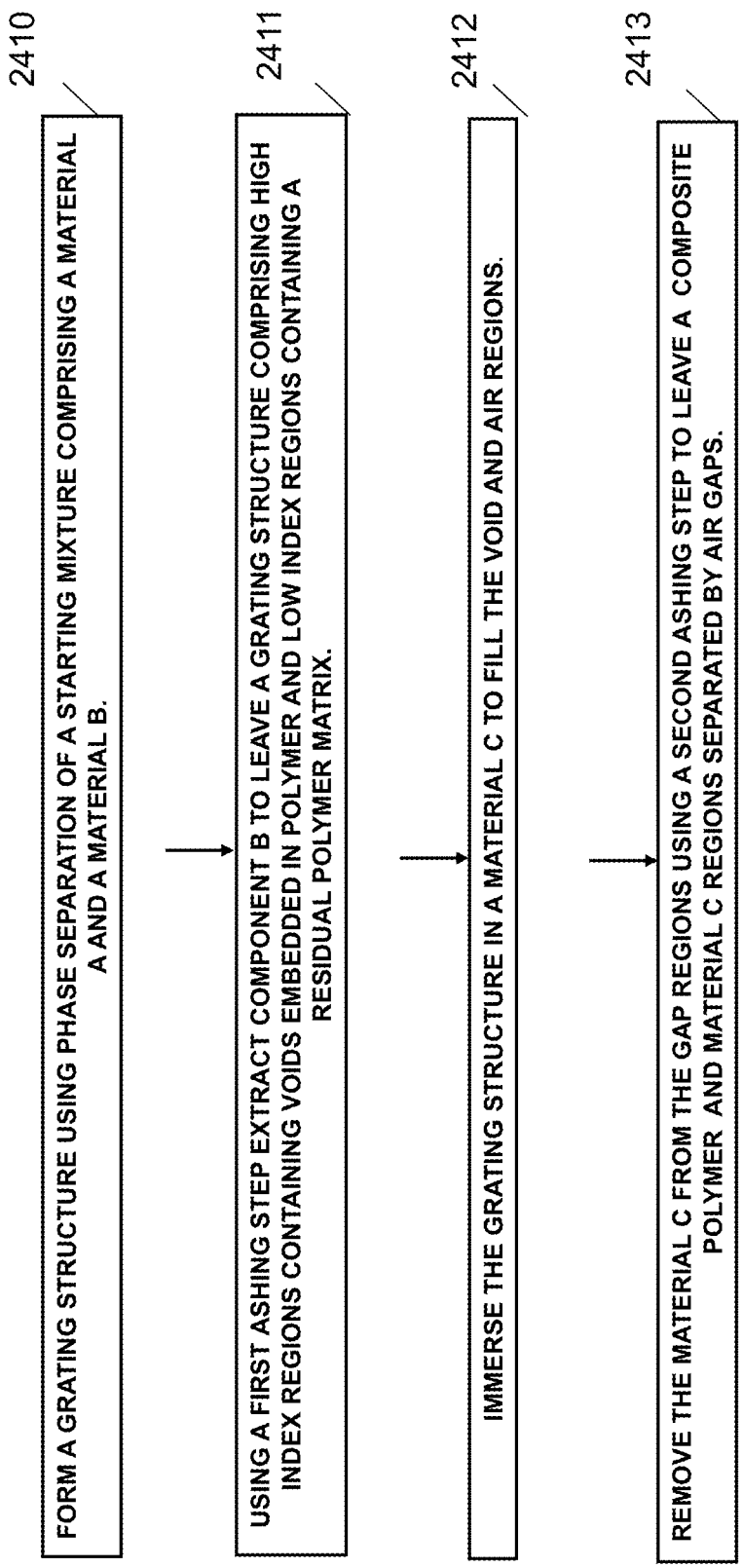
FIG. 24 illustrates an example process flow for fabricating SRGs in accordance with an embodiment of the invention.

FIG. 24 illustrates an example process flow for fabricating SRGs in accordance with an embodiment of the invention. In a first step, a grating structure may be formed 2410 using a phase separation process utilizing a starting mixture including a material A and a material B. After phase separation, there may be a material A rich region and a material B rich region. In a second step which includes a first ashing step, material B may be extracted (2411) to leave a grating structure including high index regions containing voids embedded in polymer and index regions containing a residual polymer matrix. The material B rich regions may become an air regions after the first ashing step. In a third step, the grating structure may be immersed (2412) in a material C to fill the voids in the polymer rich regions and air regions. In a fourth step, the material C may be extracted (2413), using a second ashing step, to remove material C from the previous air regions to leave a composite polymer and material C region separated by air gaps. As described previously, this may result in a lower surface roughness in the fabricated SRGs. In some embodiments, the SRGs may be deep SRGs as discussed previously.

Surface Relief Gratings Configured as Dual Interaction Gratings

In conventional Bragg gratings, dual interaction can be understood using basic ray optics by considering upwards and downward TIR ray interactions with a fold grating. The upward and downwards rays occurring when guided light is reflected at the lower and upper waveguide TIR surfaces. The two ray paths give rise to two shifted diffraction efficiency vs angle characteristics which combine to extend the angular bandwidth. Examples of an optical waveguide including at least two TIR surfaces and containing a grating of a first prescription configured such that an input TIR light with a first angular range along a first propagation direction undergoes at least two diffractions within said grating and undergoes a change in propagation direction from said first propagation direction to a second propagation direction, wherein each ray from said first angular range and its corresponding diffracted rays lie on a diffraction cone of said grating, wherein each diffraction provides a unique TIR angular range along said second propagation direction are disclosed in U.S. Pat. No. 9,632,226, entitled "Waveguide Grating Device" and filed Feb. 12, 2015, which is incorporated herein by reference in its entirety for all purposes.

Figure 25A:
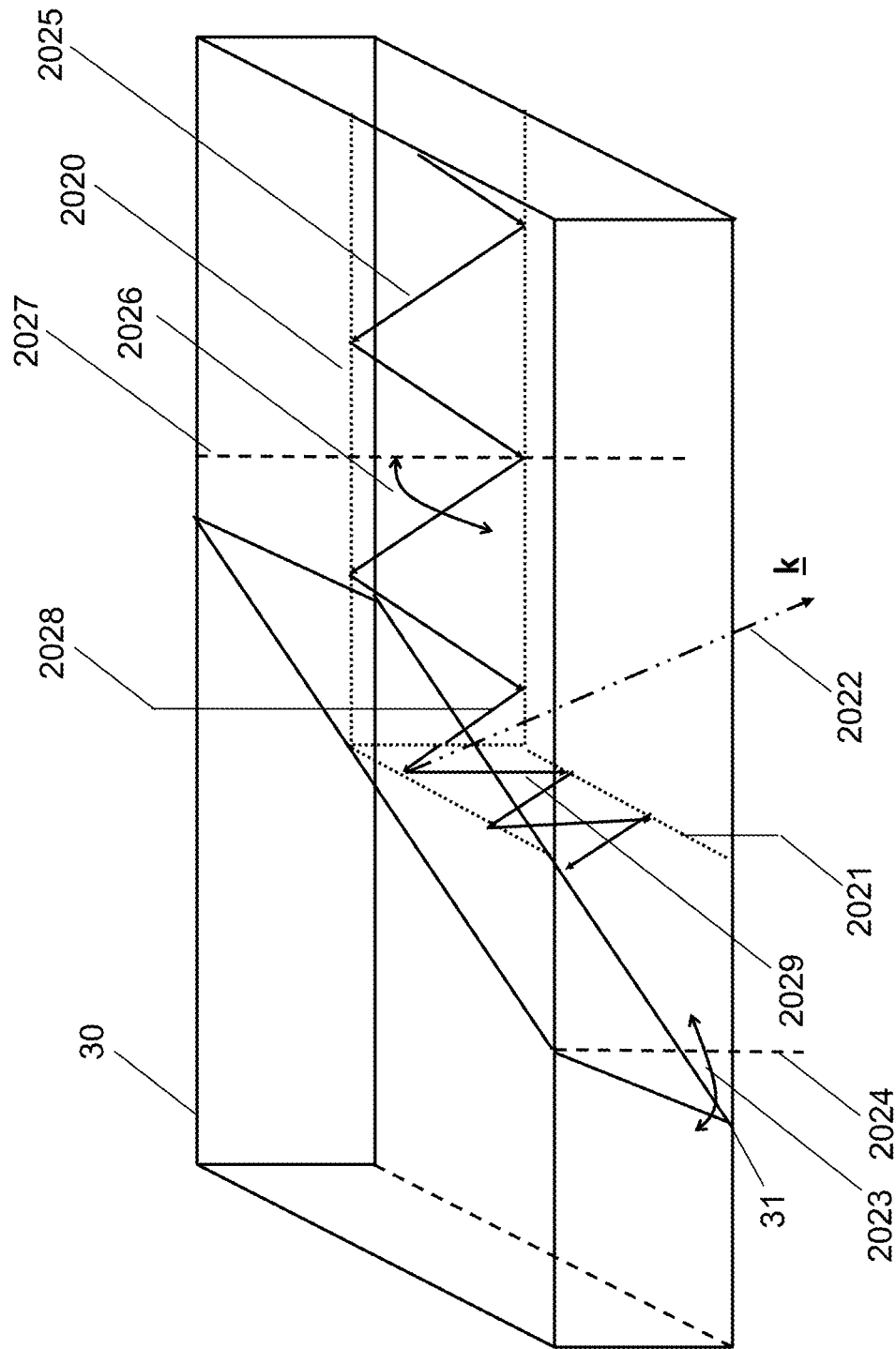
FIGS. 25A and 25B illustrate the principles of a dual interaction grating for implementation in a waveguide.
Figure 25B:
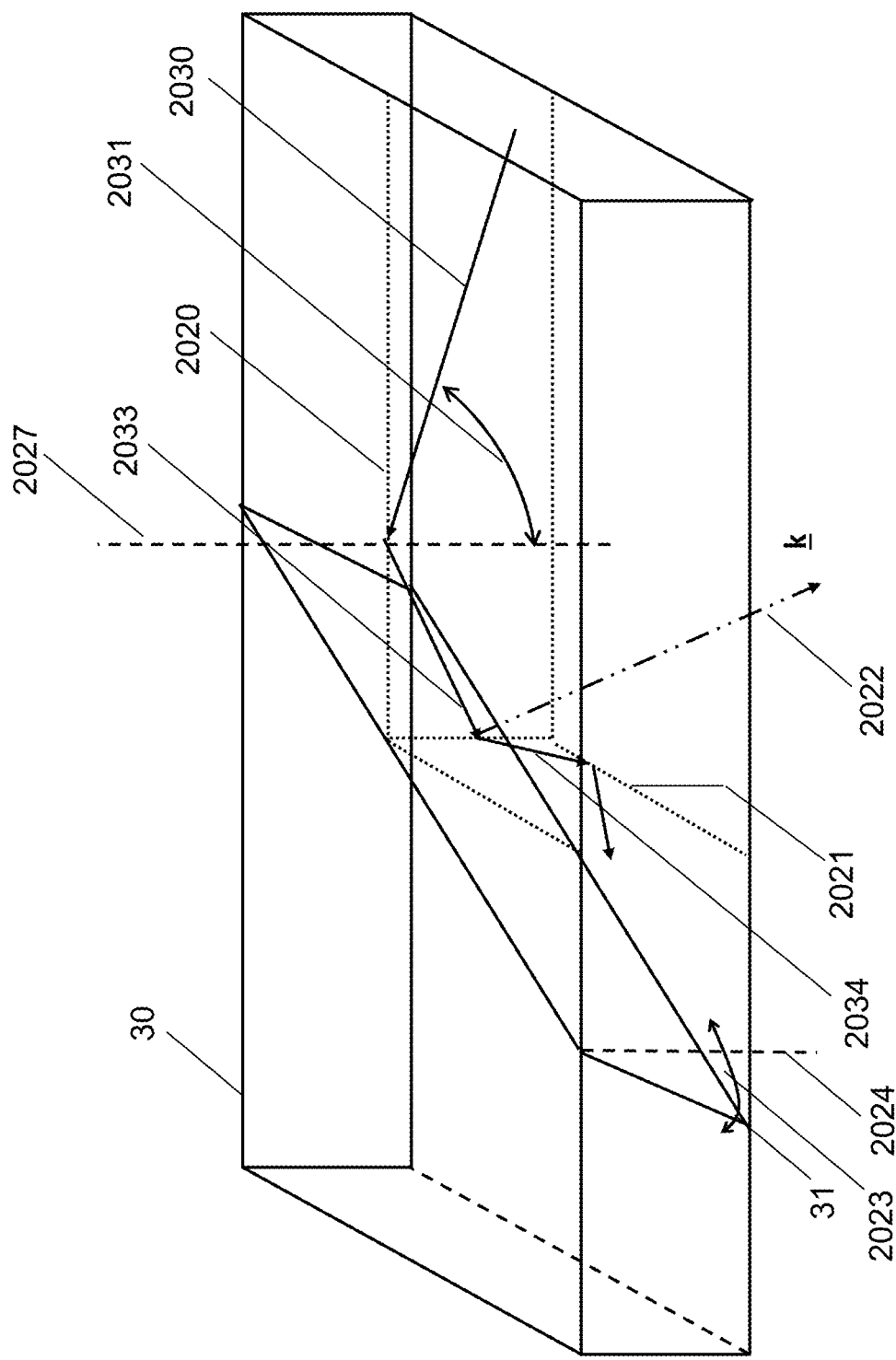

FIGS. 25A and 25B illustrate the principles of a dual interaction grating for implementation in a waveguide. The waveguide 30 includes grating fringes 31 slanted with respect to the waveguide TIR faces and aligned at a clocking angle within the waveguide plane. In many embodiments clocking angle may be 45 degrees to provide a 90 degree beam deflection. In FIG. 25A, a first TIR path lies in the input propagation plane 2020 and, after diffraction in the output propagation plane 2021. The grating has a k-vector 2022 also labelled by the symbol k. The tilt angle 2023 of the grating fringes relative to the waveguide surface normal 2024 is also indicated. TIR light 2025 in the propagation plane 2001 having a TIR angle 2026 relative to the waveguide plane normal 2027 strikes the grating fringe as an upward-going ray 2028 which is diffracted into the TIR direction 2029 lying inside the propagation plane 2021. In FIG. 25B, a second TIR path in the input propagation plane 2001 indicated by 2030 has a TIR angle 2031 relative to the waveguide plane normal 2027 strikes the grating fringe as a downward-going ray 2033 which is diffracted into the TIR direction 2034 lying inside the output propagation plane 2021. Since the upward-going and downward-going TIR rays are asymmetric in this case there may be two peaks in the output diffraction efficiency versus angle characteristics.

Figure 26:
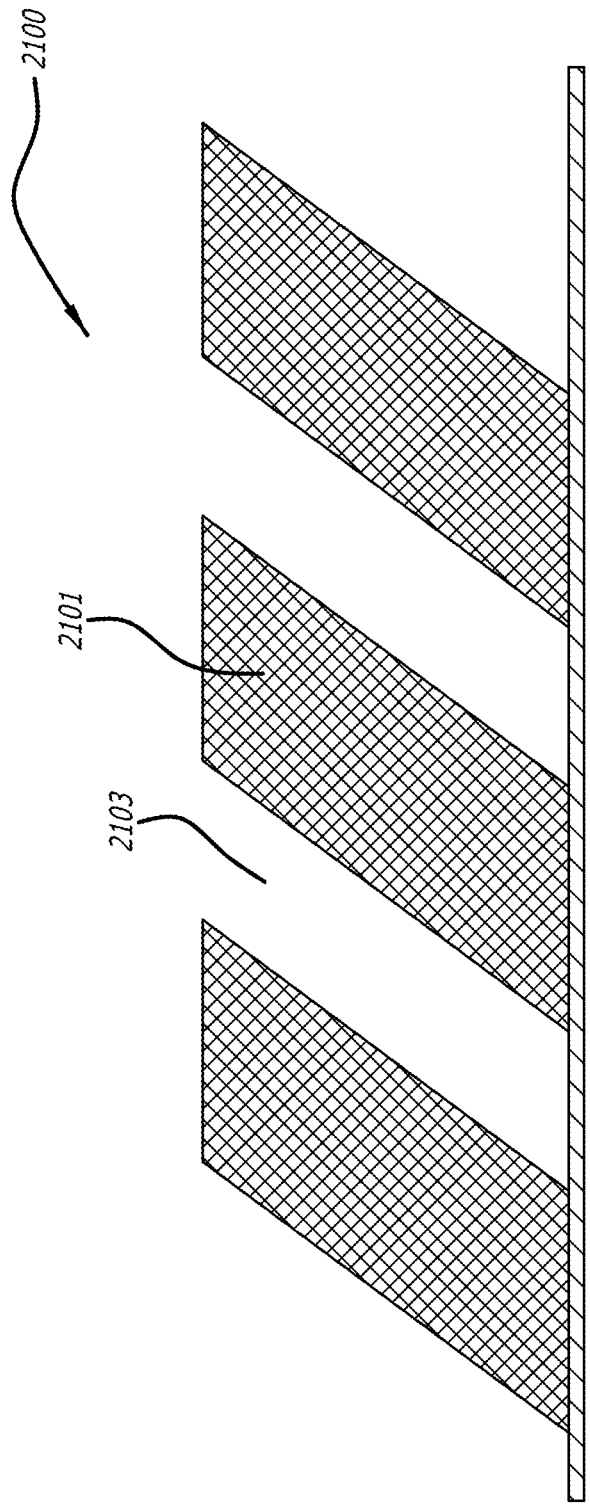
FIG. 26 conceptually illustrates a cross section of a grating in accordance with an embodiment of the invention.
Figure 27:
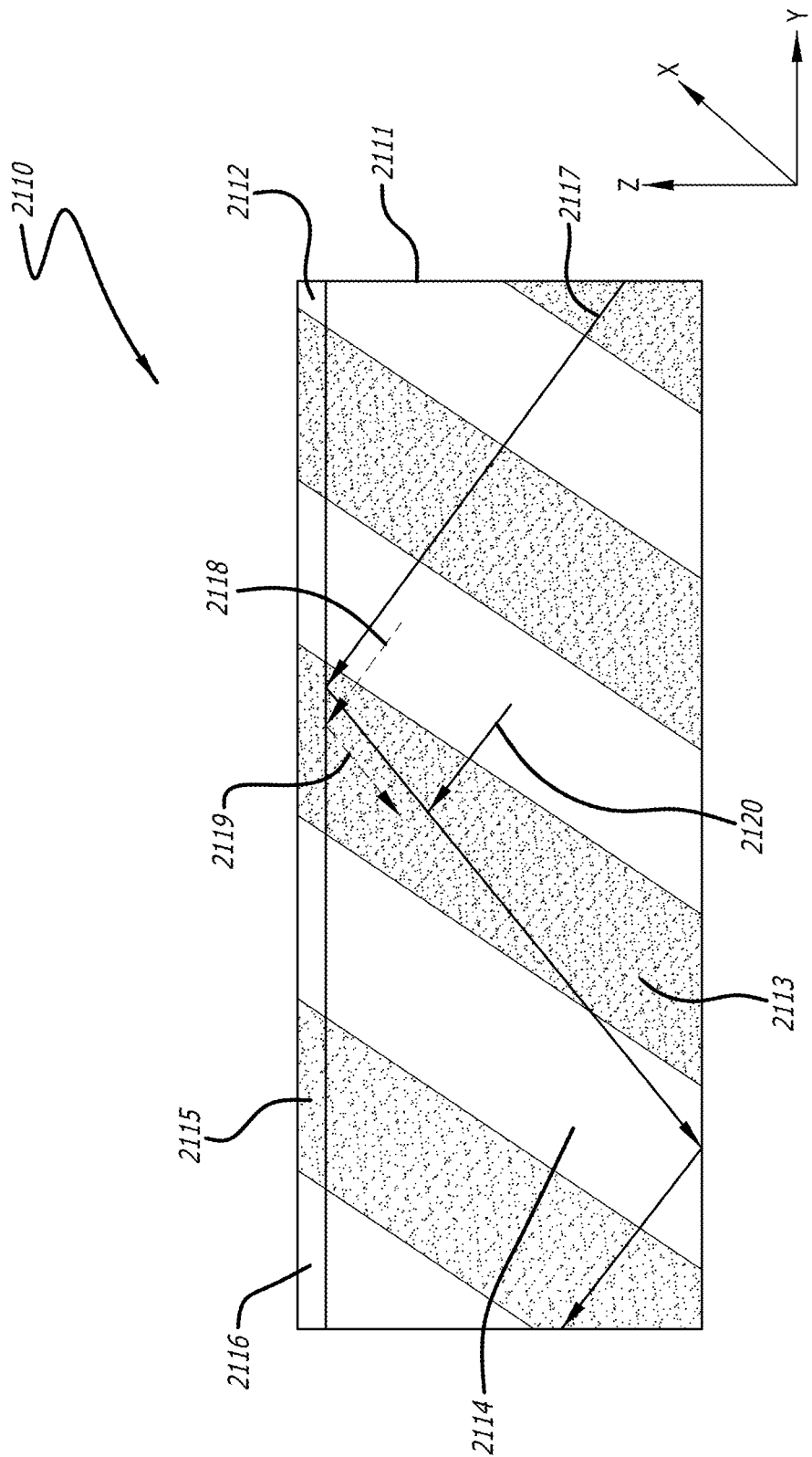
FIG. 27 is a conceptual representation of beam propagation with the grating of FIG. 26.

FIG. 26 conceptually illustrates a cross section of a grating in accordance with an embodiment of the invention. The grating may be a SRG 2100 including slanted fringes 2101 separated by air volumes 2103. In many embodiments, the gratings may be clocked or slanted within the waveguide plane. FIG. 27 is a conceptual representation of beam propagation with the grating of FIG. 26. The grating is represented as a configuration 2110 which for conceptual purposes may be divided up into a deep grating portion 2111 including alternating high index fringes 2113 and low index fringes 2114, which operates in the Bragg regime, overlaid by a thin grating portion 2112 including alternating high index regions 2115 and low index regions 2116 which operates in the Raman-Nath regime. In many embodiments, the high index regions 2115 are polymer and the low index regions 2116 are air. The grating configuration 2110 supports TIR beam propagation include ray paths such as 2117. To simplify the explanation of the embodiment the guided ray reflection as represented by the rays 2118,2119, is represented as taking place at the interface of the volume grating portion 2111 and the thin grating portion 2112. A reasonable approximation of the TIR at the thin grating portion 2112 may be considered separated from the coupled wave propagation through the volume grating portion 2112.

Figure 28:
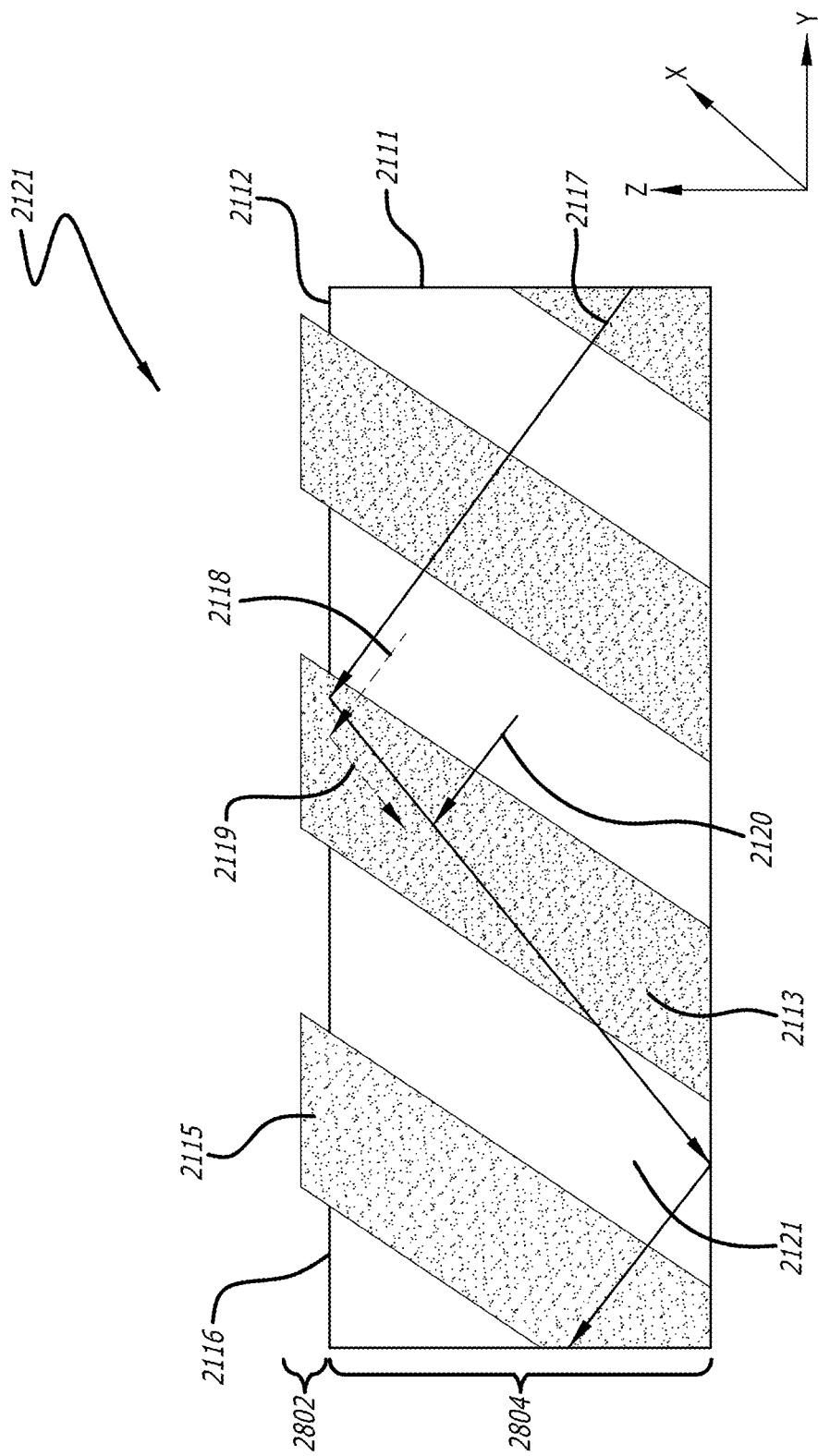
FIG. 28 illustrates an example of a partially backfilled grating in accordance with an embodiment of the invention.

In some embodiments, the thick grating portion 2112 may be partially backfilled with a different refractive index material up to the level of the thin grating portion 2112 and thick grating portion 2111 interface. FIG. 28 illustrates an example of a partially backfilled grating 2121 in accordance with an embodiment of the invention. This partially backfilled grating 2121 may be considered a hybrid surface relief grating/volume Bragg grating. The backfilled grating 2121 is the grating described in connection with FIG. 27 that has been backfilled with a different refractive index material. The backfilled grating 2121 may be considered a volume grating. In many embodiments, the unfilled regions that remain after partial backfilling of the air regions may provide a polymer Raman-Nath surface relief grating 2802 including alternating polymer regions and air regions overlaying a Bragg grating 2804 comprising alternating polymer regions and backfilled material regions. In a waveguide implementation the upward and downward TIR propagation directions may be produced by TIR at the waveguide to air interfaces.

The dual interaction illustrated in FIGS. 25A-25B may include upward and downward propagating TIR rays. In an SRG, one of the TIR propagation directions results from the reflective diffraction at the SRG taking place at an angle equal to the TIR angle. The SRG may allow diffraction TIR to take place with high efficiency subject to some constraints on the ranges of incidence angles, K-vector directions, grating clock angles, grating period, and/or grating thickness. In some embodiments, the SRG may be a fold grating.

Hence a first TIR propagation direction 2119 produced by the surface grating and an opposing TIR propagation direction 2120 produced by reflection from the opposite face of the grating substrate may interact within the volume grating portion shown in FIG. 28. In many embodiments, this ray-grating interaction may result in a dual interaction according to the embodiments and teachings of U.S. Pat. No. 9,632,226 which is hereby incorporated by reference in its entirety for all purposes. The grating diffraction efficiency may be dependent on the at least one of the guide beam angular bandwidth, grating vector, grating thickness, and/or grating fringe spacing. In some embodiments, the thick grating portion 2111 may be eliminated to provide only the thin surface relief grating portion 2112 supported by a transparent substrate.

Hybrid surface relief grating/volume Bragg grating structures may offer several advantages including wider cumulative angular response which, in many embodiments, may allow thicker gratings to be used for improving DE without compromising angular bandwidth. Coating the hybrid gratings with an ALD coating to increase the effective index may further enhance the angular bandwidth. In many embodiments, the hybrid surface relief grating/volume Bragg grating structures may improve the diffraction efficiency for P-polarized light. In some embodiments, a hybrid surface relief grating/volume Bragg grating structures formed by phase separating a mixture of an inorganic component and a monomer may include fully inorganic SRG after complete removal of the final polymer component from the cured grating. In many embodiments the inorganic component may be nanoparticles. In many embodiments, a hybrid surface relief grating/volume Bragg grating structures may be used in at least one of a fold grating and/or an output grating to reduce haze and to reduce coupling losses in a fold grating. Reducing haze may increase contrast. Reducing coupling losses in the fold grating may be equivalent to increasing diffraction efficiency in the fold grating. In many embodiments, a polymer/air SRG may be used as an input grating with high diffraction efficiency.

As illustrated previously, hybrid surface relief grating/volume Bragg grating structures may be formed by partial back filling of a grating structure to form a structure comprising a volume Bragg grating with an overlaid surface relief grating. Hybrid surface relief grating/volume Bragg grating structures may show improved angular response after an additional plasma ashing or reactive ion etch.

In many embodiments, hybrid surface relief grating/volume Bragg grating structures may be formed during holographic phase separation and curing. In many embodiments, the grating may be formed in a cell in which the grating material is sandwiched by a base substrate and a release layer. The surface structure may be revealed when the release layer is removed. Without limitation to any particular theory, the surface grating may be formed because of polymerization induced shrinkage during to mass migration and phase separation. The relative depths of high and low index regions can be adjusted by utilizing an additional plasma ashing step. An ALD deposited layer can be added to the grating surface to increase effective index. In many embodiments, the grating thickness may be 1.1 microns with a grating period of 375 nm and a 22-degree slant angle (relative to the cell optical surface normal). The finished gratings may be isotropic or anisotropic depending on the system components in the initial mixture.

Figure 29:
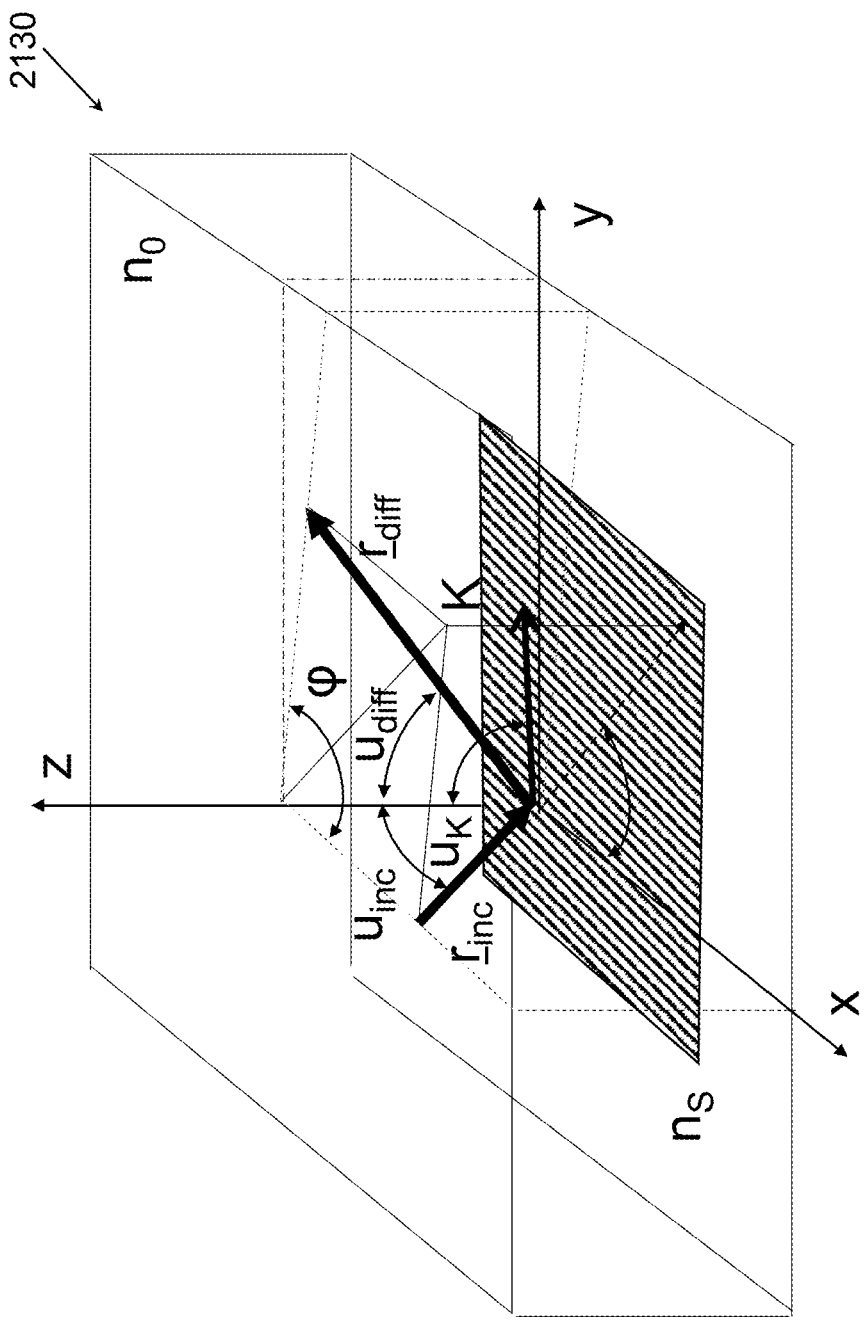
FIG. 29 schematically illustrates a ray-grating interaction geometry of a TIR surface grating.

FIG. 29 schematically illustrates a ray-grating interaction geometry 2130 of a TIR surface grating. Such configurations are commonly referred to as conical diffraction configurations. For a TIR grating recorded on a transparent substrate of refractive index $n_S$ immersed in a low index medium of index $n_0$ (which in many embodiments will be air) but can be any medium satisfying the relation $n_S > n_0$, only reflected diffracted orders exist for rays that satisfy the relation $n_S/n_0 \leq |\sin(u_{inc})| \leq 1$. Referring to the xyz Cartesian reference frame in FIG. 28, the equations relating incident and diffracted ray angles to the grating vectors may be expressed as follows:

$x$ direction: $-k\, n_S \sin(u_{inc}) + K_S \cos(\varphi_S) = -k\, n_S \sin(u_{diff})\cos(\varphi_{diff})$;

$y$ direction: $K_S \sin(\varphi_S) = k\, n_S \sin(u_{diff})\sin(\varphi_{diff})$; and $z$ direction: $k\, n_S \cos(u_{inc}) = k\, n_S \cos(u_{diff}) + K_S/\tan(\varphi_S)$.

where $u_{inc}$ is the polar angle of the incident ray vector $r_{inc}$, $\varphi_S$ is the azimuth angle of the incident ray, $u_{diff}$ is the polar angle of the diffracted ray vector $r_{diff}$, $\varphi_S$ is the azimuth angle of the grating vector, and us is the polar angle of the grating vector K.

The wavenumber k of the incident light may be provided by $k=2\pi/\lambda$, where $\lambda$ is the wavelength of the guided light. The modulus of the surface component of the grating vector is given by $K_S = k = 2\pi/\Lambda s$ where $\Lambda s$ is the surface grating pitch. Solutions to the above equations may be obtain by setting the incidence angle equal to the diffracted angle.

In many embodiments, the dual interaction grating is implemented in a polymer grating structure comprising alternating polymer rich and air regions. In many embodiments, the grating depth of the polymer grating structure is less than the Bragg fringe spacing. In many embodiments, the grating depth of the polymer grating structure is greater than the Bragg fringe spacing. In many embodiments, the total internal reflection from the polymer grating structure occurs when the first order diffraction from the polymer grating structures has a diffraction angle equal to the TIR angle of the waveguide. In many embodiments, the polymer grating structure provides no transmitted diffraction orders. In many embodiments, the polymer grating structure is a photonic crystal. In many embodiments, the polymer grating structure is configured as a Raman Nath grating having a first grating period overlaying a Bragg grating having the same grating period with the minima of the Raman Nath grating overlaying the minima of the Bragg grating. In many embodiments, the polymer grating structure is a slanted grating. In many embodiments, the air regions of polymer grating structure may be at least partially backfilled with a material having a refractive index different than that of the polymer rich regions.

Embodiments Including OLED Arrays as Image Generators

There is growing interest in the use of Organic Light Emitting Diode (OLED) arrays as image generators in waveguide displays. OLEDs have many advantages in waveguide display applications. As an emissive technology, OLEDs require no light source. OLEDs can be printed cost-effectively over large areas. Non-rectangular pixel array patterns can be printed onto curved or flexible substrates. As will be discussed below, the ability to pre-distort a pixel array and create a curved focal plane adds a new design dimension that can enable compensation for guided beam wavefront distortions caused by curved waveguides and prescription lenses supported by a waveguide. OLEDs with resolutions of 4K×4K pixels are currently available with good prospects of higher resolution in the near term, offering a faster route to high resolution, wide FOV AR displays than can be provided by technologies such as Liquid Crystal on Silicon (LCoS) and Micro Electro Mechanical Systems (MEMS) devices such as digital light processing (DLP) devices. Another significant advantage over LCoS is that OLEDs can switch in microseconds (compared with milliseconds for LC devices).

OLEDs have certain disadvantages. In their basic form, OLEDs are Lambertian emitters, which makes efficient light collection much more challenging than with LCoS and DLP micro displays. The red, green, and blue spectral bandwidths of OLEDs are broader than those of Light Emitting Diodes (LEDs), presenting further light management problems in holographic waveguides. The most significant disadvantage of OLEDs is that in waveguides using HPDLC periodic structures such as switchable periodic structures, which tend to be P-polarization selective, half of the available light from the OLED is wasted. As such, many embodiments of the invention are directed towards waveguide displays for use with emissive unpolarized image sources that can provide high light efficiency for unpolarized light and towards related methods of manufacturing such waveguide displays.

For the purposes of describing embodiments, some well-known features of optical technology known to those skilled in the art of optical design and visual displays have been omitted or simplified in order to not obscure the basic principles of the invention. Unless otherwise stated, the term "on-axis" in relation to a ray or a beam direction refers to propagation parallel to an axis normal to the surfaces of the optical components described in relation to the invention. In the following description the terms light, ray, beam, and direction may be used interchangeably and in association with each other to indicate the direction of propagation of electromagnetic radiation along rectilinear trajectories. The term light and illumination may be used in relation to the visible and infrared bands of the electromagnetic spectrum. Parts of the following description will be presented using terminology commonly employed by those skilled in the art of optical design. As used herein, the term grating may encompass a grating comprised of a set of gratings in some embodiments. For illustrative purposes, it is to be understood that the drawings are not drawn to scale unless stated otherwise.

Figure 30:
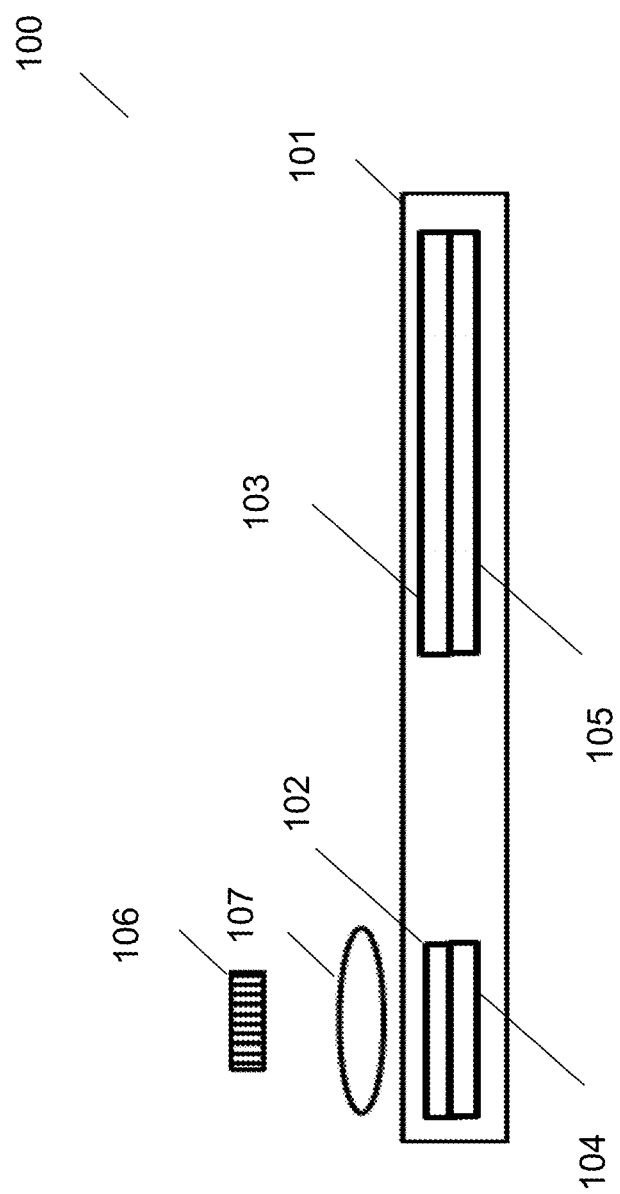
FIG. 30 conceptually illustrates a waveguide display in accordance with an embodiment of the invention.

Turning now to the drawings, methods and apparatus for providing waveguide displays using emissive input image panels in accordance with various embodiments of the invention are illustrated. FIG. 30 conceptually illustrates a waveguide display in accordance with an embodiment of the invention. As shown, the apparatus 100 includes a waveguide 101 supporting input 102 and output 103 gratings with high diffraction efficiency for P-polarized light in a first wavelength band and input 104 and output 105 gratings with high diffraction efficiency for S-polarized light in the first wavelength band.

The apparatus 100 further includes an OLED microdisplay 106 emitting unpolarized light with an emission spectral bandwidth that includes the first wavelength band and a collimation lens 107 for projecting light from the OLED microdisplay 106 into a field of view. In the illustrative embodiment, the S and P diffracting gratings 102-105 can be layered with no air gap required. In other embodiments, the grating layers can be separated by an air gap or a transparent layer. The S and P diffracting gratings 102-105 may be the deep SRGs or EPSs described above.

Figure 31:
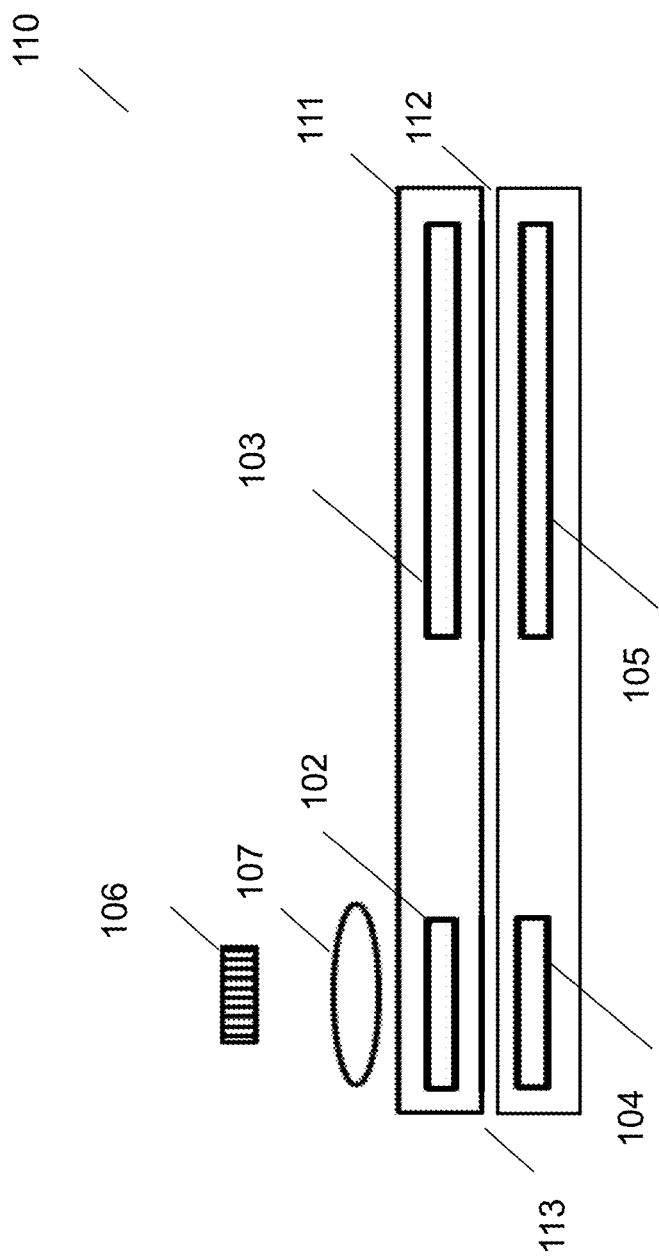
FIG. 31 conceptually illustrates a waveguide display having two air-spaced waveguide layers in accordance with an embodiment of the invention.

FIG. 31 conceptually illustrates a waveguide display in accordance with an embodiment of the invention in which the P-diffracting and S-diffracting gratings are disposed in separate air-spaced waveguide layers. As shown, the apparatus 110 comprises upper 111 and lower 112 waveguide layers (supporting the gratings 102, 103 and 104, 105, respectively) separated by an air gap 113. The gratings 102, 103 and 104, 105 may be the deep SRGs and EPSs described above.

Figure 32:
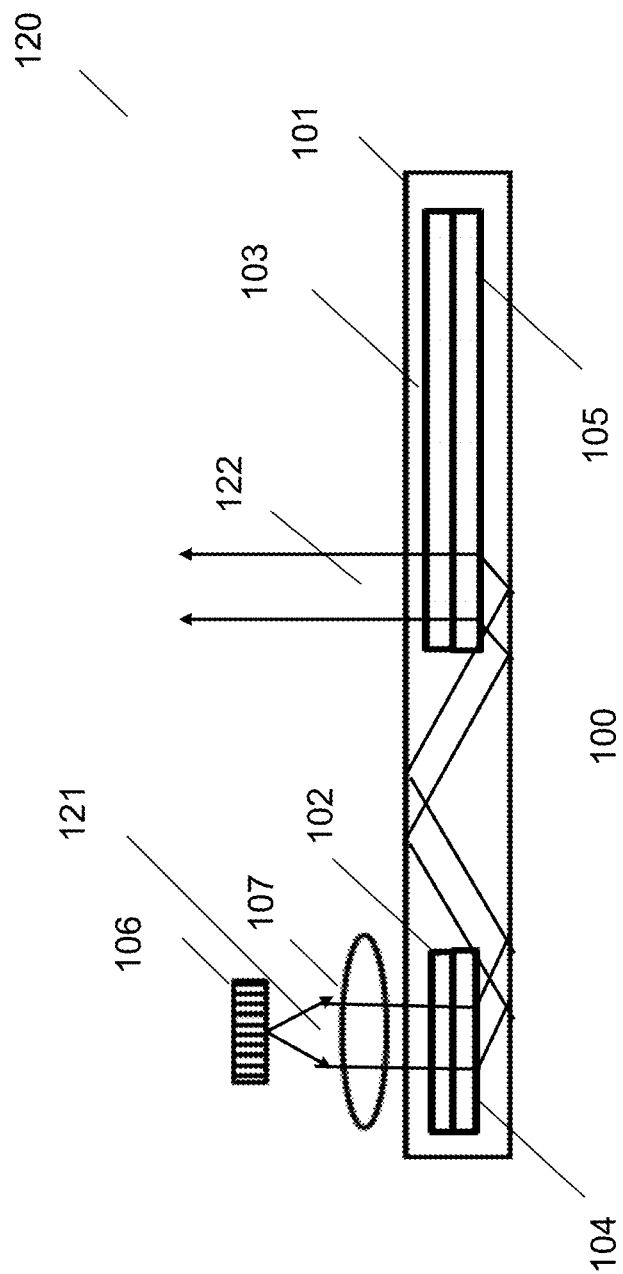
FIG. 32 conceptually illustrates typical ray paths for a waveguide display in accordance with an embodiment of the invention.

FIG. 32 conceptually illustrates typical ray paths in a waveguide display in accordance with an embodiment of the invention. In the embodiment 120 illustrated in FIG. 32, a microdisplay 106 is configured to emit unpolarized light 121 in a first wavelength band, which is collimated and projected into a field of view by a collimator lens 107. The S-polarized emission from the microdisplay 106 can be coupled into a total internal reflection path in a waveguide 101 by an S-diffracting input grating 104 and extracted from the waveguide 101 by an S-diffracting output grating 105. P-polarized light from the microdisplay 106 can be in-coupled and extracted using P-diffracting input and output gratings 102, 103 in a similar fashion. Dispersion can be corrected for both S and P light provided that the input and output gratings spatial frequencies are matched. The input and output gratings 102, 103 may be the deep SRGs or EPSs described above.

Although FIGS. 23-25 show specific waveguide display configurations, various configurations including modifications to those shown can be implemented, the specific implementation of which can depend on the specific requirements of the given application. Furthermore, such displays can be manufactured using a number of different methods. For example, in many embodiments, the two grating layers are formed using an inkjet printing process.

In many embodiments, the waveguide operates in a monochrome band. In some embodiments, the waveguide operates in the green band. In several embodiments, waveguide layers operating in different spectral bands such as red, green, and blue (RGB) can be stacked to provide a three-layer waveguiding structure. In further embodiments, the layers are stacked with air gaps between the waveguide layers. In various embodiments, the waveguide layers operate in broader bands such as blue-green and green-red to provide two-waveguide layer solutions. In other embodiments, the gratings are color multiplexed to reduce the number of grating layers. Various types of gratings can be implemented. In some embodiments, at least one grating in each layer is a switchable periodic structure.

The invention can be applied using a variety of waveguides architectures, including those disclosed in the literature. In many embodiments, the waveguide can incorporate at least one of: angle multiplexed gratings, color multiplexed gratings, fold gratings, dual interaction gratings, rolled K-vector gratings, crossed fold gratings, tessellated gratings, chirped gratings, gratings with spatially varying refractive index modulation, gratings having spatially varying grating thickness, gratings having spatially varying average refractive index, gratings with spatially varying refractive index modulation tensors, and gratings having spatially varying average refractive index tensors. In some embodiments, the waveguide can incorporate at least one of: a half wave plate, a quarter wave plate, an anti-reflection coating, a beam splitting layer, an alignment layer, a photochromic back layer for glare reduction, louvre films for glare reduction In several embodiments, the waveguide can support gratings providing separate optical paths for different polarizations. In various embodiments, the waveguide can support gratings providing separate optical paths for different spectral bandwidths. In a number of embodiments, gratings for use in the invention can be HPDLC gratings, switching gratings recorded in HPDLC (such switchable Bragg Gratings), Bragg gratings recorded in holographic photopolymer, or surface relief gratings.

In some embodiments, the EPS may be a dual axis expansion grating for use in a display waveguide. In Bragg gratings, dual interaction can be understood using basic ray optics by considering upwards and downward TIR ray interactions with a fold grating, the upward and downwards rays occurring when guided light is reflected at the lower and upper waveguide TIR surfaces. In an EPS, one of the TIR interfaces is replaced by the grating. Using diffraction grating theory, it can be shown that a SRG (and a SRG fold in particular) may allow the diffraction angle into first order to equal the incidence angle such that TIR can take place subject to some constraints on the ranges of incidence angles, K-vector directions, grating clock angles, grating depths and grating periods. Hence upward and downward TIR paths through the grating exist for SRGs. Increasing the SRG thickness into the Bragg domain, dual interaction may occur in an EPS in the same way as in a volume Bragg grating. Thus, various embodiments of the invention pertain to a dual interaction EPS.

In many embodiments, the waveguide display can provide an image field of view of at least 50° diagonal. In further embodiments, the waveguide display can provide an image field of view of at least 70° diagonal. In some embodiments, an OLED display can have a luminance greater than 4000 nits and a resolution of 4k×4k pixels. In several embodiments, the waveguide can have an optical efficiency greater than 10% such that a greater than 400 nit image luminance can be provided using an OLED display of luminance 4000 nits. Waveguide displays implementing P-diffracting gratings typically have a waveguide efficiency of 5%-6.2%. Providing S-diffracting gratings as discussed above can increase the efficiency of the waveguide by a factor of 2. In various embodiments, an eyebox of greater than 10 mm with an eye relief greater than 25 mm can be provided. In many embodiments, the waveguide thickness can be between 2.0-5.0 mm.

Figure 33:
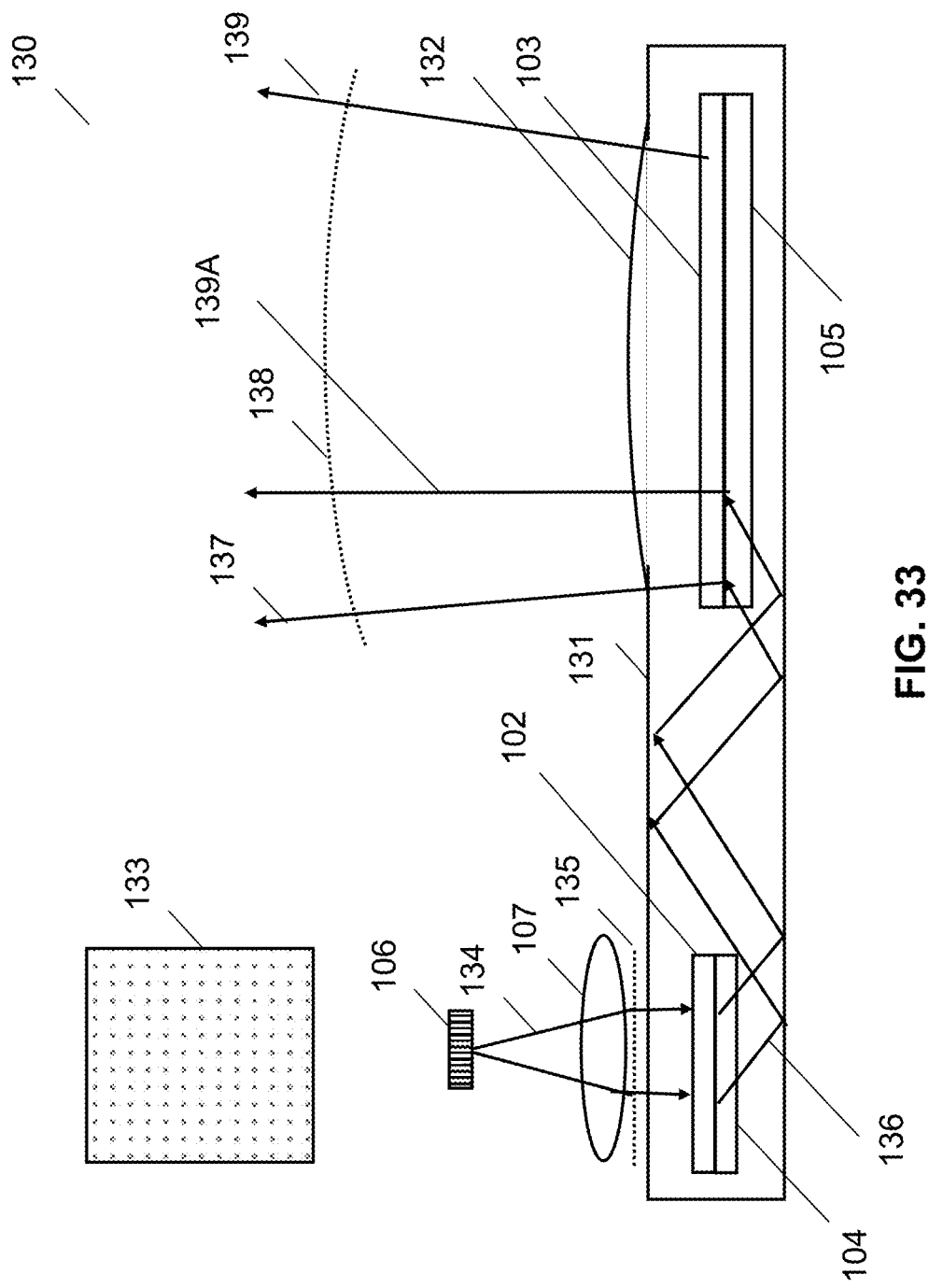
FIG. 33 conceptually illustrates a waveguide display in which the waveguide supports a curved optical surface in accordance with an embodiment of the invention.
Figure 34:
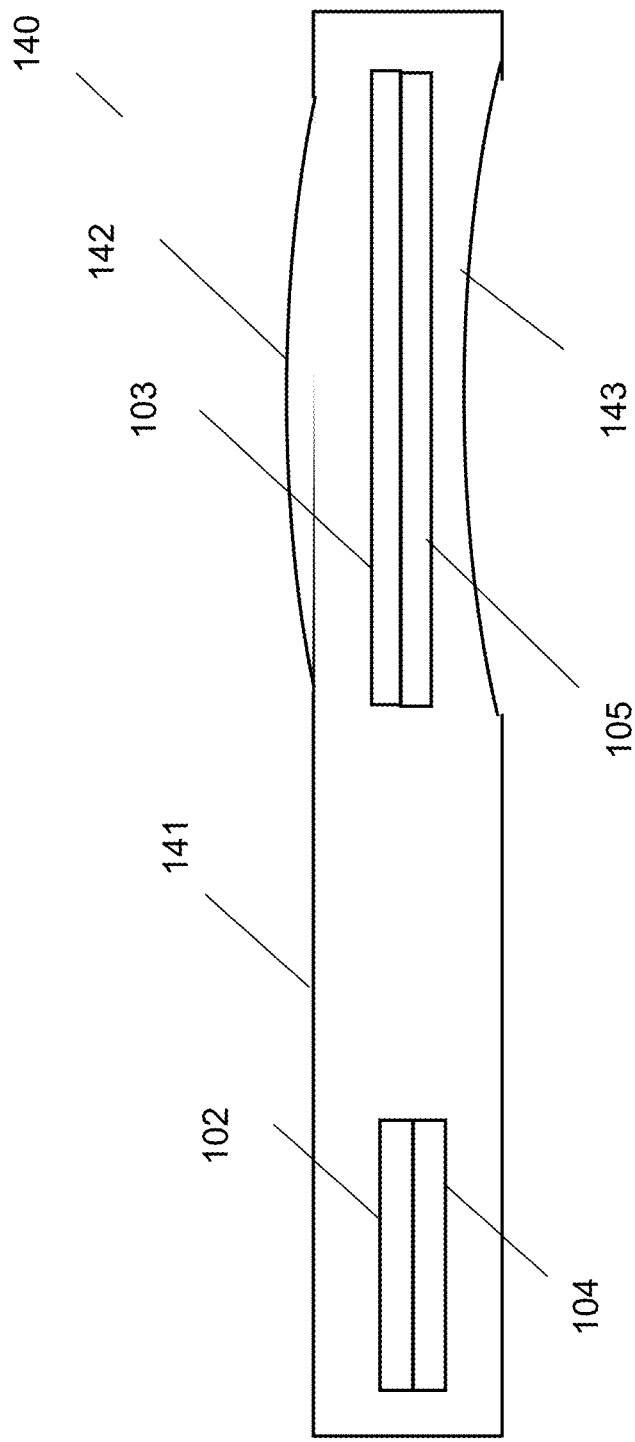
FIG. 34 conceptually illustrates a waveguide display in which the waveguide supports upper and lower curved optical surfaces in accordance with an embodiment of the invention.

FIG. 33 conceptually illustrates a waveguide display in accordance with an embodiment of the invention in which at least one portion of at least one of the waveguide optical surfaces is curved and the effect of the curved surface portion on the guided beam wavefronts. As shown, the apparatus 130 includes a waveguide 131 supporting the curved surface portion 132. In the illustrative embodiment, the waveguide 131 supports input 102 and output 103 gratings with high diffraction efficiency for P-polarized light in a first wavelength band and input 104 and output 105 gratings with high diffraction efficiency for S-polarized light in the first wavelength band. The microdisplay 106, which displays a rectangular array of pixels 133 emits unpolarized light 134 in the first wavelength band, which is collimated and projected into a field of view by a collimator lens 107. The P-polarized emission from the microdisplay 106 can be coupled into a total internal reflection path into the waveguide by the P-diffracting input grating 102 and extracted from the waveguide by the P-diffracting output grating 103. The presence of any non-planar surface in a waveguide can distort the waterfronts of the guided light such that the output light when viewed from the eyebox exhibits defocus, geometric distortion, and other aberrations. For example, in FIG. 33, the light projected by the collimator lens 107 from a single pixel has planar wavefronts 135, which after propagating through the waveguide 131 along the TIR path 136 forms non-parallel output rays 137-139 that are normal to the curved output wavefront 139A. On the other hand, a perfect planar waveguide would instead provide parallel beam expanded light. FIG. 34 conceptually illustrates a version 140 of the waveguide in which the waveguide substrate 141 supports two overlapping upper 142 and lower 143 curved surfaces.

Figure 35:
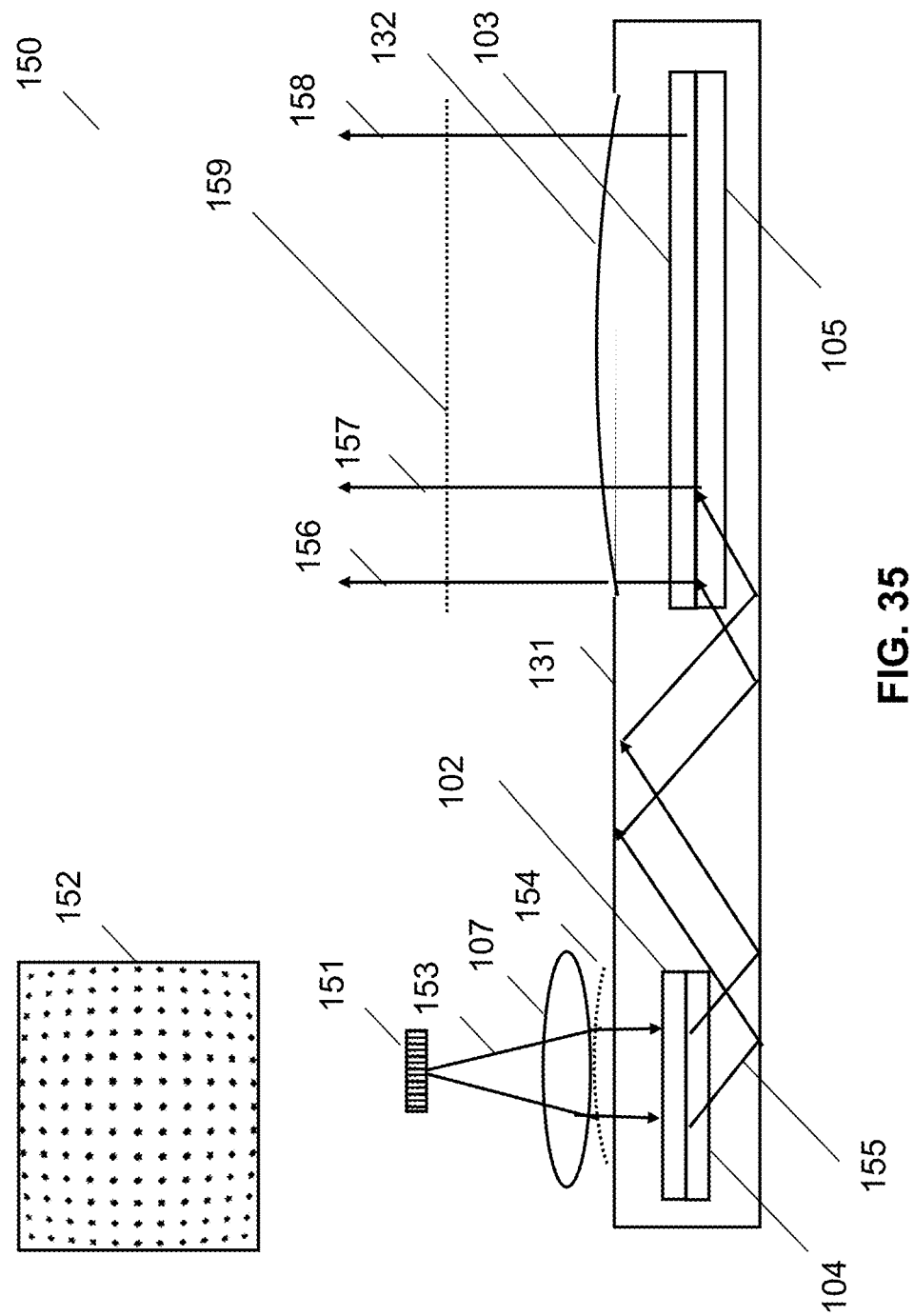
FIG. 35 conceptually illustrates a waveguide display in which the waveguide supports a curved optical surface and an input image is provided using a pixel array predistorted to compensate for aberrations introduced by the curved optical surface in accordance with an embodiment of the invention.

FIG. 35 conceptually illustrates a waveguide display in accordance with an embodiment of the invention in which the aberrations introduced by a curved surface portion can be corrected by pre-distorting the pixel pattern of the OLED microdisplay. In the illustrative embodiment, the waveguide apparatus 150 is similar to the one illustrated in FIG. 25. As shown, the apparatus 150 includes a microdisplay 151 that supports a pre-distorted pixel pattern 152. Unpolarized first wavelength light 153 emitted by the microdisplay is focused by the lens 107, which substantially collimates the beam entering the waveguide while forming wavefronts 154 that are pre-distorted by a small amount. After in-coupling and propagation 155 through the waveguide 131, the predistorted wavefronts are focused by the curved surface 132 to form parallel output rays 156-158, which are normal to the planar output wavefront 159.

Figure 36:
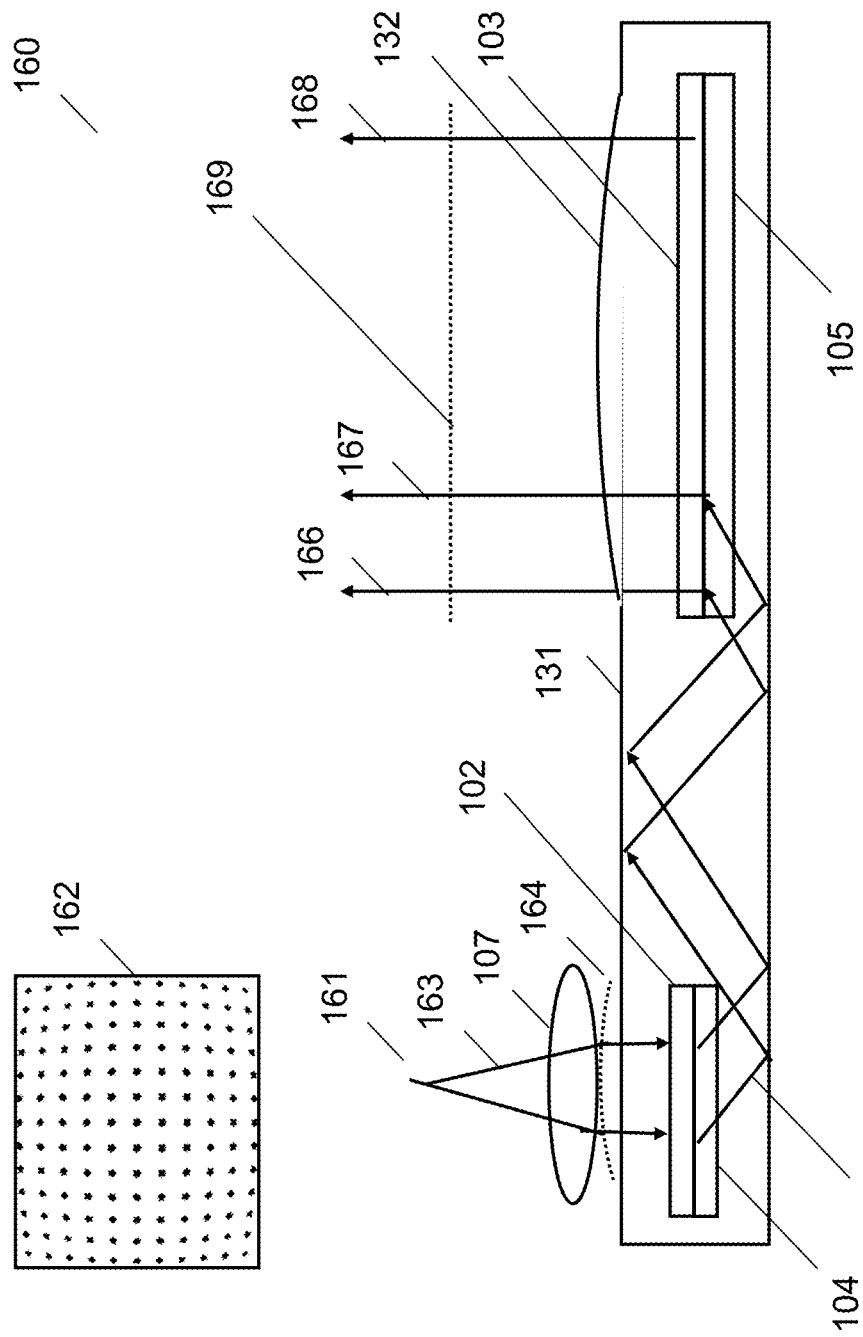
FIG. 36 conceptually illustrates a waveguide display in which the waveguide supports a curved optical surface and an input image is provided using a pixel array supported by a curved substrate and predistorted to compensate for aberrations introduced by the curved optical surface in accordance with an embodiment of the invention.

FIG. 36 conceptually illustrates a waveguide display in accordance with an embodiment of the invention in which the aberrations introduced by a curved surface portion can be corrected by pre-distorting the pixel pattern of an OLED microdisplay formed on a curved substrate. The curved microdisplay substrates can help to correct focus errors field curvature, distortion, and other aberrations in association with the distorted pixel pattern. In the illustrative embodiment, the waveguide apparatus 160 is similar to the one illustrated in FIG. 32. As shown, the curved substrate microdisplay 161 supports the pre-distorted pixel pattern 164. Unpolarized first wavelength light 163 emitted by the microdisplay is focused by the lens 107 to form substantially collimated guided beams with slightly pre-distorted wavefronts 164, which, after in-coupling and propagation 165 through the waveguide 131, form parallel output rays 166-168 that are normal to the planar output wavefront 169.

Although FIGS. 32-36 show specific configurations of waveguides having curved surfaces, many other different configurations and modifications can be implemented. For example, the techniques and underlying theory illustrated in such embodiments can also be applied to waveguides supporting eye prescription optical surfaces. In many embodiments, prescription waveguide substrates can be custom-manufactured using similar processes to those used in the manufacture of eye prescription spectacles, with a standard baseline prescription being fine-tuned to individual user requirements. In some embodiments, waveguide gratings can be inkjet printed with a standard baseline prescription. In several embodiments, the OLED display can be custom-printed with a pre-distorted pixel pattern formed. In various embodiments, the OLED display can be printed onto a curved backplane substrate. In a number of embodiments, additional refractive or diffractive pre-compensation elements can be supported by the waveguide. In many embodiments, additional correction functions can be encoded in at least one of the input and output gratings. The input and output gratings may be the deep SRGs or EPSs or the hybrid gratings described above and may be manufactured in the methods described in connection with FIGS. 1-5. The input and output gratings may also have thicknesses described in connection with FIGS. 6-8.

Figure 37:
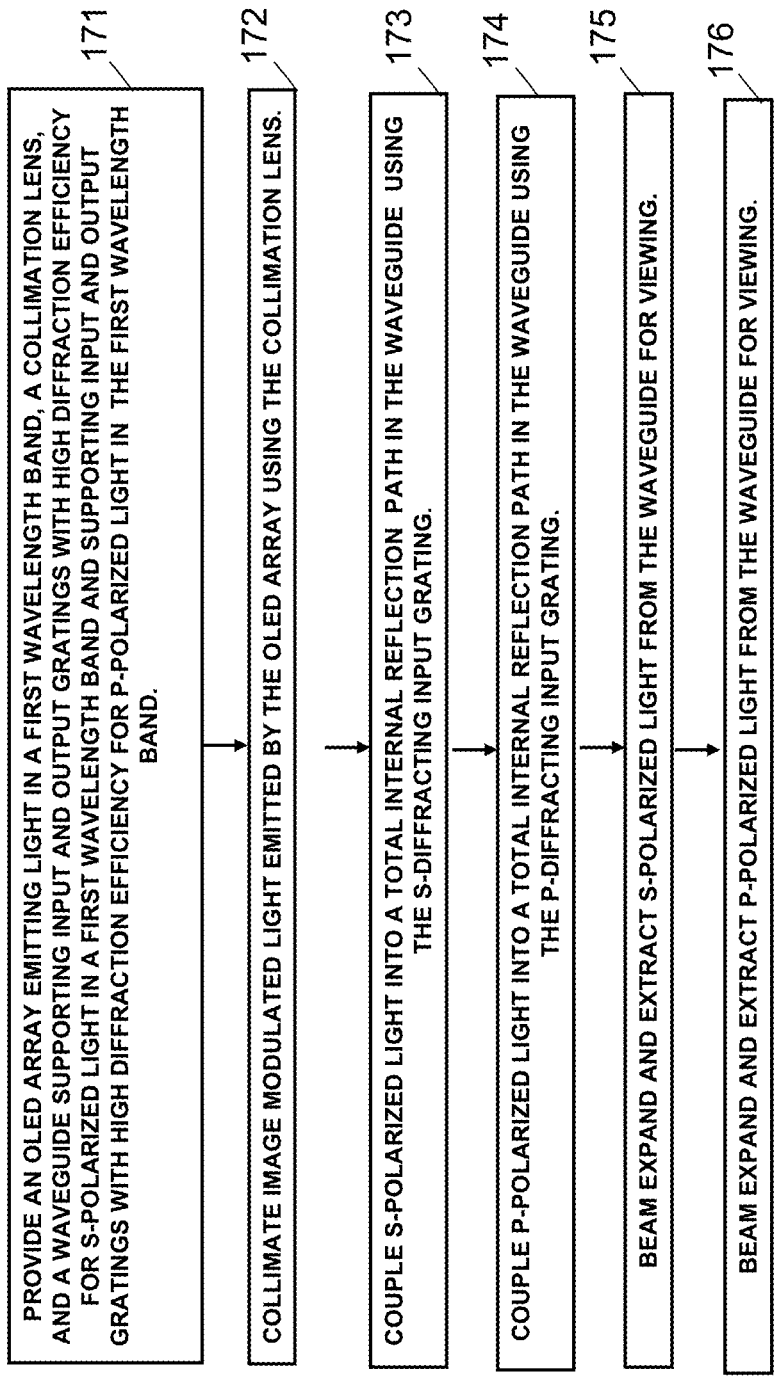
FIG. 37 is a flow chart conceptually illustrating a method for projecting image light for view using a waveguide containing S-diffracting and P-diffracting gratings in accordance with an embodiment of the invention.

FIG. 37 is a flow chart conceptually illustrating a method for projecting image light for view using a waveguide containing S-diffracting and P-diffracting gratings in accordance with an embodiment of the invention. As shown, the method 170 of forming an image is provided. Referring to the flow diagram, method 170 includes providing (171) an OLED array emitting light in a first wavelength range, a collimation lens, and a waveguide supporting input and output gratings with high diffraction efficiency for S-polarized light in a first wavelength band and input and output gratings with high diffraction efficiency for P-polarized light in the first wavelength band. In some embodiments, the input and output gratings may be the deep SRGs, EPSs, or hybrid gratings discussed previously. Image light emitted by the OLED array can be collimated (172) using the collimation lens. S-polarized light can be coupled (173) into a total internal reflection path in the waveguide using the S-diffracting input grating. P-polarized light can be coupled (174) into a total internal reflection path in the waveguide using the P-diffracting input grating. S-polarized light can be beam expanded and extracted (175) from the waveguide for viewing. P-polarized light can be beam expanded and extracted (176) from the waveguide for viewing.

Figure 38:
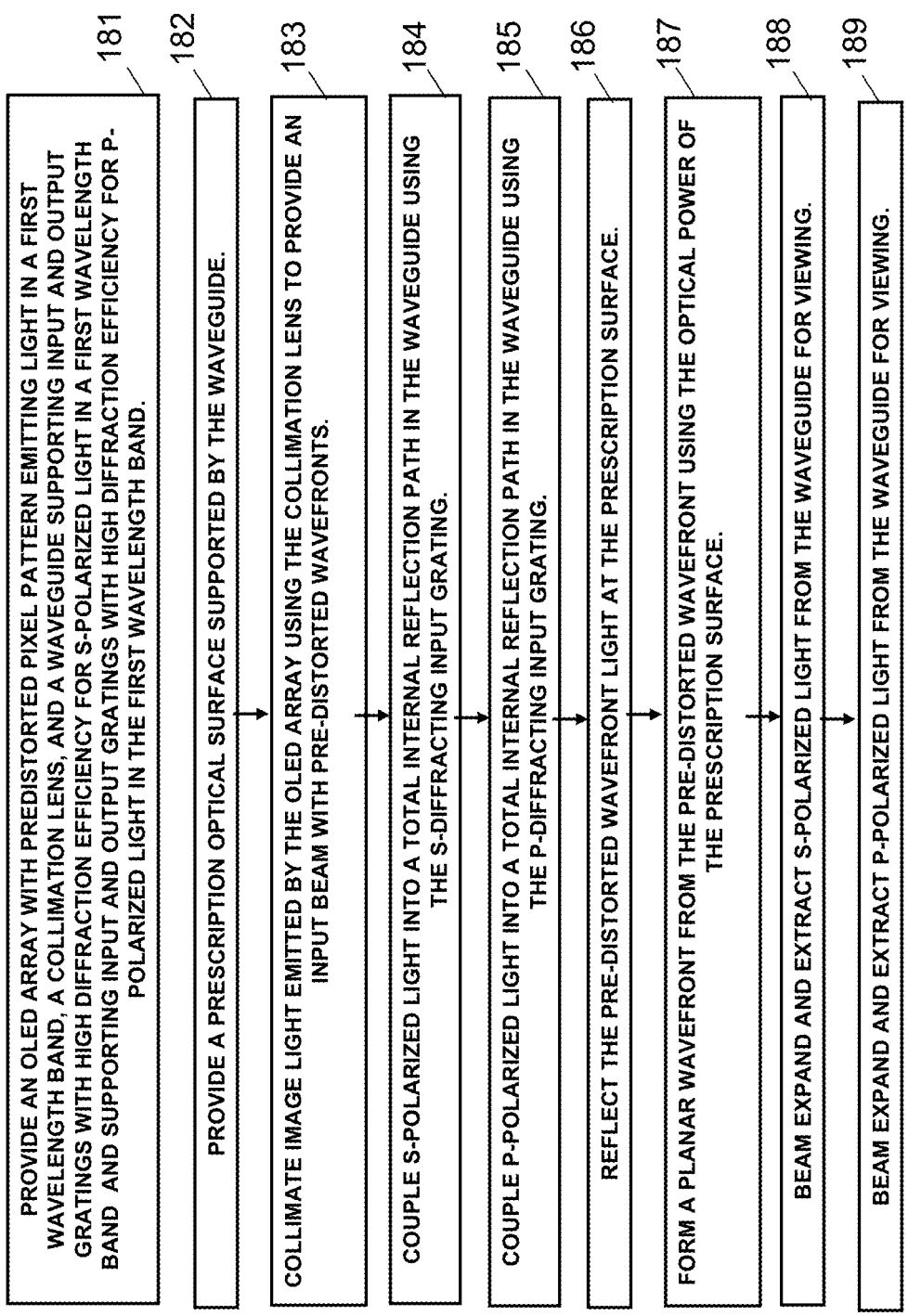
FIG. 38 is a flow chart conceptually illustrating a method for projecting image light for view using a waveguide supporting an optical prescription surface and containing S-diffracting and P-diffracting gratings in accordance with an embodiment of the invention.

FIG. 38 is a flow chart conceptually illustrating a method for projecting image light for view using a waveguide supporting an optical prescription surface and containing S-diffracting and P-diffracting gratings in accordance with an embodiment of the invention. As shown, the method 180 of forming an image is provided. Referring to the flow diagram, method 180 includes providing (181) an OLED array with a predistorted pixel pattern emitting light in a first wavelength range, a collimation lens, and a waveguide supporting input and output gratings with high diffraction efficiency for S-polarized light into a first wavelength band and input and output gratings with high diffraction efficiency for P-polarized light in the first wavelength band and further providing (182) a prescription optical surface supported by the waveguide. In some embodiments, the input and output gratings may be the deep SRGs, EPSs, or hybrid gratings discussed previously. Image light emitted by the OLED array can be collimated (183) using the collimation lens. S-polarized light can be coupled (184) into a total internal reflection path in the waveguide using the S-diffracting input grating. P-polarized light can be coupled (185) into a total internal reflection path in the waveguide using the P-diffracting input grating. The pre-distorted wavefront can be reflected (186) at the prescription surface. A planar wavefront can be formed (187) from the pre-distorted wavefront using the optical power of the prescription surface. S-polarized light can be beam expanded and extracted (188) from the waveguide for viewing. P-polarized light can be beam expanded and extracted (189) from the waveguide for viewing.

Discussion of Embodiments Including Varied Pixel Geometries

Figure 39A:
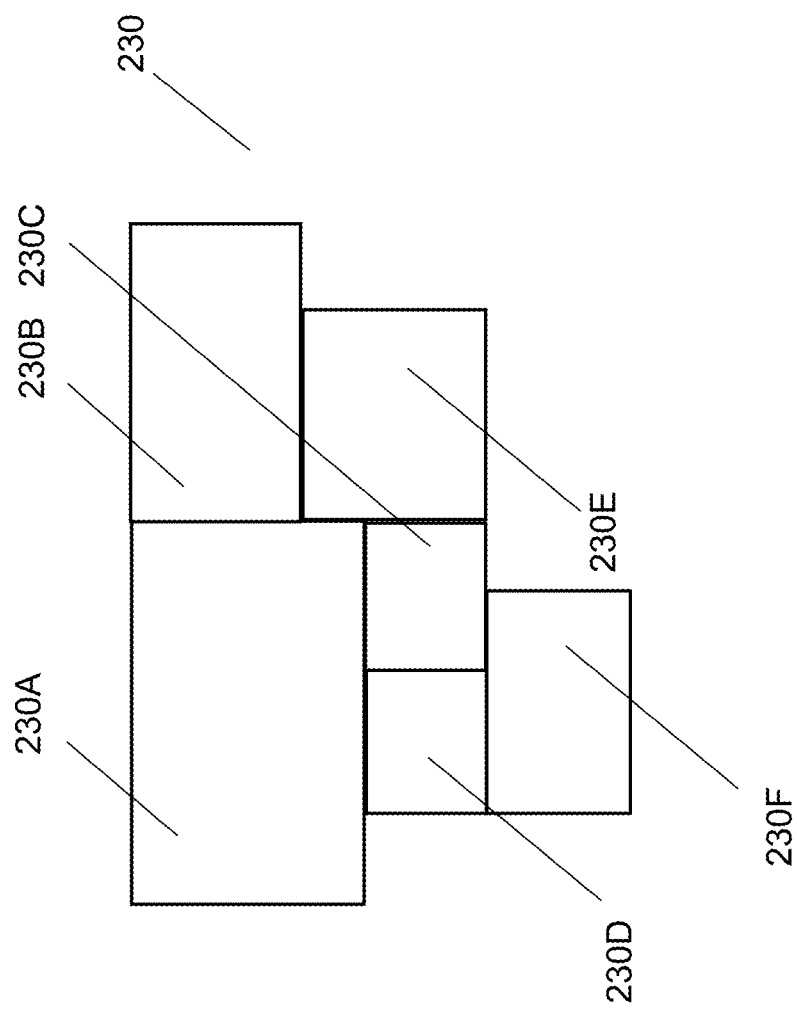
FIG. 39A conceptually illustrates a portion of a pixel pattern having rectangular elements of differing size and aspect ratio for use in an emissive display panel in accordance with an embodiment of the invention.
Figure 39B:
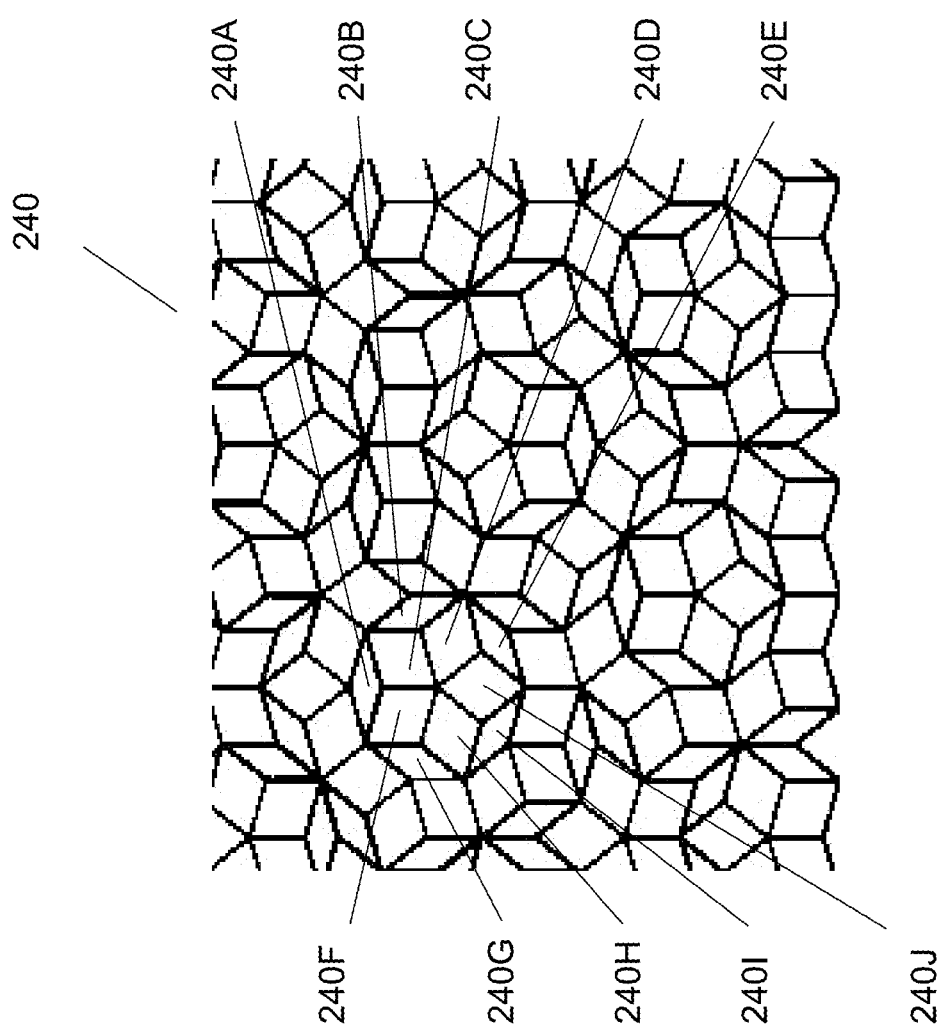
FIG. 39B conceptually illustrates a portion of a pixel pattern having Penrose tiles for use in an emissive display panel in accordance with an embodiment of the invention.

The various apparatus discussed in this disclosure can be applied using emissive displays with input pixel arrays of many different geometries that are limited only by geometrical constraints and the practical issues in implementing the arrays. In many embodiments, the pixel array can include pixels that are aperiodic (non-repeating). In such embodiments, the asymmetry in the geometry and the distribution of the pixels can be used to produce uniformity in the output illumination from the waveguide. The optimal pixel sizes and geometries can be determined using reverse vector raytracing from the eyebox though the output and input gratings (and fold gratings, if used) onto the pixel array. A variety of asymmetric pixel patterns can be used in the invention. For example, FIG. 39A conceptually illustrates a portion 230 of a pixel pattern comprising rectangular elements 230A-230F of differing size and aspect ratios for use in an emissive display panel in accordance with an embodiment of the invention. In some embodiments, the pixels array can be based a non-repeating pattern based on a finite set of polygonal base elements. For example, FIG. 39B conceptually illustrates a portion 240 of a pixel pattern having Penrose tiles 240A-240J for use in an emissive display panel in accordance with an embodiment of the invention. The tiles can be based on the principles disclosed in U.S. Pat. No. 4,133,152 by Penrose entitled "Set of tiles for covering a surface" which is hereby incorporated by reference in its entirety. Patterns occurring in nature, of which honeycombs are well known examples, can also be used in many embodiments.

Figure 39C:
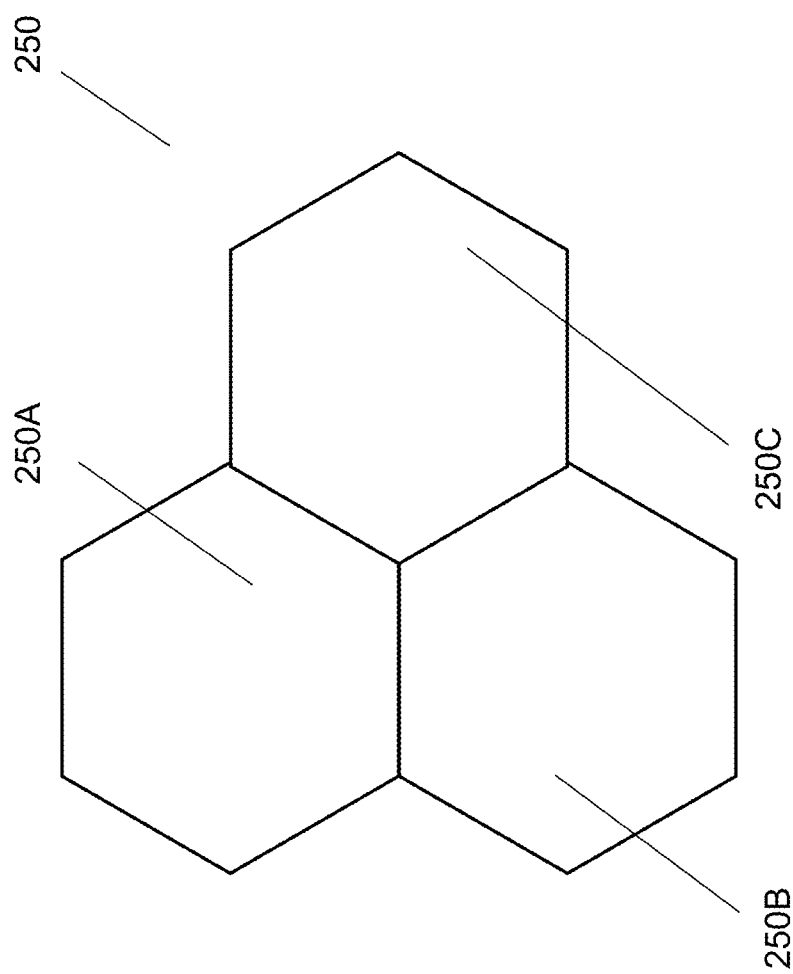
FIG. 39C conceptually illustrates a portion of a pixel pattern having hexagonal elements for use in an emissive display panel in accordance with an embodiment of the invention.
Figure 39D:
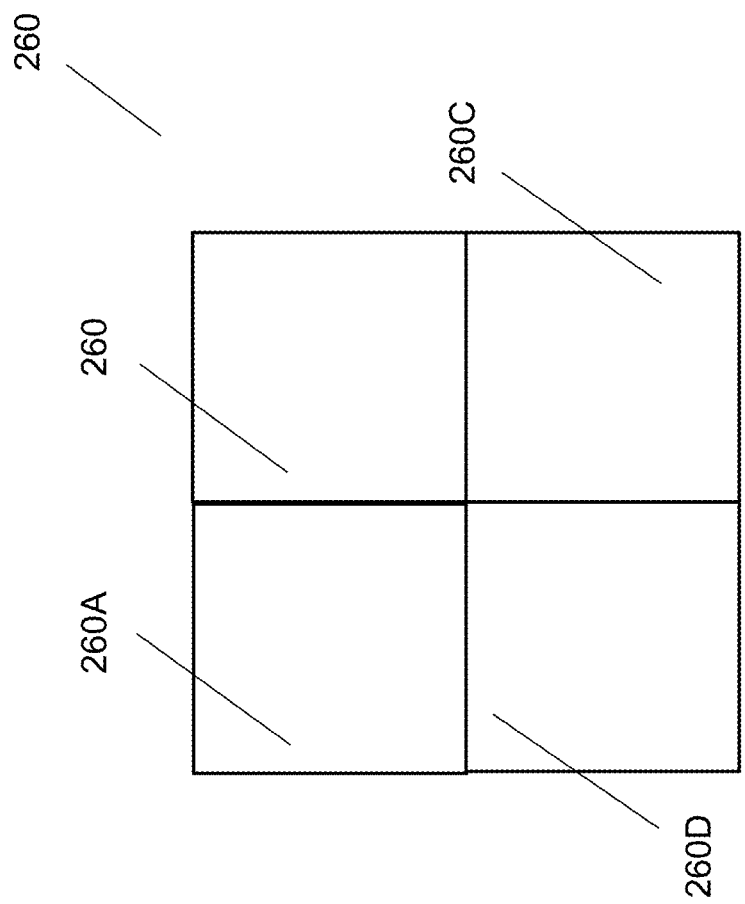
FIG. 39D conceptually illustrates a portion of a pixel pattern having square elements for use in an emissive display panel in accordance with an embodiment of the invention.
Figure 39F:
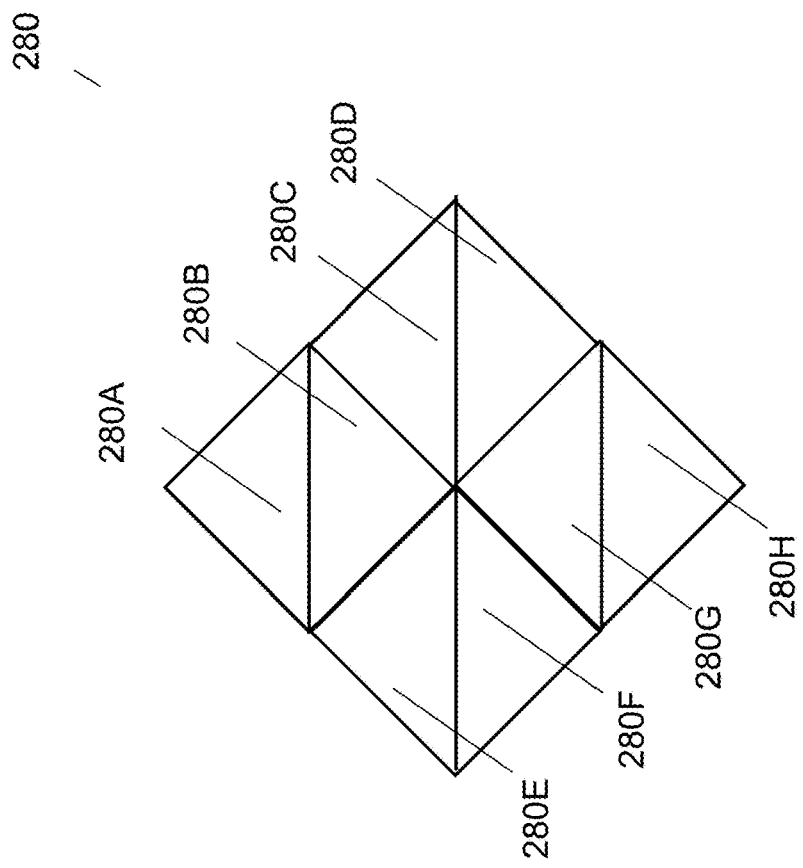
FIG. 39F conceptually illustrates a portion of a pixel pattern having isosceles triangular elements for use in an emissive display panel in accordance with an embodiment of the invention.
Figure 39E:
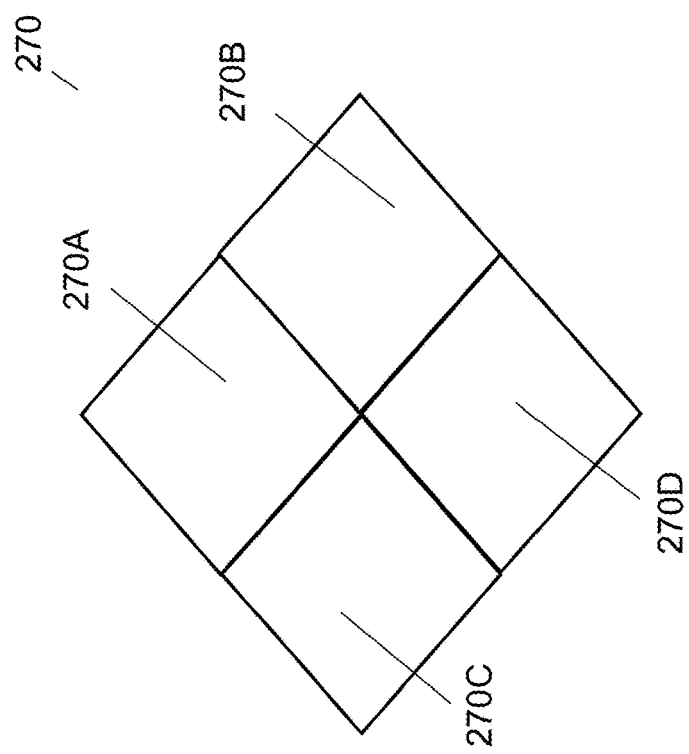
FIG. 39E conceptually illustrates a portion of a pixel pattern having diamond-shaped elements for use in an emissive display panel in accordance with an embodiment of the invention.

In many embodiments, the pixels can include arrays of identical regular polygons. For example, FIG. 39C conceptually illustrates a portion 250 of a pixel pattern having hexagonal elements in accordance with an embodiment of the invention. FIG. 39D conceptually illustrates a portion 260 of a pixel pattern having square elements 250A-250C in accordance with an embodiment of the invention. FIG. 39E conceptually illustrates a portion 270 of a pixel pattern having diamond-shaped elements 270A-270D in accordance with an embodiment of the invention. FIG. 39F conceptually illustrates a portion 280 of a pixel pattern having isosceles triangle elements 280A-280H in accordance with an embodiment of the invention.

Figure 39G:
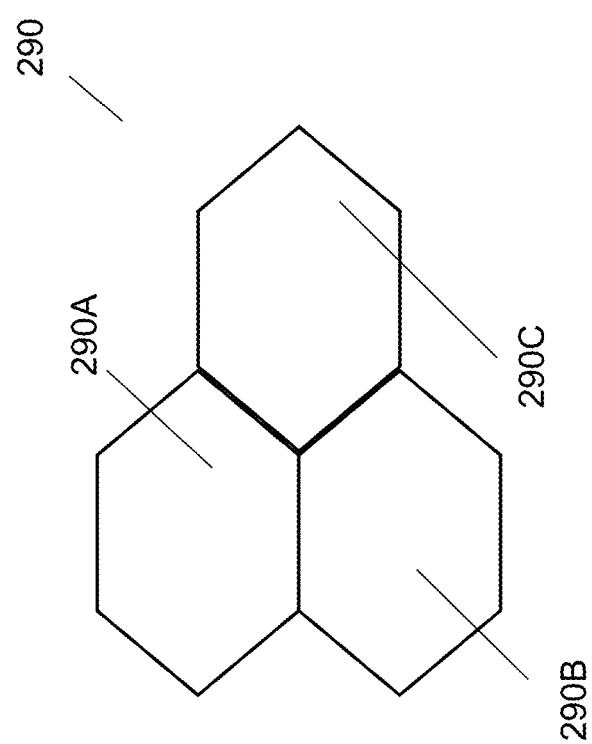
FIG. 39G conceptually illustrates a portion of a pixel pattern having hexagonal elements with horizontally biased aspect ratios for use in an emissive display panel in accordance with an embodiment of the invention.
Figure 39I:
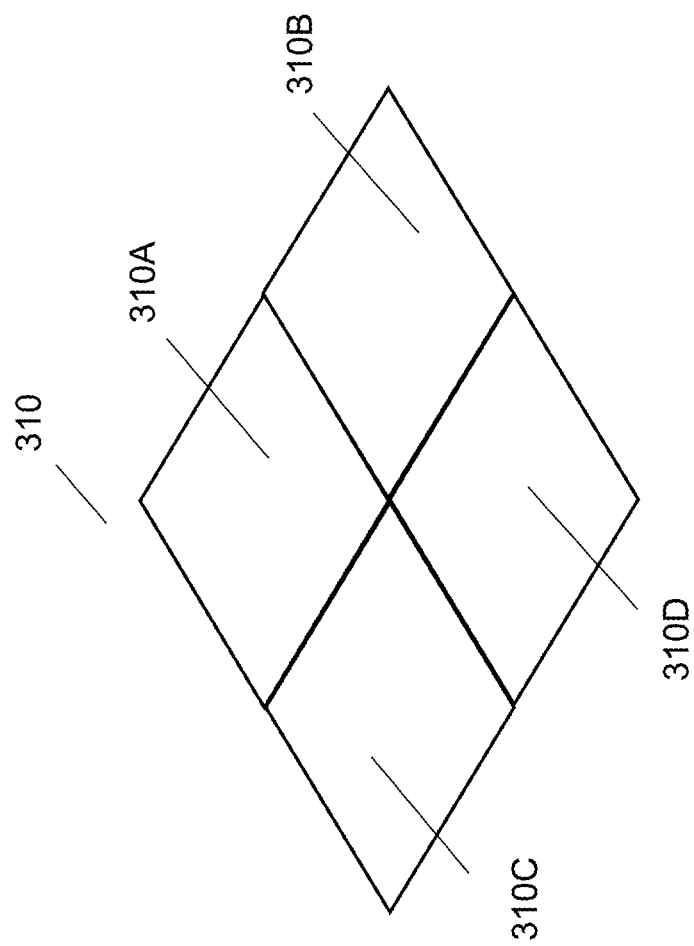
FIG. 39I conceptually illustrates a portion of a pixel pattern having diamond shaped elements with horizontally biased aspect ratios for use in an emissive display panel in accordance with an embodiment of the invention.
Figure 39J:
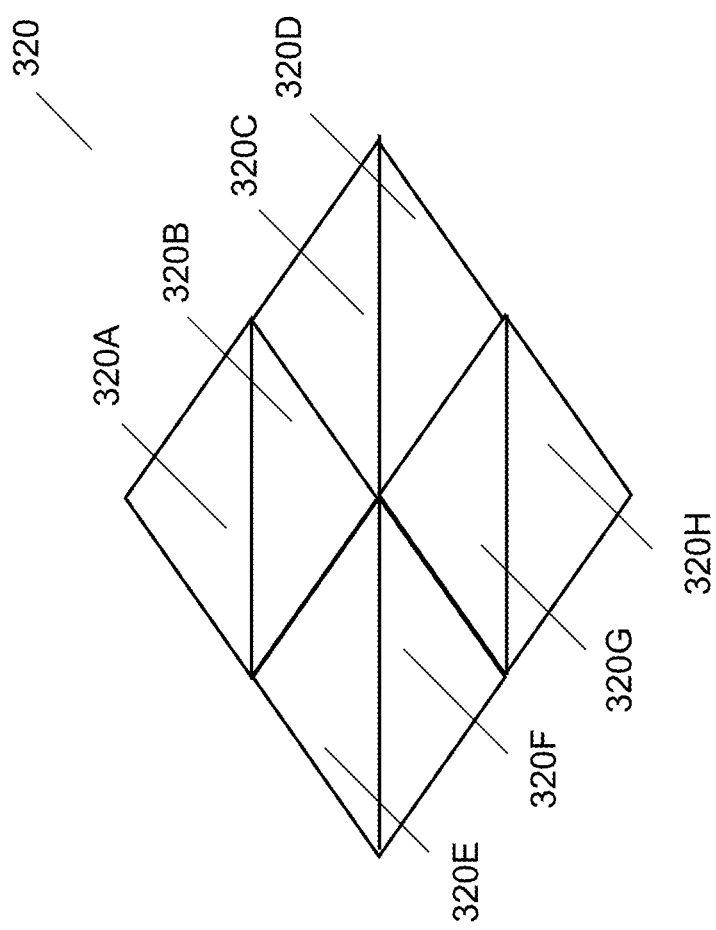
FIG. 39J conceptually illustrates a portion of a pixel pattern having triangles with horizontally biased aspect ratios for use in an emissive display panel in accordance with an embodiment of the invention.

In many embodiments, the pixels have vertically or horizontally biased aspect ratios. FIG. 39G conceptually illustrates a portion 290 of a pixel pattern having hexagonal elements 290A-290C of horizontally biased aspect ratio. FIG. 39H conceptually illustrates a portion 300 of a pixel pattern having rectangular elements 300A-300D of horizontally biased aspect ratio in accordance with an embodiment of the invention. FIG. 39I conceptually illustrates a portion 310 of a pixel pattern having diamond shaped elements 310A-310D of horizontally biased aspect ratio in accordance with an embodiment of the invention. FIG. 39J conceptually illustrates a portion 320 of a pixel pattern having triangular elements 320A-320H of horizontally biased aspect ratio in accordance with an embodiment of the invention.

Figure 40:
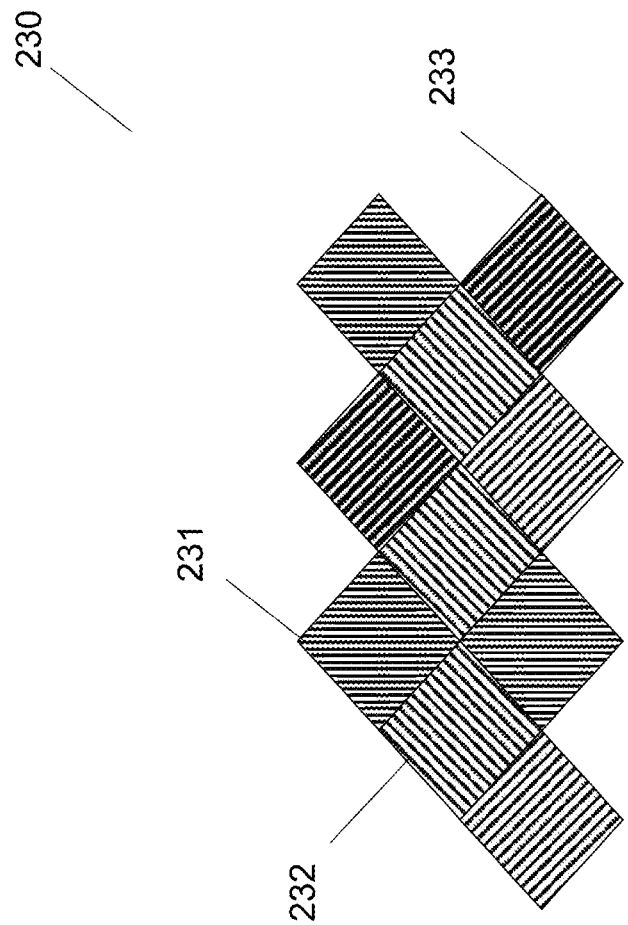
FIG. 40 conceptually illustrates a portion of a pixel pattern having diamond shaped elements in which different pixels can have different emission characteristics in accordance with an embodiment of the invention.

In many embodiments, OLEDs can be fabricated with cavity shapes and multilayer structures for shaping the spectral emission characteristics of the OLED. In some embodiments microcavity OLEDs optimized to provide narrow spectral bandwidths can be used. In some embodiments, the spectral bandwidth can be less than 40 nm. In some embodiments, spectral bandwidth of 20 nm or less can be provided. In some embodiments, OLEDs can be made from materials that provide electroluminescent emission in a relatively narrow band centered near selected spectral regions which correspond to one of the three primary colors. FIG. 40 conceptually illustrates a pixel pattern in which different pixels may have different emission characteristics. In some embodiments, pixels may have differing spectral emission characteristics according to their position in the pixel array. In some embodiments, pixels may have differing angular emission characteristics according to their position in the pixel array. In some embodiments the pixels can have both spectral and angular emission characteristics that vary spatially across the pixel array. The pixel pattern can be based on any of the patterns illustrated in FIGS. 39A-39J. In many embodiments, pixels of different sizes and geometries can be arranged to provide a spatial emission variation for controlling uniformity in the final image.

In many embodiments, OLEDs can have cavity structures designed for transforming a given light distribution into a customized form. This is typically achieved by secondary optical elements, which can be bulky for wearable display application. Such designs also suffer from the problem that they limit the final light source to a single permanent operational mode, which can only be overcome by employing mechanically adjustable optical elements. In some embodiments, OLEDs can enable real-time regulation of a beam shape without relying on secondary optical elements and without using any mechanical adjustment. In some embodiments, an OLED can be continuously tuned between forward and off axis principal emission directions while maintaining high quantum efficiency in any setting as disclosed in an article by Fries (Fries F. et al, "Real-time beam shaping without additional optical elements", Light Science & Applications, 7(1), 18, (2018)).

An important OLED development, the "microcavity OLED", may offer potential for more controlled spectral bandwidths and emission angles in some embodiments. However, microcavity OLEDs are not yet ready for commercial exploitation. In one embodiment (corresponding to a 2-micron grating with index modulation 0.1, an average index 1.65 and an incident angle in the waveguide of 45 degrees) the diffraction efficiency of an SBG is greater than 75% over the OLED emission spectrum (between 25%-of-peak points). Narrower bandwidth OLEDs using deeper cavity structures will reduce bandwidths down 40 nm. and below.

Advantageously, the invention can use OLEDs optimized for use in the blue at 460 nm, which provides better blue contrast in daylight AR display applications than the more commonly used 440 nm OLED as well as better reliability and lifetime.

In some embodiments, the emissive display can be an OLED full color silicon backplane microdisplay similar to one developed by Kopin Corporation (Westborough, MA). The Kopin microdisplay provides an image diagonal of 0.99 inch and a pixel density of 2490 pixels per inch. The microdisplay uses Kopin's patented Pantile™ magnifying lenses to enable a compact form factor.

Although the invention has been discussed in terms of embodiments using OLED microdisplays as an input image source, in many other embodiments, the invention can be applied with any other type of emissive microdisplay technology. In some embodiment the emissive microdisplay can be a micro LED. Micro-LEDs benefit from reduced power consumption and can operate efficiently at higher brightness than that of an OLED display. However, microLEDs are inherently monochrome Phosphors typically used for converting color in LEDs do not scale well to small size, leading to more complicated device architectures which are difficult to scale down to microdisplay applications.

Although polymer periodic structures have been discussed in terms of use within OLED array based waveguide displays, polymer periodic structures have advantageous synergetic applications with other classes of displays. Examples of these displays include image generators using a non-emissive display technology such as LCoS and MEMS based displays. While LCoS based displays typically emit polarized light which may make the polarization based advantages of polymer grating structures less applicable, polymer grating structures may provide an advantageous efficiency and manufacturing cost savings over conventional imprinted gratings. Further, polymer grating structures may be applicable in various other non-display waveguide-based implementations such as waveguide sensors and/or waveguide illumination devices.

Example Embodiments

Although many embodiments of the invention have been described in detail, it should be appreciated that the invention may be implemented in many other forms without departing from the spirit or scope of the invention. For example, embodiments such as enumerated below are contemplated:

Item 1: A method for fabricating a periodic structure, the method comprising:
providing a holographic mixture on a base substrate;
sandwiching the holographic mixture between the base substrate and a cover substrate, wherein the holographic mixture forms a holographic mixture layer on the base substrate;
applying holographic recording beams to the holographic mixture layer to form a holographic polymer dispersed liquid crystal periodic structure comprising alternating polymer rich regions and liquid crystal rich regions; and
removing the cover substrate from the holographic polymer dispersed liquid crystal periodic structure, wherein the cover substrate has different properties than the base substrate to allow for the cover substrate to adhere to the unexposed holographic mixture layer while capable of being removed from the formed holographic polymer dispersed liquid crystal periodic structure after exposure.

Item 2: The method of Item 1, further comprising removing at least a portion of the liquid crystal in the liquid crystal rich regions to form a polymer periodic structure.

Item 3: The method of Item 2, further comprising refilling the liquid crystal rich regions with a backfill material.

Item 4: The method of Item 3, wherein the backfill material has a different refractive index than the refractive index of the remaining polymer rich regions.

Item 5: The method of Item 3, wherein the backfill material comprises a liquid crystal material.

Item 6: The method of claim 5, wherein the liquid crystal material is different from the liquid crystal removed from the liquid crystal rich regions.

Item 7: The method of Item 2, wherein removing at least a portion of the liquid crystal comprises removing substantially all of the liquid crystal in the liquid crystal rich regions.

Item 8: The method of Item 2, wherein removing at least a portion of the liquid crystal further comprises leaving at least a portion of the liquid crystal in the liquid crystal rich regions.

Item 9: The method of Item 2, wherein removing at least a portion of liquid crystal comprises washing the holographic polymer dispersed liquid crystal grating with a solvent.

Item 10: The method of any one of the preceding items, wherein the base substrate comprises plastic.

Item 11: The method of Item 1, wherein a silicon oxide layer is deposited on the base substrate.

Item 12: The method of any one of Items 1-6, wherein the base substrate comprises glass, quartz, or silica.

Item 13: The method of any one of items 1-6, wherein the cover substrate comprises plastic.

Item 14: The method of Item 10, wherein a silicon oxide layer is deposited on the cover substrate.

Item 15: The method of any one of items 1-6, wherein the cover substrate comprises glass, quartz, or silica.

Item 16: The method of any one of the preceding Items, wherein an adhesion promotion layer is coated on top of the base substrate which promotes adhesion between the base substrate and the holographic polymer dispersed liquid crystal periodic structure.

Item 17: The method of Item 16, wherein the base substrate comprises a glass surface including hydroxyl groups and wherein a silane-based reagent bonds with the hydroxyl group and the adhesion promotion layer.

Item 18: The method of any one of the preceding items, wherein a release layer is coated on top of the cover substrate which allows the cover substrate to easily release from the holographic polymer dispersed liquid crystal periodic structure.

Item 19: The method of Item 18, wherein the cover substrate comprises a glass surface including hydroxyl groups and wherein the release layer is a silane based fluoro reactant which bonds with the hydroxyl groups.

Item 20: The method of any one of the preceding items, further comprising applying a protective substrate to the holographic polymer dispersed liquid crystal periodic structure, wherein the holographic polymer dispersed liquid crystal periodic structure is positioned between the protective substrate and the base substrate.

Item 21: A method for fabricating periodic structures, the method comprising:
  providing a first holographic mixture on a first base substrate;
  sandwiching the first holographic mixture between the first base substrate and a cover substrate, wherein the first holographic mixture forms a first holographic mixture layer on the first base substrate;
  applying holographic recording beams to the first holographic mixture layer to form a first holographic polymer dispersed liquid crystal periodic structure comprising alternating polymer rich regions and liquid crystal rich regions;
  removing the cover substrate from the holographic polymer dispersed liquid crystal periodic structure;
  providing a second holographic mixture on a second base substrate;
  sandwiching the second holographic mixture between the second base substrate and the cover substrate, wherein the second holographic mixture forms a second holographic mixture layer on the second base substrate; and
  applying holographic recording beams to the second holographic mixture layer to form a second holographic polymer dispersed liquid crystal periodic structure comprising alternating polymer rich regions and liquid crystal rich regions.

Item 22: The method of Item 21, wherein the cover substrate has different properties than the first base substrate and second base substrate to allow for the cover substrate to adhere to the first and second unexposed holographic mixture layer while capable of being removed from the formed first and second holographic polymer dispersed liquid crystal periodic structure after exposure.

Item 23: The method of any one of Items 21 or 22, further comprising removing the cover substrate from the second holographic polymer dispersed liquid crystal periodic structure.

Item 24: The method of any one of Items 21-23, further comprising removing at least a portion of the liquid crystal in the liquid crystal rich regions of the first or second holographic polymer dispersed liquid crystal periodic structure to form a polymer surface relief grating.

Item 25: The method of Item 24, further comprising refilling the liquid crystal rich regions of the first or second holographic polymer dispersed liquid crystal periodic structure with a backfill material.

Item 26: The method of Item 25, wherein the backfill material has a different refractive index than the refractive index of the remaining polymer rich regions.

Item 27: The method of Item 25, wherein the backfill material comprises a liquid crystal material.

Item 28: The method of Item 27, wherein the liquid crystal material is different from the liquid crystal removed from the liquid crystal rich regions.

Item 29: The method of Item 24, wherein removing at least a portion of the liquid crystal comprises removing substantially all of the liquid crystal in the liquid crystal rich regions.

Item 30: The method of Item 24, wherein removing at least a portion of the liquid crystal further comprises leaving at least a portion of the liquid crystal in the liquid crystal rich regions.

Item 31: The method of Item 24, wherein removing at least a portion of liquid crystal comprises washing the holographic polymer dispersed liquid crystal grating with a solvent.

Item 32: The method of any one of Items 21-31, wherein the first base substrate and/or second base substrate comprises plastic.

Item 33: The method of Items 21-32, wherein a silicon oxide layer is deposited on the first base substrate and/or second base substrate.

Item 34: The method of any one of Items 21-31, wherein the first base substrate and/or second base substrate comprises glass, quartz, or silica.

Item 35: The method of any one of Items 21-31, wherein the cover substrate comprises plastic.

Item 36: The method of Item 35, wherein a silicon oxide layer is deposited on the cover substrate.

Item 37: The method of any one of Items 21-31, wherein the cover substrate comprises glass, quartz, or silica.

Item 38: The method of any one of Items 21-31, wherein an adhesion promotion layer is coated on top of the first base substrate which promotes adhesion between the first base substrate and the first holographic polymer dispersed liquid crystal grating.

Item 39: The method of Item 38, wherein the first base substrate comprises a glass surface including hydroxyl groups and wherein a silane-based reagent bonds with the hydroxyl group and the adhesion promotion layer.

Item 40: The method of Items 21-39, wherein a release layer is coated on top of the cover substrate which allows the cover substrate to easily release from the holographic polymer dispersed liquid crystal grating.

Item 41: The method of Item 40, wherein the cover substrate comprises a glass surface including hydroxyl groups and wherein the release layer is a silane based fluoro reactant which bonds with the hydroxyl groups.

Item 42: A device for fabricating a deep surface relief grating (SRG) comprising:
  a holographic mixture sandwiched between a base substrate and a cover substrate,
  wherein the holographic mixture is configured to form a holographic polymer dispersed liquid crystal grating comprising alternating polymer rich regions and liquid crystal rich regions when exposed to holographic recording beams, and wherein the base substrate and the cover substrate have different properties to allow the cover substrate to adhere to the unexposed holographic mixture layer while capable of being removed from the formed holographic polymer dispersed liquid crystal grating after exposure.

Item 43: The device of Item 42, wherein the base substrate comprises plastic.

Item 44: The device of Item 43, wherein a silicon oxide layer is disposed on the base substrate.

Item 45: The device of Item 42, wherein the base substrate comprises glass, quartz, or silica.

Item 46: The device of Item 45, wherein the cover substrate comprises plastic.

Item 47: The device of Item 46, wherein a silicon oxide layer is disposed on the cover substrate.

Item 48: The device of Item 42, wherein the cover substrate comprises glass, quartz, or silica.

Item 49: The device of any one of Items 42-48, wherein an adhesion promotion layer is coated on top of the first base substrate which promotes adhesion between the first base substrate and the first holographic polymer dispersed liquid crystal grating.

Item 50: The device of Item 49, wherein the first base substrate comprises a glass surface including hydroxyl groups and wherein a silane-based reagent bonds with the hydroxyl group and the adhesion promotion layer.

Item 51: The device of any one of Items 42-50, wherein a release layer is coated on top of the cover substrate which allows the cover substrate to easily release from the holographic polymer dispersed liquid crystal grating.

Item 52: The device of Item 51, wherein the cover substrate comprises a glass surface including hydroxyl groups and wherein the release layer is a silane based fluoro reactant which bonds with the hydroxyl groups.

Item 53: A waveguide device comprising:
 a waveguide supporting a polymer grating structure for diffracting light propagating in total internal reflection in said waveguide,
 wherein the polymer grating structure comprises:
  a polymer regions;
  air gaps between adjacent portions of the polymer regions; and
  a coating disposed on the tops of the polymer regions and the tops of the waveguide.

Item 54: The waveguide device of Item 53, wherein the coating comprises an atomic layer deposition (ALD) deposited metallic layer or dielectric layer to enhance evanescent coupling between the waveguide and the polymer grating structure.

Item 55: The waveguide device of Item 53, wherein the coating comprises an atomic layer deposition (ALD) deposited metallic layer or dielectric layer to enhance the effective refractive index of the polymer grating structure.

Item 56: The waveguide device of Item 53, wherein the coating comprises an atomic layer deposition (ALD) deposited metallic layer or dielectric layer to enhance adhesion and/or perform as a bias layer.

Item 57: The waveguide device of Item 53, wherein the coating comprises an atomic layer deposition (ALD) conformally deposited metallic layer or dielectric layer disposed over the entirety of the polymer regions and the tops of the waveguide.

Item 58: The waveguide device of Item 53, wherein the coating comprises an atomic layer deposition (ALD) deposited metallic layer or dielectric layer disposed over one or more facets of the polymer regions including one or more of the upper, lower, or sidewall facets of the polymer regions.

Item 59: The waveguide device of Item 53, wherein a passivation coating is applied to the surfaces of the polymer grating structure and/or the coating.

Item 60: The waveguide device of Item 53, wherein the polymer regions include a slant angle with respect to the waveguide.

Item 61: The waveguide device of Item 53, wherein the polymer grating structure further comprises an isotropic material between adjacent portions of the polymer network, wherein the isotropic material has a refractive index higher or lower than the refractive index of the polymer network.

Item 62: The waveguide device of Item 61, wherein the isotropic material occupies a space at a bottom portion of the space between adjacent portions of the polymer network and the air occupies the space from above the top surface of the isotropic material to the modulation depth.

Item 63: The waveguide device of Item 61, wherein the isotropic material comprises a birefringent crystal material.

Item 64: The waveguide device of Item 63, wherein the birefringent crystal material comprises a liquid crystal material.

Item 65: The waveguide device of Item 53, wherein the polymer grating structure has a modulation depth greater than a wavelength of visible light.

Item 66: The waveguide device of Item 53, wherein the polymer grating structure comprises a modulation depth and a grating pitch and wherein the modulation depth is greater than the grating pitch.

Item 67: The waveguide device of Item 53, wherein the waveguide comprises two substrates and the polymer grating structure is either sandwiched between the two substrates or positioned on an external surface of either substrate.

Item 68: The waveguide device of Item 53, wherein the Bragg fringe spacing of the polymer network is 0.35 μm to 0.8 μm and the grating depth of the polymer network is 1 μm to 3 μm.

Item 69: The waveguide device of Item 53, wherein the ratio of grating depth of the polymer network to the Bragg fringe spacing is 1:1 to 5:1.

Item 70: The waveguide device of Item 53, further comprising a picture generating unit, and wherein the polymer grating structure comprises a waveguide diffraction grating.

Item 71: The waveguide device of Item 70, wherein the waveguide diffraction grating is configured as a multiplexing grating.

Item 72: The waveguide device of Item 71, wherein the waveguide diffraction grating is configured to accept light from the picture generating unit which includes multiple images.

Item 73: The waveguide device of Item 70, wherein the waveguide diffraction grating is configured to outcouple light from the waveguide.

Item 74: The waveguide device of Item 70, wherein the waveguide diffraction grating is configured as a beam expander.

Item 75: The waveguide device of Item 70, wherein the waveguide diffraction grating is configured to incouple light including image data generated from the picture generating unit.

Item 76: The waveguide device of Item 75, wherein the waveguide diffraction grating is further configured to incouple S-polarized light with a high degree of efficiency.

Item 77: The waveguide device of Item 76, wherein the diffraction grating is further configured to incouple S-polarized light at an efficiency of 70% to 95% at a Bragg angle.

Item 78. The waveguide device of Item 76, wherein the diffraction grating is further configured to incouple P-polarized light at an efficiency of 25% to 50% at a Bragg angle.

Item 79: The waveguide device of Item 53, wherein the refractive index difference between the polymer network and the air gaps is 0.25 to 0.4.

Item 80: The waveguide device of Item 63, wherein the refractive index difference between the polymer network and the birefringent crystal material is 0.05 to 0.2.

Item 81: The waveguide device of Item 53, wherein the polymer grating structure comprises a two-dimensional lattice structure or a three-dimensional lattice structure.

Item 82: The waveguide device of Item 53, further comprising another grating structure.

Item 83: The waveguide device of Item 82, wherein the polymer grating structure comprises an incoupling grating and the other grating structure comprises a beam expander or an outcoupling grating.

Item 84: A waveguide device comprising:
a waveguide supporting a polymer grating structure for diffracting light propagating in total internal reflection in said waveguide,
wherein the polymer grating structure comprises:
a polymer regions;
air gaps between adjacent portions of the polymer regions;
an optical layer disposed between the polymer regions and the waveguide; and
a coating disposed on the tops of the polymer regions and the tops of the optical layer.

Item 85: The waveguide device of Item 84, wherein the coating comprises an atomic layer deposition (ALD) deposited metallic layer or dielectric layer to enhance evanescent coupling between the waveguide and the polymer grating structure.

Item 86: The waveguide device of Item 84, wherein the coating comprises an atomic layer deposition (ALD) deposited metallic layer or dielectric layer to enhance the effective refractive index of the polymer grating structure.

Item 87: The waveguide device of Item 84, wherein the coating comprises an atomic layer deposition (ALD) deposited metallic layer or dielectric layer to enhance adhesion and/or perform as a bias layer.

Item 88: The waveguide device of Item 84, wherein the coating comprises an atomic layer deposition (ALD) conformally deposited metallic layer or dielectric layer disposed over the entirety of the polymer regions and the exposed tops of the optical layer.

Item 89: The waveguide device of Item 84, wherein the coating comprises an atomic layer deposition (ALD) deposited metallic layer or dielectric layer disposed over one or more facets of the polymer regions including one or more of the upper, lower, or sidewall facets of the polymer regions.

Item 90: The waveguide device of Item 84, wherein a passivation coating is applied to the surfaces of the polymer grating structure.

Item 91: The waveguide device of Item 84, wherein the polymer regions include a slant angle with respect to the waveguide.

Item 92: The waveguide device of Item 84, wherein the thickness of optical layer is designed to selectively modify diffraction efficiency vs angle characteristics within a defined angular range.

Item 93: The waveguide device of Item 84, wherein the polymer grating structure further comprises an isotropic material between adjacent portions of the polymer network, wherein the isotropic material has a refractive index higher or lower than the refractive index of the polymer network.

Item 94: The waveguide device of Item 93, wherein the isotropic material occupies a space at a bottom portion of the space between adjacent portions of the polymer network and the air occupies the space from above the top surface of the isotropic material to the modulation depth.

Item 95: The waveguide device of Item 93, wherein the isotropic material comprises a birefringent crystal material.

Item 96: The waveguide device of Item 95, wherein the birefringent crystal material comprises a liquid crystal material.

Item 97: The waveguide device of Item 84, wherein the polymer grating structure has a modulation depth greater than a wavelength of visible light.

Item 98: The waveguide device of Item 84, wherein the polymer grating structure comprises a modulation depth and a grating pitch and wherein the modulation depth is greater than the grating pitch.

Item 99: The waveguide device of Item 84, wherein the waveguide comprises two substrates and the polymer grating structure is either sandwiched between the two substrates or positioned on an external surface of either substrate.

Item 100: The waveguide device of Item 84, wherein the Bragg fringe spacing of the polymer network is 0.35 µm to 0.8 µm and the grating depth of the polymer network is 1 µm to 3 µm.

Item 101: The waveguide device of Item 84, wherein the ratio of grating depth of the polymer network to the Bragg fringe spacing is 1:1 to 5:1.

Item 102: The waveguide device of Item 84, further comprising a picture generating unit, and wherein the polymer grating structure comprises a waveguide diffraction grating.

Item 103: The waveguide device of Item 102, wherein the waveguide diffraction grating is configured as a multiplexing grating.

Item 104: The waveguide device of Item 103, wherein the waveguide diffraction grating is configured to accept light from the picture generating unit which includes multiple images.

Item 105: The waveguide device of Item 104, wherein the waveguide diffraction grating is configured to outcouple light from the waveguide.

Item 106: The waveguide device of Item 102, wherein the waveguide diffraction grating is configured as a beam expander.

Item 107: The waveguide device of Item 102, wherein the waveguide diffraction grating is configured to incouple light including image data generated from the picture generating unit.

Item 108: The waveguide device of Item 107, wherein the waveguide diffraction grating is further configured to incouple S-polarized light with a high degree of efficiency.

Item 109: The waveguide device of Item 108, wherein the diffraction grating is further configured to incouple S-polarized light at an efficiency of 70% to 95% at a Bragg angle.

Item 110: The waveguide device of Item 108, wherein the diffraction grating is further configured to incouple P-polarized light at an efficiency of 25% to 50% at a Bragg angle.

Item 111: The waveguide device of Item 84, wherein the refractive index difference between the polymer network and the air gaps is 0.25 to 0.4.

Item 112: The waveguide device of Item 95, wherein the refractive index difference between the polymer network and the birefringent crystal material is 0.05 to 0.2.

Item 113: The waveguide device of Item 84, wherein the polymer grating structure comprises a two-dimensional lattice structure or a three-dimensional lattice structure.

Item 114: The waveguide device of Item 84, further comprising another grating structure.

Item 115: The waveguide device of Item 114, wherein the polymer grating structure comprises an incoupling grating and the other grating structure comprises a beam expander or an outcoupling grating.

Item 116: A waveguide device comprising:
a waveguide supporting a polymer grating structure for diffracting light propagating in total internal reflection in said waveguide,
wherein the polymer grating structure comprises:
a polymer regions;
air gaps between adjacent portions of the polymer regions; and
an optical layer disposed between the polymer regions and the waveguide.

Item 117: The waveguide device of Item 116, wherein the thickness of optical layer is designed to selectively modify diffraction efficiency vs angle characteristics within a defined angular range.

Item 118: The waveguide device of Item 116, wherein the polymer grating structure further comprises an isotropic material between adjacent portions of the polymer network, wherein the isotropic material has a refractive index higher or lower than the refractive index of the polymer network.

Item 119: The waveguide device of Item 118, wherein the isotropic material occupies a space at a bottom portion of the space between adjacent portions of the polymer network and the air occupies the space from above the top surface of the isotropic material to the modulation depth.

Item 120: The waveguide device of Item 118, wherein the isotropic material comprises a birefringent crystal material.

Item 121: The waveguide device of Item 120, wherein the birefringent crystal material comprises a liquid crystal material.

Item 122: The waveguide device of Item 118, wherein the polymer grating structure has a modulation depth greater than a wavelength of visible light.

Item 123: The waveguide device of Item 118, wherein the polymer grating structure comprises a modulation depth and a grating pitch and wherein the modulation depth is greater than the grating pitch.

Item 124: The waveguide device of Item 118, wherein the waveguide comprises two substrates and the polymer grating structure is either sandwiched between the two substrates or positioned on an external surface of either substrate.

Item 125: The waveguide device of Item 118, wherein the Bragg fringe spacing of the polymer network is 0.35 μm to 0.8 μm and the grating depth of the polymer network is 1 μm to 3 μm.

Item 126: The waveguide device of Item 118, wherein the ratio of grating depth of the polymer network to the Bragg fringe spacing is 1:1 to 5:1.

Item 127: The waveguide device of Item 118, further comprising a picture generating unit, and wherein the polymer grating structure comprises a waveguide diffraction grating.

Item 128: The waveguide device of Item 127, wherein the waveguide diffraction grating is configured as a multiplexing grating.

Item 129: The waveguide device of Item 128, wherein the waveguide diffraction grating is configured to accept light from the picture generating unit which includes multiple images.

Item 130: The waveguide device of Item 127, wherein the waveguide diffraction grating is configured to outcouple light from the waveguide.

Item 131: The waveguide device of Item 130, wherein the waveguide diffraction grating is configured as a beam expander.

Item 132: The waveguide device of Item 127, wherein the waveguide diffraction grating is configured to incouple light including image data generated from the picture generating unit.

Item 133: The waveguide device of Item 132, wherein the waveguide diffraction grating is further configured to incouple S-polarized light with a high degree of efficiency.

Item 134: The waveguide device of Item 133, wherein the diffraction grating is further configured to incouple S-polarized light at an efficiency of 70% to 95% at a Bragg angle.

Item 135: The waveguide device of Item 133, wherein the diffraction grating is further configured to incouple P-polarized light at an efficiency of 25% to 50% at a Bragg angle.

Item 136: The waveguide device of Item 116, wherein the refractive index difference between the polymer network and the air gaps is 0.25 to 0.4.

Item 137: The waveguide device of Item 120, wherein the refractive index difference between the polymer network and the birefringent crystal material is 0.05 to 0.2.

Item 138: The waveguide device of Item 116, wherein the polymer grating structure comprises a two-dimensional lattice structure or a three-dimensional lattice structure.

Item 139: The waveguide device of Item 116, further comprising another grating structure.

Item 140: The waveguide device of Item 139, wherein the polymer grating structure comprises an incoupling grating and the other grating structure comprises a beam expander or an outcoupling grating.

Item 141: The waveguide device of Item 116, wherein the optical is sandwiched by the waveguide and the polymer grating structure and wherein the polymer grating structure extends all the way to the optical layer to directly contact the optical layer.

Item 142: A waveguide device comprising:
a waveguide supporting a polymer grating structure for diffracting light propagating in total internal reflection in said waveguide,
wherein the polymer grating structure comprises:
a polymer regions; and
air gaps between adjacent portions of the polymer regions,
wherein the polymer regions and air gaps directly contact the waveguide.

Item 143: The waveguide device of Item 142, wherein the thickness of optical layer is designed to selectively modify diffraction efficiency vs angle characteristics within a defined angular range.

Item 144: The waveguide device of Item 142, wherein the polymer surface relief grating extends all the way to directly contact the waveguide.

Item 145. The waveguide device of claim 142, wherein there is no bias layer between the polymer surface relief grating and the substrate.

Item 146: The waveguide device of Item 142, wherein the polymer grating structure further comprises an isotropic material between adjacent portions of the polymer network, wherein the isotropic material has a refractive index higher or lower than the refractive index of the polymer network.

Item 147: The waveguide device of Item 146, wherein the isotropic material occupies a space at a bottom portion of the space between adjacent portions of the polymer network and the air occupies the space from above the top surface of the isotropic material to the modulation depth.

Item 148: The waveguide device of Item 146, wherein the isotropic material comprises a birefringent crystal material.

Item 149: The waveguide device of Item 148, wherein the birefringent crystal material comprises a liquid crystal material.

Item 150: The waveguide device of Item 142, wherein the polymer grating structure has a modulation depth greater than a wavelength of visible light.

Item 151: The waveguide device of Item 142, wherein the polymer grating structure comprises a modulation depth and a grating pitch and wherein the modulation depth is greater than the grating pitch.

Item 152: The waveguide device of Item 142, wherein the waveguide comprises two substrates and the polymer grating structure is either sandwiched between the two substrates or positioned on an external surface of either substrate.

Item 153: The waveguide device of Item 142, wherein the Bragg fringe spacing of the polymer network is 0.35 µm to 0.8 µm and the grating depth of the polymer network is 1 µm to 3 µm.

Item 154: The waveguide device of Item 142, wherein the ratio of grating depth of the polymer network to the Bragg fringe spacing is 1:1 to 5:1.

Item 155: The waveguide device of Item 142, further comprising a picture generating unit, and wherein the polymer grating structure comprises a waveguide diffraction grating.

Item 156: The waveguide device of Item 155, wherein the waveguide diffraction grating is configured as a multiplexing grating.

Item 157: The waveguide device of Item 156, wherein the waveguide diffraction grating is configured to accept light from the picture generating unit which includes multiple images.

Item 158: The waveguide device of Item 155, wherein the waveguide diffraction grating is configured to outcouple light from the waveguide.

Item 159: The waveguide device of Item 155, wherein the waveguide diffraction grating is configured as a beam expander.

Item 160: The waveguide device of Item 155, wherein the waveguide diffraction grating is configured to incouple light including image data generated from the picture generating unit.

Item 161: The waveguide device of Item 160, wherein the waveguide diffraction grating is further configured to incouple S-polarized light with a high degree of efficiency.

Item 162: The waveguide device of Item 160, wherein the waveguide diffraction grating is further configured to incouple S-polarized light at an efficiency of 70% to 95% at a Bragg angle.

Item 163: The waveguide device of Item 160, wherein the diffraction grating is further configured to incouple P-polarized light at an efficiency of 25% to 50% at a Bragg angle.

Item 164: The waveguide device of Item 142, wherein the refractive index difference between the polymer network and the air gaps is 0.25 to 0.4.

Item 165: The waveguide device of Item 164, wherein the refractive index difference between the polymer network and the birefringent crystal material is 0.05 to 0.2.

Item 166: The waveguide device of Item 142, wherein the polymer grating structure comprises a two-dimensional lattice structure or a three-dimensional lattice structure.

Item 167: The waveguide device of Item 142, further comprising another grating structure.

Item 168: The waveguide device of Item 167, wherein the polymer grating structure comprises an incoupling grating and the other grating structure comprises a beam expander or an outcoupling grating.

Item 169. A method for fabricating a grating, the method comprising:
providing a mixture of monomer and a nonreactive material;
providing a substrate;
coating a layer of the mixture on a surface of the substrate;
applying holographic recording beams to the layer to form a holographic polymer dispersed grating comprising alternating polymer rich regions and nonreactive material rich regions;
removing at least a portion of the nonreactive material in the nonreactive material rich regions to form a polymer surface relief grating including alternating polymer regions and air regions; and
applying a coating to the top surfaces of the polymer regions and the top surfaces of the substrate in the air regions.

Item 170: The method of Item 169, wherein applying the coating comprises an atomic layer deposition (ALD) process.

Item 171: The method of Item 169, wherein the coating comprises $TiO_2$ or $ZnO_2$.

Item 172: The method of Item 169, wherein the monomer comprises acrylates, methacrylates, vinyls, isocyanates, thiols, isocyanate-acrylate, and/or thiolene.

Item 173: The method of Item 172, wherein the mixture further comprises at least one of a photoinitiator, a coinitiator, or additional additives.

Item 174: The method of Item 172, wherein the thiols comprise thiol-vinyl-acrylate.

Item 175: The method of Item 173, wherein the photoinitiator comprises photosensitive components.

Item 176: The method of Item 175, wherein the photosensitive components comprise dyes and/or radical generators.

Item 177: The method of Item 169, wherein providing a mixture of monomer and liquid crystal comprises:
mixing the monomer, liquid crystal, and at least one of a photoinitiator, a coinitiator, multifunctional thiol, or additional additives;
storing the mixture in a location absent of light at a temperature of 22° C. or less;
adding additional monomer;
filtering the mixture through a filter of 0.6 µm or less; and
storing the filtered mixture in a location absent of light.

Item 178: The method of Item 169, wherein the substrate comprises a glass substrate or plastic substrate.

Item 179: The method of Item 169, wherein the substrate comprises a transparent substrate.

Item 180: The method of Item 169, further comprising sandwiching the mixture between the substrate and another substrate with one or more spacers for maintaining internal dimensions.

Item 181: The method of Item 180, further comprising applying a non-stick release layer on one surface of the other substrate.

Item 182: The method of Item 181, wherein the non-stick release layer comprises a fluoropolymer.

Item 183: The method of Item 169, further comprising refilling the liquid crystal rich regions with a liquid crystal material.

Item 184: The method of Item 183, wherein the liquid crystal material has a different molecular structure than the previously removed liquid crystal.

Item 185: The method of Item 169, wherein removing at least a portion of the liquid crystal comprises removing substantially all of the liquid crystal in the liquid crystal rich regions.

Item 186: The method of Item 169, wherein removing at least a portion of the liquid crystal further comprises leaving at least a portion of the liquid crystal in the polymer rich regions.

Item 187: The method of Item 169, further comprising applying a protective layer over the deep SRG.

Item 188: The method of Item 187, wherein the protective layer comprises an anti-reflective layer.

Item 189: The method of Item 187, wherein the protective layer comprises silicate or silicon nitride.

Item 190: The method of Item 187, wherein applying a protective layer comprises depositing the protective layer on the deep SRG.

Item 191: The method of Item 190, wherein depositing the protective layer comprises chemical vapor deposition.

Item 192: The method of Item 191, wherein the chemical vapor deposition is a nanocoating process.

Item 193: The method of Item 190, wherein the protective layer comprises a parylene coating.

Item 194: The method of Item 169, wherein the liquid crystal rich regions comprise air gaps after removing at least a portion of the liquid crystal in the liquid crystal rich regions.

Item 195: The method of Item 194, further comprising creating a vacuum in the air gaps or filling the air gaps with an inert gas.

Item 196: The method of Item 169, wherein removing at least a portion of liquid crystal comprises washing the holographic polymer dispersed liquid crystal grating with a solvent.

Item 197: The method of Item 196, wherein washing the holographic polymer dispersed liquid crystal grating comprises immersing the holographic polymer dispersed liquid crystal grating in the solvent.

Item 198: The method of Item 196, wherein the solvent comprises isopropyl alcohol.

Item 199: The method of Item 196, wherein the solvent is kept at a temperature lower than room temperature while washing the holographic polymer dispersed liquid crystal grating.

Item 200: The method of Item 196, wherein removing at least a portion of the liquid crystal further comprises drying the holographic polymer dispersed liquid crystal grating with a high flow air source.

Item 201: The method of Item 169, further comprising curing the holographic polymer dispersed liquid crystal grating.

Item 202: The method of Item 201, wherein curing the holographic polymer dispersed liquid crystal grating comprises exposing the holographic polymer dispersed liquid crystal grating to a low intensity white light for a period of about an hour.

Item 203: The method of Item 169, wherein the polymer surface relief grating is configured to incouple S-polarized light at an efficiency of 70% to 95%.

Item 204: The method of Item 203, wherein the polymer surface relief grating is further configured to incouple P-polarized light at an efficiency of 25% to 50%.

Item 205: The method of Item 169, wherein the refractive index difference between the polymer network and the air gaps is 0.25 to 0.4.

Item 206: The method of Item 183, wherein the refractive index difference between the polymer network and the liquid crystal material is 0.05 to 0.2.

Item 207: The method of Item 169, wherein the polymer surface relief grating comprises a Bragg fringe spacing of 0.35 μm to 0.8 μm and the grating depth of 1 μm to 3 μm.

Item 208: The method of Item 169, wherein the polymer surface relief grating comprises a ratio of Bragg fringe spacing to grating depth of 1:1 to 5:1.

Item 209: The method of Item 169, wherein the liquid crystal content in the mixture of monomer and liquid crystal is approximately 20% to 50%.

Item 210: The method of Item 169, wherein the liquid crystal in the mixture of monomer and liquid crystal comprises liquid crystal singles.

Item 211: The method of Item 210, wherein the liquid crystal singles comprise cyanobiphenyl and/or pentylcyanobiphenyl.

Item 212: A method for fabricating a grating, the method comprising:
 providing a mixture of monomer and a nonreactive material;
 providing a substrate;
 coating a layer of the mixture on a surface of the substrate;
 applying holographic recording beams to the layer to form a holographic polymer dispersed grating comprising alternating polymer rich regions and nonreactive material rich regions;
 removing at least a portion of the nonreactive material in the nonreactive material rich regions to form a polymer surface relief grating including alternating polymer regions and air regions, wherein an optical layer is disposed between the polymer regions and the substrate; and
 applying a coating to the top surfaces of the polymer regions and the top surfaces of the optical layer in the air regions.

Item 213: The method of Item 212, wherein applying the coating comprises an atomic layer deposition (ALD) process.

Item 214: The method of Item 212, wherein the coating comprises $TiO_2$ or $ZnO_2$.

Item 215: The method of Item 212, wherein the monomer comprises acrylates, methacrylates, vinyls, isocyanates, thiols, isocyanate-acrylate, and/or thiolene.

Item 216: The method of Item 215, wherein the mixture further comprises at least one of a photoinitiator, a coinitiator, or additional additives.

Item 217: The method of Item 215, wherein the thiols comprise thiol-vinyl-acrylate.

Item 218: The method of Item 216, wherein the photoinitiator comprises photosensitive components.

Item 219: The method of Item 218, wherein the photosensitive components comprise dyes and/or radical generators.

Item 220: The method of Item 212, wherein providing a mixture of monomer and liquid crystal comprises:
   mixing the monomer, liquid crystal, and at least one of a photoinitiator, a coinitiator, multifunctional thiol, or additional additives;
   storing the mixture in a location absent of light at a temperature of 22° C. or less;
   adding additional monomer;
   filtering the mixture through a filter of 0.6 µm or less; and
   storing the filtered mixture in a location absent of light.

Item 221: The method of Item 212, wherein the substrate comprises a glass substrate or plastic substrate.

Item 222: The method of Item 212, wherein the substrate comprises a transparent substrate.

Item 223: The method of Item 212, further comprising sandwiching the mixture between the substrate and another substrate with one or more spacers for maintaining internal dimensions.

Item 224: The method of Item 223, further comprising applying a non-stick release layer on one surface of the other substrate.

Item 225: The method of Item 224, wherein the non-stick release layer comprises a fluoropolymer.

Item 226: The method of Item 212, further comprising refilling the liquid crystal rich regions with a liquid crystal material.

Item 227: The method of Item 226, wherein the liquid crystal material has a different molecular structure than the previously removed liquid crystal.

Item 228: The method of Item 212, wherein removing at least a portion of the liquid crystal comprises removing substantially all of the liquid crystal in the liquid crystal rich regions.

Item 229: The method of Item 212, wherein removing at least a portion of the liquid crystal further comprises leaving at least a portion of the liquid crystal in the polymer rich regions.

Item 230: The method of Item 212, further comprising applying a protective layer over the deep SRG.

Item 231: The method of Item 230, wherein the protective layer comprises an anti-reflective layer.

Item 232: The method of Item 230, wherein the protective layer comprises silicate or silicon nitride.

Item 233: The method of Item 230, wherein applying a protective layer comprises depositing the protective layer on the deep SRG.

Item 234: The method of Item 233, wherein depositing the protective layer comprises chemical vapor deposition.

Item 235: The method of Item 234, wherein the chemical vapor deposition is a nanocoating process.

Item 236: The method of Item 230, wherein the protective layer comprises a parylene coating.

Item 237: The method of Item 212, wherein the liquid crystal rich regions comprise air gaps after removing at least a portion of the liquid crystal in the liquid crystal rich regions.

Item 238: The method of Item 237, further comprising creating a vacuum in the air gaps or filling the air gaps with an inert gas.

Item 239: The method of Item 212, wherein removing at least a portion of liquid crystal comprises washing the holographic polymer dispersed liquid crystal grating with a solvent.

Item 240: The method of Item 239, wherein washing the holographic polymer dispersed liquid crystal grating comprises immersing the holographic polymer dispersed liquid crystal grating in the solvent.

Item 241: The method of Item 239, wherein the solvent comprises isopropyl alcohol.

Item 242: The method of Item 239, wherein the solvent is kept at a temperature lower than room temperature while washing the holographic polymer dispersed liquid crystal grating.

Item 243: The method of Item 239, wherein removing at least a portion of the liquid crystal further comprises drying the holographic polymer dispersed liquid crystal grating with a high flow air source.

Item 244: The method of Item 212, further comprising curing the holographic polymer dispersed liquid crystal grating.

Item 245: The method of Item 244, wherein curing the holographic polymer dispersed liquid crystal grating comprises exposing the holographic polymer dispersed liquid crystal grating to a low intensity white light for a period of about an hour.

Item 246: The method of Item 212, wherein the polymer surface relief grating is configured to incouple S-polarized light at an efficiency of 70% to 95%.

Item 247: The method of Item 246, wherein the polymer surface relief grating is further configured to incouple P-polarized light at an efficiency of 25% to 50%.

Item 248: The method of Item 212, wherein the refractive index difference between the polymer network and the air gaps is 0.25 to 0.4.

Item 249: The method of Item 226, wherein the refractive index difference between the polymer network and the liquid crystal material is 0.05 to 0.2.

Item 250: The method of Item 212, wherein the polymer surface relief grating comprises a Bragg fringe spacing of 0.35 µm to 0.8 µm and the grating depth of 1 µm to 3 µm.

Item 251: The method of Item 212, wherein the polymer surface relief grating comprises a ratio of Bragg fringe spacing to grating depth of 1:1 to 5:1.

Item 252: The method of Item 212, wherein the liquid crystal content in the mixture of monomer and liquid crystal is approximately 20% to 50%.

Item 253: The method of Item 212, wherein the liquid crystal in the mixture of monomer and liquid crystal comprises liquid crystal singles.

Item 254: The method of Item 253, wherein the liquid crystal singles comprise cyanobiphenyl and/or pentylcyanobiphenyl.

Item 255: A method for fabricating a grating, the method comprising:
   providing a mixture of monomer and a nonreactive material;
   providing a substrate;
   coating a layer of the mixture on a surface of the substrate;
   applying holographic recording beams to the layer to form a holographic polymer dispersed grating comprising alternating polymer rich regions and nonreactive material rich regions;
   removing at least a portion of the nonreactive material in the nonreactive material rich regions to form a polymer surface relief grating including alternating polymer regions and air regions; and
   performing a plasma ashing process to remove at least a portion of polymer from the polymer regions.

Item 256: The method of Item 255, wherein the mixture contains chemical additives for enhancing the effectiveness of the plasma ashing process.

Item 257: The method of Item 256, wherein the plasma ashing process includes reactive species including oxygen and the mixture includes nitrogen to control the plasma ashing rate.

Item 258: The method of Item 256, wherein the plasma ashing process includes reactive species including oxygen, fluorine, and/or hydrogen.

Item 259: The method of Item 258, wherein the plasma ashing process includes a plasma mixture of nitrogen and hydrogen.

Item 260: The method of Item 259, wherein the plasma mixture further includes fluorine.

Item 261: The method of Item 255, wherein the monomer comprises acrylates, methacrylates, vinyls, isocynates, thiols, isocyanate-acrylate, and/or thioline.

Item 262: The method of Item 261, wherein the mixture further comprises at least one of a photoinitiator, a coinitiator, or additional additives.

Item 263: The method of Item 261, wherein the thiols comprise thiol-vinyl-acrylate.

Item 264: The method of Item 262, wherein the photoinitiator comprises photosensitive components.

Item 265: The method of Item 264, wherein the photosensitive components comprise dyes and/or radical generators.

Item 266: The method of Item 255, wherein providing a mixture of monomer and liquid crystal comprises:
  mixing the monomer, liquid crystal, and at least one of a photoinitiator, a coinitiator, multifunctional thiol, or additional additives;
  storing the mixture in a location absent of light at a temperature of 22° C. or less;
  adding additional monomer;
  filtering the mixture through a filter of 0.6 µm or less; and
  storing the filtered mixture in a location absent of light.

Item 267: The method of Item 255, wherein the substrate comprises a glass substrate or plastic substrate.

Item 268: The method of Item 255, wherein the substrate comprises a transparent substrate.

Item 269: The method of Item 255, further comprising sandwiching the mixture between the substrate and another substrate with one or more spacers for maintaining internal dimensions.

Item 270: The method of Item 265, further comprising applying a non-stick release layer on one surface of the other substrate.

Item 271: The method of Item 270, wherein the non-stick release layer comprises a fluoropolymer.

Item 272: The method of Item 255, further comprising refilling the liquid crystal rich regions with a liquid crystal material.

Item 273: The method of Item 272, wherein the liquid crystal material has a different molecular structure than the previously removed liquid crystal.

Item 274: The method of Item 255, wherein removing at least a portion of the liquid crystal comprises removing substantially all of the liquid crystal in the liquid crystal rich regions.

Item 275: The method of Item 255, wherein removing at least a portion of the liquid crystal further comprises leaving at least a portion of the liquid crystal in the polymer rich regions.

Item 276: The method of Item 255, further comprising applying a protective layer over the deep SRG.

Item 277: The method of Item 276, wherein the protective layer comprises an anti-reflective layer.

Item 278: The method of Item 276, wherein the protective layer comprises silicate or silicon nitride.

Item 279: The method of Item 276, wherein applying a protective layer comprises depositing the protective layer on the deep SRG.

Item 280: The method of Item 279, wherein depositing the protective layer comprises chemical vapor deposition.

Item 281: The method of Item 280, wherein the chemical vapor deposition is a nanocoating process.

Item 282: The method of Item 276, wherein the protective layer comprises a parylene coating.

Item 283: The method of Item 255, wherein the liquid crystal rich regions comprise air gaps after removing at least a portion of the liquid crystal in the liquid crystal rich regions.

Item 284: The method of Item 283, further comprising creating a vacuum in the air gaps or filling the air gaps with an inert gas.

Item 285: The method of Item 254, wherein removing at least a portion of liquid crystal comprises washing the holographic polymer dispersed liquid crystal grating with a solvent.

Item 286: The method of Item 285, wherein washing the holographic polymer dispersed liquid crystal grating comprises immersing the holographic polymer dispersed liquid crystal grating in the solvent.

Item 287: The method of Item 285, wherein the solvent comprises isopropyl alcohol.

Item 288: The method of Item 285, wherein the solvent is kept at a temperature lower than room temperature while washing the holographic polymer dispersed liquid crystal grating.

Item 289: The method of Item 285, wherein removing at least a portion of the liquid crystal further comprises drying the holographic polymer dispersed liquid crystal grating with a high flow air source.

Item 290: The method of Item 255, further comprising curing the holographic polymer dispersed liquid crystal grating.

Item 291: The method of Item 290, wherein curing the holographic polymer dispersed liquid crystal grating comprises exposing the holographic polymer dispersed liquid crystal grating to a low intensity white light for a period of about an hour.

Item 292: The method of Item 255, wherein the polymer surface relief grating is configured to incouple S-polarized light at an efficiency of 70% to 95%.

Item 293: The method of Item 292, wherein the polymer surface relief grating is further configured to incouple P-polarized light at an efficiency of 25% to 50%.

Item 294: The method of Item 255, wherein the refractive index difference between the polymer network and the air gaps is 0.25 to 0.4.

Item 295: The method of Item 272, wherein the refractive index difference between the polymer network and the liquid crystal material is 0.05 to 0.2.

Item 296: The method of Item 255, wherein the polymer surface relief grating comprises a Bragg fringe spacing of 0.35 µm to 0.8 µm and the grating depth of 1 µm to 3 µm.

Item 297: The method of Item 255, wherein the polymer surface relief grating comprises a ratio of Bragg fringe spacing to grating depth of 1:1 to 5:1.

Item 298: The method of Item 255, wherein the liquid crystal content in the mixture of monomer and liquid crystal is approximately 20% to 50%.

Item 299: The method of Item 255, wherein the liquid crystal in the mixture of monomer and liquid crystal comprises liquid crystal singles.

Item 300: The method of Item 299, wherein the liquid crystal singles comprise cyanobiphenyl and/or pentylcynobiphenyl.

Item 301: The method of Item 255, for fabricating a grating, further comprising:
immersing the grating in a refractive material to fill the air regions and voids in the polymer rich regions formed by removal of the nonreactive material to form alternating polymer regions and refractive material regions; and
removing the refractive material in the refractive material regions to leave alternating composite polymer and second nonreactive material regions and air regions.

Item 302: The method of Item 301, wherein removing the refractive material in the refractive materials is performed using a plasma ashing process.

Item 303. A waveguide comprising:
an optical substrate supporting a polymer grating structure for diffracting light propagating in total internal reflection in said waveguide,
wherein the polymer grating structure comprises:
a polymer regions;
air gaps between adjacent portions of the polymer regions, wherein a portion of the polymer regions on the same level as the air gaps along with the air gaps form a surface relief grating; and
backfill material regions below the air gaps, wherein a portion of the polymer regions on the same level as the backfill material regions along with the backfill material regions form a volume grating, and
wherein the polymer grating structure comprises a dual interaction grating in which total internal reflection light from the surface relief grating formed by the polymer grating structure interacts with the volume grating formed by the polymer grating structure to provide a first diffraction efficiency versus angle characteristic and total internal reflection light from an opposing face of the optical substrate interacts with the volume grating formed by the polymer grating structure to provide a second diffraction efficiency versus angle characteristic.

Item 304: The waveguide of Item 303, wherein the polymer grating structure is a fold grating.

Item 305: The waveguide of Item 303, wherein grating depth of the polymer grating structure is less than the fringe spacing of the polymer grating structure.

Item 306: The waveguide of Item 303, wherein grating depth of the polymer grating structure is greater than the fringe spacing of the polymer grating structure.

Item 307. The waveguide of Item 303, wherein total internal reflection from the surface relief grating formed by the polymer grating structure occurs when the reflected first order diffraction from the surface relief grating formed by the polymer grating structure has a diffraction angle equal to the TIR angle of the waveguide.

Item 308: The waveguide of Item 303, wherein the polymer grating structure provides no transmitted diffraction orders.

Item 309: The waveguide of Item 303, wherein the polymer grating structure is a photonic crystal.

Item 310: The waveguide of Item 303, wherein the polymer grating structure comprises a Raman Nath grating overlaying a Bragg grating, wherein the Raman Nath grating has the same grating period as the Bragg grating, and the minima of the Raman Nath grating overlays the minima of the Bragg grating.

Item 311. The waveguide of Item 303, wherein the polymer grating structure is a slanted grating.

Item 312: The waveguide of Item 303, wherein the polymer grating structure is an unslanted grating.

Item 313. The waveguide of Item 303, wherein the backfill material regions have a refractive index different from that of the polymer rich regions.

Item 314. The waveguide device of Item 313, wherein the air regions and the polymer rich regions on the same level of the air regions comprise a Raman-Nath grating.

Item 315. The waveguide device of claim 314, wherein the backfilled material regions and the polymer rich regions on the same level as the backfilled material regions comprise a volume Bragg grating.

DOCTRINE OF EQUIVALENTS

While the above description contains many specific embodiments of the invention, these should not be construed as limitations on the scope of the invention, but rather as an example of one embodiment thereof. It is therefore to be understood that the present invention may be practiced in ways other than specifically described, without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

What is claimed is:

1. A method for fabricating a periodic structure, the method comprising:
providing a holographic mixture on a base substrate;
sandwiching the holographic mixture between the base substrate and a cover substrate, wherein the holographic mixture forms a holographic mixture layer on the base substrate;
applying holographic recording beams to the holographic mixture layer to form a holographic polymer dispersed periodic structure comprising alternating polymer rich regions and non-reactive material rich regions; and
removing the cover substrate from the holographic polymer dispersed periodic structure, wherein the cover substrate has different properties than the base substrate to allow for the cover substrate to adhere to the unexposed holographic mixture layer while capable of being removed from the formed holographic polymer dispersed periodic structure after exposure,
wherein a release layer is coated on top of the cover substrate which allows the cover substrate to easily release from the holographic polymer dispersed periodic structure,
wherein the cover substrate comprises a glass surface including hydroxyl groups and wherein the release layer is a silane based fluoro reactant which bonds with the hydroxyl groups.

2. The method of claim 1, further comprising removing at least a portion of the non-reactive material in the non-reactive material rich regions to form a polymer periodic structure.

3. The method of claim 2, further comprising refilling the non-reactive material rich regions with a backfill material.

4. The method of claim 3, wherein the backfill material has a different refractive index than the refractive index of the remaining polymer rich regions.

5. The method of claim 3, wherein the backfill material comprises a liquid crystal material.

6. The method of claim 5, wherein the liquid crystal material is different from the non-reactive material removed from the non-reactive material rich regions.

7. The method of claim 2, wherein removing at least a portion of the non-reactive material comprises removing substantially all of the non-reactive material in the non-reactive material rich regions.

8. The method of claim 2, wherein removing at least a portion of the non-reactive material further comprises leaving at least a portion of the non-reactive material in the non-reactive material rich regions.

9. The method of claim 2, wherein removing at least a portion of non-reactive material comprises washing the holographic polymer dispersed periodic structure with a solvent.

10. The method of claim 1, wherein the base substrate comprises plastic.

11. The method of claim 10, wherein a silicon oxide layer is deposited on the cover substrate.

12. The method of claim 1, wherein a silicon oxide layer is deposited on the base substrate.

13. The method of claim 1, wherein the base substrate comprises glass, quartz, or silica.

14. The method of claim 1, wherein the cover substrate comprises plastic.

15. The method of claim 1, wherein the cover substrate comprises glass, quartz, or silica.

16. The method of claim 1, further comprising applying a protective substrate to the holographic polymer dispersed periodic structure, wherein the holographic polymer dispersed periodic structure is positioned between the protective substrate and the base substrate.

17. The method of claim 1, wherein the non-reactive material comprises a liquid crystal material.

18. A method for fabricating a periodic structure, the method comprising:

providing a holographic mixture on a base substrate;

sandwiching the holographic mixture between the base substrate and a cover substrate, wherein the holographic mixture forms a holographic mixture layer on the base substrate;

applying holographic recording beams to the holographic mixture layer to form a holographic polymer dispersed periodic structure comprising alternating polymer rich regions and non-reactive material rich regions; and removing the cover substrate from the holographic polymer dispersed periodic structure, wherein the cover substrate has different properties than the base substrate to allow for the cover substrate to adhere to the unexposed holographic mixture layer while capable of being removed from the formed holographic polymer dispersed periodic structure after exposure, wherein an adhesion promotion layer is coated on top of the base substrate which promotes adhesion between the base substrate and the holographic polymer dispersed periodic structure, and wherein the base substrate comprises a glass surface including hydroxyl groups and wherein a silane-based reagent bonds with the hydroxyl group and the adhesion promotion layer.

* * * * *